US009680108B2

(12) United States Patent
Ito et al.

(10) Patent No.: US 9,680,108 B2
(45) Date of Patent: Jun. 13, 2017

(54) ORGANIC LIGHT-EMITTING DEVICE

(71) Applicant: SAMSUNG DISPLAY CO., LTD., Yongin, Gyeonggi-Do (KR)

(72) Inventors: Naoyuki Ito, Yongin (KR); Seul-Ong Kim, Yongin (KR); Youn-Sun Kim, Yongin (KR); Dong-Woo Shin, Yongin (KR); Jung-Sub Lee, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/533,004

(22) Filed: Nov. 4, 2014

(65) Prior Publication Data

US 2015/0364693 A1 Dec. 17, 2015

(30) Foreign Application Priority Data

Jun. 11, 2014 (KR) ........................ 10-2014-0071076

(51) Int. Cl.
*H01L 51/00* (2006.01)
*H01L 51/50* (2006.01)

(52) U.S. Cl.
CPC ...... *H01L 51/0058* (2013.01); *H01L 51/0067* (2013.01); *H01L 51/0072* (2013.01);
(Continued)

(58) Field of Classification Search
CPC ........................ H01L 51/0072; H01L 51/0067
See application file for complete search history.

(56) References Cited

U.S. PATENT DOCUMENTS

| | | |
|---|---|---|
| 3,968,051 A | 7/1976 | Stamm et al. |
| 6,582,837 B1 | 6/2003 | Toguchi et al. |

(Continued)

FOREIGN PATENT DOCUMENTS

| | | |
|---|---|---|
| JP | 11-003782 A | 1/1999 |
| JP | 2002-63989 | 2/2002 |

(Continued)

OTHER PUBLICATIONS

Patent Abstracts of Japan Publication No. JP 2009-224512, dated Oct. 1, 2009, for JP 5281304, 1 page.

(Continued)

*Primary Examiner* — Caridad Everhart
*Assistant Examiner* — Ankush Singal
(74) *Attorney, Agent, or Firm* — Lewis Roca Rothgerber Christie LLP

(57) ABSTRACT

An organic light-emitting device includes a first electrode; a second electrode facing the first electrode; and an organic layer between the first electrode and the second electrode, wherein the organic layer includes at least one first material represented by Formula 1 below, and at least one second material represented by Formula 2 below:

(Continued)

Formula 1

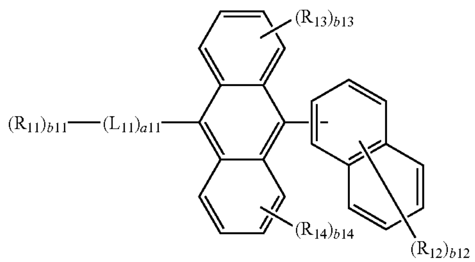

Formula 2

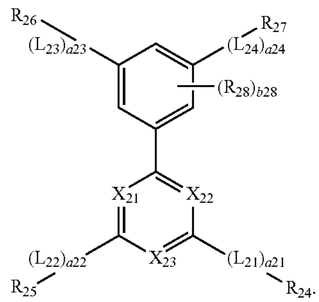

20 Claims, 1 Drawing Sheet

(52) U.S. Cl.
CPC ...... *H01L 51/0073* (2013.01); *H01L 51/0074* (2013.01); *H01L 51/0077* (2013.01); *H01L 51/5012* (2013.01); *H01L 51/5072* (2013.01); *H01L 51/5096* (2013.01); *H01L 2251/308* (2013.01)

(56) References Cited

U.S. PATENT DOCUMENTS 6,596,415 B2 7/2003 Shi et al.
7,053,255 B2 5/2006 Ikeda et al.
7,233,019 B2 6/2007 Ionkin et al.
7,839,074 B2 11/2010 Ikeda et al.
8,221,905 B2 7/2012 Lin et al.
2004/0137270 A1 7/2004 Seo et al.
2004/0214036 A1 10/2004 Bentsen et al.
2005/0156164 A1 7/2005 Sotoyama
2005/0214565 A1 9/2005 Ikeda et al.
2005/0245752 A1 11/2005 Conley et al.
2005/0249972 A1 11/2005 Hatwar et al.
2006/0083945 A1 4/2006 Morishita et al.
2006/0113905 A1 6/2006 Nakamura
2006/0159952 A1 7/2006 Ricks et al.
2007/0152565 A1 7/2007 Kubota et al.
2007/0155991 A1 7/2007 Funahashi
2007/0170419 A1 7/2007 Gerhard et al.
2007/0237984 A1* 10/2007 Matsuura .............. C07C 13/567 428/690
2008/0160342 A1 7/2008 Meng et al.
2008/0193796 A1 8/2008 Arakane et al.
2009/0004458 A1 1/2009 Falster et al.
2009/0004485 A1 1/2009 Zheng et al.
2010/0013381 A1 1/2010 Stoessel et al.
2010/0032658 A1 2/2010 Lee et al.
2010/0052526 A1 3/2010 Je et al.
2010/0187521 A1* 7/2010 Park .................... H01L 51/0058 257/40
2010/0244012 A1 9/2010 Mazur et al.
2010/0270913 A1 10/2010 Matsuura et al.
2010/0277061 A1 11/2010 Matsuura et al.
2010/0279156 A1 11/2010 Kim et al.
2010/0295445 A1 11/2010 Kuma et al.
2011/0001130 A1 1/2011 Nishimura et al.
2011/0006289 A1 1/2011 Mizuki et al.
2011/0057116 A1 3/2011 Trogler et al.
2011/0210320 A1* 9/2011 Shin ..................... C07D 213/22 257/40
2011/0284832 A1 11/2011 In et al.
2012/0001158 A1 1/2012 Asari et al.
2012/0032152 A1 2/2012 Kim et al.
2012/0056165 A1 3/2012 Kawamura et al.
2012/0091885 A1 4/2012 Kim et al.
2012/0138915 A1 6/2012 Nishimura et al.
2012/0181518 A1 7/2012 Ogiwara et al.
2012/0181922 A1 7/2012 Kawamura et al.
2012/0235561 A1 9/2012 Ikeda et al.
2012/0305904 A1 12/2012 Kai et al.
2012/0313511 A1 12/2012 Tsurutani et al.
2013/0049581 A1* 2/2013 Nishide .................. C09K 11/06 315/32
2013/0090446 A1* 4/2013 Zhou .................... C08G 61/123 528/8
2013/0105786 A1* 5/2013 Watanabe ............. C07C 49/665 257/40
2013/0112949 A1* 5/2013 Sim ..................... H01L 51/5008 257/40
2013/0221332 A1* 8/2013 Xia ..................... H01L 51/0035 257/40
2013/0295706 A1 11/2013 Goto et al.
2013/0306958 A1 11/2013 Ito et al.
2014/0008641 A1 1/2014 Kubota et al.
2014/0048792 A1 2/2014 Chun et al.
2014/0124763 A1 5/2014 Funahashi
2014/0175395 A1* 6/2014 Kim ...................... H01L 51/006 257/40
2014/0332772 A1* 11/2014 Han .................... H01L 51/0058 257/40
2014/0346464 A1* 11/2014 Kim .................... H01L 51/0058 257/40
2015/0001479 A1* 1/2015 Lee ..................... H01L 51/0073 257/40
2015/0053946 A1* 2/2015 Kim .................... H01L 51/0094 257/40
2015/0069344 A1 3/2015 Kim et al.
2015/0090964 A1* 4/2015 Hwang ............... H01L 51/0058 257/40
2015/0090965 A1* 4/2015 Park .................... H01L 51/0058 257/40
2015/0108448 A1* 4/2015 Dai ....................... C09K 11/06 257/40
2015/0171337 A1 6/2015 Jung et al.
2015/0236273 A1* 8/2015 Jang .................... H01L 51/0072 257/40
2015/0255736 A1 9/2015 Kim et al.
2015/0318508 A1* 11/2015 Kim .................... H01L 51/5008 257/40
2015/0333266 A1* 11/2015 Ito ....................... H01L 51/0052 257/40
2015/0349265 A1 12/2015 Hwang et al.
2015/0357574 A1 12/2015 Ito et al.
2015/0364693 A1 12/2015 Ito et al.
2016/0005980 A1 1/2016 Ito et al.
2016/0020404 A1 1/2016 Ito et al.
2016/0133845 A1 5/2016 Jung et al.

FOREIGN PATENT DOCUMENTS

JP 2003-306454 10/2003
JP 2005-041843 A 2/2005
JP 2006-273737 A 10/2006
JP 2008-291263 12/2008
JP 2009-212238 9/2009
JP 2012-82209 4/2012
JP 2012-156499 A 8/2012
JP 2013-063930 4/2013

(56) References Cited

FOREIGN PATENT DOCUMENTS

| | | |
|---|---|---|
| JP | 2013-063931 | 4/2013 |
| JP | 5281304 | 5/2013 |
| JP | 52-08271 B2 | 6/2013 |
| KR | 10-2005-0058465 | 6/2005 |
| KR | 10-2005-0086518 | 8/2005 |
| KR | 10-2005-0107809 | 11/2005 |
| KR | 10-2006-0006760 | 1/2006 |
| KR | 10-2006-0109524 | 10/2006 |
| KR | 10-2006-0113954 | 11/2006 |
| KR | 10-2006-0127138 | 12/2006 |
| KR | 10-2007-0009074 | 1/2007 |
| KR | 10-2007-0015195 | 2/2007 |
| KR | 10-2009-0033493 | 4/2009 |
| KR | 10-2010-0007552 | 1/2010 |
| KR | 10-2010-0007780 | 1/2010 |
| KR | 10-2010-0024894 | 3/2010 |
| KR | 10-2010-0048203 | 5/2010 |
| KR | 10-2010-0057465 | 5/2010 |
| KR | 10-2010-0070979 | 6/2010 |
| KR | 10-2010-0070992 | 6/2010 |
| KR | 10-2010-0093085 | 8/2010 |
| KR | 10-2010-0097182 | 9/2010 |
| KR | 10-2010-0099327 | 9/2010 |
| KR | 10-2010-0105099 | 9/2010 |
| KR | 10-2011-0015213 | 2/2011 |
| KR | 10-2011-0041728 | 4/2011 |
| KR | 10-2011-0094271 | 8/2011 |
| KR | 10-2011-0107679 | 10/2011 |
| KR | 10-2011-0134885 | 12/2011 |
| KR | 10-2012-0002865 | 1/2012 |
| KR | 10-2012-0026513 | 3/2012 |
| KR | 10-2012-0039470 | 4/2012 |
| KR | 10-2012-0041110 | 4/2012 |
| KR | 10-2012-0057611 | 6/2012 |
| KR | 10-2012-0066390 | 6/2012 |
| KR | 10-2012-0093354 | 8/2012 |
| KR | 10-2012-0117622 | 10/2012 |
| KR | 10-2012-0117675 | 10/2012 |
| KR | 10-2013-0007495 | 1/2013 |
| KR | 10-2013-0009765 | 1/2013 |
| KR | 10-1233377 | 2/2013 |
| KR | 10-1262420 | 5/2013 |
| KR | 10-2013-0100948 | 9/2013 |
| WO | WO 2010/050781 A1 | 5/2010 |
| WO | WO 2010/058995 A1 | 5/2010 |
| WO | WO 2010/107244 A2 | 9/2010 |
| WO | WO 2010/137678 A1 | 12/2010 |
| WO | WO 2012/070226 A1 | 5/2012 |
| WO | WO 2012/070234 A1 | 5/2012 |
| WO | WO 2013/051875 A2 | 4/2013 |

OTHER PUBLICATIONS

Zhensheng Ding, et al., A Succinct Synthesis of the Vaulted Biaryl Ligand Vanol via a Dienone-Phenol Rearrangement, Full Papers, 2011 Wiley-VCH Verlag GmbH & Co., KGaA, Weinheim, Chem. Asian J. 2011, 6, 2130-2146, 17 pages.

USPTO Office Action for related U.S. Appl. No. 14/195,836, dated May 5, 2016, 18 pages.

Katritzky, A., et al., *Polycyclic Fused Phenanthridines: An Alternative Approach from Benzotriazoles*, Center for Heterocyclic Compounds., Department of Chemistry, Univ. of Florida, pp. 1-27.

U.S. Office action dated Feb. 19, 2016, for cross reference U.S. Appl. No. 14/072,478, (12 pages).

U.S. Office action dated Oct. 6, 2016, for cross-referenced U.S. Appl. No. 14/550,801 (9 pages).

U.S. Office Action dated Apr. 20, 2016, issued in cross-reference U.S. Appl. No. 14/075,573 (10 pages).

* cited by examiner

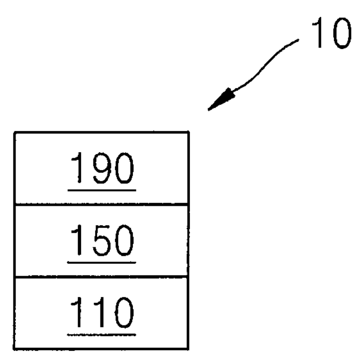
10
190
150
110

ORGANIC LIGHT-EMITTING DEVICE

CROSS-REFERENCE TO RELATED APPLICATION

This application claims priority to and the benefit of Korean Patent Application No. 10-2014-0071076, filed on 11 Jun. 2014, in the Korean Intellectual Property Office, the disclosure of which is incorporated herein in its entirety by reference.

BACKGROUND

1. Field

One or more embodiments of the present invention relate to organic light-emitting devices.

2. Description of the Related Art

Organic light-emitting devices (OLEDs) are self-emitting devices that can provide multicolored images and have desired characteristics such as wide viewing angles, excellent contrast, quick response time, excellent brightness, low driving voltage, and excellent response speed.

An OLED has a structure including a first electrode disposed on a substrate, and a hole transport region, an emission layer (EML), an electron transport region, and a second electrode sequentially formed on the first electrode. Holes injected from the first electrode move to the EML via the hole transport region, and electrons injected from the second electrode move to the EML via the electron transport region. Thus, excitons are generated when carriers, such as holes and electrons, recombine in the EML. When the excitons drop from an excited state to a ground state, light is emitted.

SUMMARY

One or more aspects according to one or more embodiments of the present invention are directed toward organic light-emitting devices.

Additional aspects will be set forth in part in the description which follows and, in part, will be apparent from the description, or may be learned by practice of the presented embodiments.

According to an embodiment of the present invention, an organic light-emitting device includes a first electrode; a second electrode facing the first electrode; and an organic layer between the first electrode and the second electrode, wherein the organic layer includes at least one first material represented by Formula 1 below, and at least one second material represented by Formula 2 below:

Formula 1

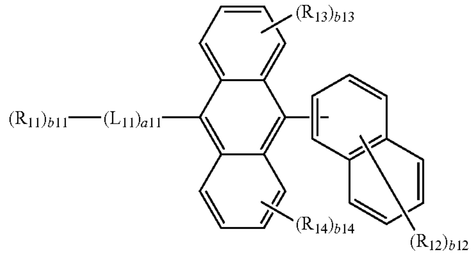

-continued

Formula 2

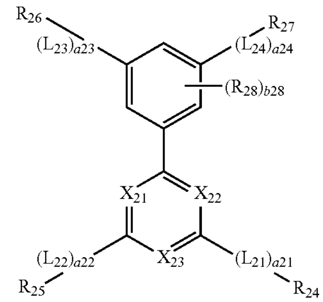

In Formulae 1 and 2, $X_{21}$ is $CR_{21}$ or a nitrogen atom (N); $X_{22}$ is $CR_{22}$ or N; $X_{23}$ is $CR_{23}$ or N;

$L_{11}$ and $L_{21}$ to $L_{24}$ are each independently selected from a substituted or unsubstituted $C_6$-$C_{60}$ arylene group, and a substituted or unsubstituted $C_1$-$C_{60}$ heteroarylene group;

a11 and a21 to a24 are each independently 0 or 1;

$R_{11}$, $R_{12}$ and $R_{24}$ to $R_{27}$ are each independently selected from a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed hetero-polycyclic group;

b11 and b12 are each independently selected from 1, 2, and 3;

$R_{13}$, $R_{14}$, $R_{21}$ to $R_{23}$, and $R_{28}$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted. $C_1$-$C_{60}$ alkoxy group, a substituted or unsubstituted $C_3$-$C_{10}$ cycloalkyl group, a substituted or unsubstituted $C_6$-$C_{60}$ aryl group, a substituted or unsubstituted $C_6$-$C_{60}$ aryloxy group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed hetero-polycyclic group, and —Si($Q_1$)($Q_2$)($Q_3$);

b13 and b14 are each independently selected from 1, 2, 3, and 4;

b28 is selected from 1, 2, and 3;

at least one substituent of the substituted $C_6$-$C_{60}$ arylene group, substituted $C_1$-$C_{60}$ heteroarylene group, substituted $C_6$-$C_{60}$ aryl group, substituted $C_1$-$C_{60}$ heteroaryl group, substituted monovalent non-aromatic condensed polycyclic group, substituted monovalent non-aromatic condensed hetero-polycyclic group, substituted $C_1$-$C_{60}$ alkyl group, substituted $C_1$-$C_{60}$ alkoxy group, substituted $C_3$-$C_{10}$ cycloalkyl group, and substituted $C_6$-$C_{60}$ aryloxy group is selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arythio group, a $C_1$-$C_{60}$ heteroaryl group, a monovalent non-aromatic condensed polycyclic group, a monovalent non-aromatic condensed hetero-polycyclic group, and —Si($Q_{11}$)($Q_{12}$)($Q_{13}$);

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arythio group, a $C_1$-$C_{60}$ heteroaryl group, a monovalent non-aromatic condensed polycyclic group, and a monovalent non-aromatic condensed hetero-polycyclic group;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arythio group, a $C_1$-$C_{60}$ heteroaryl group, a monovalent non-aromatic condensed polycyclic group, and a monovalent non-aromatic condensed hetero-polycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arythio group, a $C_1$-$C_{60}$ heteroaryl group, a monovalent non-aromatic condensed polycyclic group, a monovalent non-aromatic condensed hetero-polycyclic group, and —Si($Q_{21}$)($Q_{22}$)($Q_{23}$); and —Si($Q_{31}$)($Q_{32}$)($Q_{33}$); wherein, $Q_1$ to $Q_3$, $Q_{11}$ to $Q_{13}$, $Q_{21}$ to $Q_{23}$ and $Q_{31}$ to $Q_{33}$ are each independently selected from a $C_1$-$C_{60}$ alkyl group, a $C_6$-$C_{60}$ aryl group, a $C_1$-$C_{60}$ heteroaryl group, a monovalent non-aromatic condensed polycyclic group, and a monovalent non-aromatic condensed hetero-polycyclic group.

BRIEF DESCRIPTION OF THE DRAWING

These and/or other aspects will become apparent and more readily appreciated from the following description of the embodiments, taken in conjunction with the accompanying drawing in which the drawing shows a structure of an organic light-emitting device according to an embodiment of the present invention.

DETAILED DESCRIPTION

Reference will now be made in more detail to embodiments, examples of which are illustrated in the accompanying drawing, wherein like reference numerals refer to like elements throughout and repetitive descriptions thereof are omitted herein. In this regard, the present embodiments may have different forms and should not be construed as being limited to the descriptions set forth herein. Accordingly, the embodiments are merely described below, by referring to the FIGURE, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

As the invention allows for various changes and numerous embodiments, example embodiments will be illustrated in the drawing and described in detail in the written description. The effects and properties of the present invention and methods of achieving the same will become clear with reference to the drawing and the embodiments described below. However, the present invention is not limited to the example embodiments set forth herein and may have various forms.

The terms used in the present specification are merely used to describe example embodiments, and are not intended to limit the present invention. An expression used in the singular encompasses the expression of the plural, unless it has a clearly different meaning in the context.

In the present specification, it is to be understood that the terms such as "including", "having", and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

It will be understood that when a layer, region, or component is referred to as being "formed on" another layer, region, or component, it can be directly or indirectly formed on the other layer, region, or component. That is, for example, intervening layers, regions, or components may be present.

Sizes of components in the drawing may be exaggerated for convenience of explanation. In other words, since sizes and thicknesses of components in the drawing are arbitrarily illustrated for convenience of explanation, the following embodiments are not limited thereto.

As used herein, the expression an "(organic layer) includes at least one first material (represented by Formula 1)" may be construed as an "(organic layer) may include one first material (represented by Formula 1), or two or more different first materials (represented by Formula 1)".

As used herein, the expression, the "organic layer" is a term that refers to a single layer or a multi-layer disposed between the first electrode and the second electrode in the organic light-emitting device. Materials included in the "organic layer" are not limited to organic materials.

A substrate may be additionally disposed under the first electrode 110 or on the second electrode 190 in the drawing. The substrate may be a glass substrate or a transparent plastic substrate with excellent mechanical strength, thermal stability, transparency, surface smoothness, ease of handling, and water resistance.

The first electrode 110 may be formed by, for example, depositing or sputtering a material for the first electrode 110 on the substrate. When the first electrode 110 is an anode, the material for the first electrode 110 may be selected from materials with a high work function to enable ease of hole injection. The first electrode 110 may be a reflective electrode, a semi-transmission electrode, or a transmission electrode. The material for forming the first electrode 110 may be a transparent material with high conductivity, and examples of such a material are indium tin oxide (ITO), indium zinc oxide (IZO), tin oxide ($SnO_2$), and zinc oxide (ZnO). To manufacture the first electrode 110, which is a semi-transmission electrode or a transmission electrode, at least one of magnesium (Mg), aluminum (Al), aluminum-lithium (Al—Li), calcium (Ca), magnesium-indium (Mg—In), magnesium-silver (Mg—Ag), and the like may be used (utilized).

The first electrode 110 may have a single-layer structure or a multi-layer structure. For example, the first electrode 110 may have a three-layered structure of ITO/Ag/ITO, but is not limited thereto.

The organic layer 150 may be disposed on the first electrode 110. The organic layer 150 includes an EML.

The organic layer 150 may include at least one first material represented by Formula 1 below, and at least one second material represented by Formula 2 below:

Formula 1

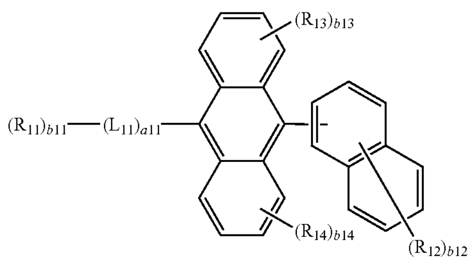

Formula 2

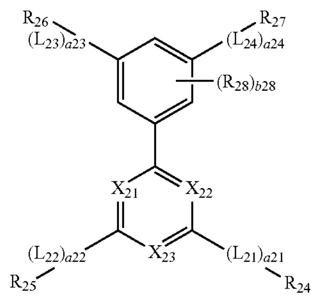

In Formulae 1 and 2, $X_{21}$ is $CR_{21}$ or a nitrogen atom (N); $X_{22}$ is $CR_{22}$ or N; and $X_{23}$ is $CR_{23}$ or N;

$L_{11}$, and $L_{21}$ to $L_{24}$ are each independently selected from a substituted or unsubstituted $C_6$-$C_{60}$ arylene group and a substituted or unsubstituted $C_1$-$C_{60}$ heteroarylene group;

a11, and a21 to a24 are each independently 0 or 1;

$R_{11}$, $R_{12}$, and $R_{24}$ to $R_{27}$ are each independently selected from a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed hetero-polycyclic group;

b11 and b12 are each independently selected from 1, 2, and 3;

$R_{13}$, $R_{14}$, $R_{21}$ to $R_{23}$, and $R_{28}$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_1$-$C_{60}$ alkoxy group, a substituted or unsubstituted $C_3$-$C_{10}$ cycloalkyl group, a substituted or unsubstituted $C_6$-$C_{60}$ aryl group, a substituted or unsubstituted $C_6$-$C_{60}$ aryloxy group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed hetero-polycyclic group, and —$Si(Q_1)(Q_2)(Q_3)$;

b13 and b14 are each independently selected from 1, 2, 3, and 4;

b28 is selected from 1, 2, and 3;

at least one substituent of the substituted $C_6$-$C_{60}$ arylene group, substituted $C_1$-$C_{60}$ heteroarylene group, substituted $C_6$-$C_{60}$ aryl group, substituted $C_1$-$C_{60}$ heteroaryl group, substituted monovalent non-aromatic condensed polycyclic group, substituted monovalent non-aromatic condensed hetero-polycyclic group, substituted $C_1$-$C_{60}$ alkyl group, substituted $C_1$-$C_{60}$ alkoxy group, substituted $C_3$-$C_{10}$ cycloalkyl group, and substituted $C_6$-$C_{60}$ aryloxy group may be selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arythio group, a $C_1$-$C_{60}$ heteroaryl group, a monovalent non-aromatic condensed polycyclic group, a monovalent non-aromatic condensed hetero-polycyclic group, and —$Si(Q_{11})(Q_{12})(Q_{13})$;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arythio group, a $C_1$-$C_{60}$ heteroaryl group, a monovalent non-aromatic condensed polycyclic group, and a monovalent non-aromatic condensed hetero-polycyclic group;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arythio group, a $C_1$-$C_{60}$ heteroaryl group, a monovalent non-aromatic condensed polycyclic group, and a monovalent non-aromatic condensed hetero-polycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arythio group, a $C_1$-$C_{60}$ heteroaryl group, a monovalent non-aromatic condensed polycyclic group, a monovalent non-aromatic condensed hetero-polycyclic group, and —$Si(Q_{21})(Q_{22})(Q_{23})$; and —$Si(Q_{31})(Q_{32})(Q_{33})$; wherein $Q_1$ to $Q_3$, $Q_{11}$ to $Q_{13}$, $Q_{21}$ to $Q_{23}$ and $Q_{31}$ to $Q_{33}$ are each independently selected from a $C_1$-$C_{60}$ alkyl group, a $C_6$-$C_{60}$ aryl group, a $C_1$-$C_{60}$ heteroaryl group, a monovalent non-aromatic condensed polycyclic group, and a monovalent non-aromatic condensed hetero-polycyclic group.

For example, in Formula 2, at least one of $X_{21}$, $X_{22}$ and $X_{23}$ may be N. In another embodiment, in Formula 2, $X_{21}$ may be $CR_{21}$, $X_{22}$ may be $CR_{22}$, and $X_{23}$ may be N. In another embodiment, in Formula 2, $X_{21}$ may be N, $X_{22}$ may be N, and $X_{23}$ may be $CR_{23}$. In another embodiment, in Formula 2, $X_{21}$ may be N, $X_{22}$ may be N, and $X_{23}$ may be N.

For example, in Formulae 1 and 2, $L_{11}$, $L_{21}$ to $L_{24}$ are each independently selected from a phenylene group, a naphthylene group, a phenanthrenylene group, an anthracenylene group, a triphenylenylene group, a pyrenylene group, a chrysenylene group, a pyrrolylene group, a thiophenylene group, a furanylene group, an imidazolylene group, a pyridinylene group, a pyrazinylene group, a pyrimidinylene group, a pyridazinylene group, an indolylene group, a quinolinylene group, an isoquinolinylene group, a benzoquinolinylene group, a phenanthridinylene group, an acridinylene group, a phenanthrolinylene group, a benzofuranylene group, a benzothiophenylene group, a triazolylene group, a tetrazolylene group, a triazinylene group, a dibenzofuranylene group, and a dibenzothiophenylene group; and a phenylene group, a naphthylene group, a phenanthrenylene group, an anthracenylene group, a triphenylenylene group, a pyrenylene group, a chrysenylene group, a pyrrolylene group, a thiophenylene group, a furanylene group, an imidazolylene group, a pyridinylene group, a pyrazinylene group, a pyrimidinylene group, a pyridazinylene group, an indolylene group, a quinolinylene group, an isoquinolinylene group, a benzoquinolinylene group, a phenanthridinylene group, an acridinylene group, a phenanthrolinylene group, a benzofuranylene group, a benzothiophenylene group, a triazolylene group, a tetrazolylene group, a triazinylene group, a dibenzofuranylene group, and a dibenzothiophenylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, and an imidazopyridinyl group, but they are not limited thereto.

In another embodiment, in Formulae 1 and 2, $L_{11}$, and $L_{21}$ to $L_{24}$ are each independently selected from a phenylene group, a naphthylene group, a pyridinylene group, a quinolinylene group, and an isoquinolinylene group; and a phenylene group, a naphthylene group, a pyridinylene group, a quinolinylene group, and an isoquinolinylene group, each substituted with at least one selected from deuterium, —F, —Cl, —Br, —I, a cyano group, a nitro group, a $C_1$-$C_{20}$ alkyl group, a phenyl group, and a naphthyl group, but they are not limited thereto.

In another embodiment, in Formulae 1 and 2, $L_{11}$, and $L_{21}$ to $L_{24}$ may be each independently groups selected from Formulae 3-1 to 3-6 below, but they are not limited thereto:

3-1

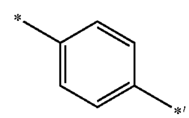

3-2

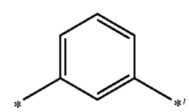

3-3

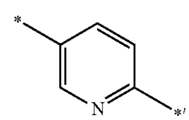

3-4

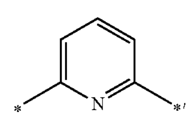

3-5

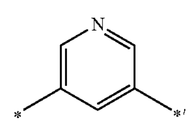

3-6

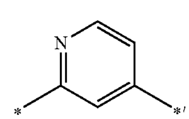

In Formulae 3-1 to 3-6,

* and *' are each a binding site to a neighboring atom.

In Formula 1, a11 represents the number of $L_{11}$s and when a11 is 0, $(L_{11})_{a11}$ may represent a direct bonding.

In Formula 1, a21 represents the number of $L_{21}$s and when a21 is 0, $(L_{21})_{a21}$ may represent a direct bonding.

In Formula 1, a22 represents the number of $L_{22}$s and when a22 is 0, $(L_{22})_{a22}$ may represent a direct bonding.

In Formula 1, a23 represents the number of $L_{23}$s and when a23 is 0, $(L_{23})_{a23}$ may represent a direct bonding.

In Formula 1, a24 represents the number of $L_{24}$s and when a24 is 0, $(L_{24})_{a24}$ may represent a direct bonding.

For example, in Formulae 1 and 2, $R_{11}$, $R_{12}$ and $R_{24}$ to $R_{27}$ may be each independently selected from a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a carbazolyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, and a dibenzocarbazolyl group; and a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a carbazolyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, and a dibenzocarbazolyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a carbazolyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, and a dibenzocarbazolyl group.

In another embodiment, in Formulae 1 and 2, $R_{11}$, $R_{12}$ and $R_{24}$ to $R_{27}$ may be each independently selected from a phenyl group, a naphthyl group, a fluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a quinolinyl group, an isoquinolinyl group, a carbazolyl group, a benzoquinolinyl group, a phthalazinyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, and a dibenzocarbazolyl group; and a phenyl group, a naphthyl group, a fluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a quinolinyl group, an isoquinolinyl group, a carbazolyl group, a benzoquinolinyl group, a phthalazinyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, and a dibenzocarbazolyl group, each substituted with at least one selected from deuterium, —F, —Cl, —Br, —I, a cyano group, a nitro group, a $C_1$-$C_{20}$ alkyl group, a phenyl group, a naphthyl group, a pyridinyl group, a quinolinyl group, and an isoquinolinyl group.

In another embodiment, in Formulae 1 and 2, $R_{11}$, $R_{12}$ and $R_{24}$ to $R_{27}$ may be each independently selected from a phenyl group, a naphthyl group, a fluorenyl group, a pyridinyl group, a quinolinyl group, and an isoquinolinyl group; and a phenyl group, a naphthyl group, a fluorenyl group, a pyridinyl group, a quinolinyl group, and an isoquinolinyl group, each substituted with at least one selected from deuterium, —F, —Cl, —Br, —I, a cyano group, a nitro group, a $C_1$-$C_{20}$ alkyl group, a phenyl group, a naphthyl group, a pyridinyl group, a quinolinyl group, and an isoquinolinyl group.

In another embodiment, in Formula 1, $R_{11}$ and $R_{12}$ may be each independently groups selected from Formulae 4-1 to 4-5, 4-23, and 4-24 below, but they are not limited thereto:

4-1

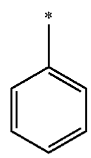

4-2

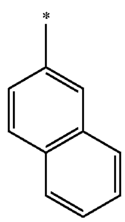

4-3

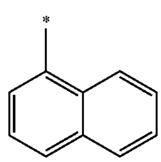

4-4

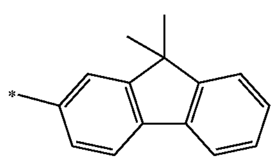

4-5

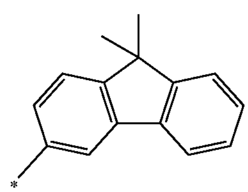

4-23

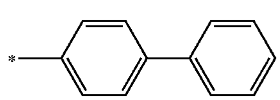

4-24

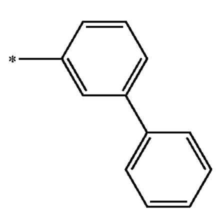

In Formulae 4-1 to 4-5, 4-23, and 4-24,
* is a binding site to a neighboring atom.

In another embodiment, in Formula 2, $R_{24}$ to $R_{27}$ may be each independently groups selected from Formulae 4-1 to 4-3 and 4-6 to 4-30 below, but they are not limited thereto:

4-1

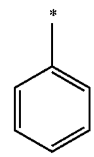

4-2

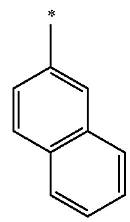

4-3

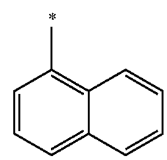

4-6

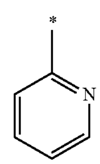

4-7

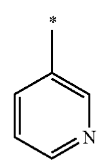

4-8

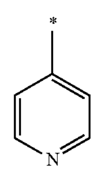

4-9

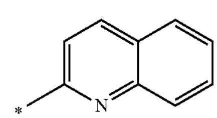

4-10

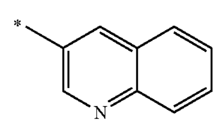

4-11

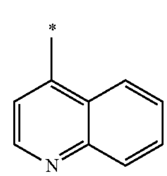

-continued 4-12

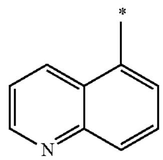

4-13

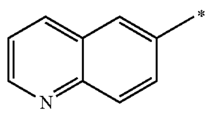

4-14

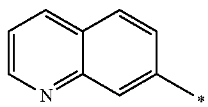

4-15

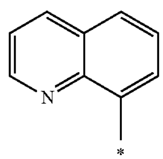

4-16

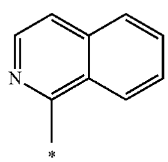

4-17

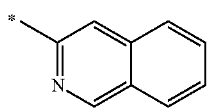

4-18

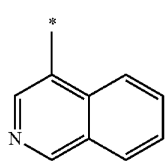

4-19

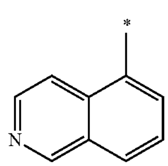

4-20

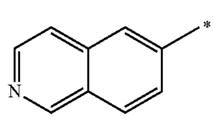

4-21

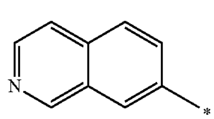

-continued 4-22

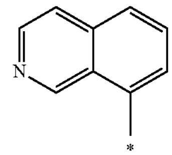

4-23

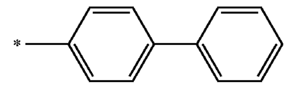

4-24

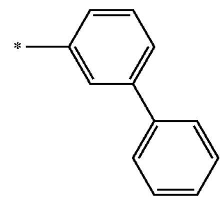

4-25

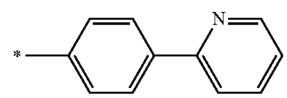

4-26

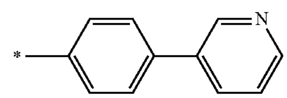

4-27

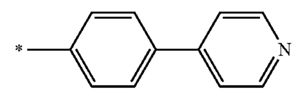

4-28

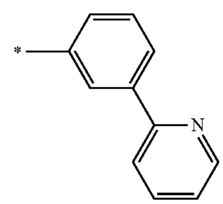

4-29

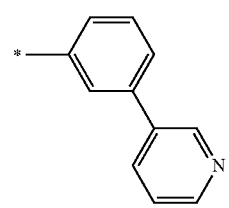

4-30

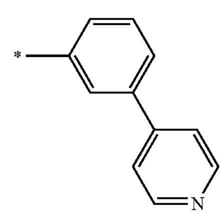

In Formulae 4-1 to 4-3 and 4-6 to 4-30,

* is a binding site to a neighboring atom.

In Formulae 1 and 2, b11 and b12 may respectively represent the number of $R_{11}$ and $R_{12}$, and when b11 and/or b12 is 2 or 3, a plurality of $R_{11}$ and/or $R_{12}$ may be the same as or different from each other.

For example, in Formulae 1 and 2, $R_{13}$, $R_{14}$, $R_{21}$ to $R_{23}$, and $R_{28}$ may be each independently selected from hydrogen, deuterium, —F, —Cl, —Br, —I, a cyano group, a nitro group, a methyl group, an ethyl group, an n-propyl group, an iso-propyl group, an n-butyl group, a sec-butyl group, an iso-butyl group, a tert-butyl group, an n-pentyl group, an n-hexyl group, an n-heptyl group, an n-octyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a carbazolyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, and a dibenzocarbazolyl group, but they are not limited thereto.

In another embodiment, in Formulae 1 and 2, $R_{13}$, $R_{14}$, $R_{21}$ to $R_{23}$, and $R_{28}$ may be each independently selected from hydrogen, deuterium, —F, —Cl, —Br, —I, a cyano group, a nitro group, a methyl group, an ethyl group, an n-propyl group, an iso-propyl group, an n-butyl group, a sec-butyl group, an iso-butyl group, a tert-butyl group, an n-pentyl group, an n-hexyl group, an n-heptyl group, an n-octyl group, and groups represented by Formulae 4-1 to 4-30 below, but they are not limited thereto:

4-1

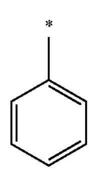

4-2

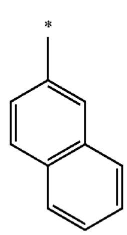

4-3

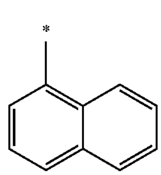

-continued 4-4

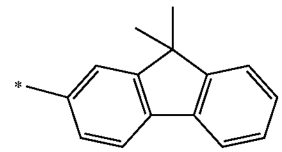

4-5

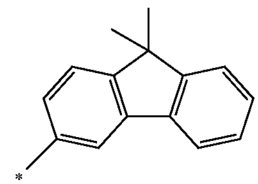

4-6

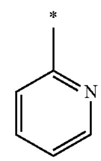

4-7

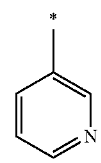

4-8

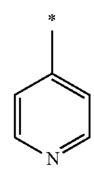

4-9

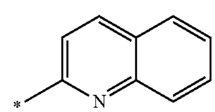

4-10

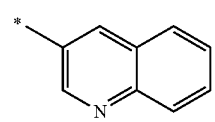

4-11

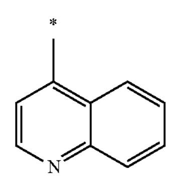

4-12

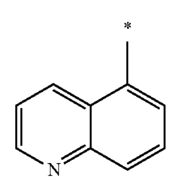

4-13

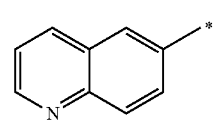

-continued 4-14

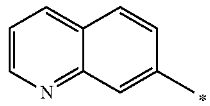

4-15

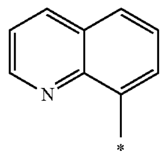

4-16

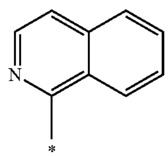

4-17

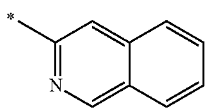

4-18

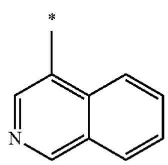

4-19

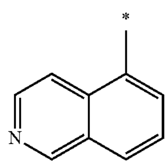

4-20

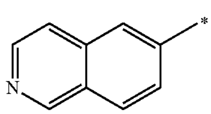

4-21

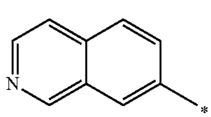

4-22

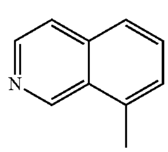

4-23

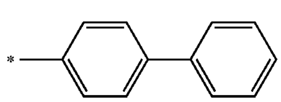

-continued 4-24

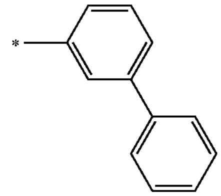

4-25

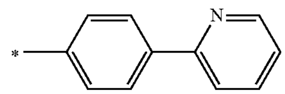

4-26

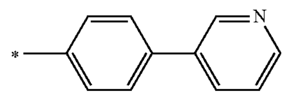

4-27

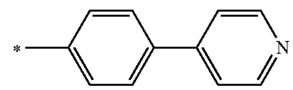

4-28

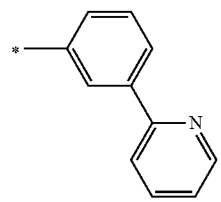

4-29

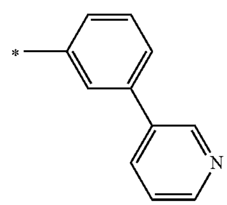

4-30

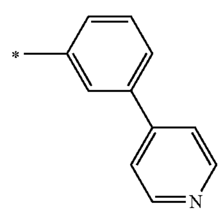

In Formulae 4-1 to 4-30,

* is a binding site to a neighboring atom.

In Formulae 1 and 2, b13 and b14 may respectively represent the number of $R_{13}$ and $R_{14}$, and when b13 and/or b14 is selected from 2, 3, and 4, a plurality of $R_{13}$ and/or $R_{14}$ may be the same as or different from each other.

For example, the first material may be represented by any one of Formulae 1A and 1B, and the second material may be represented by any one of Formulae 2A to 2C, but they are not limited thereto:

Formula 1A

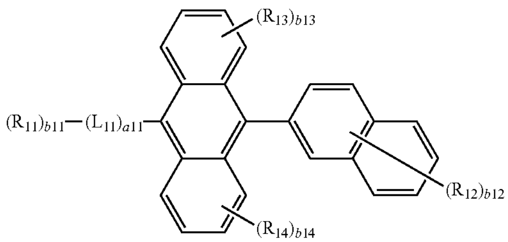

Formula 1B

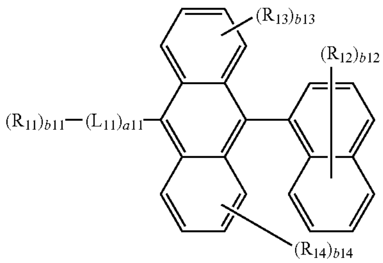

Formula 2A

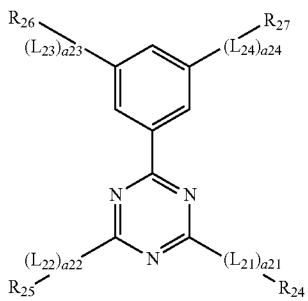

Formula 2B

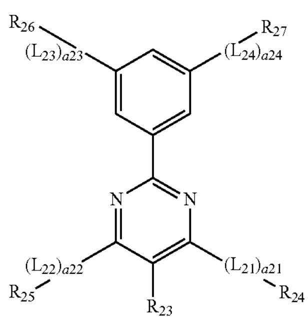

Formula 2C

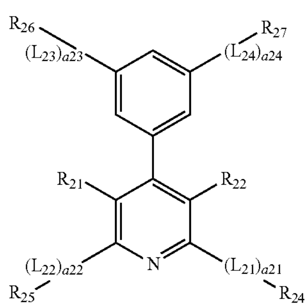

In Formulae 1A, 1B, 2A, 2B, and 2C, $L_{11}$, a11, $R_{11}$ to $R_{14}$, b11 to b14, $L_{21}$ to $L_{24}$, a21 to a24, and $R_{21}$ to $R_{27}$ are the same as described below.

In another embodiment, the first material may be represented by any one of Formulae 1A-1, 1A-2, 1B-1, and 1B-2 below, and the second material may be represented by any one of Formulae 2A to 2C below, but they are not limited thereto:

Formula 1A-1

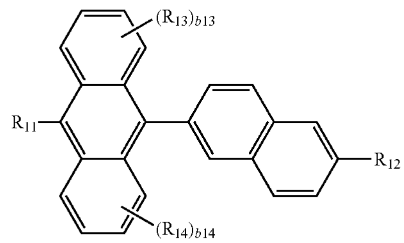

Formula 1A-2

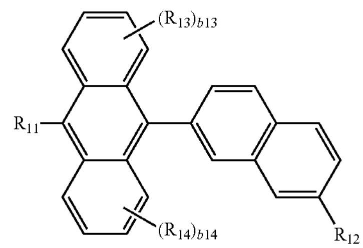

Formula 1B-1

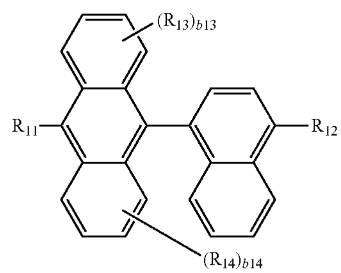

Formula 1B-2

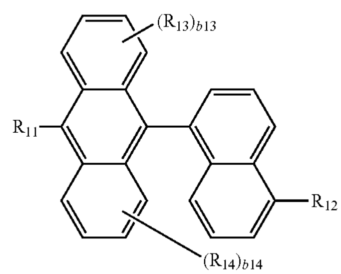

Formula 2A

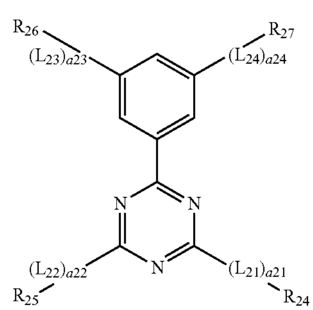

-continued

Formula 2B

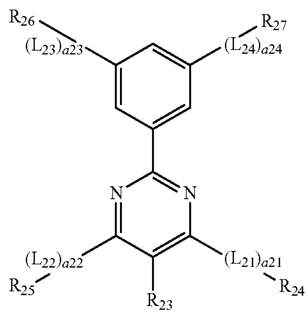

Formula 2C

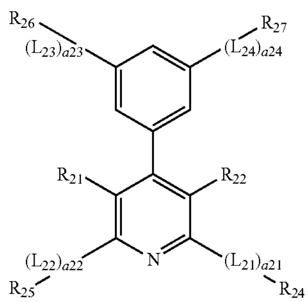

In Formula 1A-1, 1A-2, 1B-1, 1B-2, 2A, 2B and 2C, $R_{11}$ to $R_{14}$, b13, b14, $L_{21}$ to $L_{24}$, a21 to a24, and $R_{21}$ to $R_{27}$ are the same as described above.

In another embodiment, the first material may be represented by any one of Formulae 1A-1, 1A-2, 1B-1, and 1B-2 below, and the second material may be represented by any one of Formulae 2A-1 to 2C-1 below, but they are not limited thereto:

Formula 1A-1

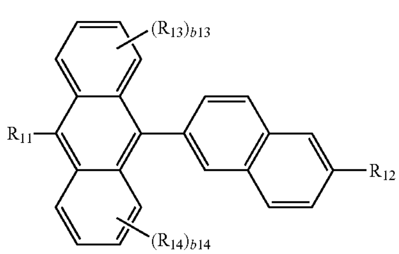

Formula 1A-2

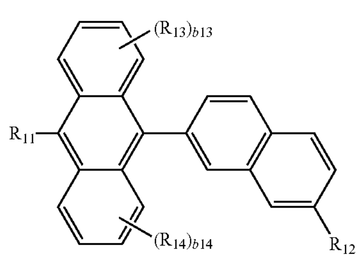

-continued

Formula 1B-1

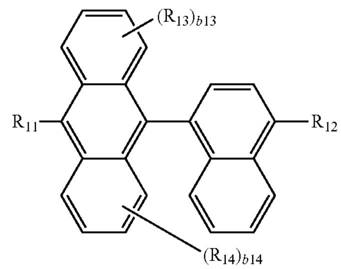

Formula 1B-2

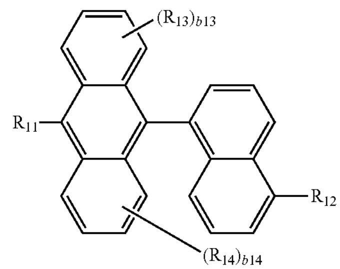

Formula 2A-1

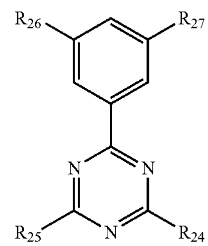

Formula 2B-1

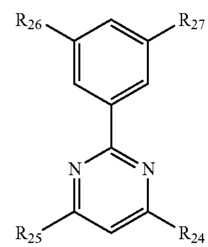

Formula 2C-1

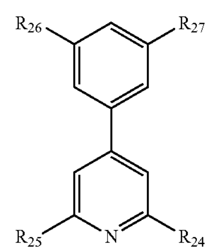

In Formula 1A-1, 1A-2, 1B-1, 1B-2, 2A-1, 2B-1, and 2C-1 above, $R_{11}$ to $R_{14}$, b13, b14, and $R_{24}$ to $R_{27}$ may be the same as described above.

In another embodiment, the first material may be selected from Compounds 100 to 201, and the second material may be selected from Compounds 300 to 544, but they are not limited thereto:

-continued
100
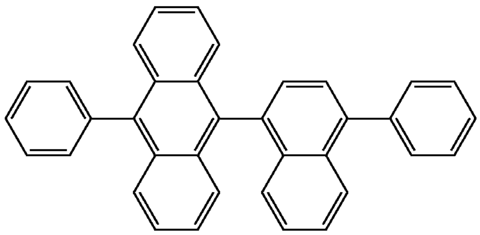
101
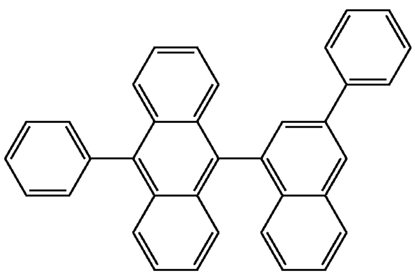
102
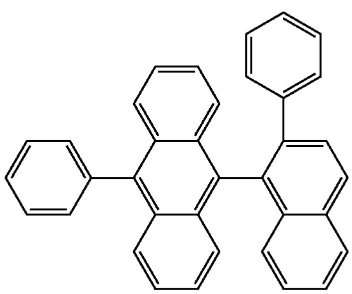
103
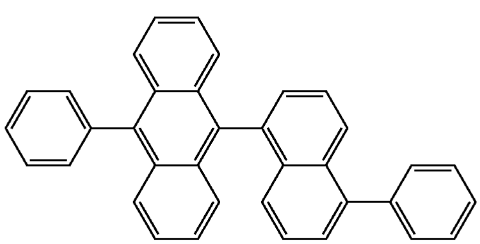
104
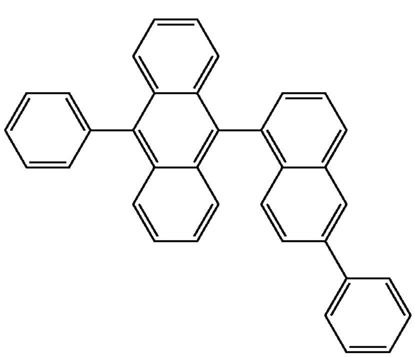
105
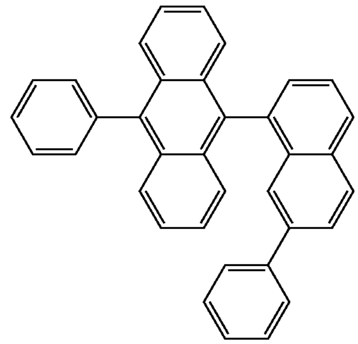
106
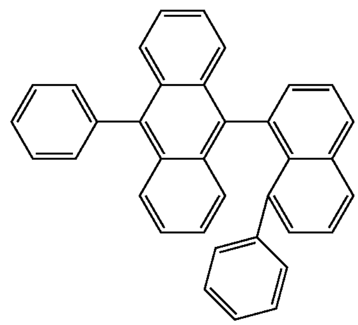
107
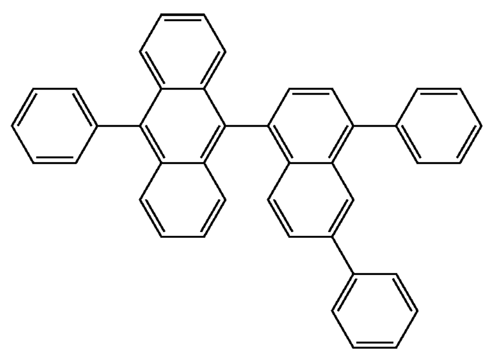
108
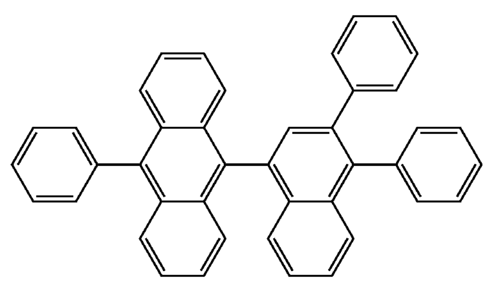
109
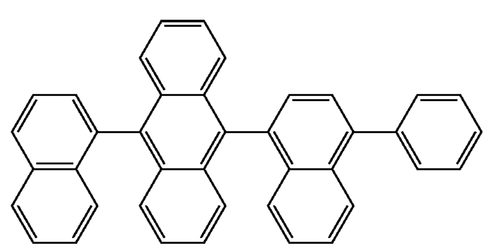

-continued
110
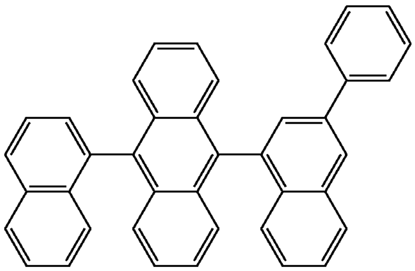
111
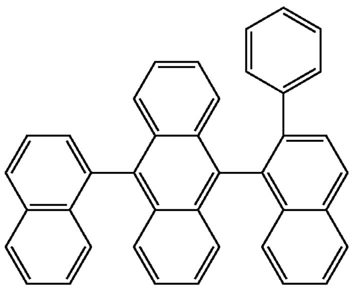
112
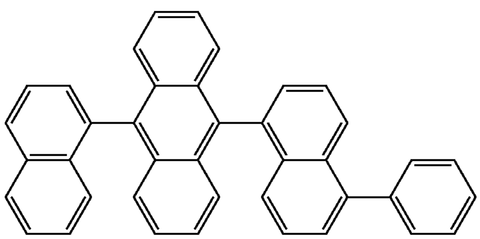
113
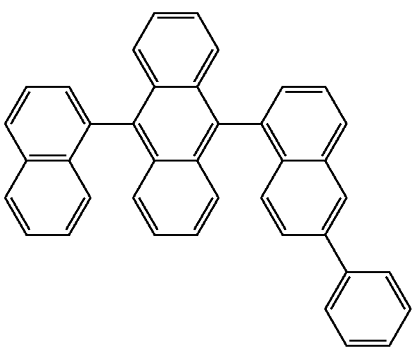
114
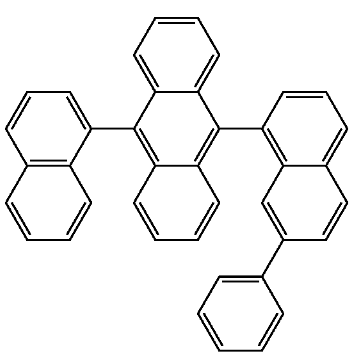
-continued
115
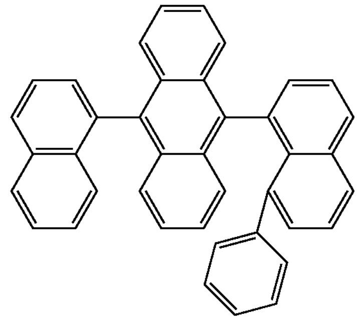
116
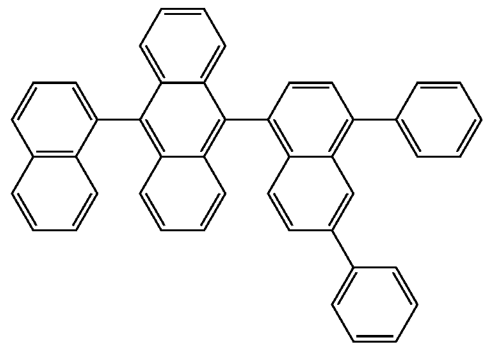
117
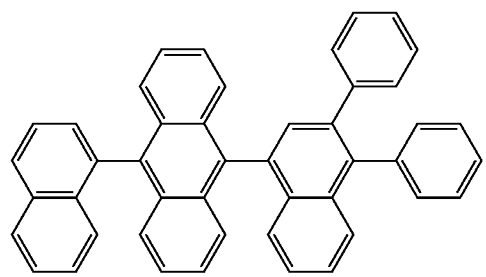
118
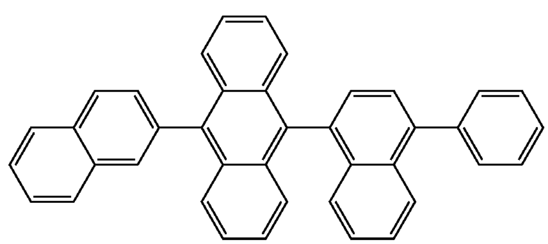
119
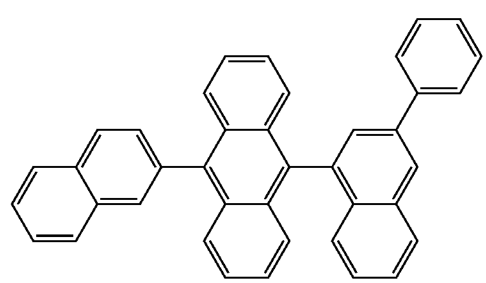

-continued
120
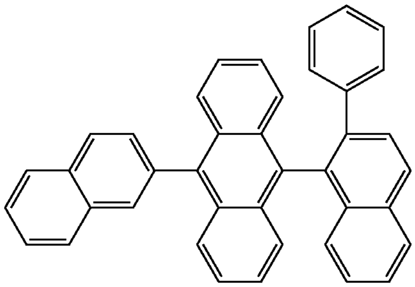
121
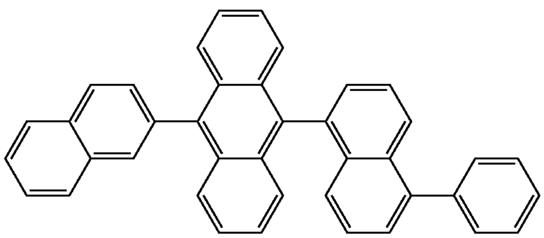
122
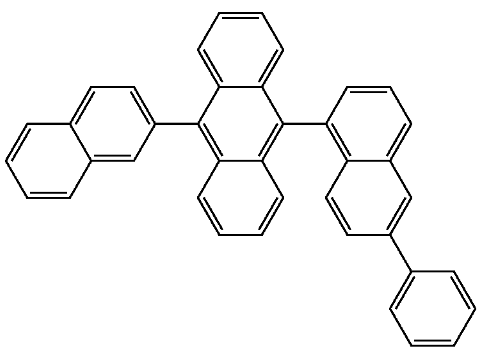
123
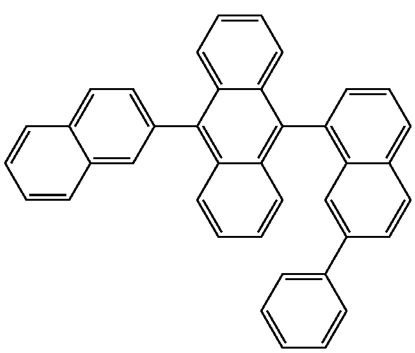
124
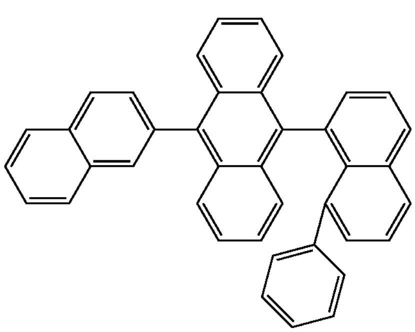
-continued
125
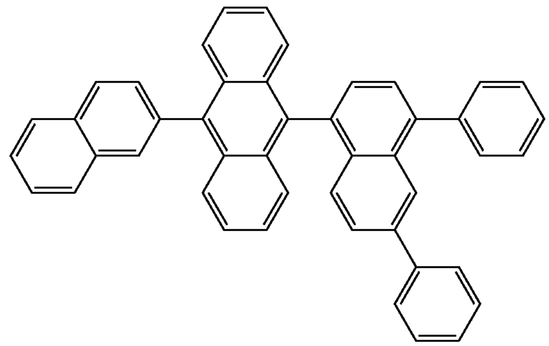
126
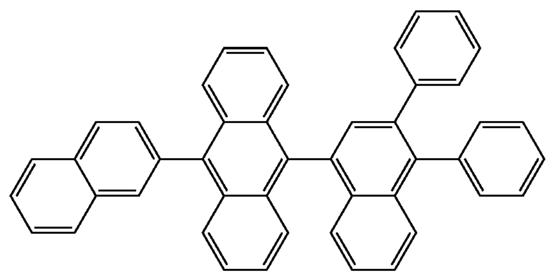
127
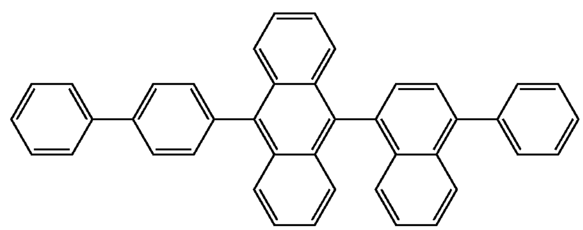
128
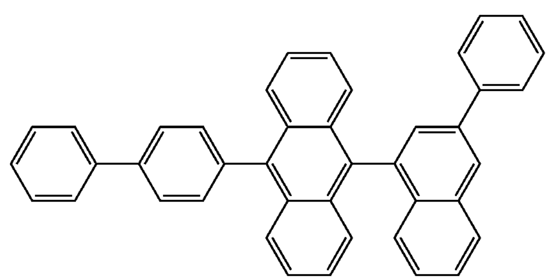
129
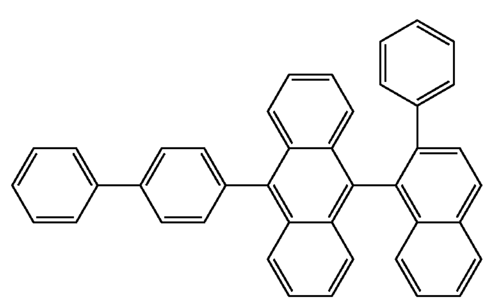

-continued
130
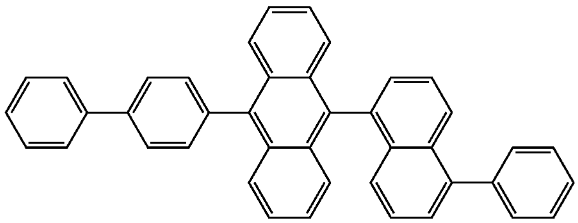
131
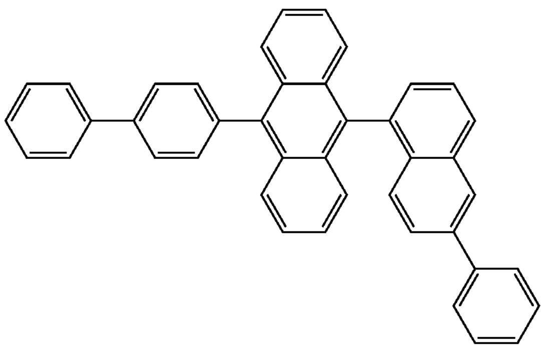
132
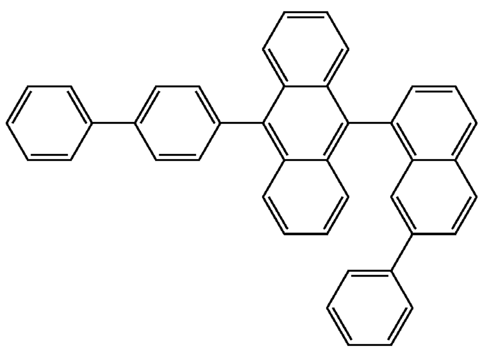
133
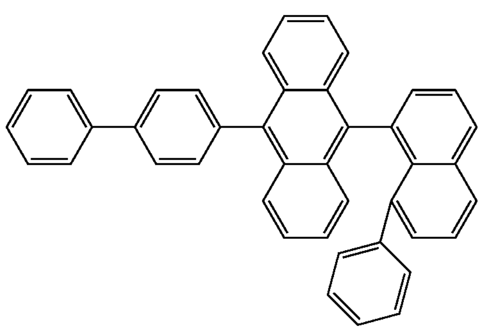
134
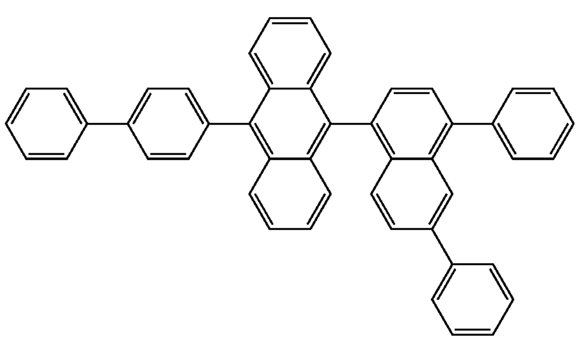
-continued
135
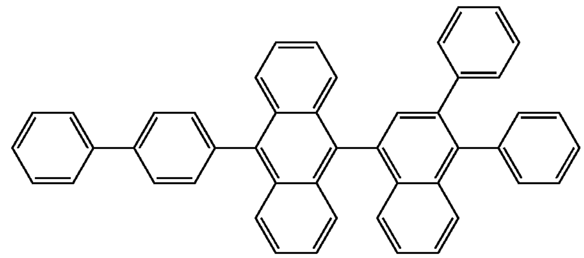
136
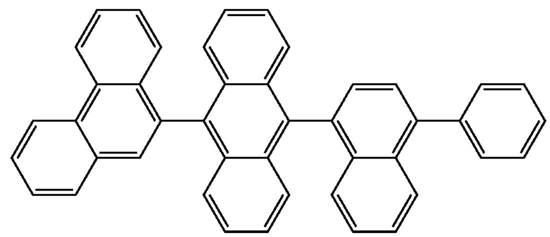
137
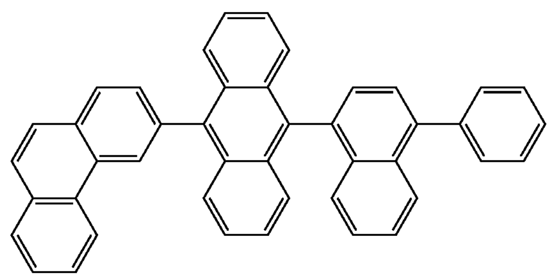
138
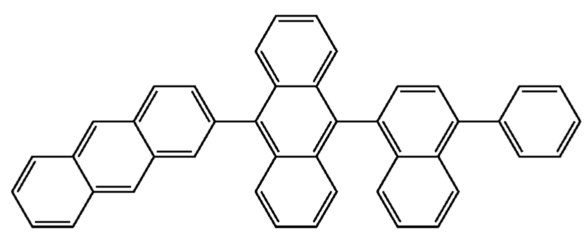
139
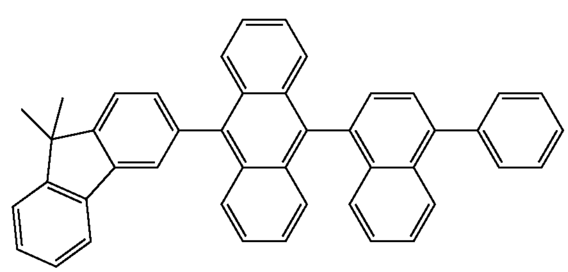

-continued
140
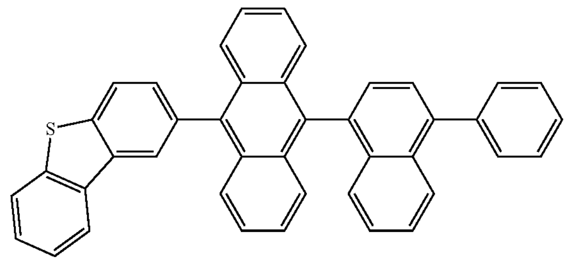
141
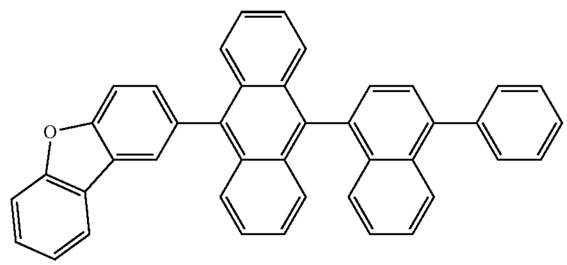
142
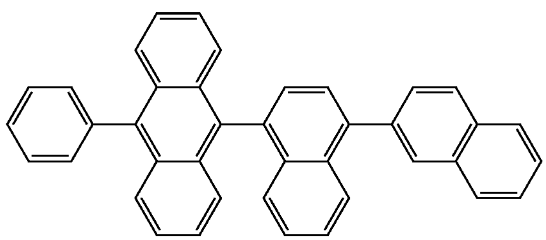
143
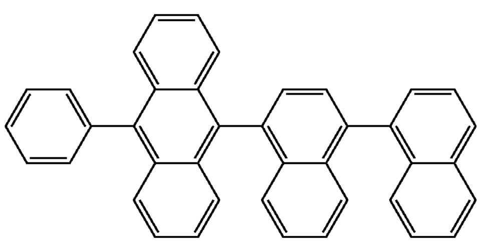
144
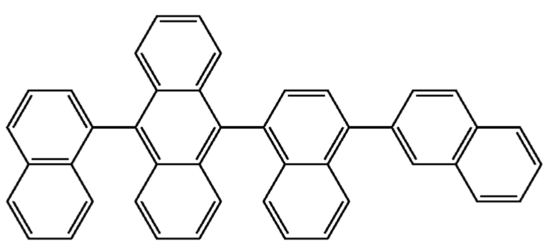
145
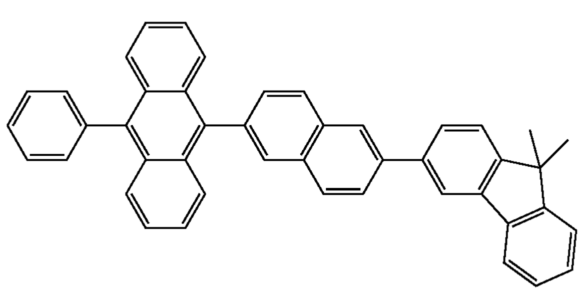
-continued
146
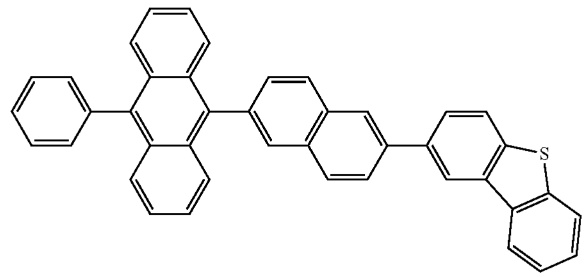
147
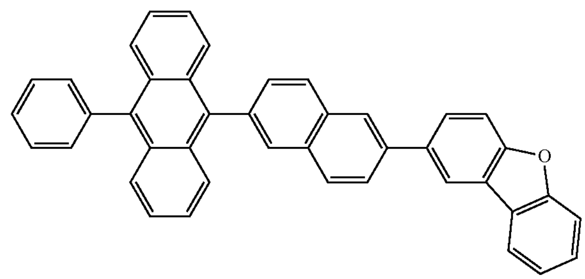
148
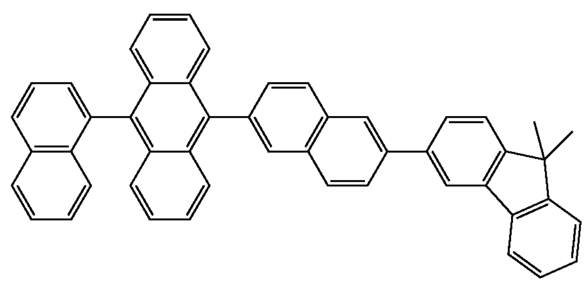
149
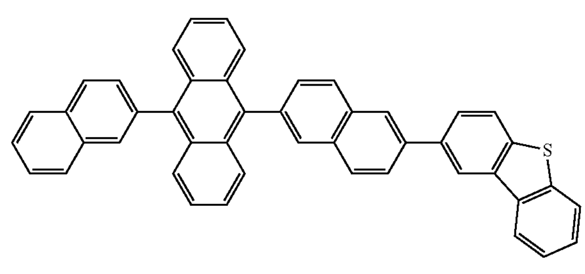
150
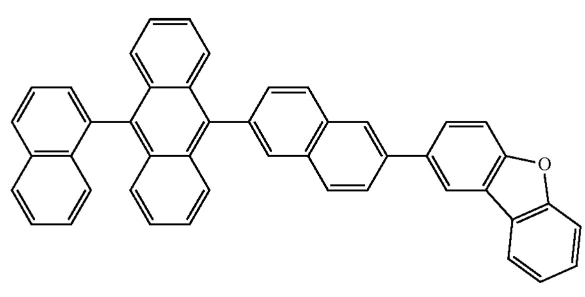

-continued
151
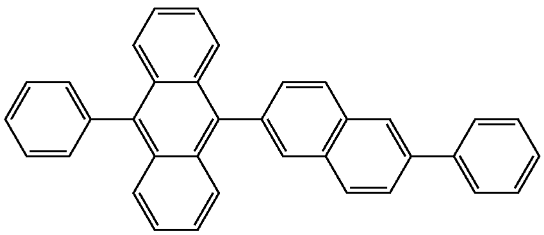
152
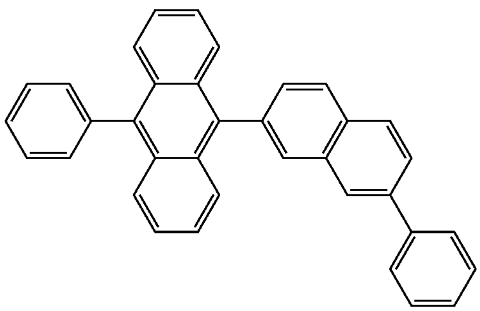
153
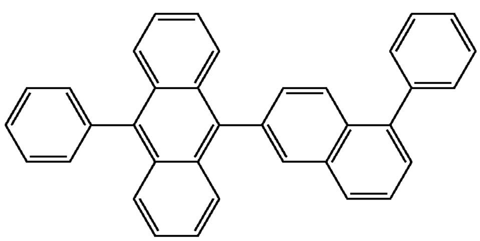
154
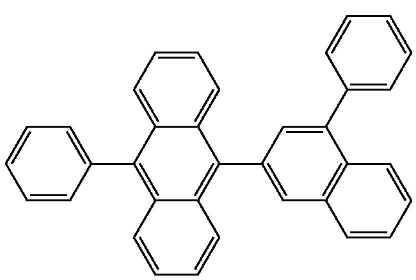
155
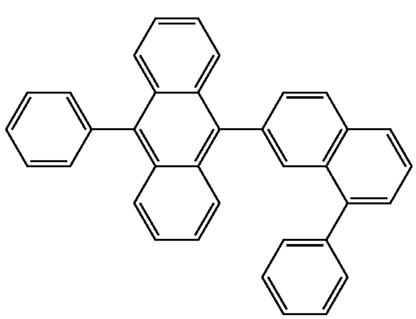
-continued
156
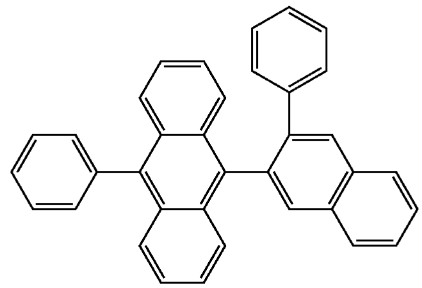
157
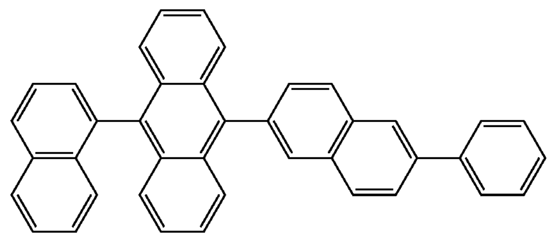
158
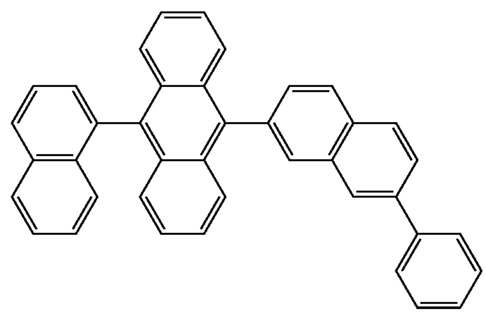
159
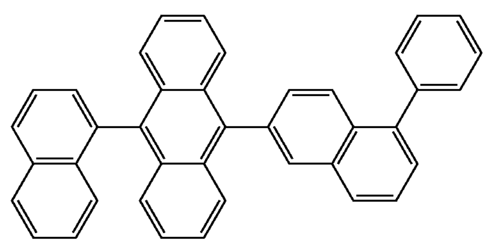
160
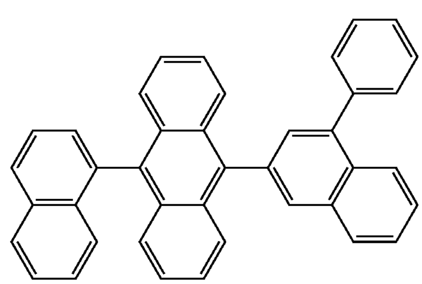

161
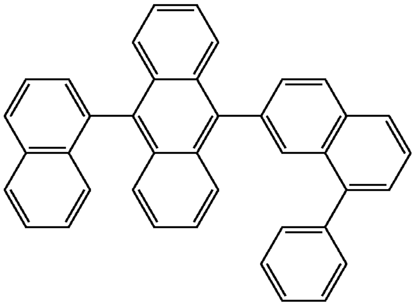
162
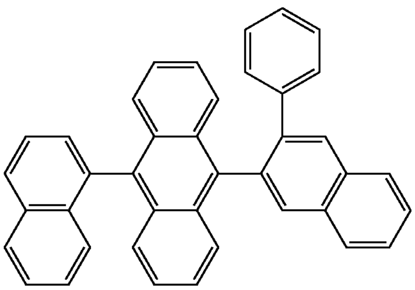
163
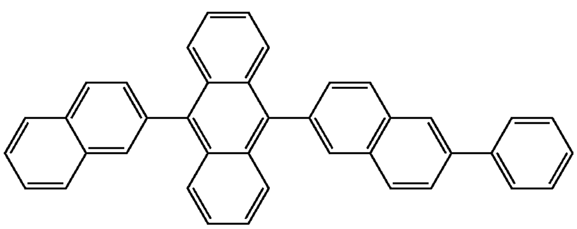
164
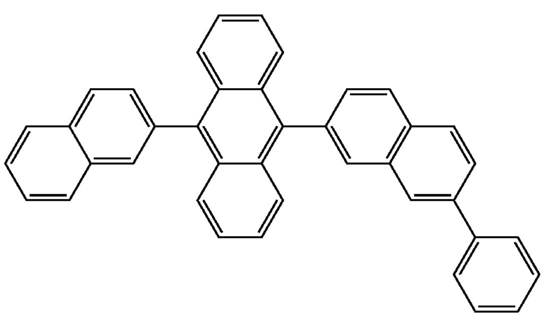
165
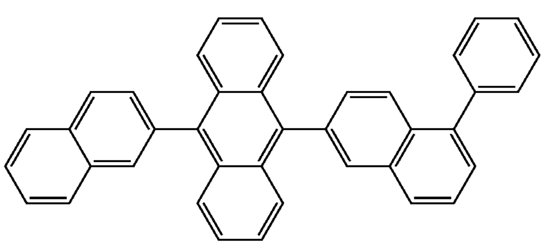
166
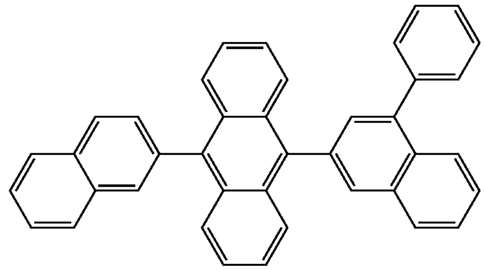
167
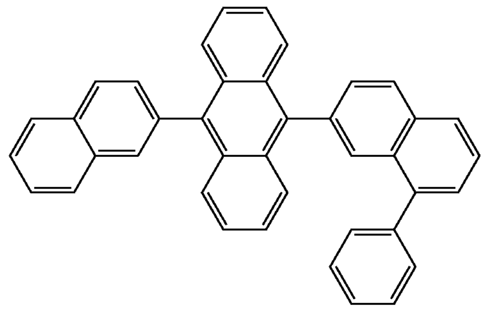
168
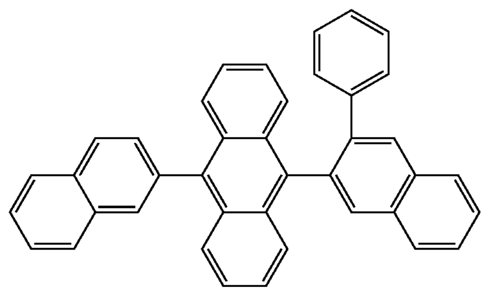
169
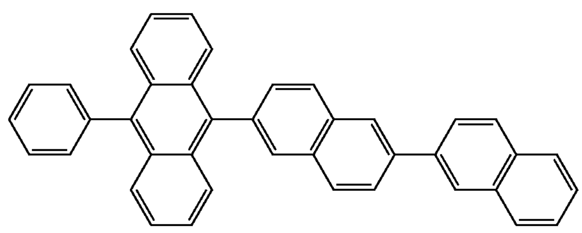
170
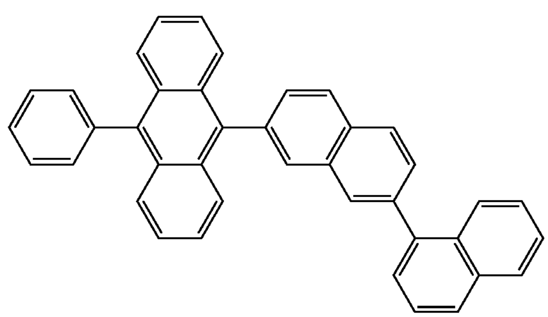

-continued
171
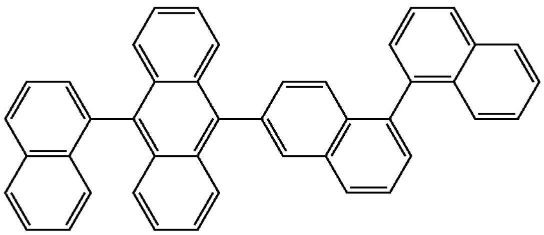
172
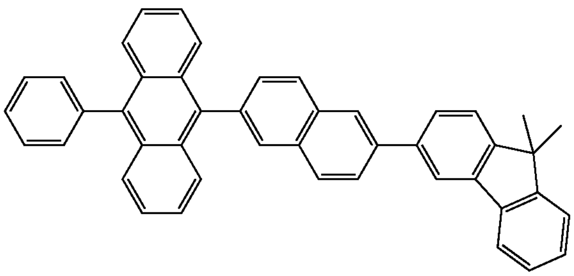
173
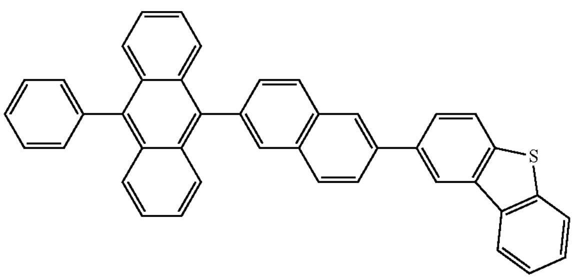
174
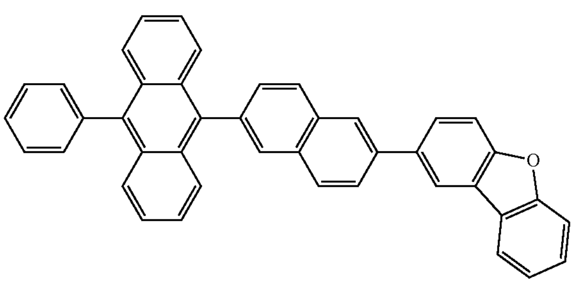
175
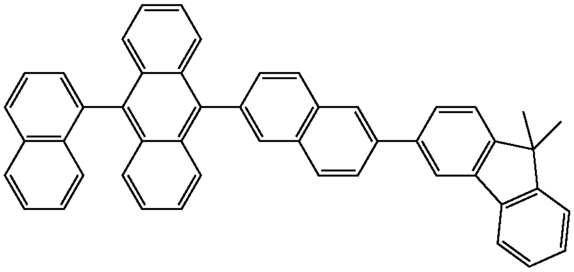
-continued
176
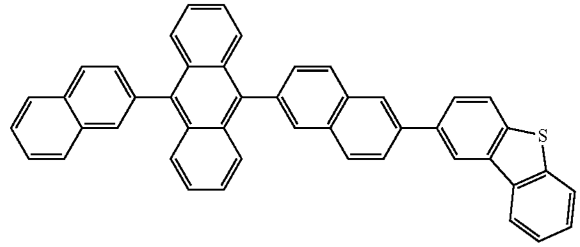
177
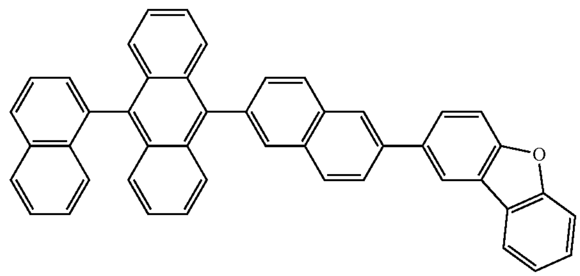
178
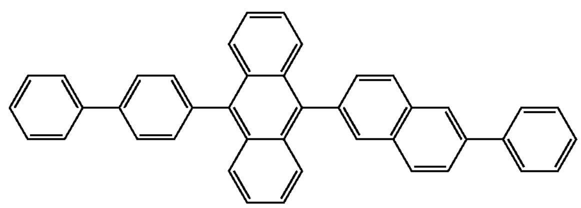
179
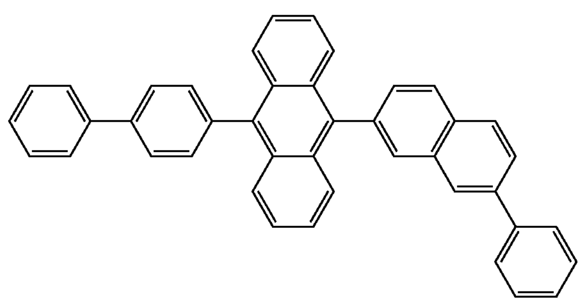
180
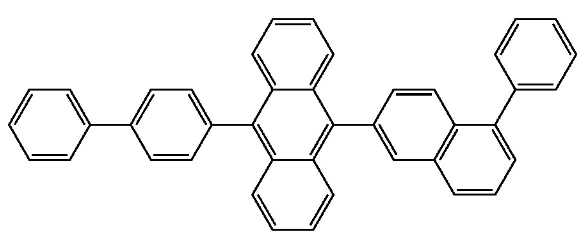
181
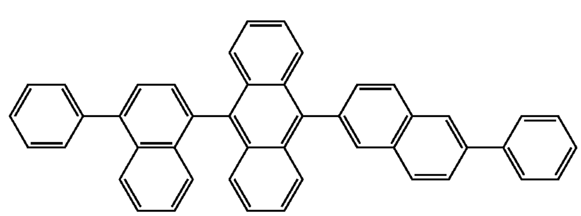

-continued
182
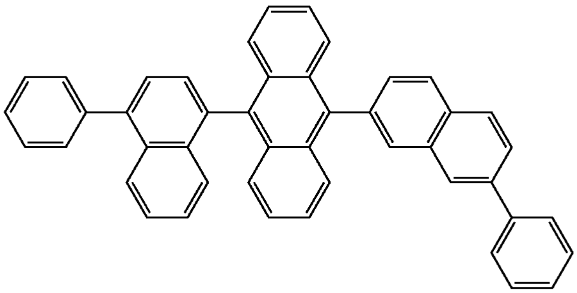
183
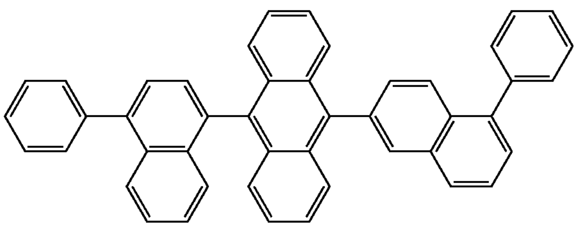
184
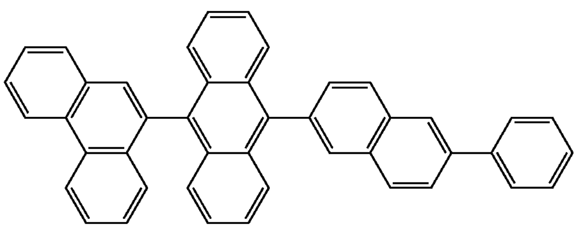
185
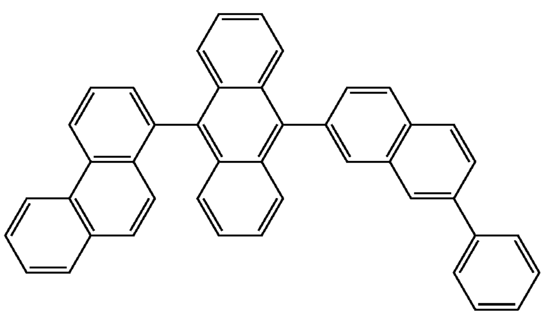
186
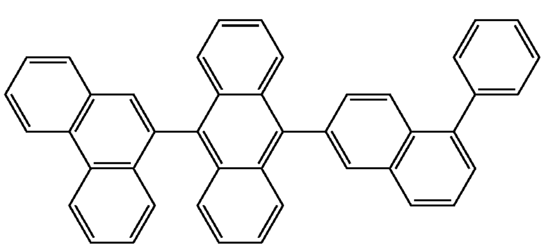
-continued
187
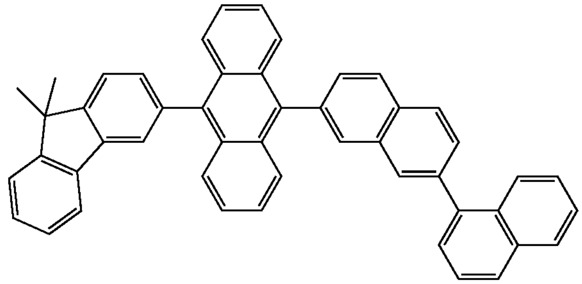
188
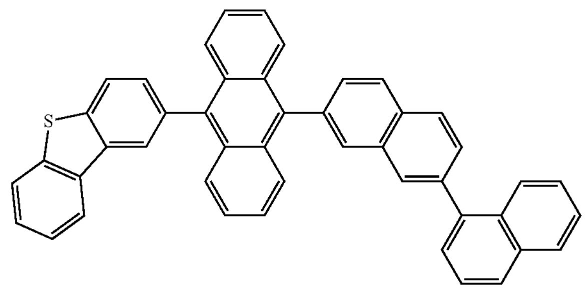
189
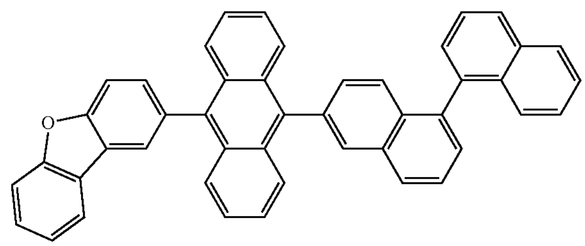
190
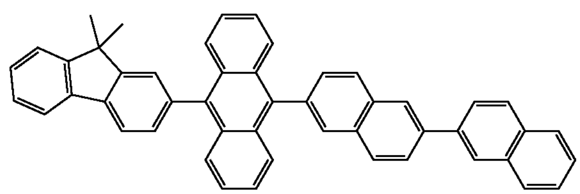
191
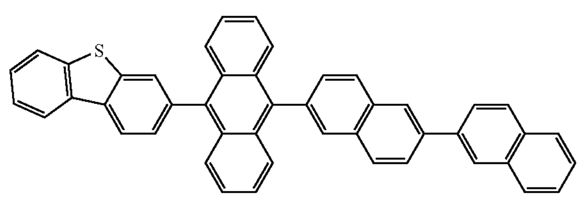
192
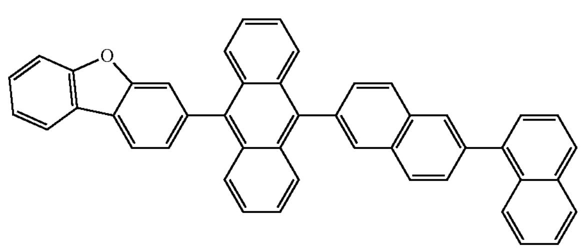

-continued
193
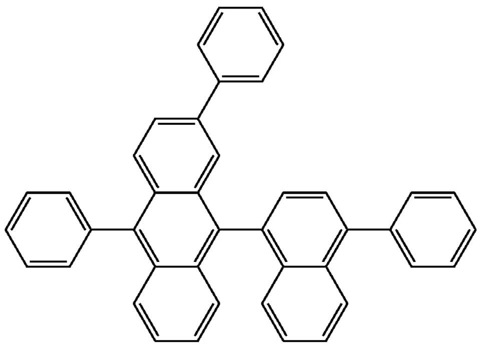
194
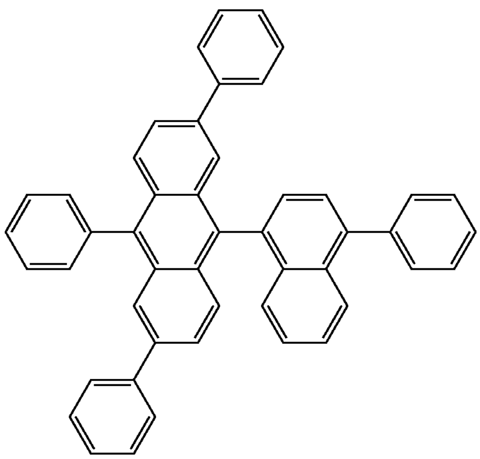
195
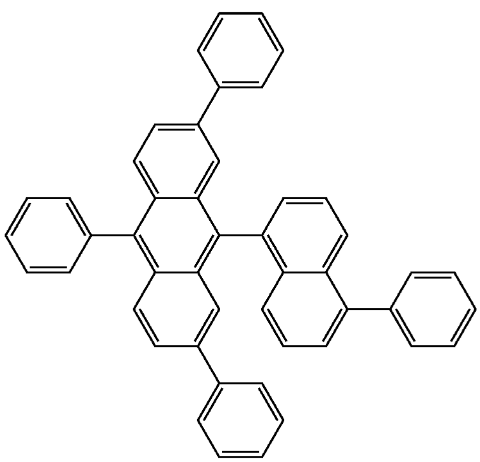
196
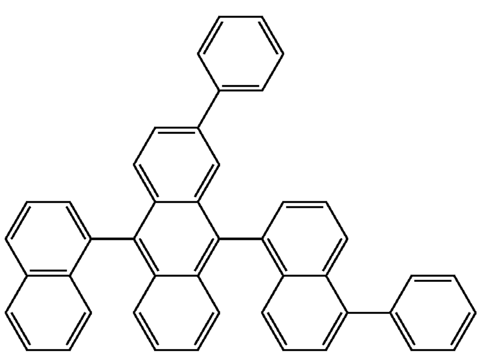
-continued
197
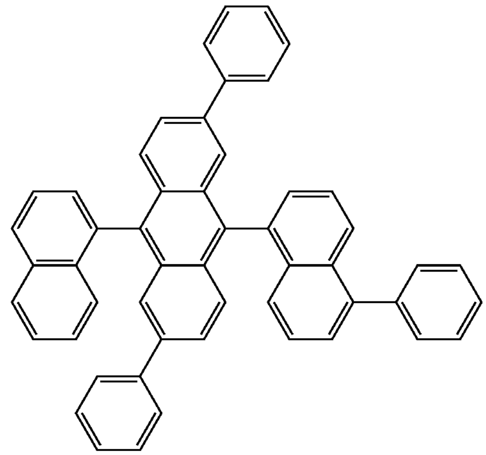
198
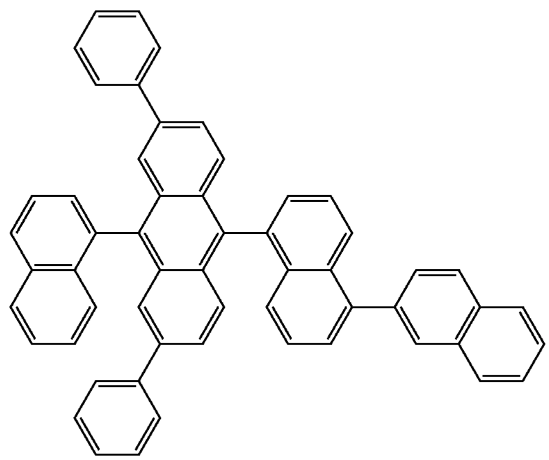
199
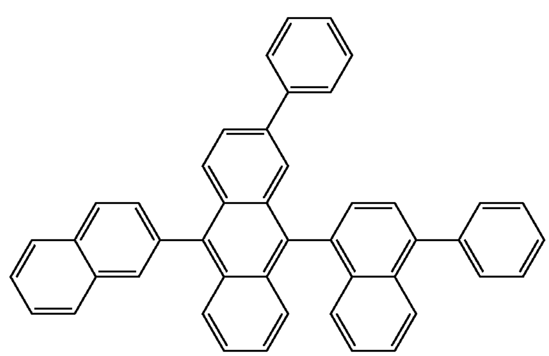

-continued
200
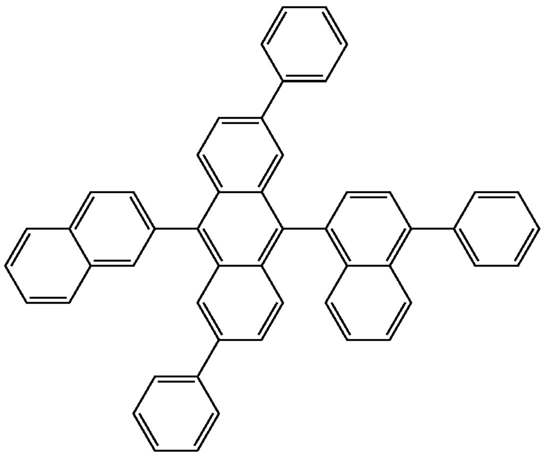
201
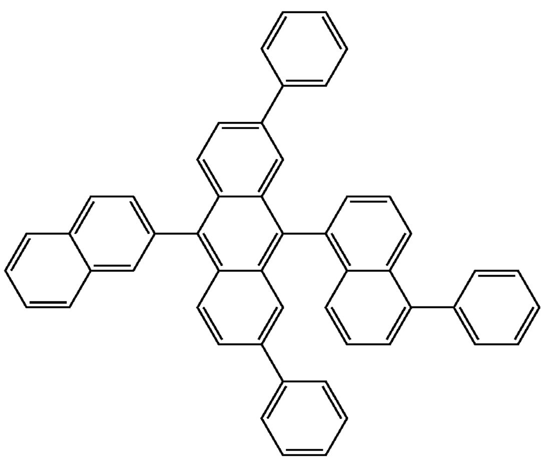
300
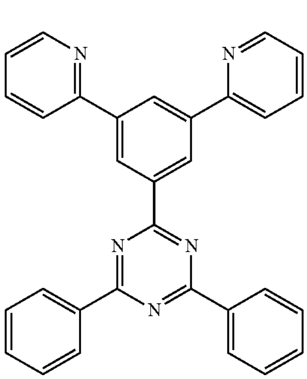
-continued
301
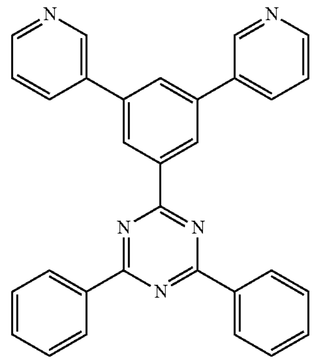
302
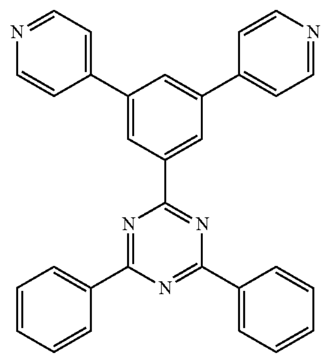
303
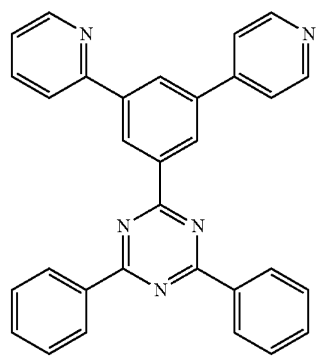
304
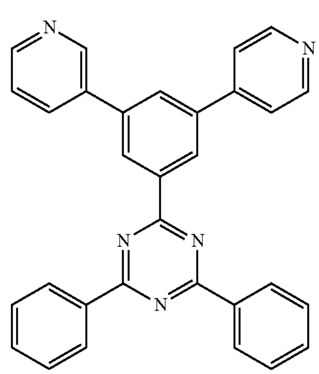

-continued
305
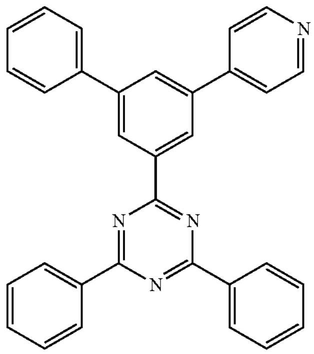
306
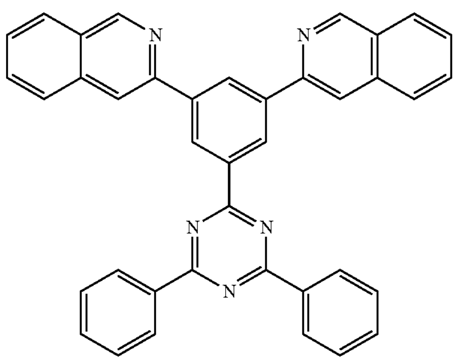
307
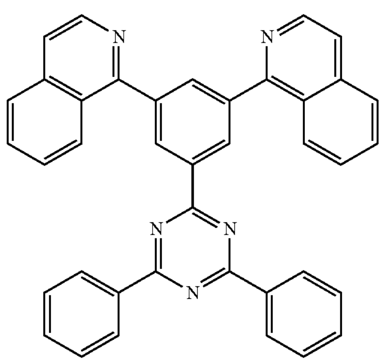
308
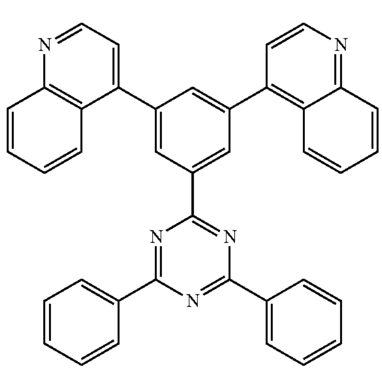
-continued
309
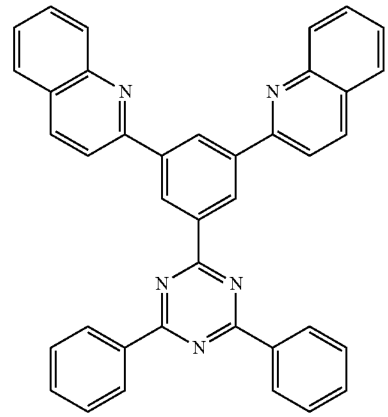
310
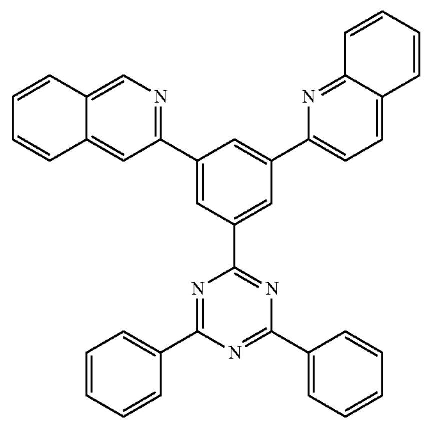
311
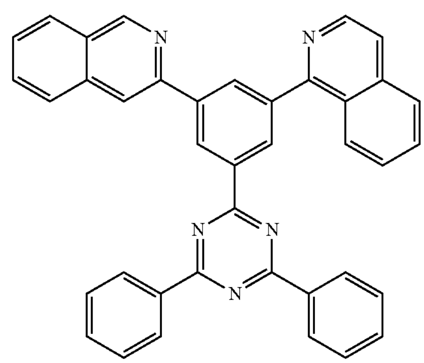
312
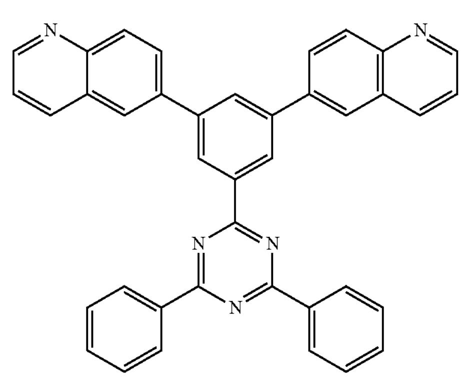

-continued
313
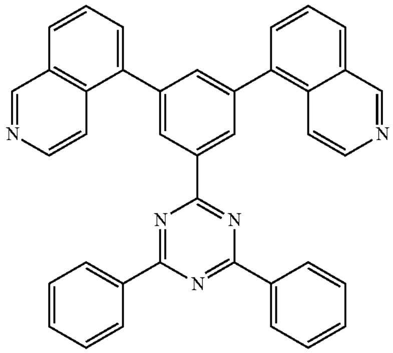
314
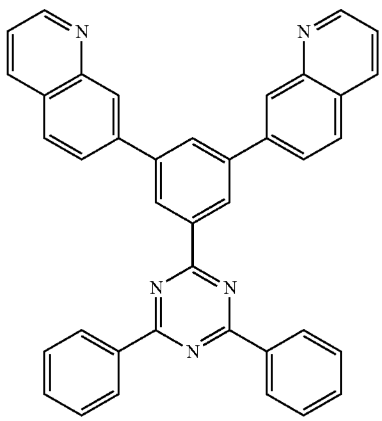
315
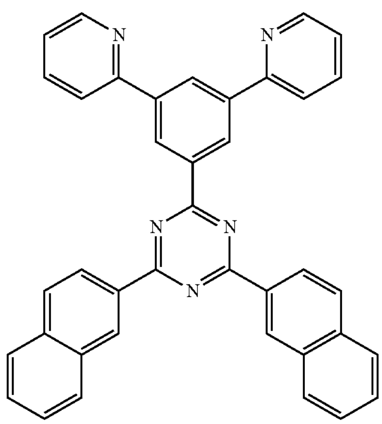
316
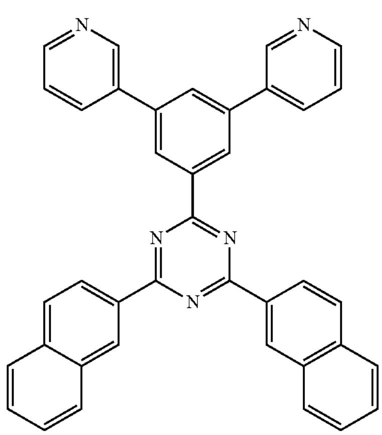
-continued
317
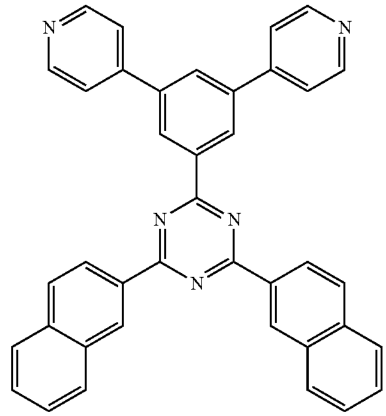
318
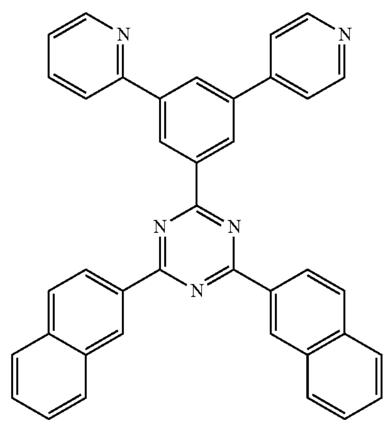
319
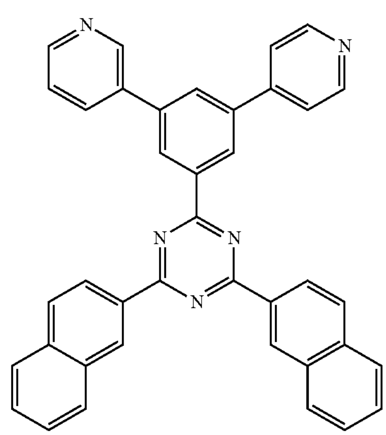

-continued
320
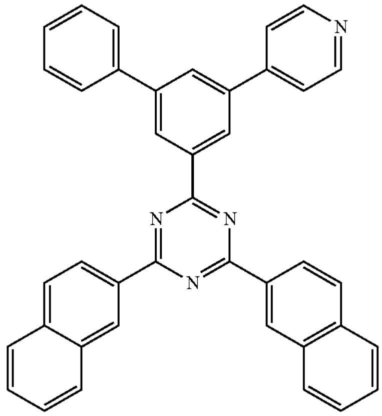
321
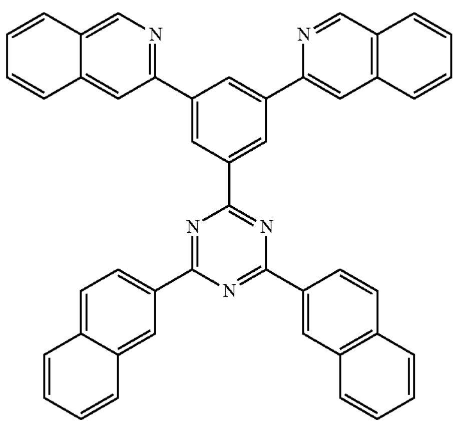
322
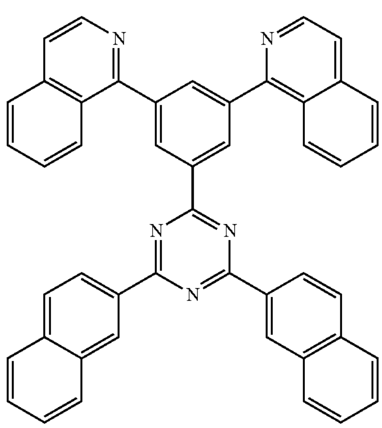
-continued
323
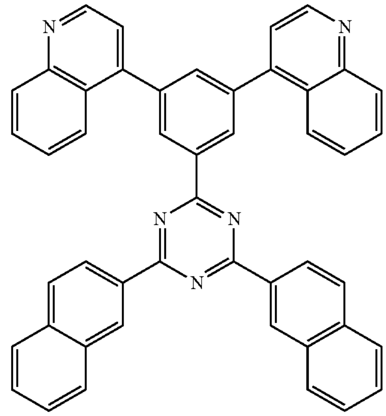
324
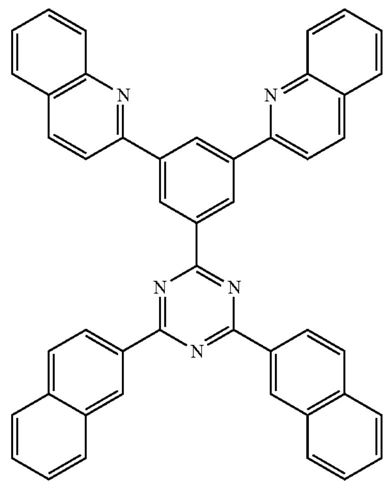
325
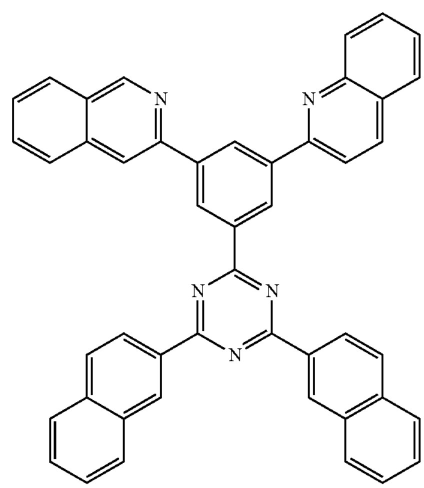

326
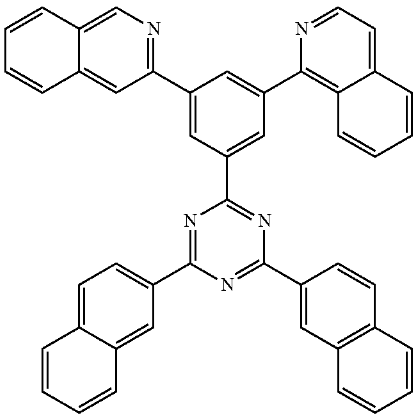
327
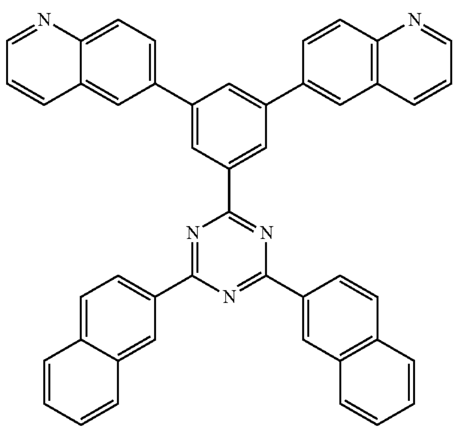
328
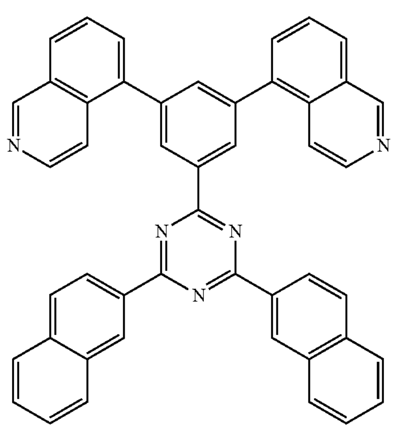
329
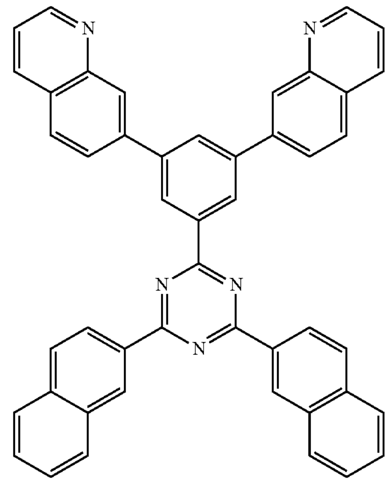
330
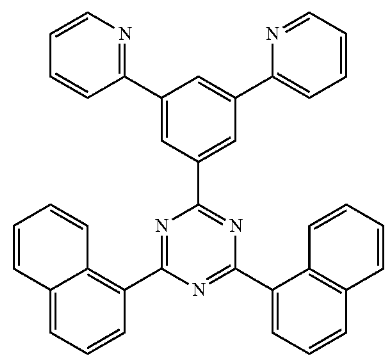
331
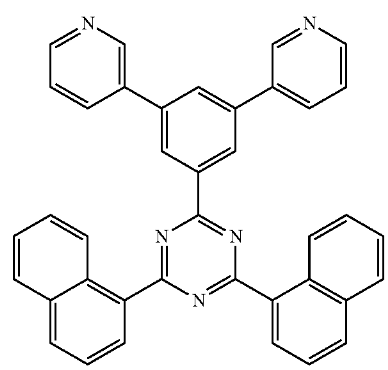
332
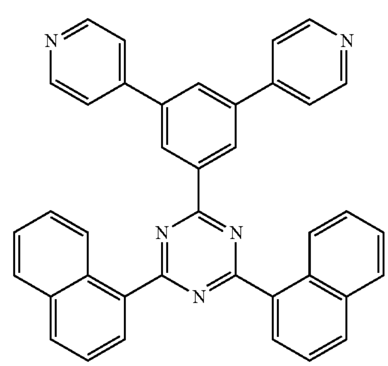

-continued
333
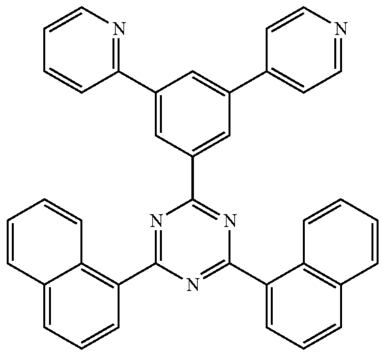
334
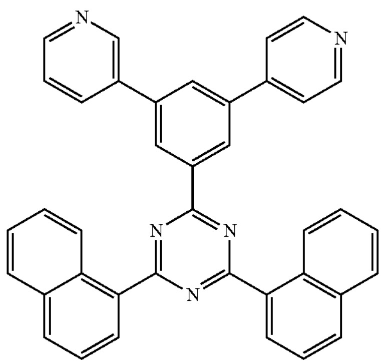
335
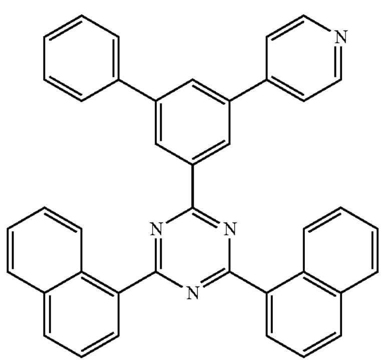
336
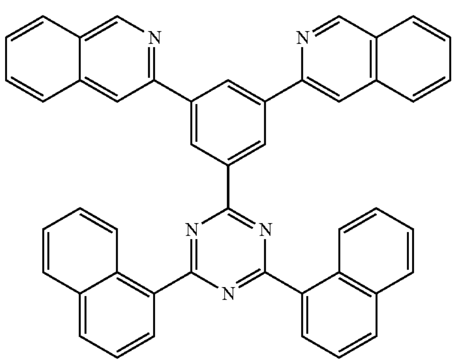
-continued
337
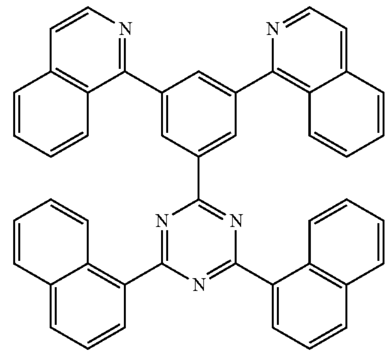
338
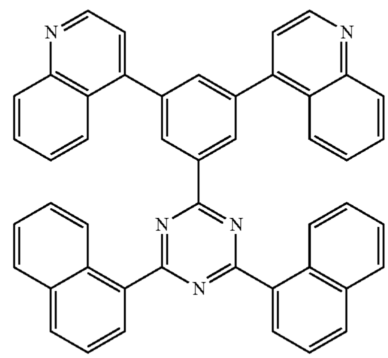
339
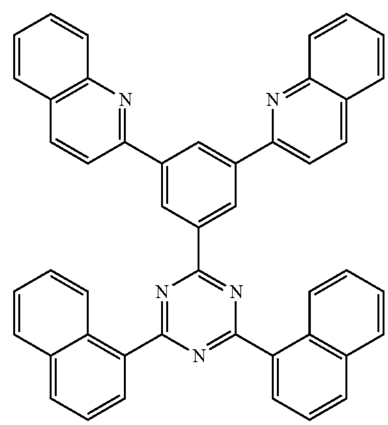
340
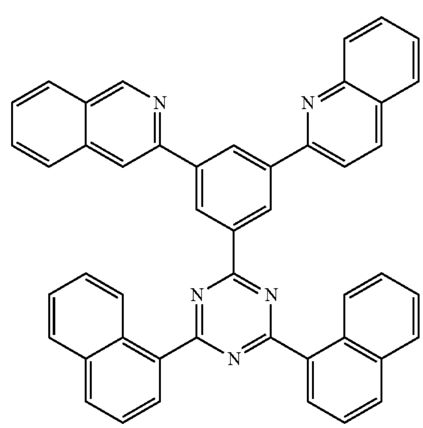

-continued
341
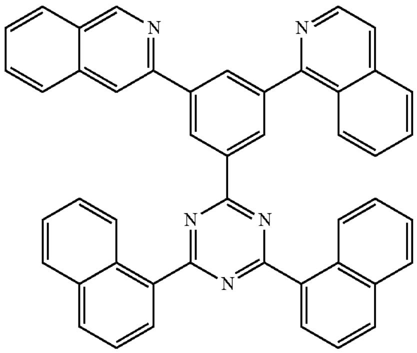
342
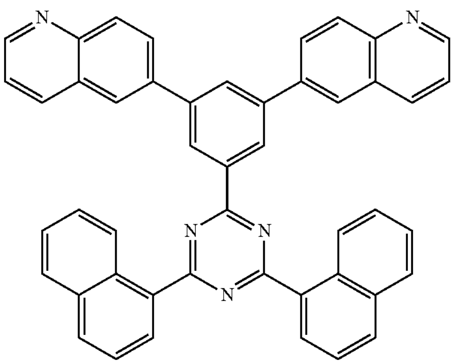
343
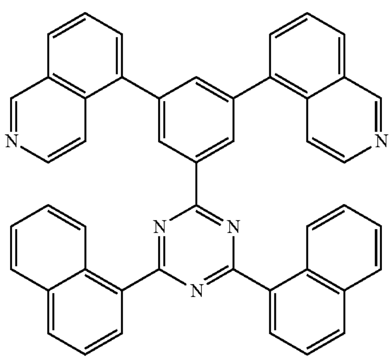
344
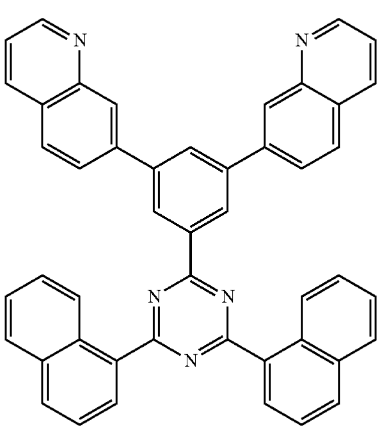
-continued
345
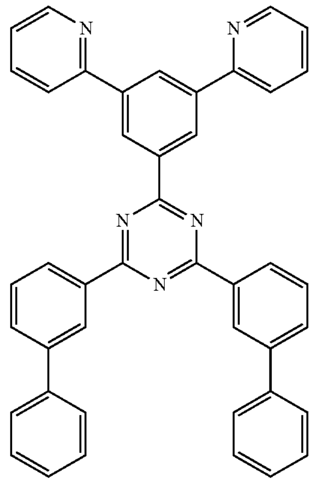
346
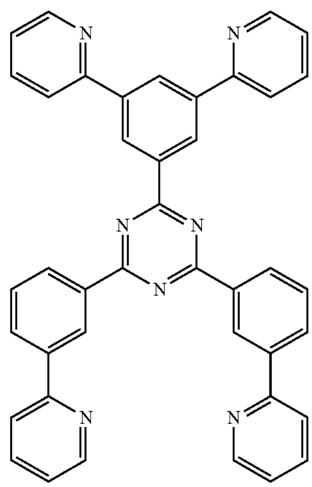
347
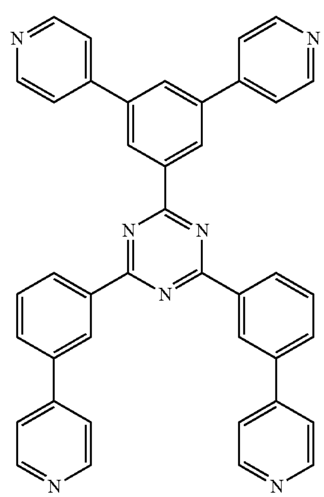

-continued
348
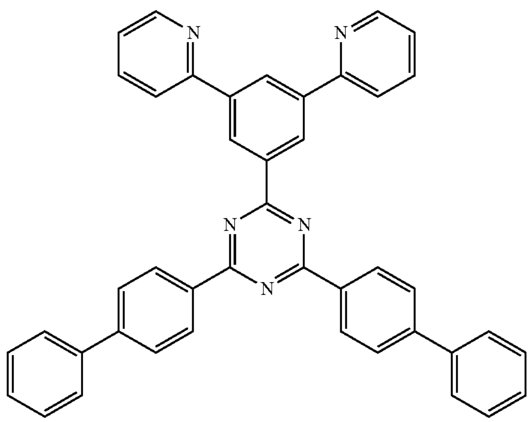
349
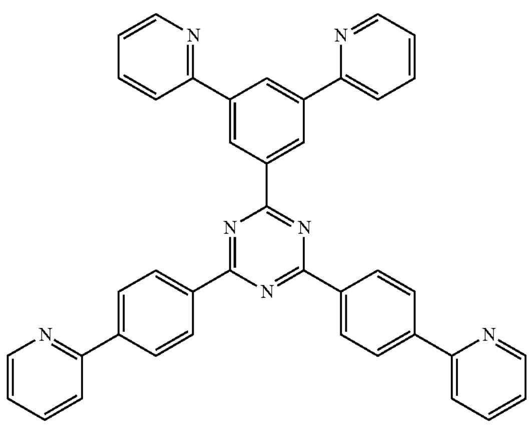
350
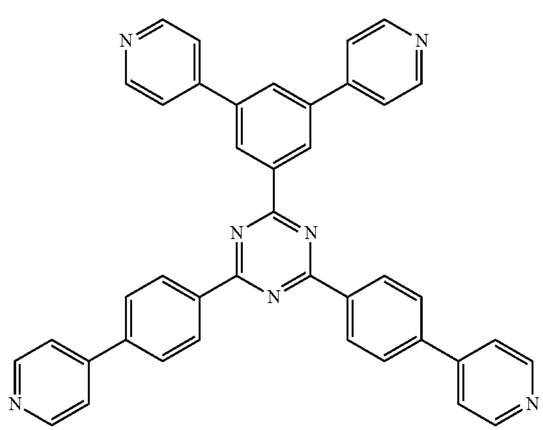
-continued
351
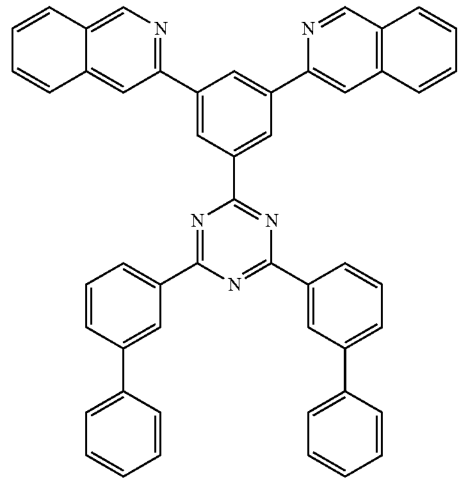
352
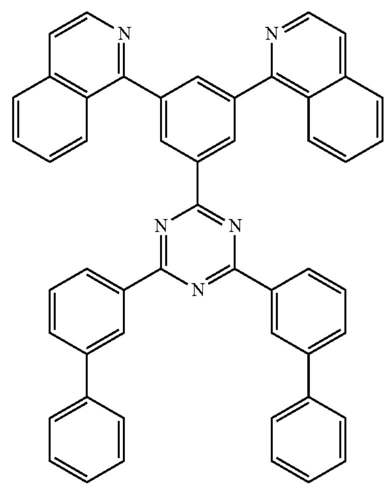
353
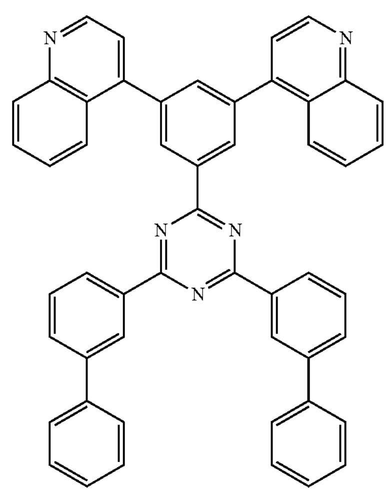

-continued
354
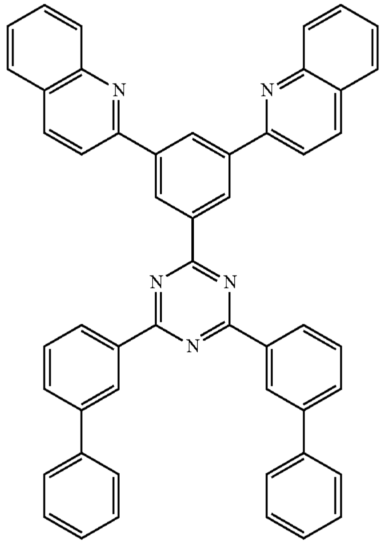
355
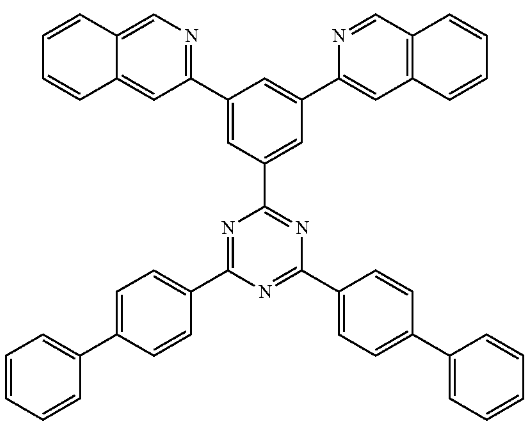
356
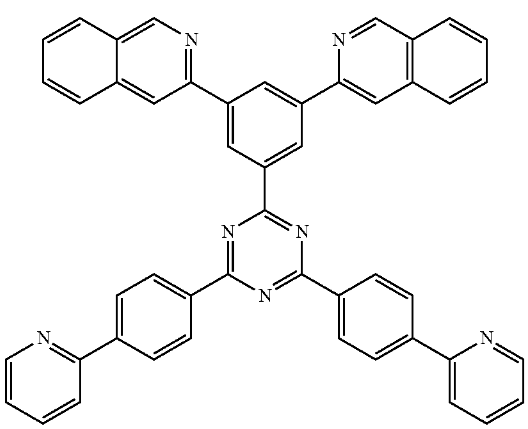
-continued
357
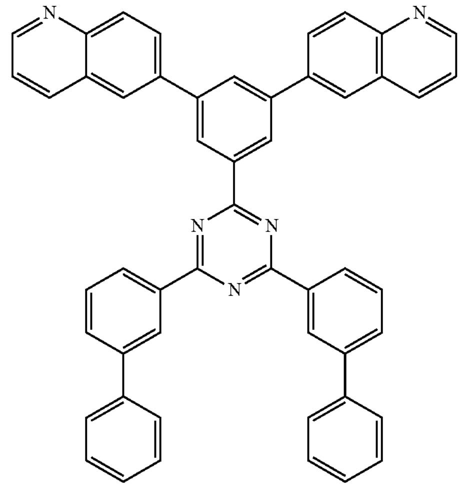
358
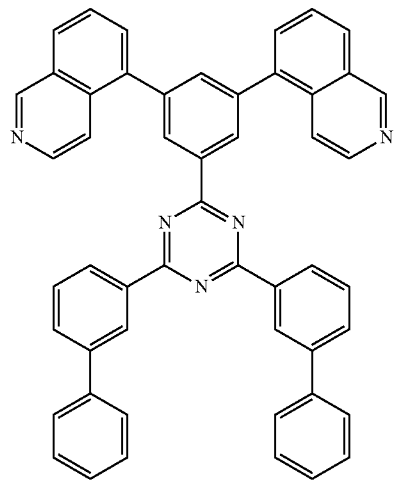
359
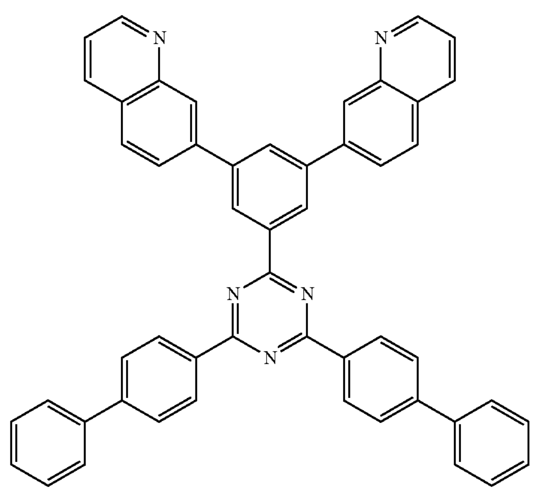

-continued
360
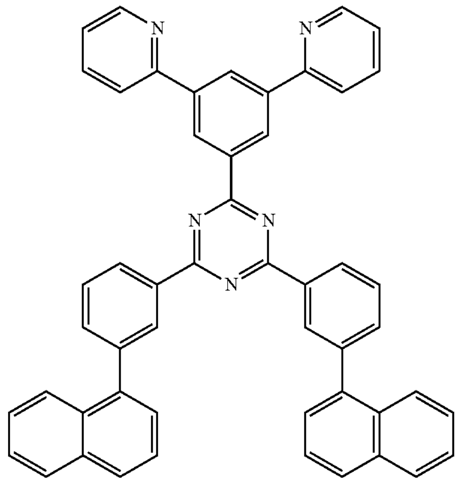
361
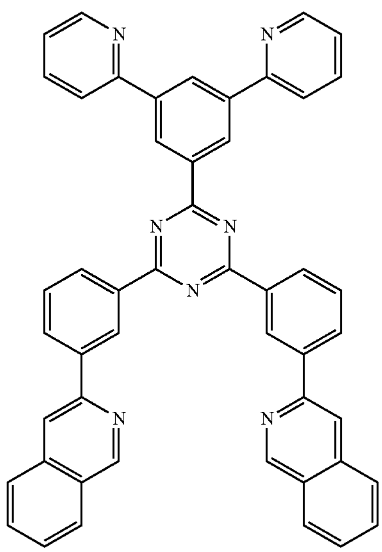
362
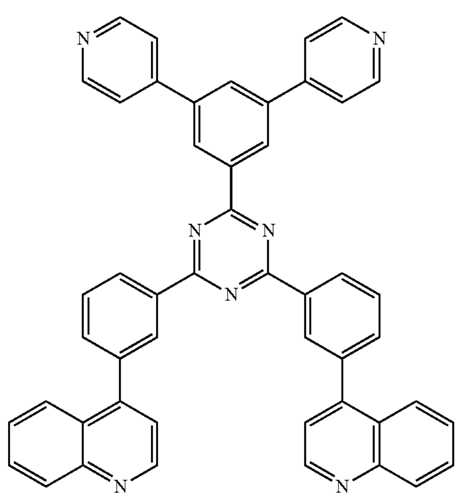
363
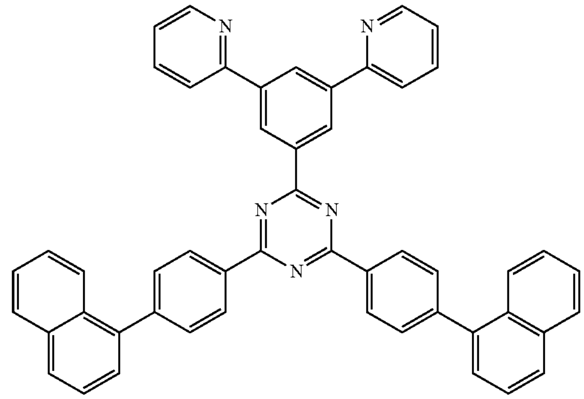
364
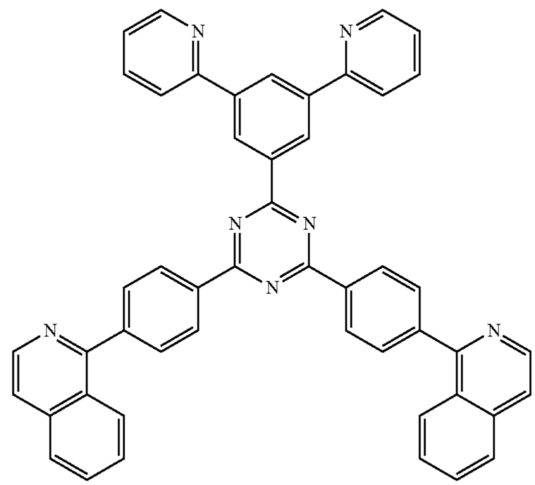
365
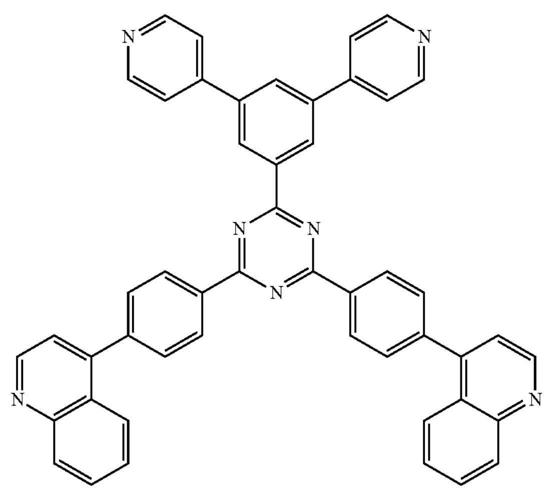

-continued
366
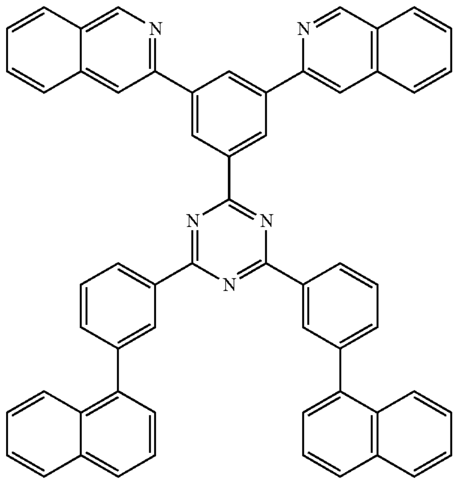
367
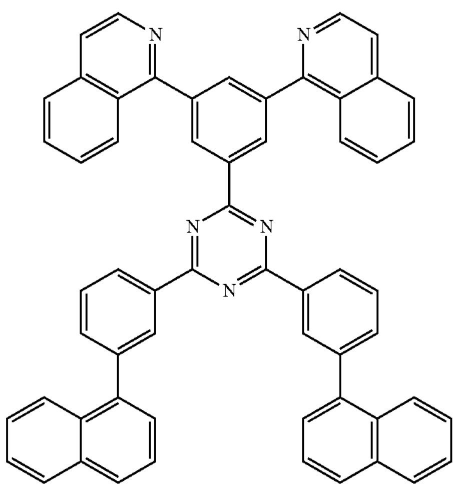
368
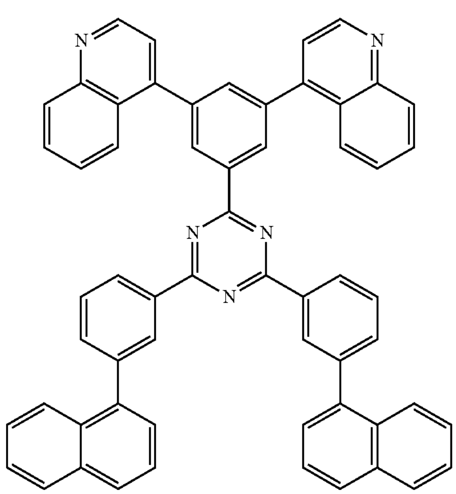
-continued
369
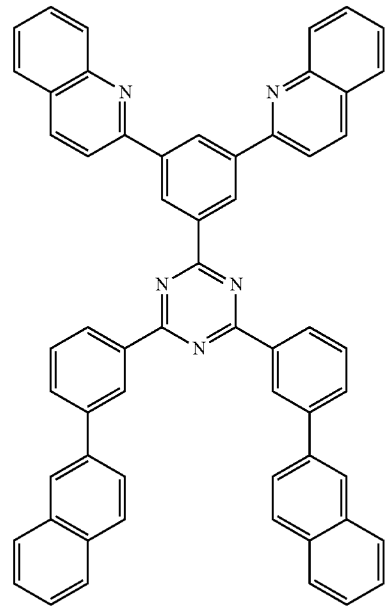
370
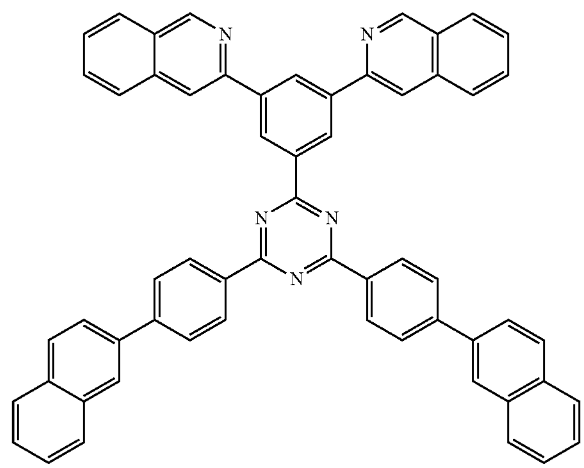
371
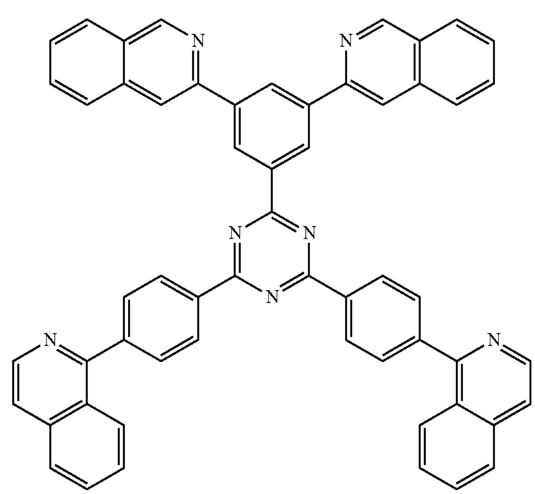

-continued
372
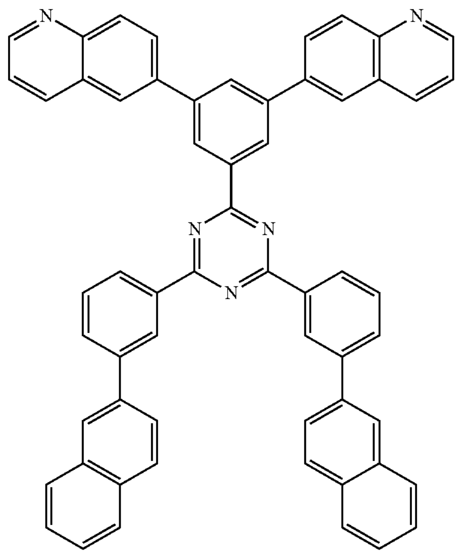
373
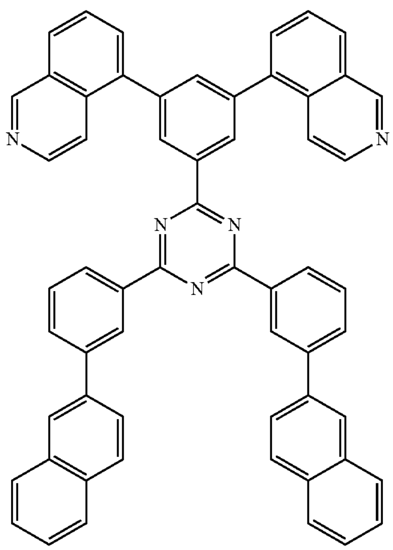
374
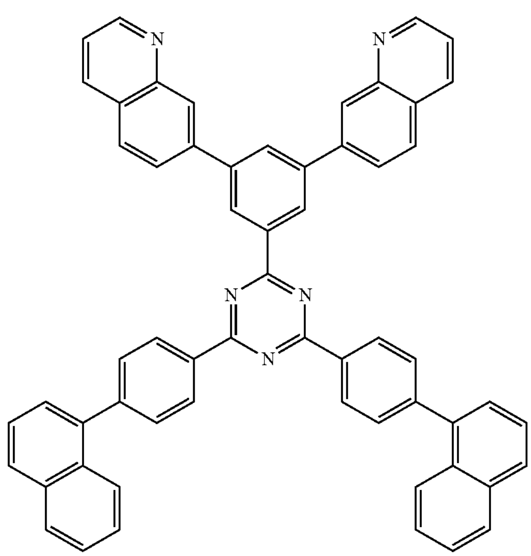
-continued
375
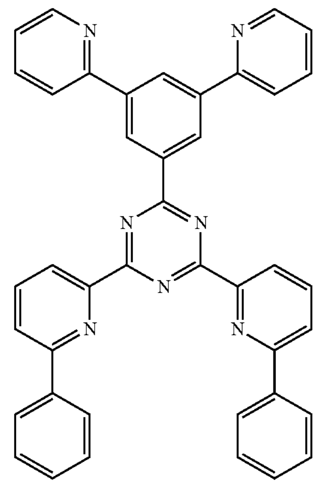
376
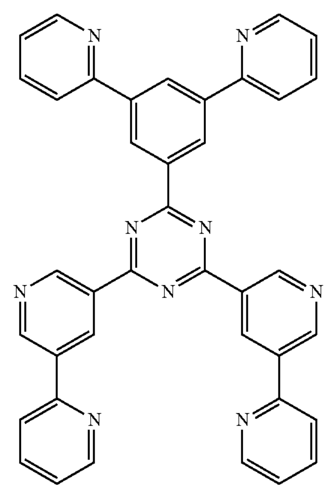
377
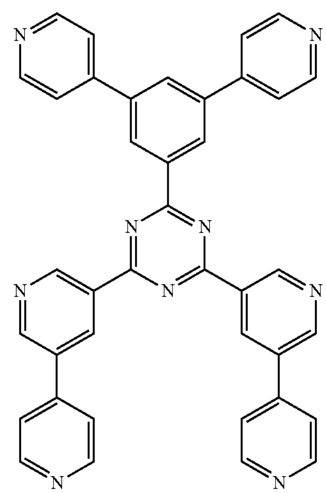

-continued
378
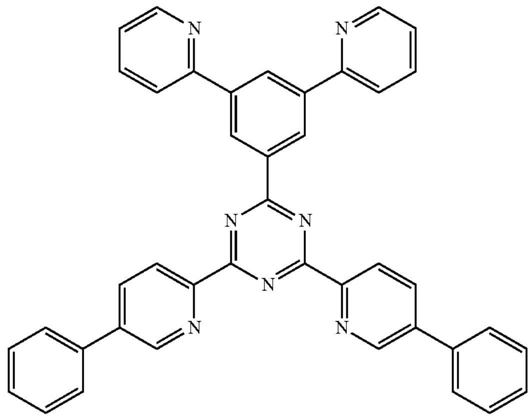
379
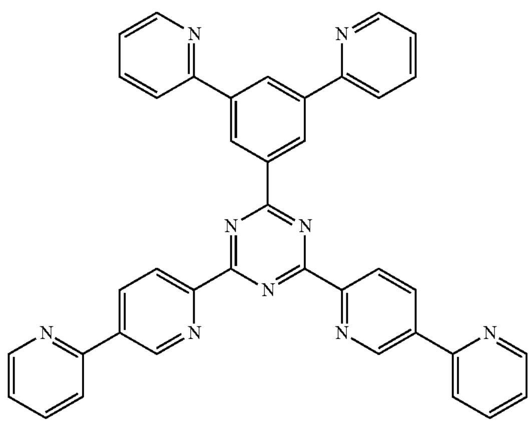
380
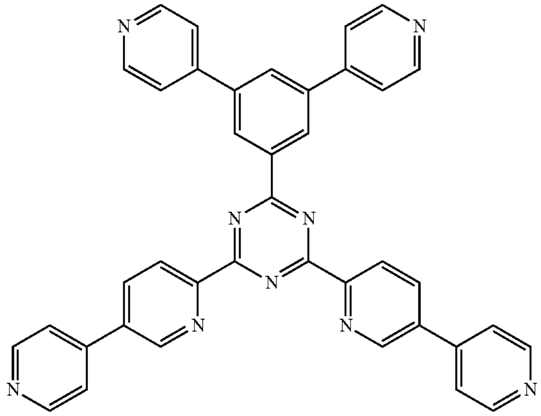
-continued
381
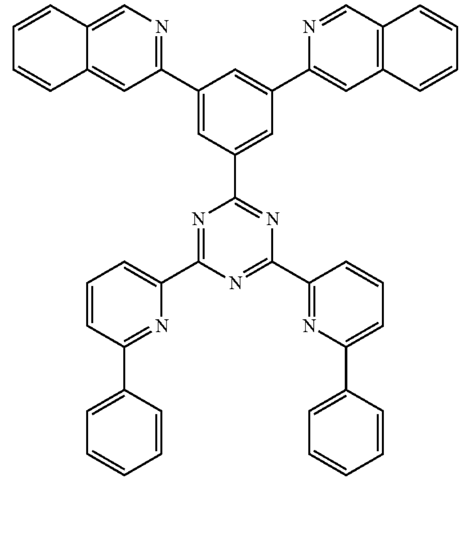
382
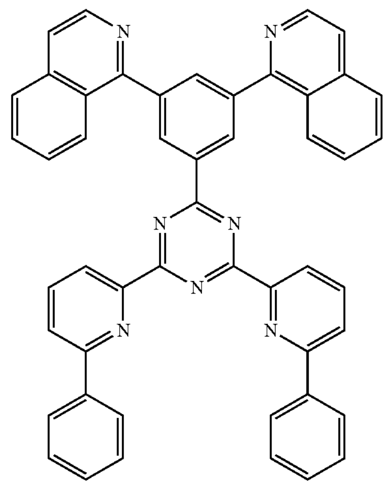
383
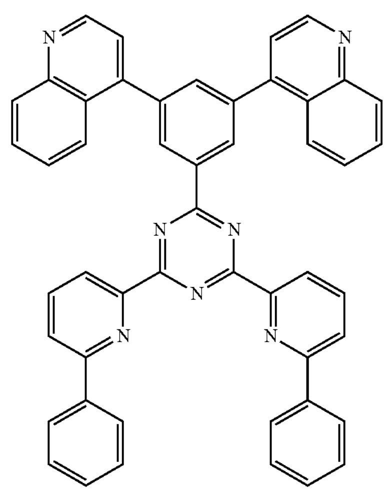

-continued
384
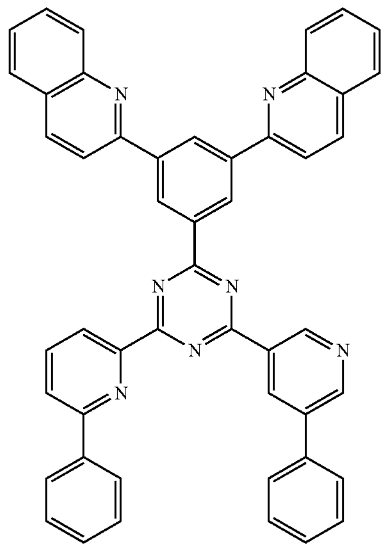
385
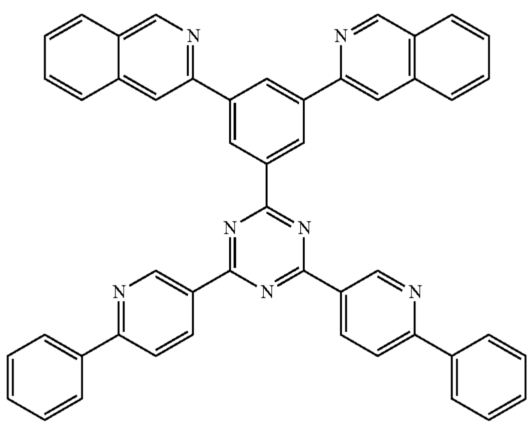
386
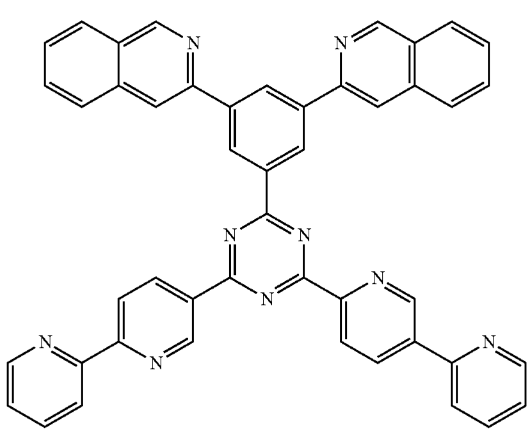
-continued
387
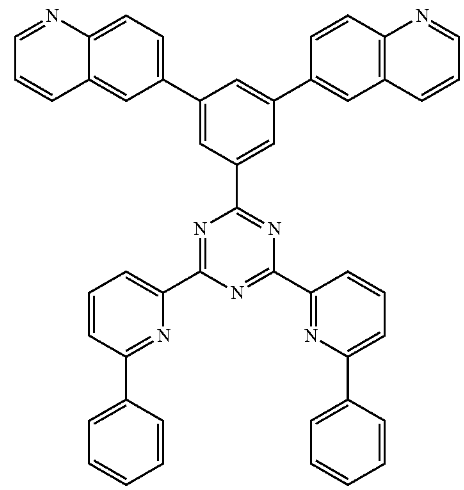
388
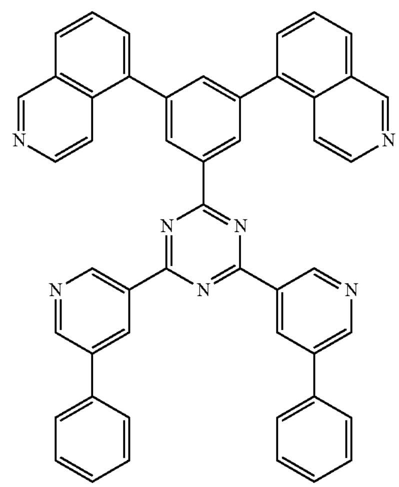
389
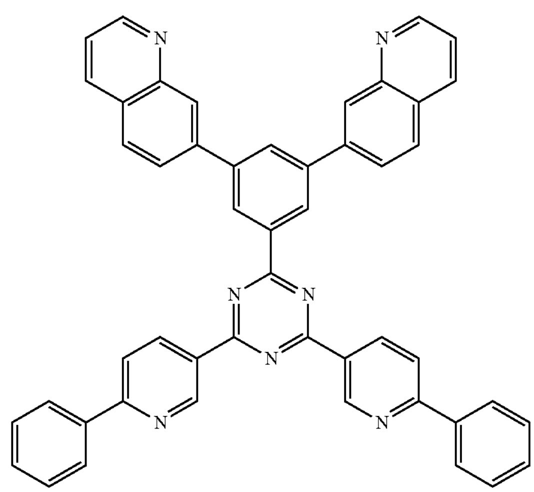

-continued
390
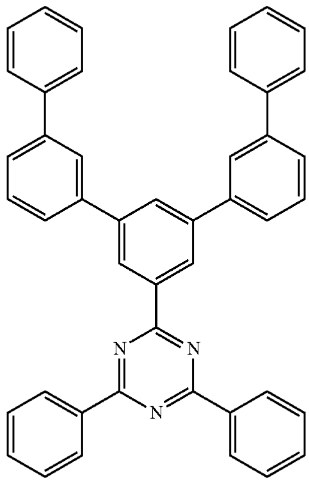
391
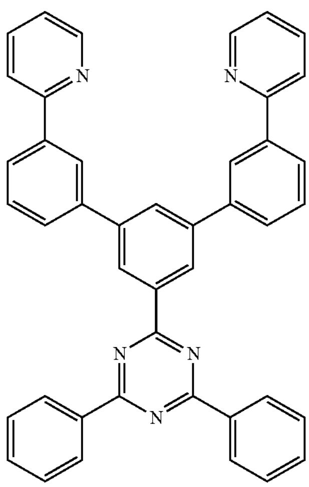
392
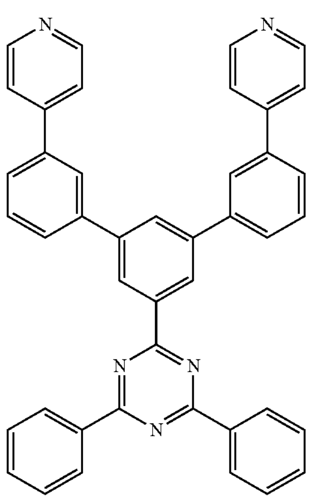
-continued
393
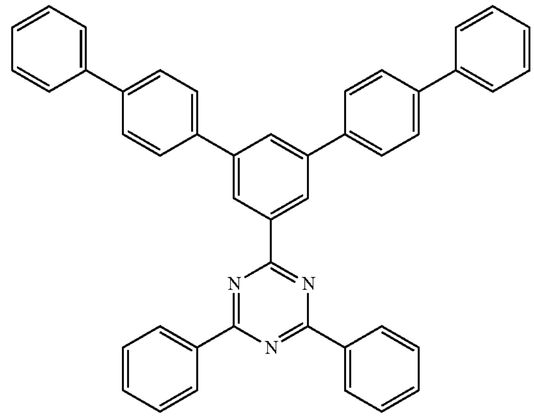
394
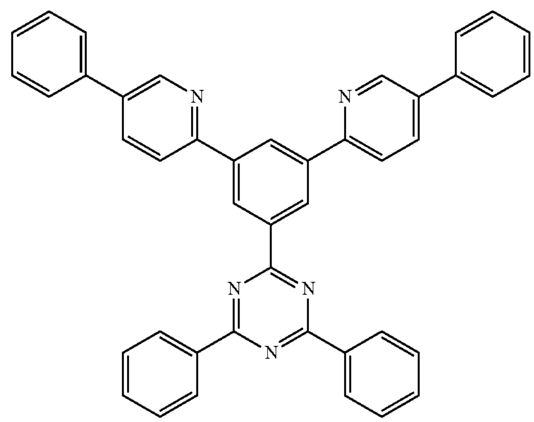
395
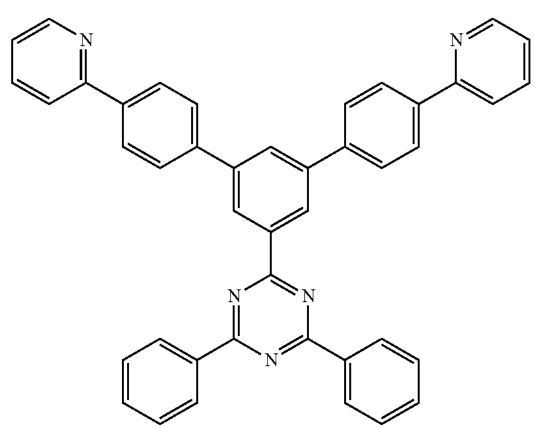

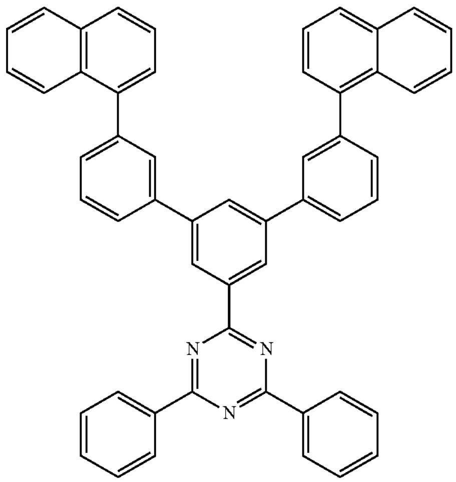
396
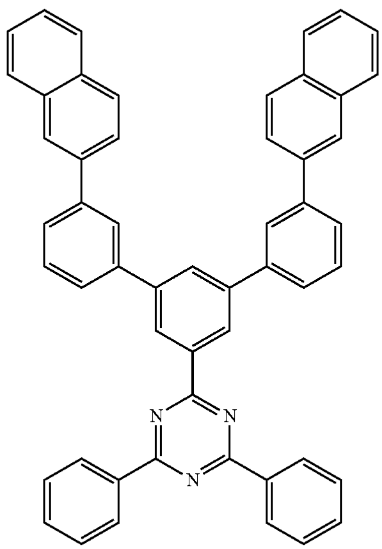
397
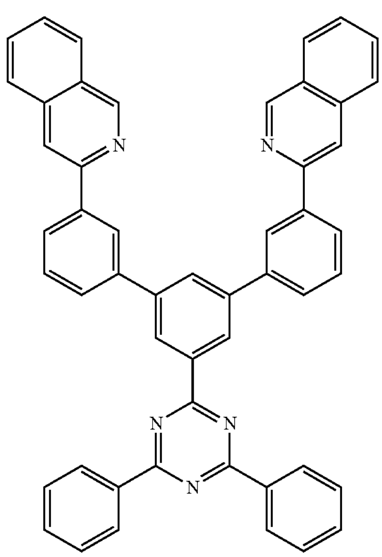
398
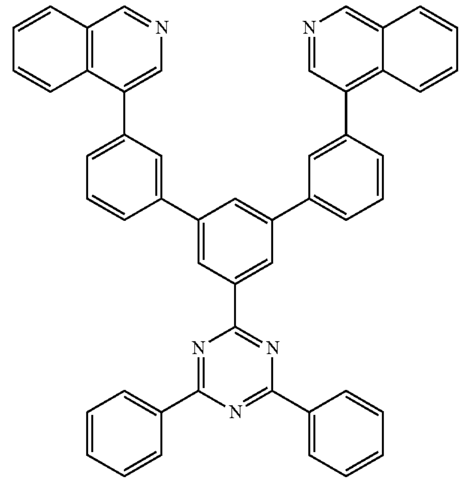
399
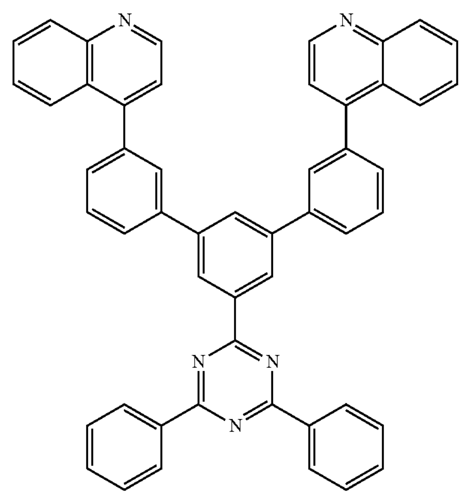
400
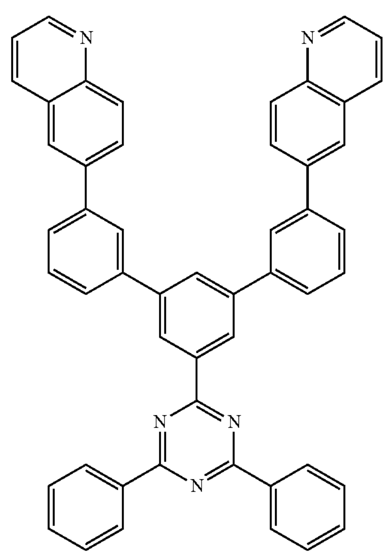
401

-continued
402
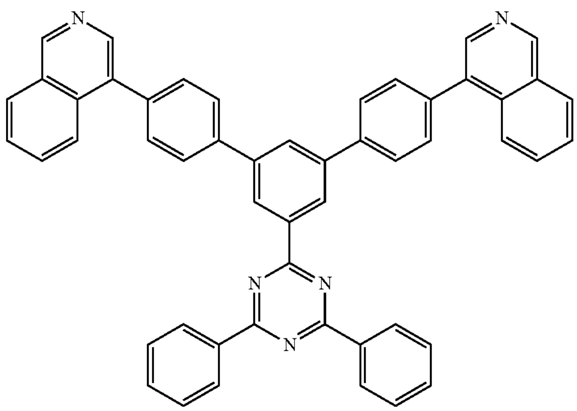
403
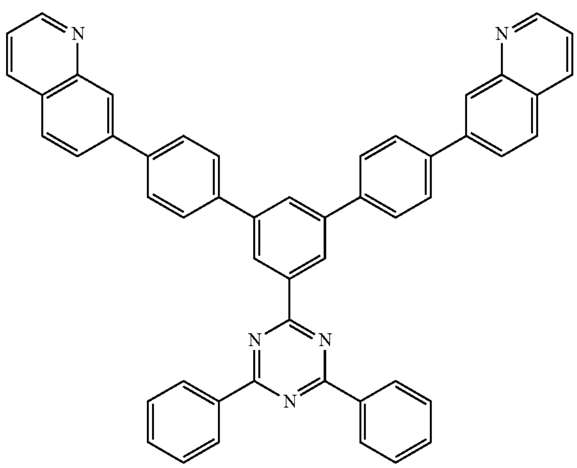
404
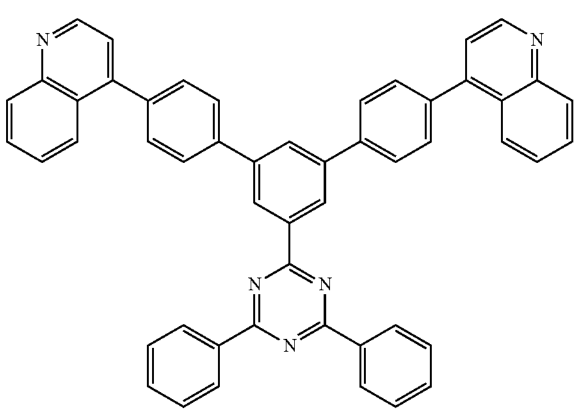
-continued
405
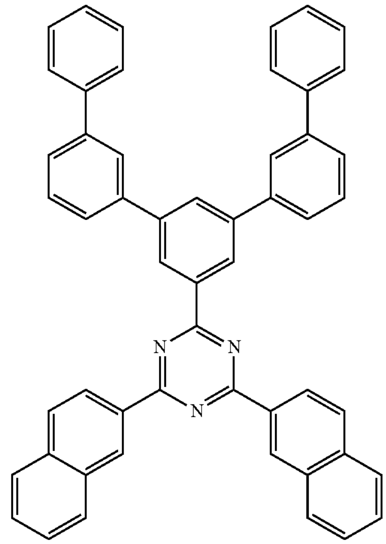
406
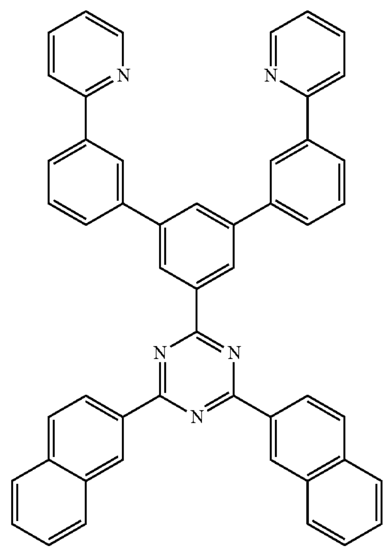
407
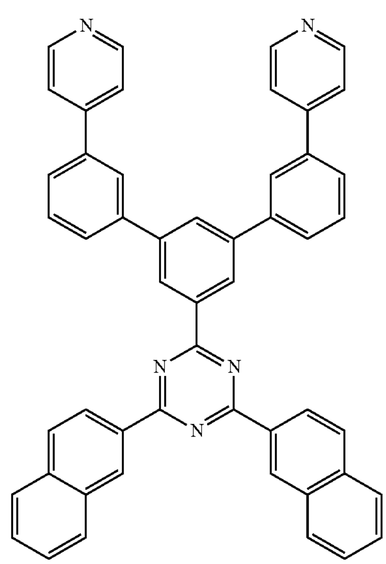

-continued
408
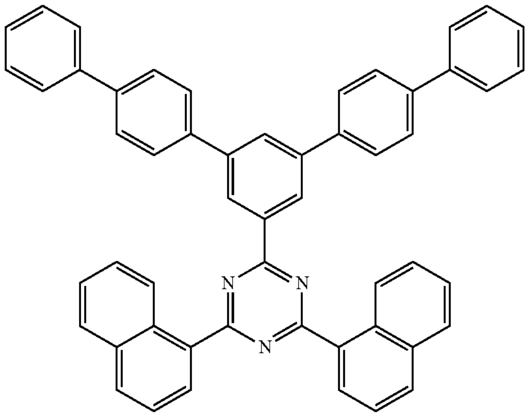
409
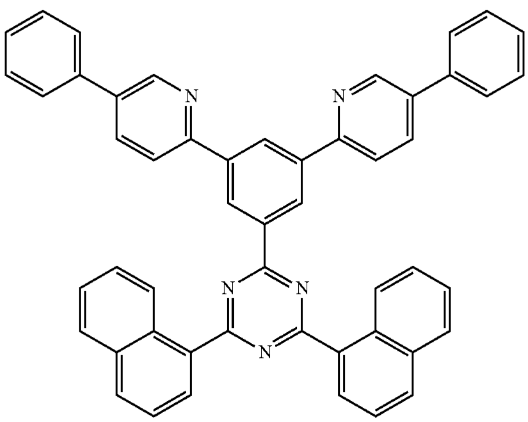
410
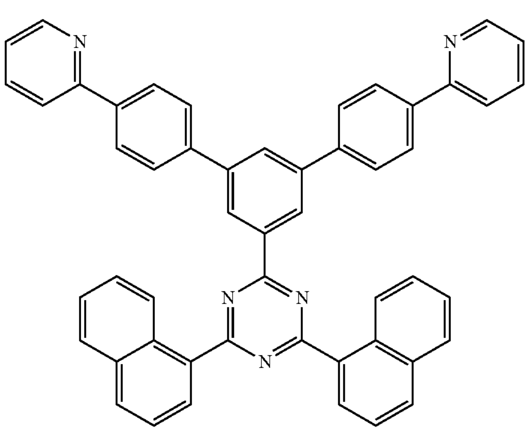
-continued
411
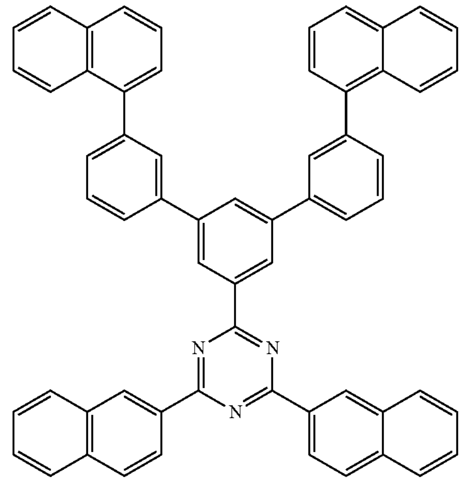
412
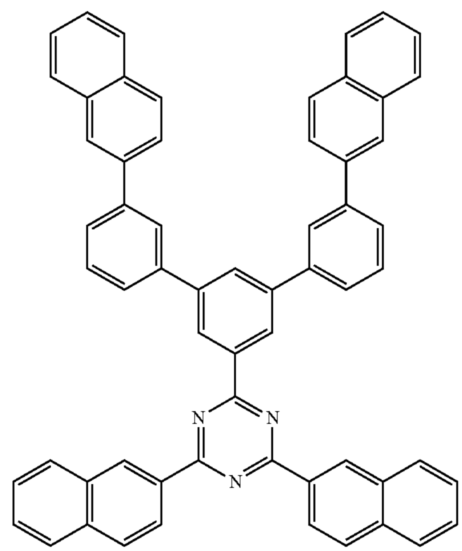
413
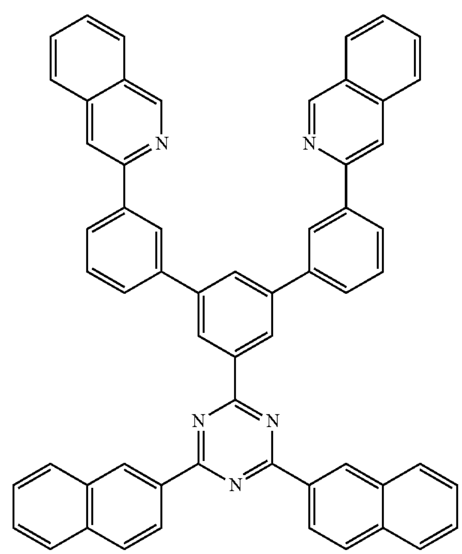

-continued
414
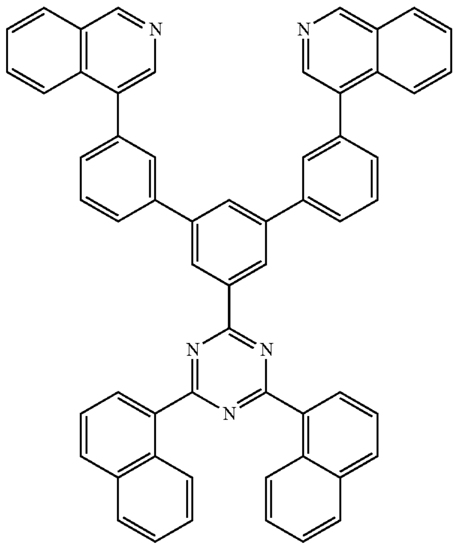
415
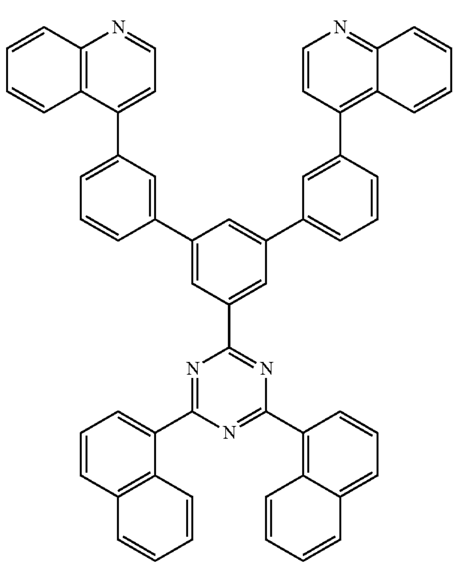
-continued
416
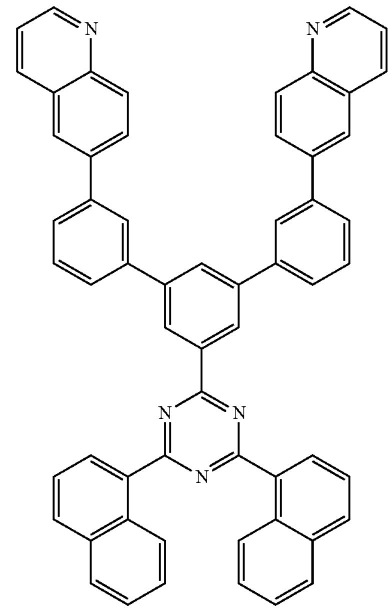
417
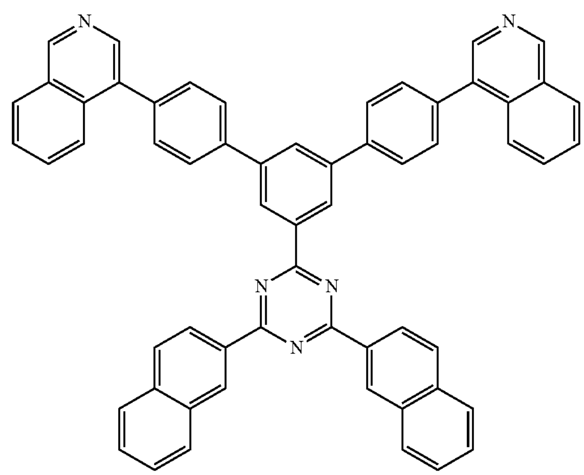
418
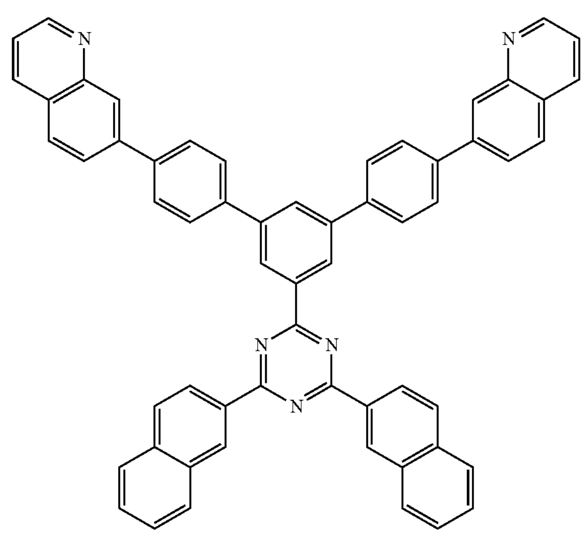

419
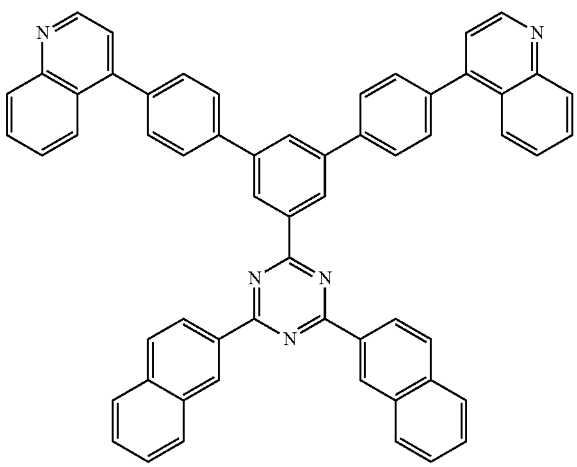
420
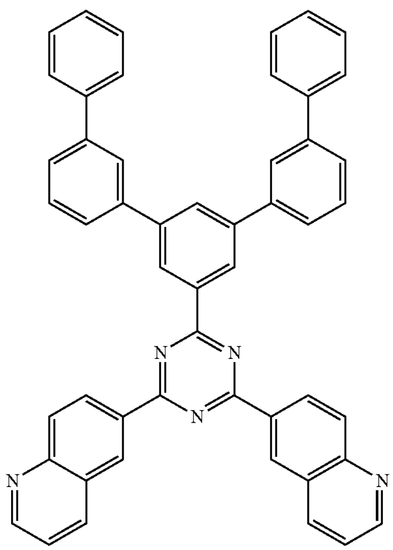
421
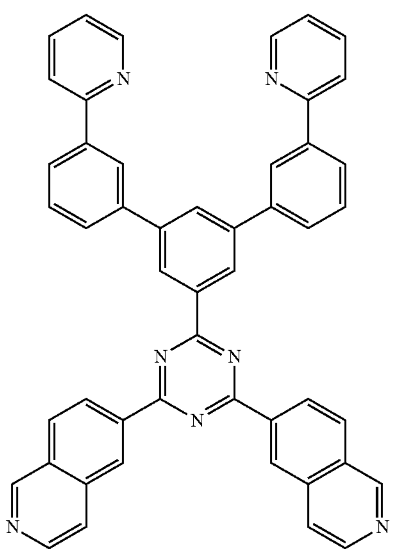
422
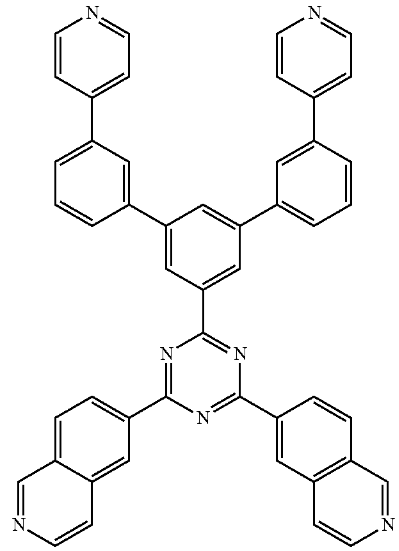
423
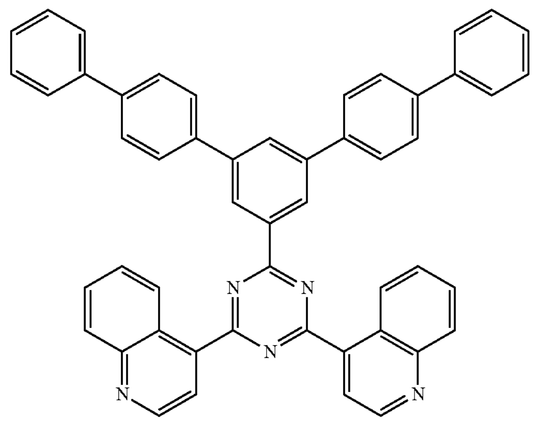
424
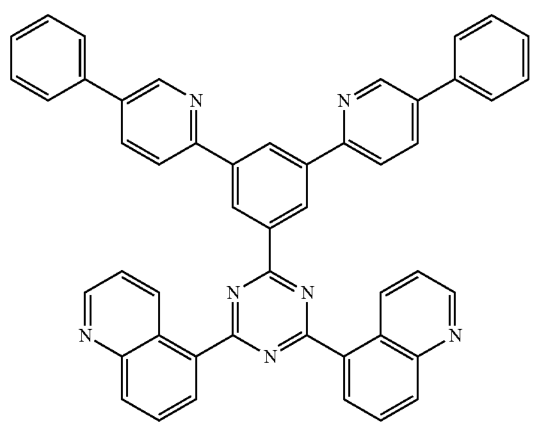

-continued
425
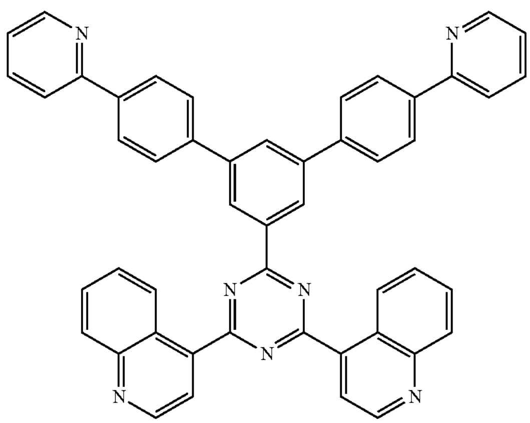
426
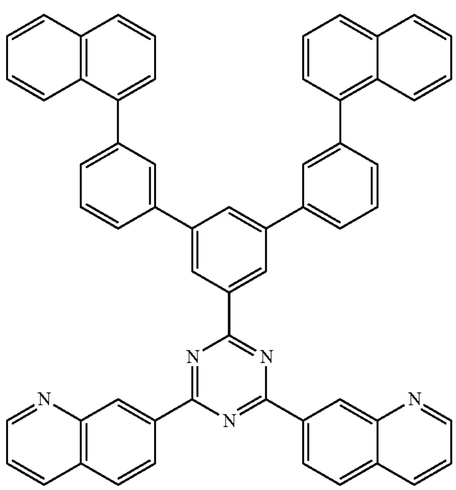
427
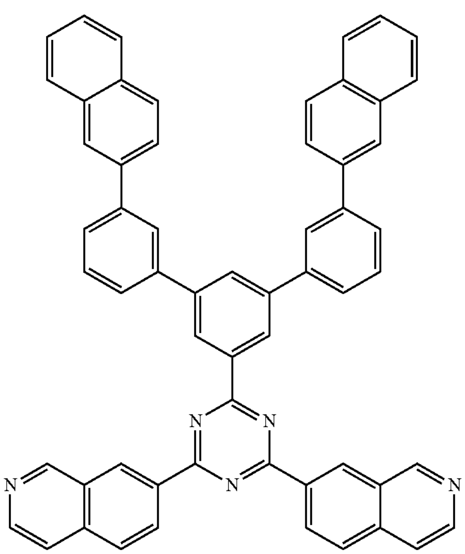
-continued
428
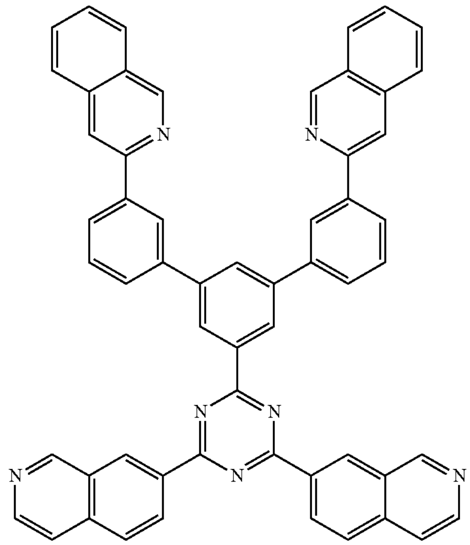
429
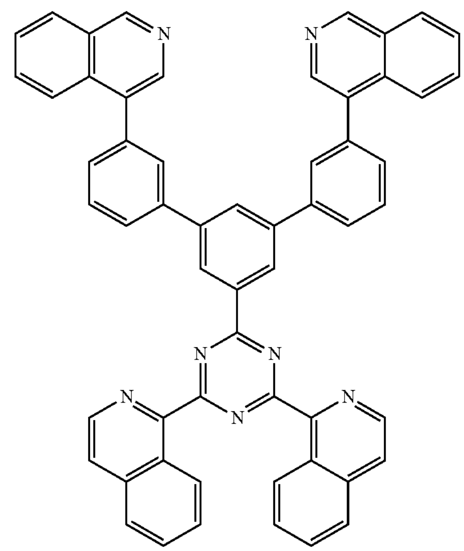
430
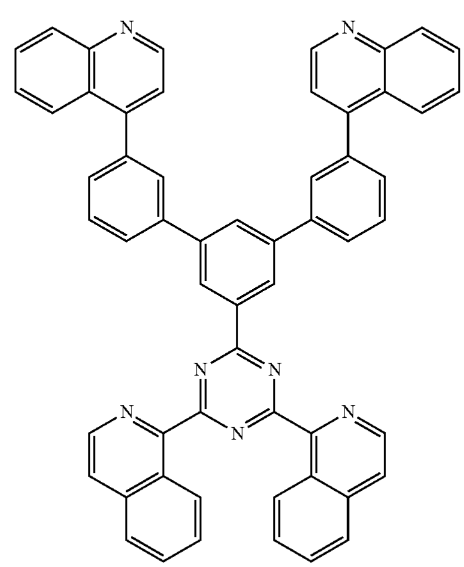

431
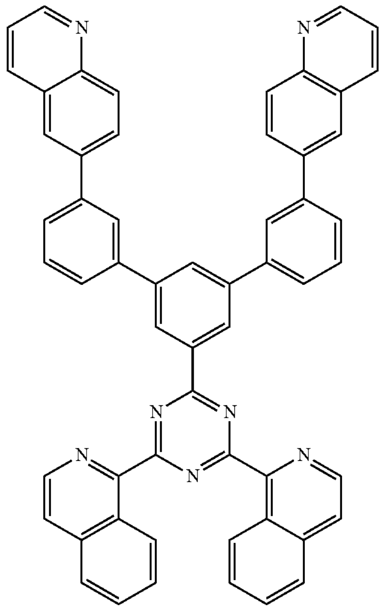
432
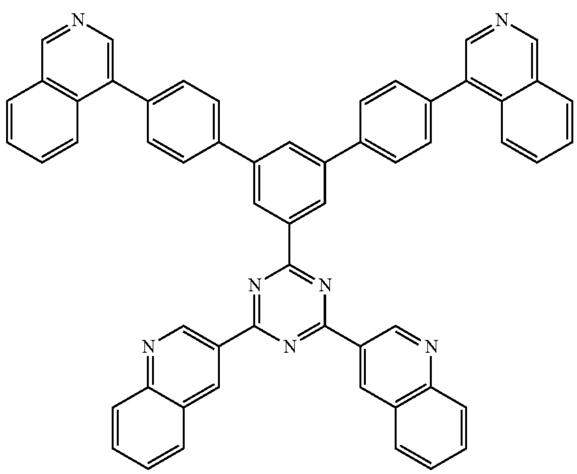
433
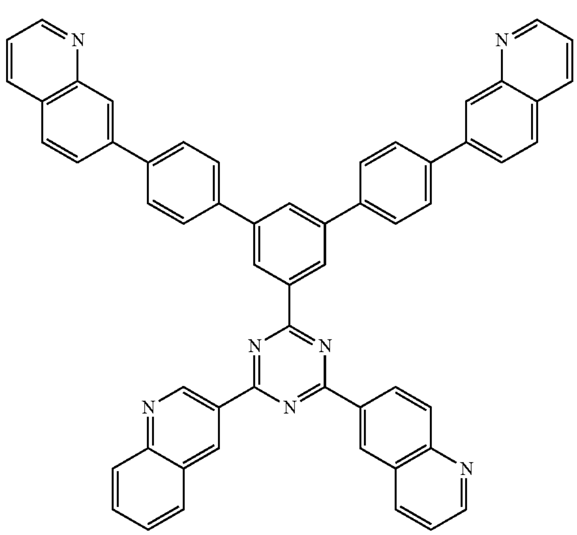
434
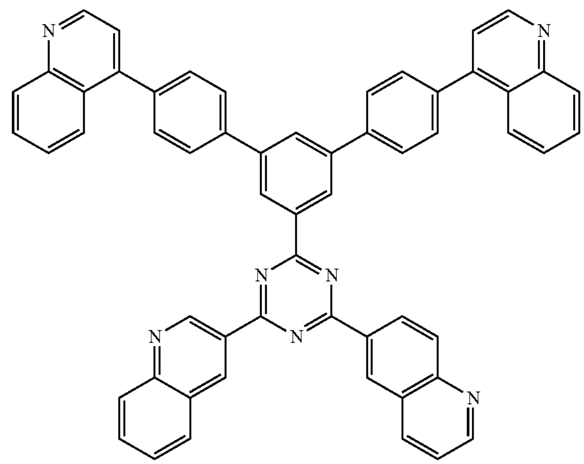
435
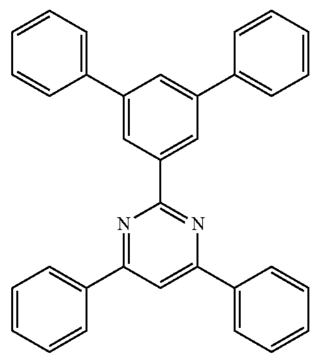
436
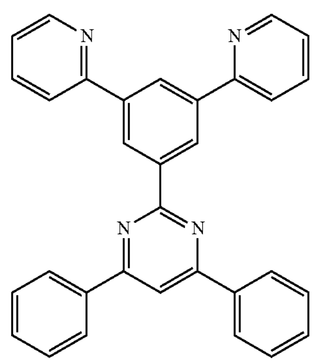
437
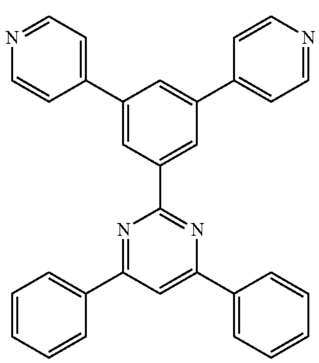

-continued
438
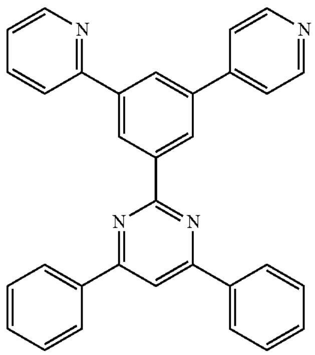
439
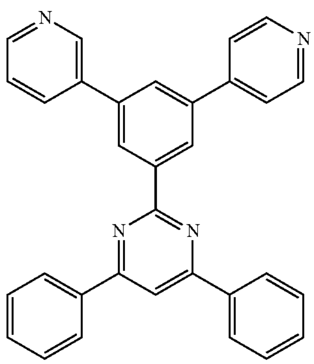
440
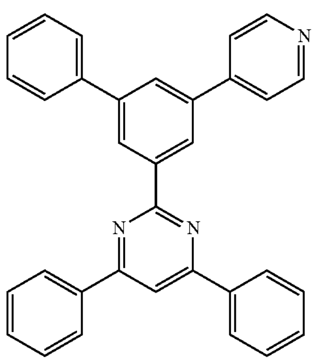
441
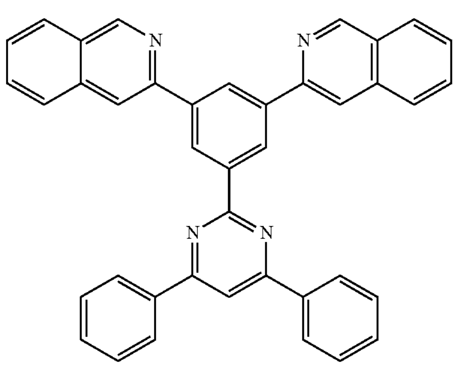
-continued
442
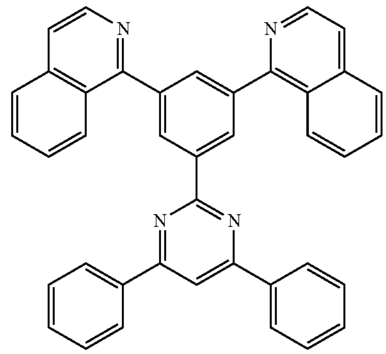
443
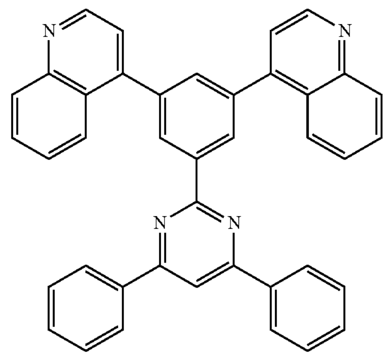
444
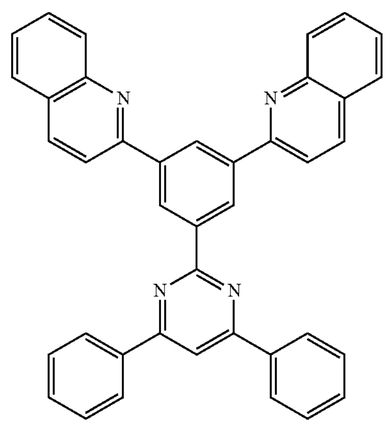
445
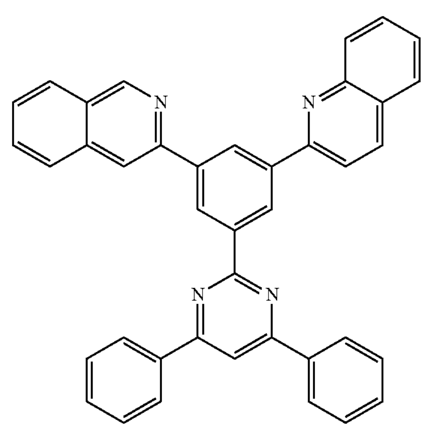

-continued
446
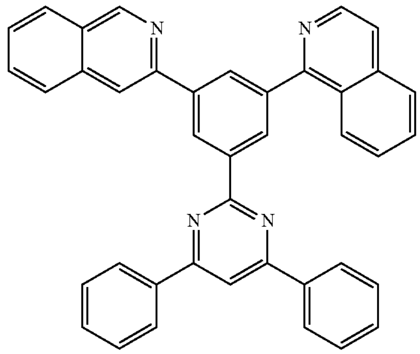
447
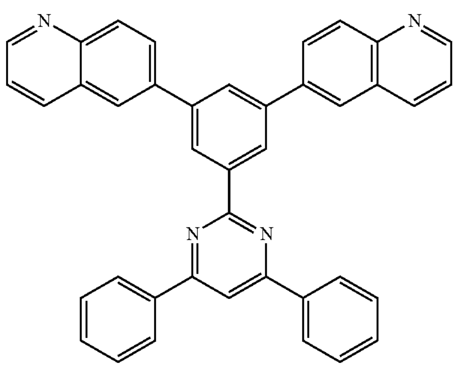
448
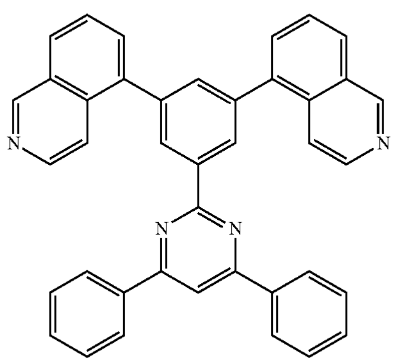
449
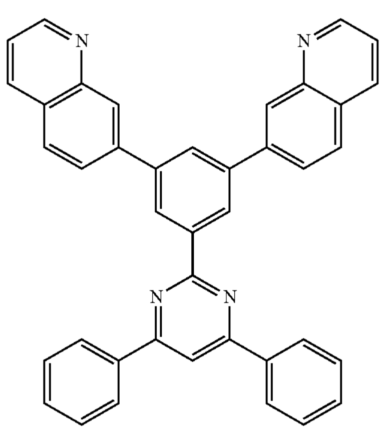
-continued
450
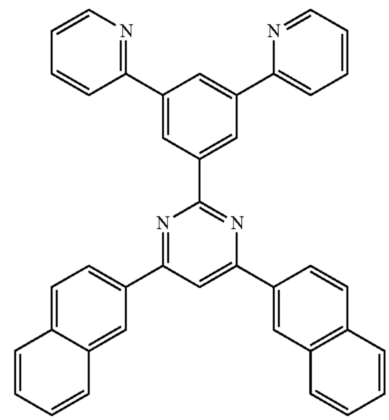
451
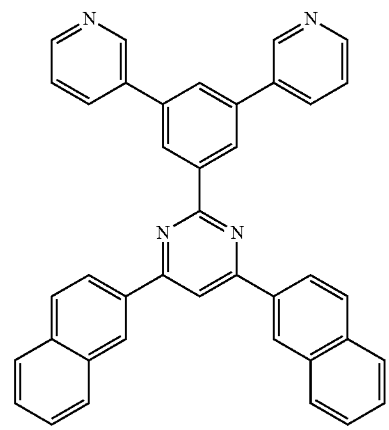
452
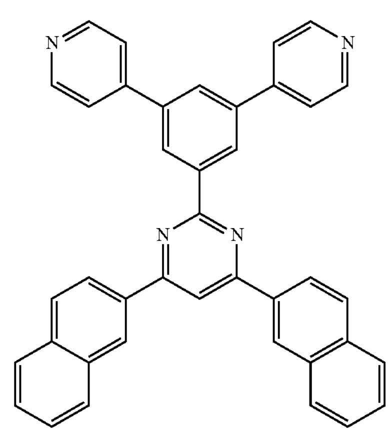

-continued
453
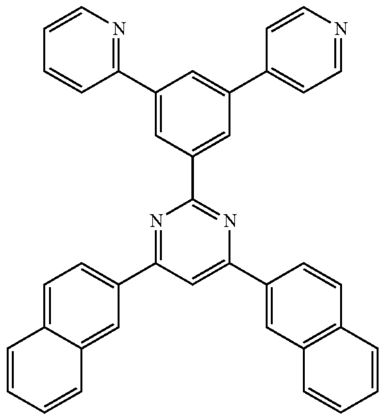
454
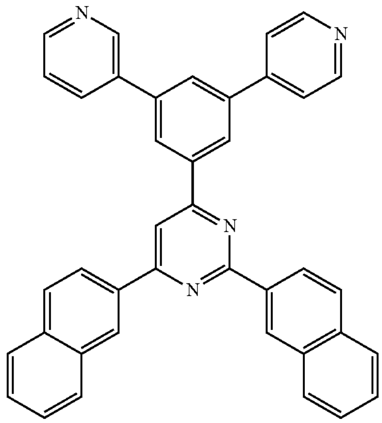
455
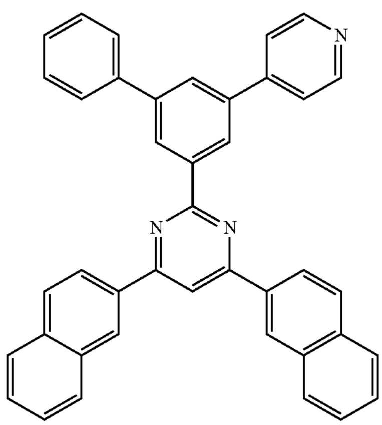
455
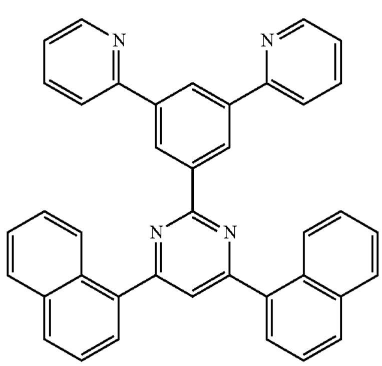
-continued
456
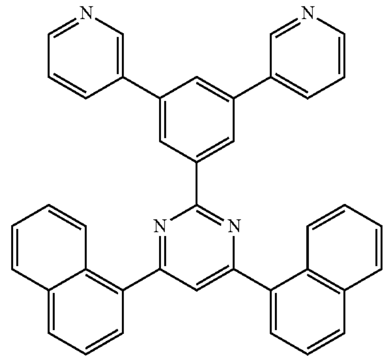
457
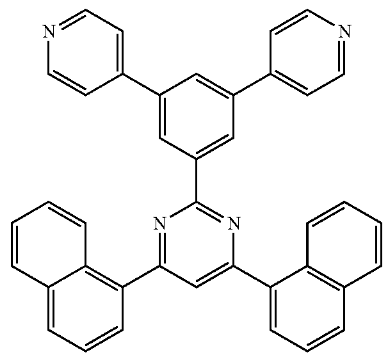
458
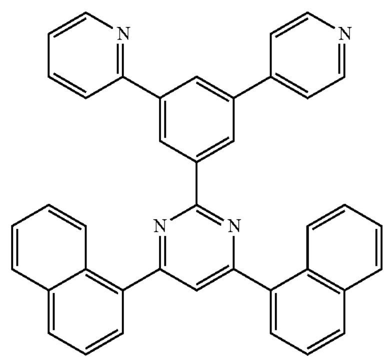
459
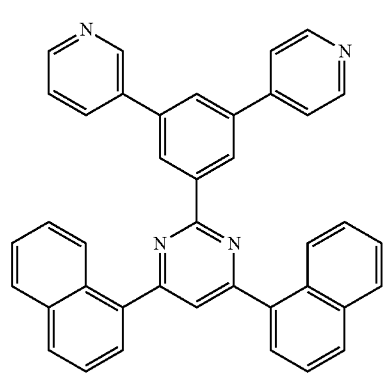

-continued
460
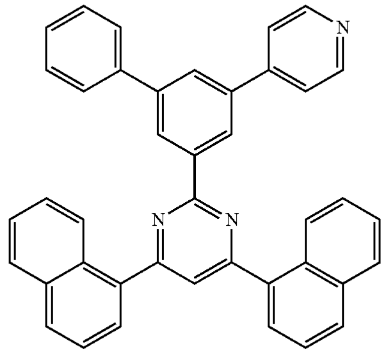
461
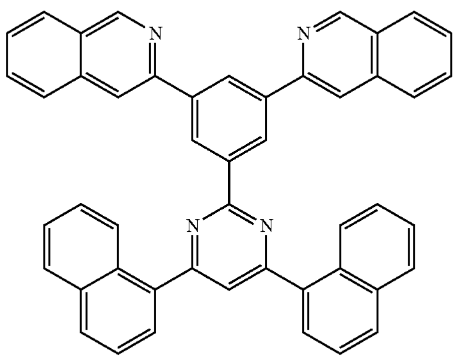
462
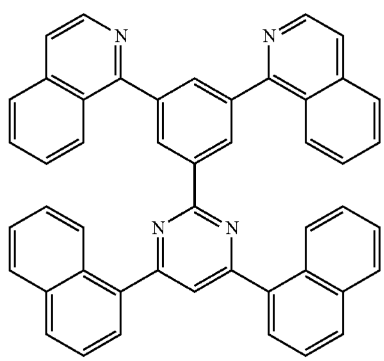
463
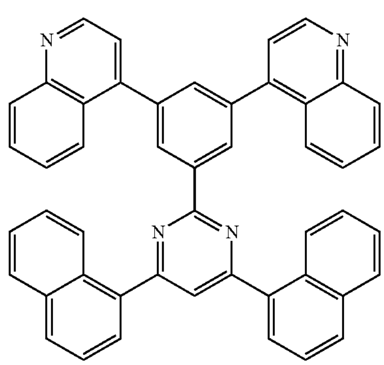
456
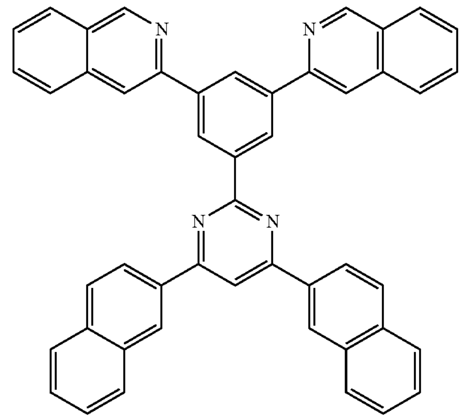
457
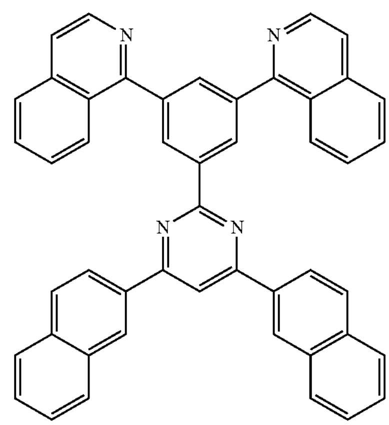
458
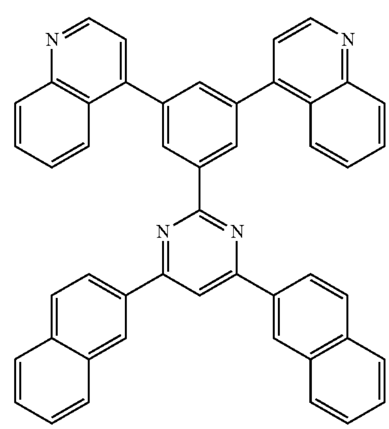

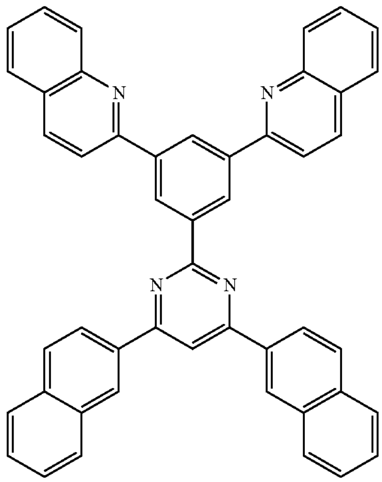
459
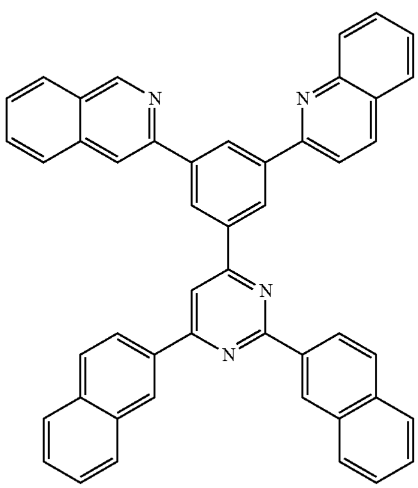
450
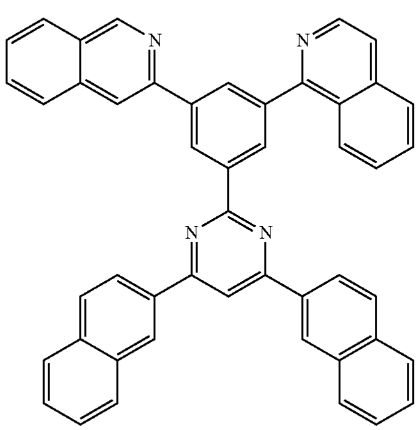
451
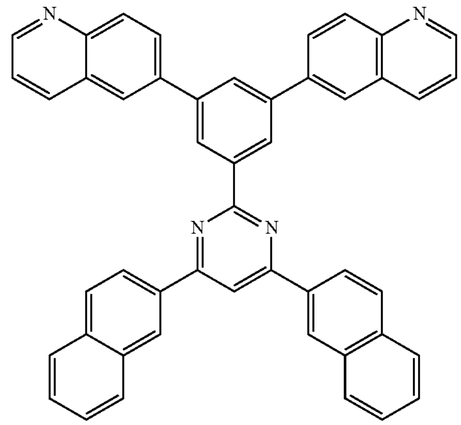
452
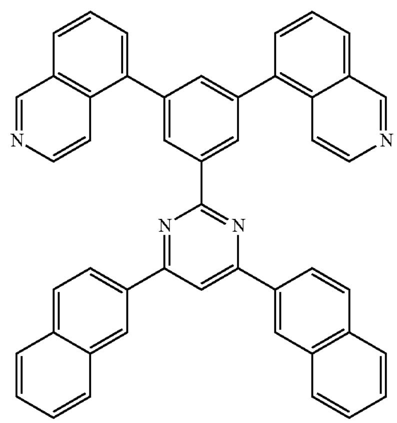
453
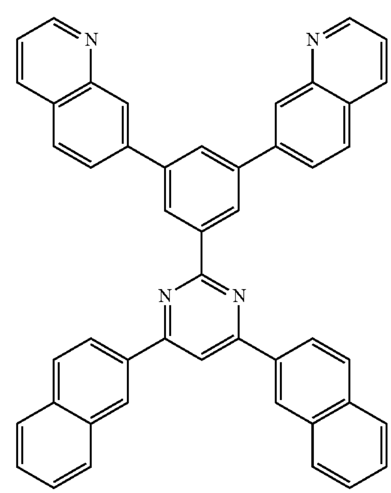
454

-continued
464
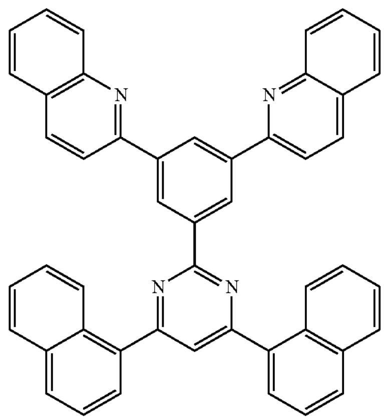
465
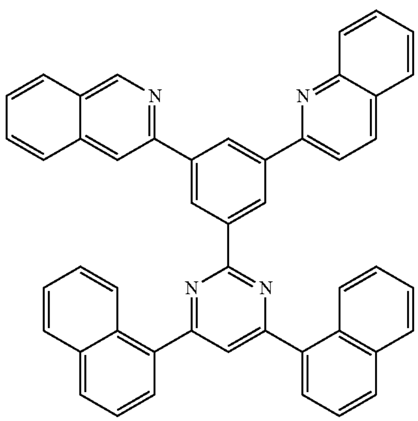
466
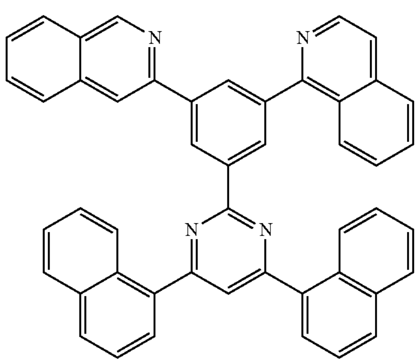
467
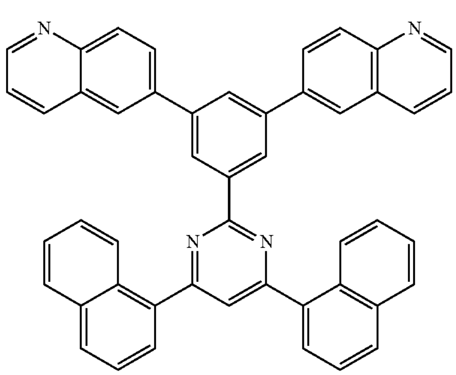
-continued
468
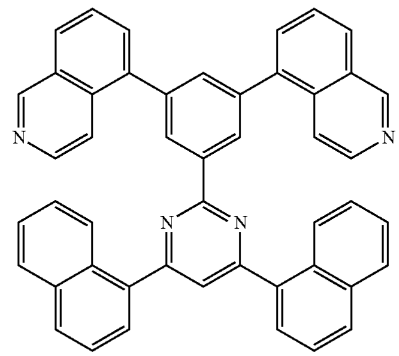
469
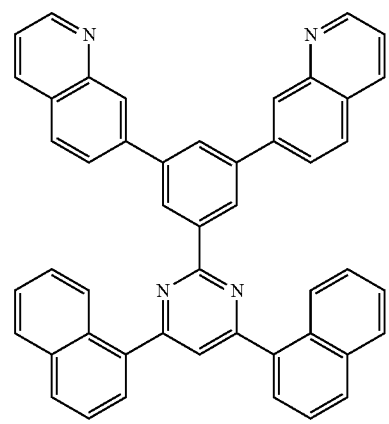
470
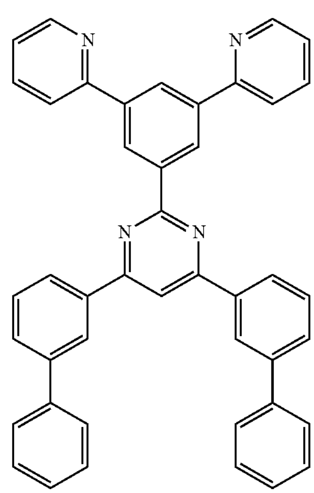

-continued
471
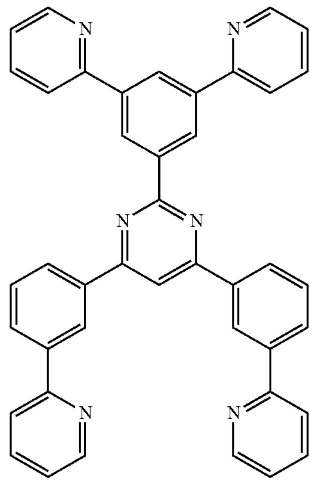
472
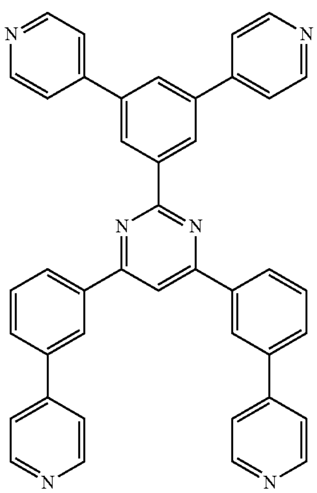
473
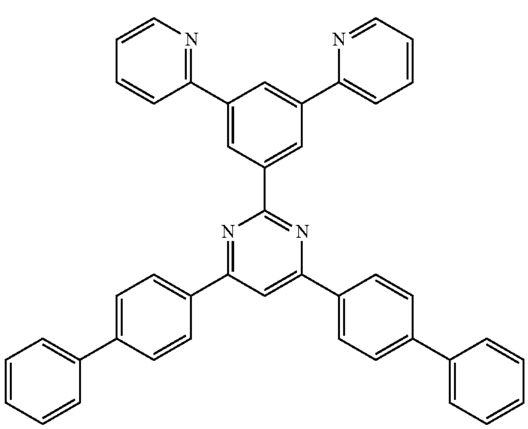
-continued
474
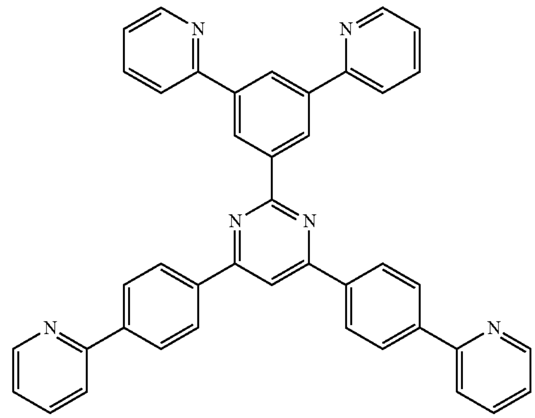
475
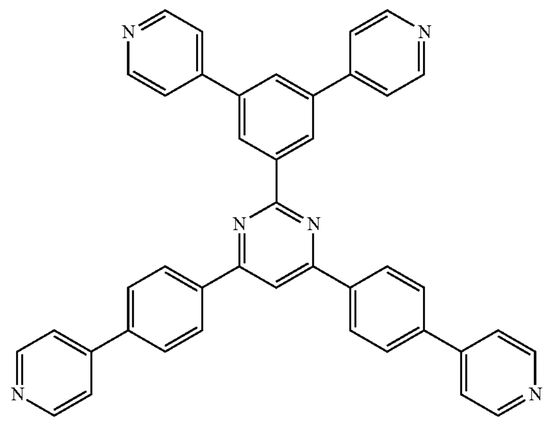
476
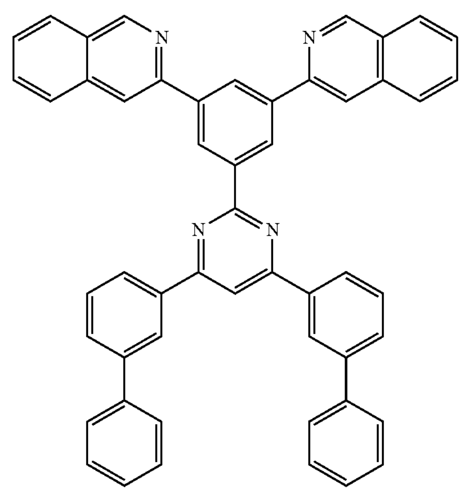

-continued
477
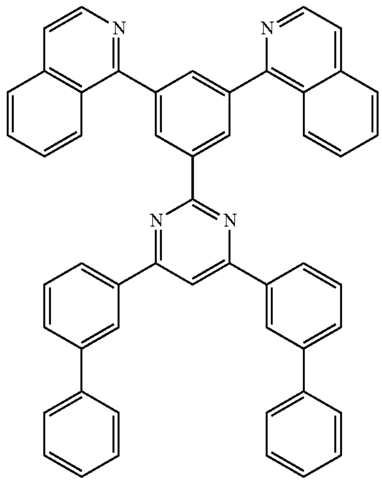
478
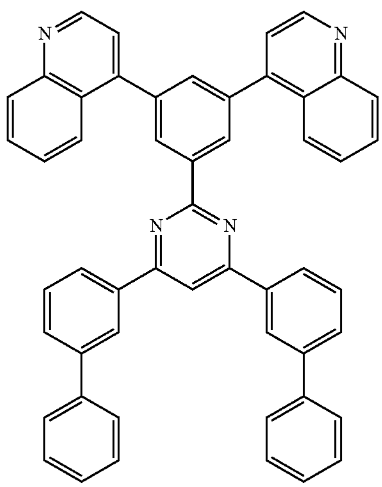
479
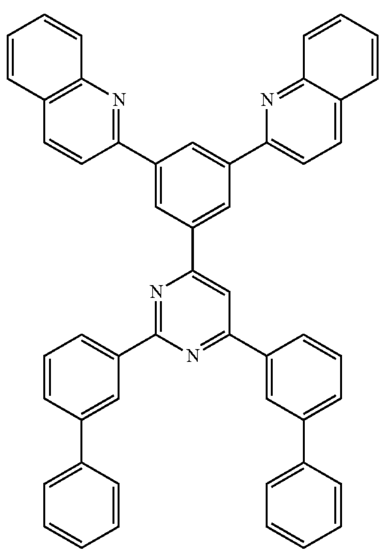
-continued
480
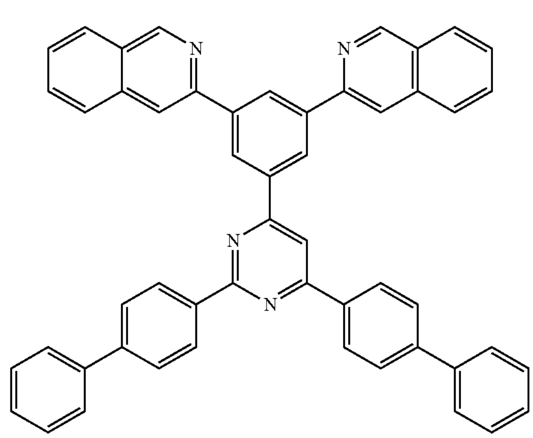
481
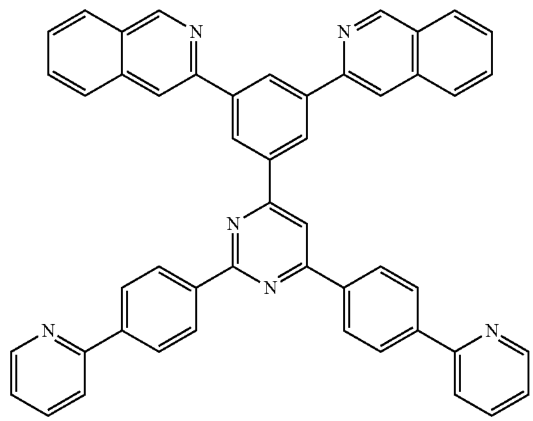
482
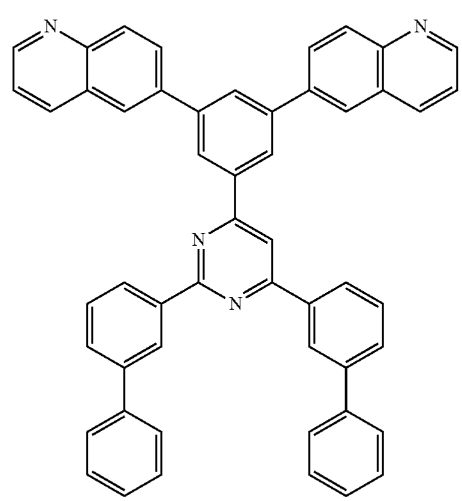

483
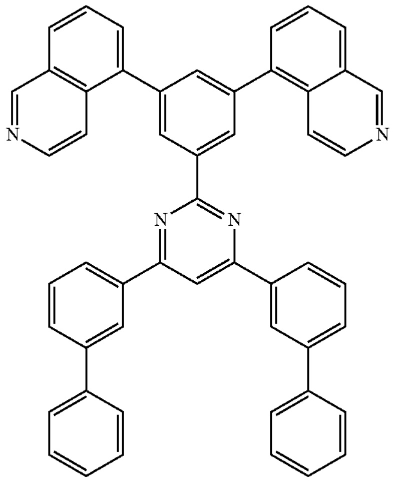
484
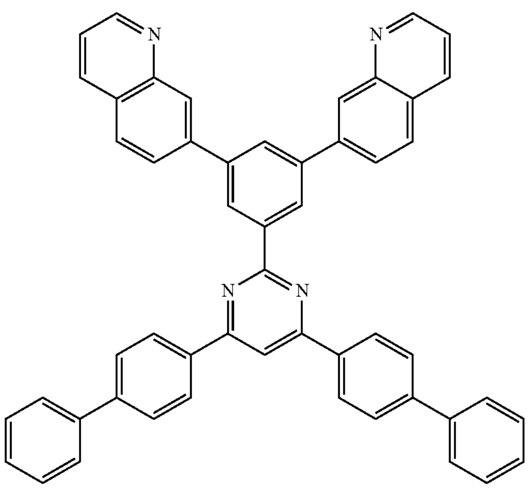
485
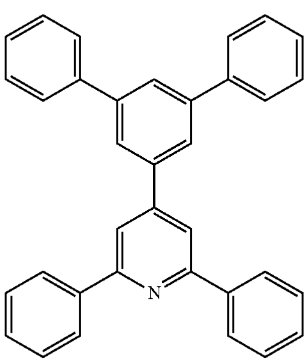
486
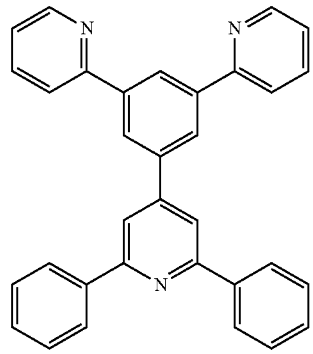
487
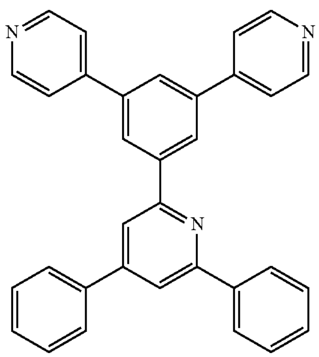
488
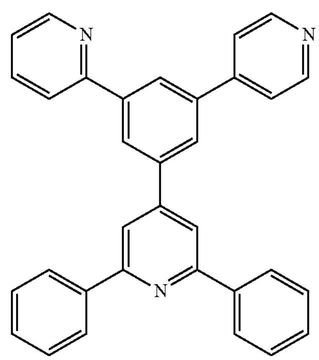
489
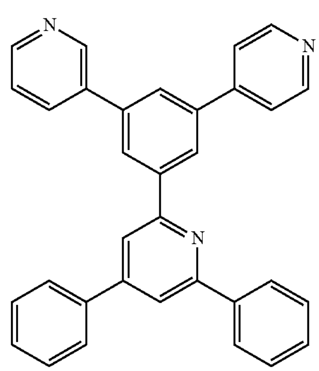

-continued
490
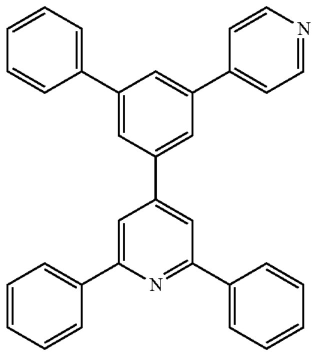
491
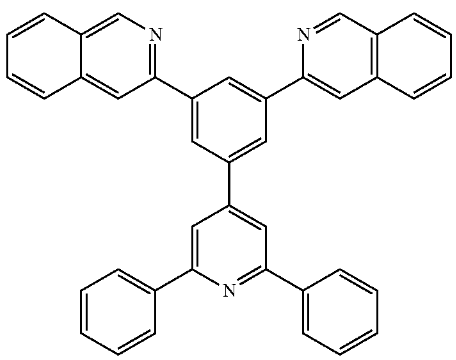
492
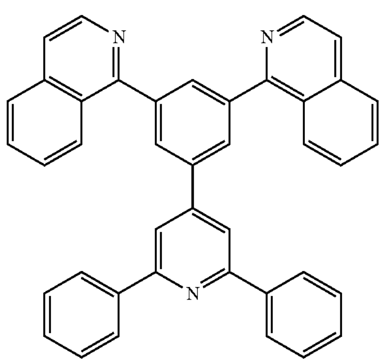
493
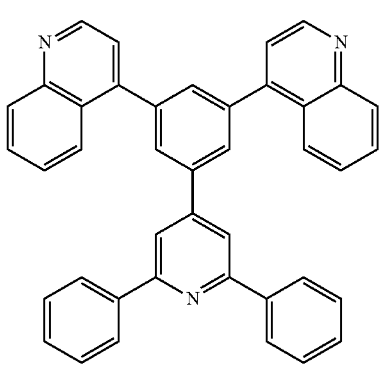
-continued
494
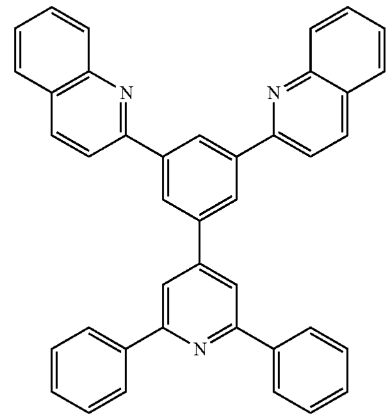
495
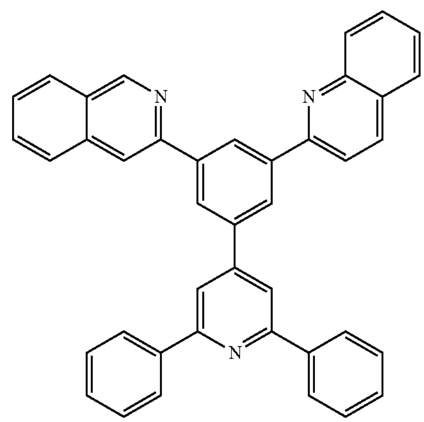
496
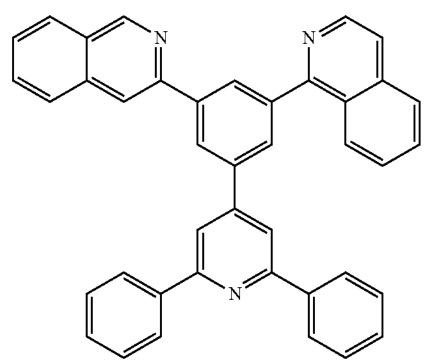
497
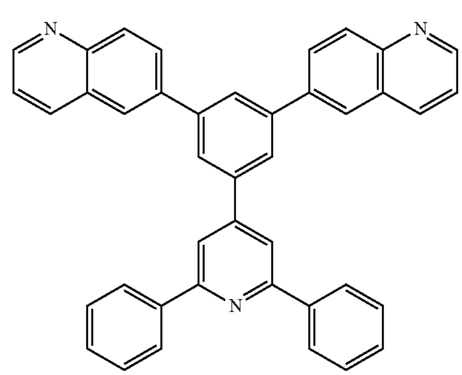

-continued
498
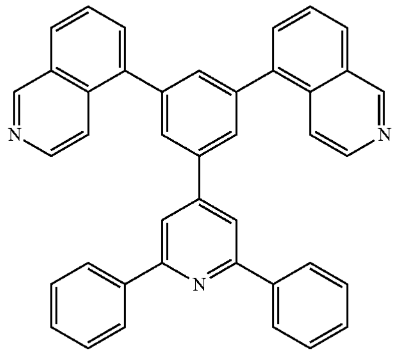
499
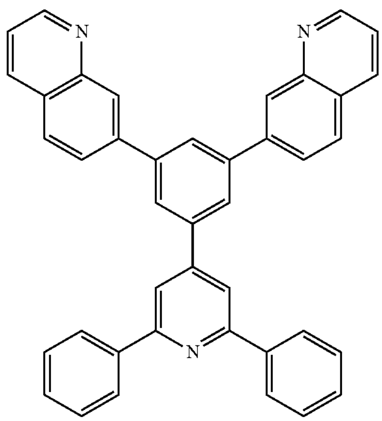
500
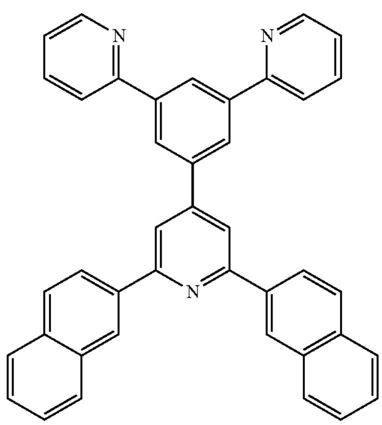
501
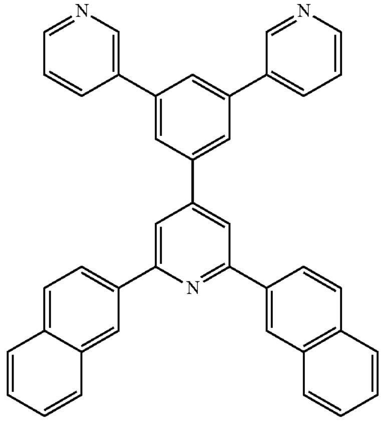
-continued
502
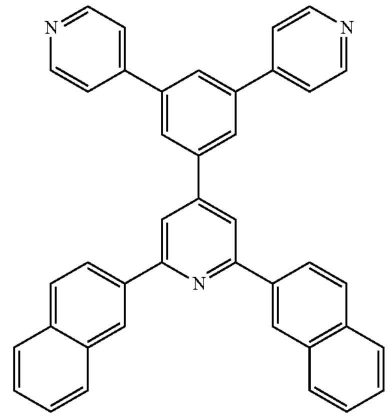
503
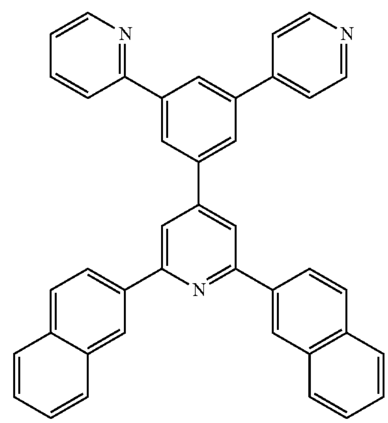
504
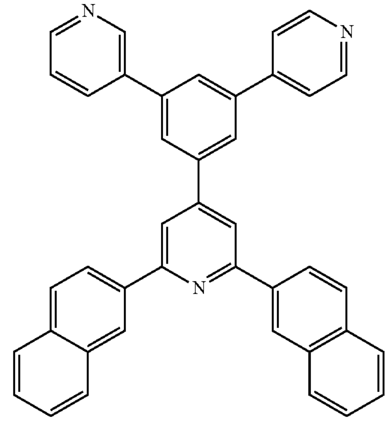

505
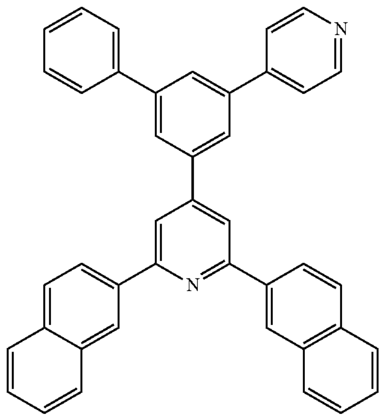
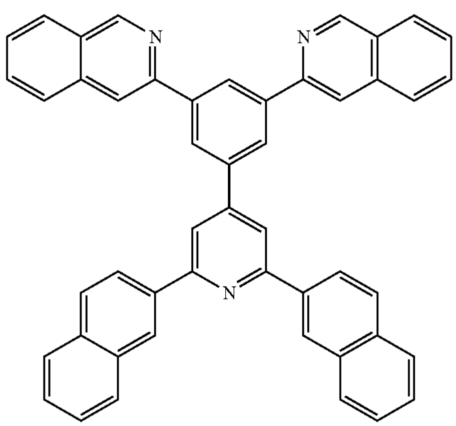
506
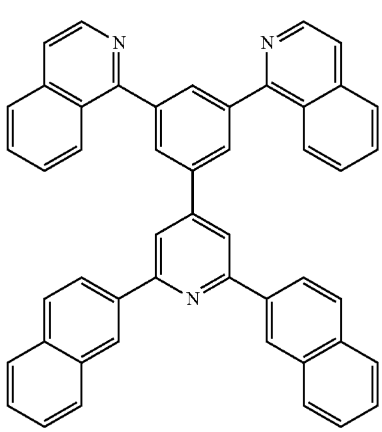
507
508
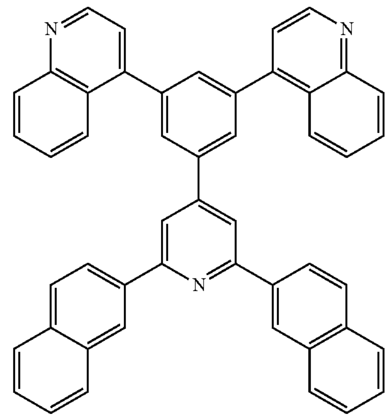
509
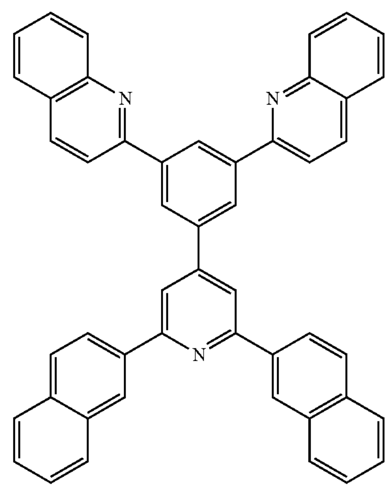
510
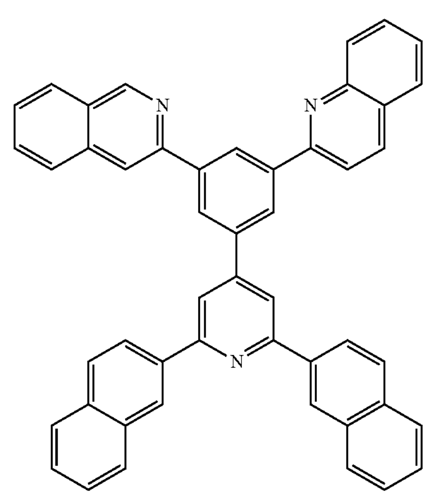

-continued
511
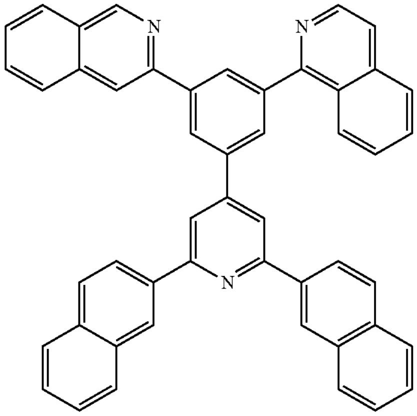
512
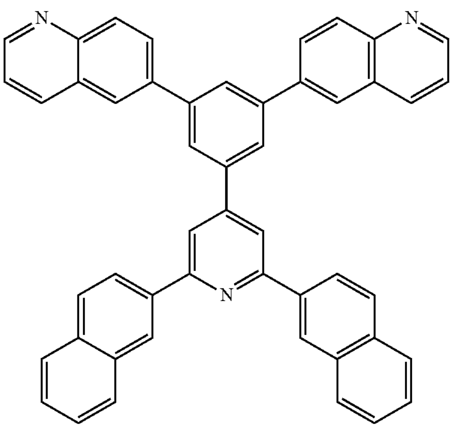
513
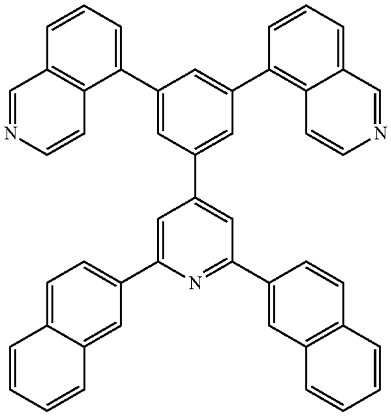
-continued
514
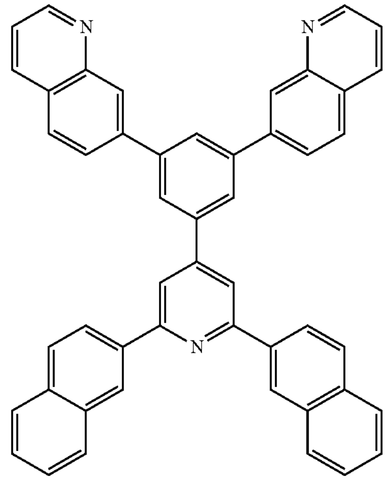
515
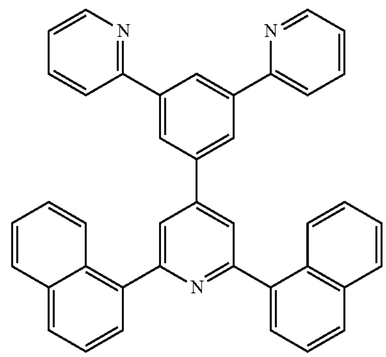
516
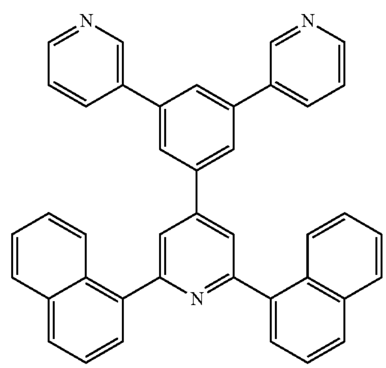
517
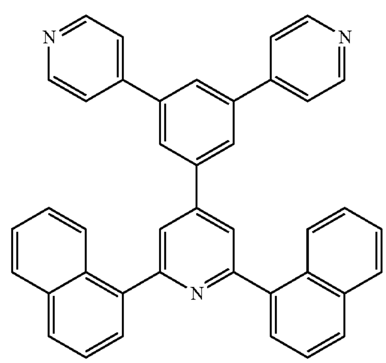

518
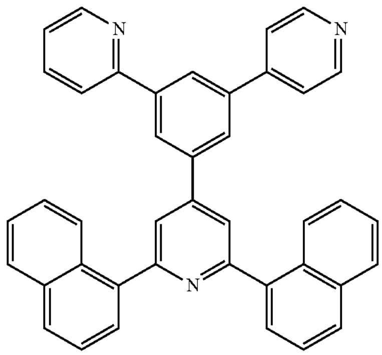
519
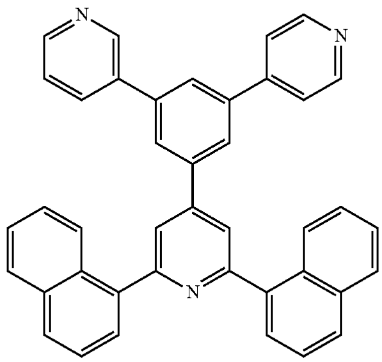
520
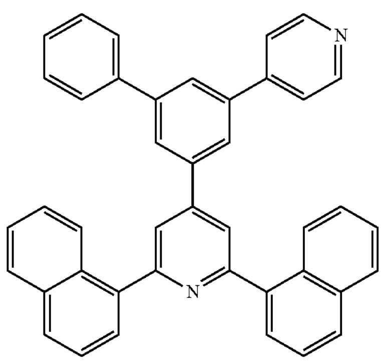
521
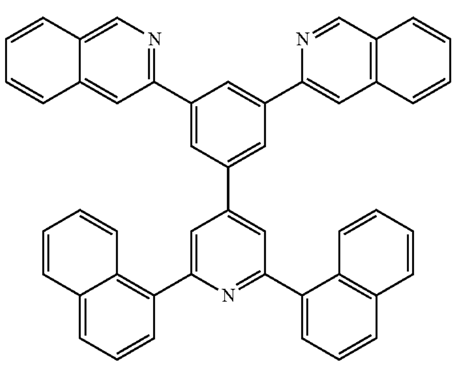
522
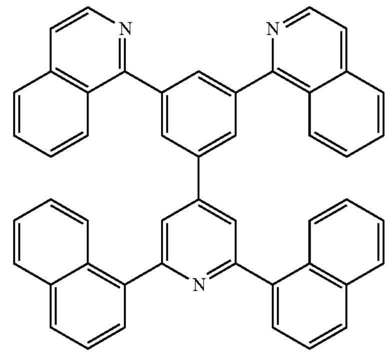
523
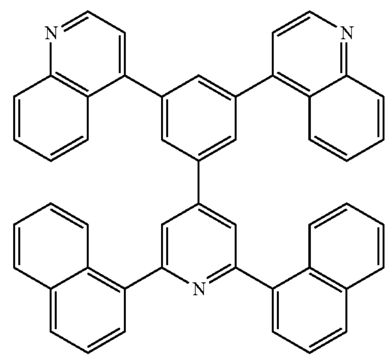
524
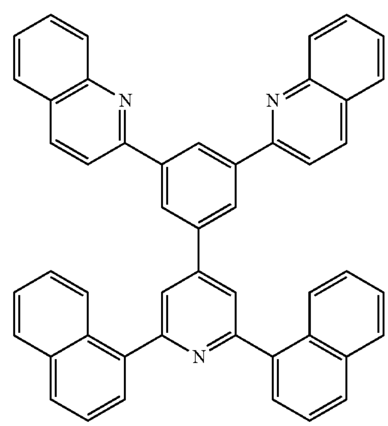
525
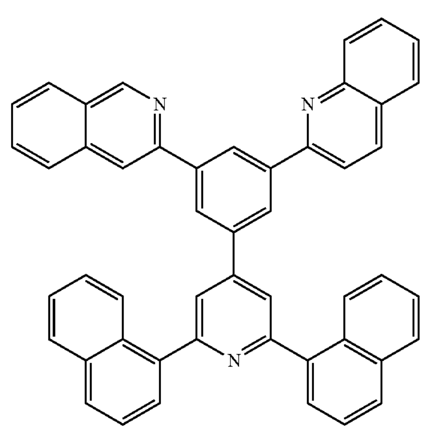

-continued
526
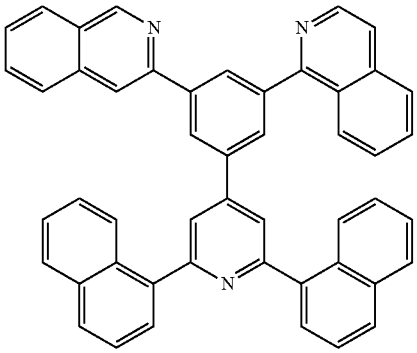
527
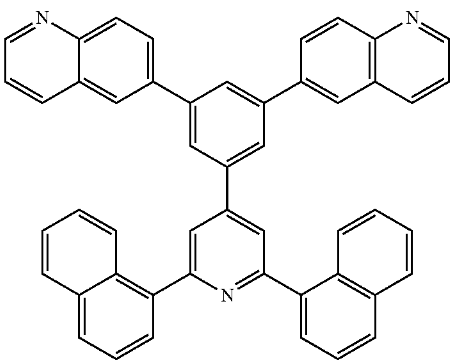
528
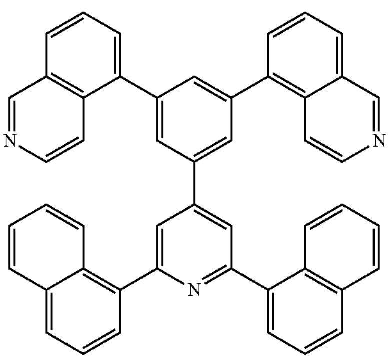
529
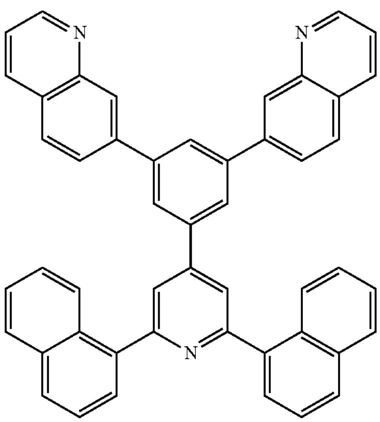
-continued
530
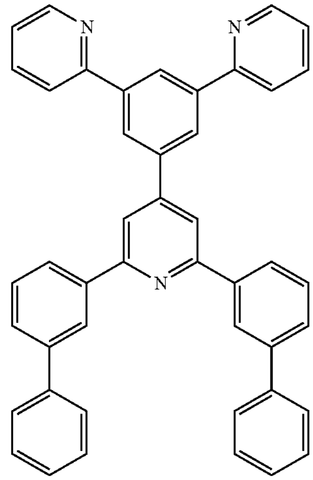
531
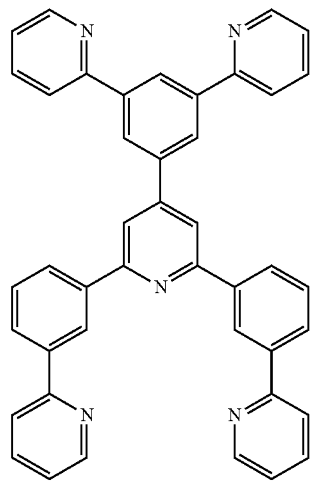
532
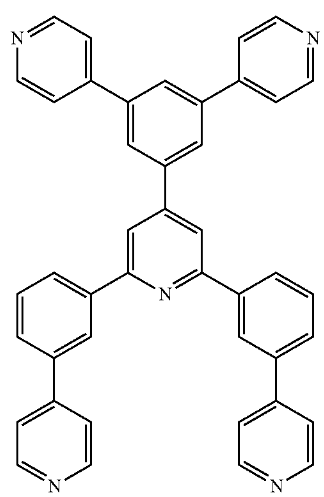

-continued
533
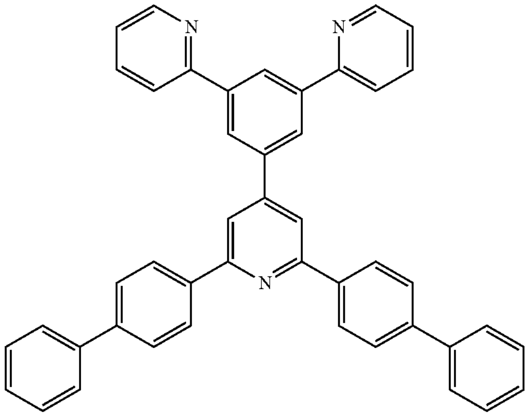
534
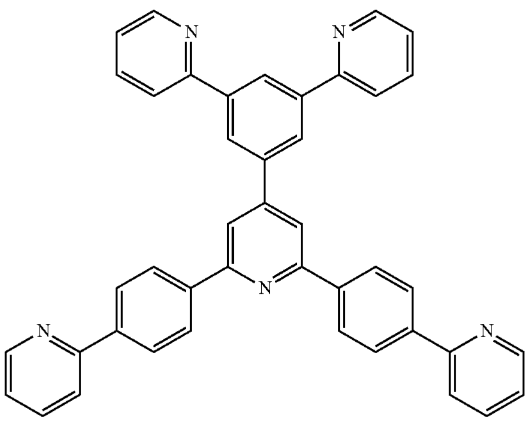
535
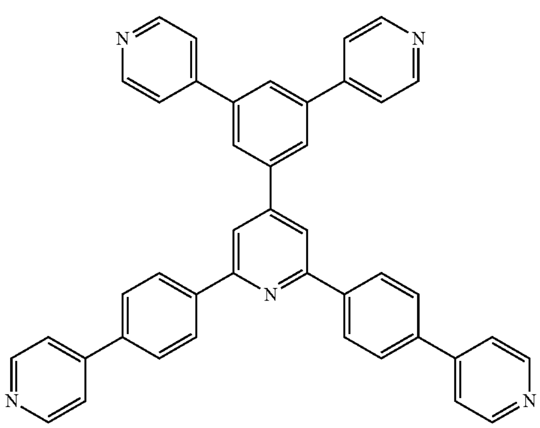
-continued
536
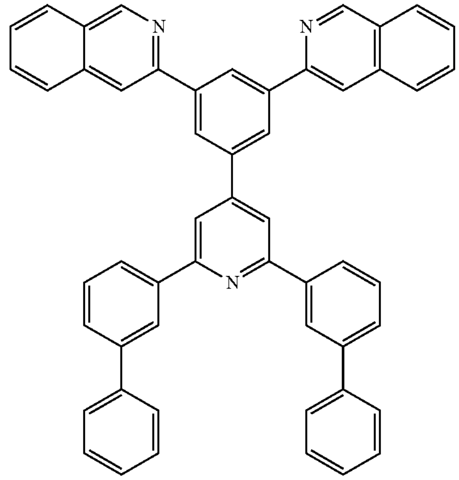
537
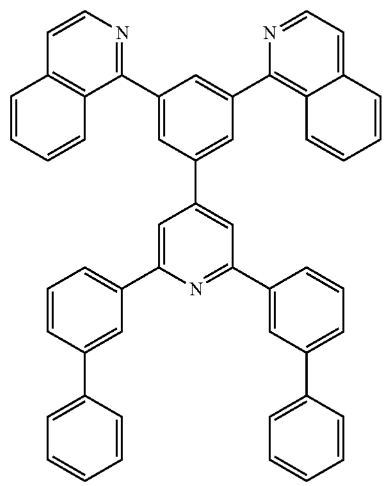
538
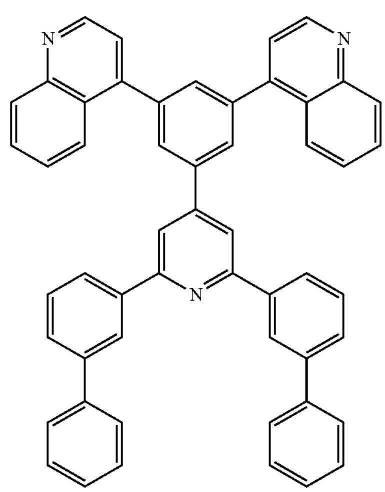

-continued
539
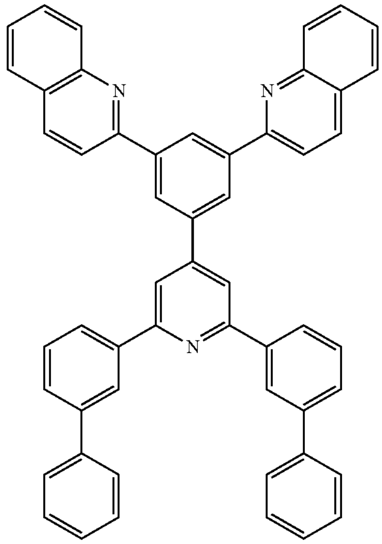
540
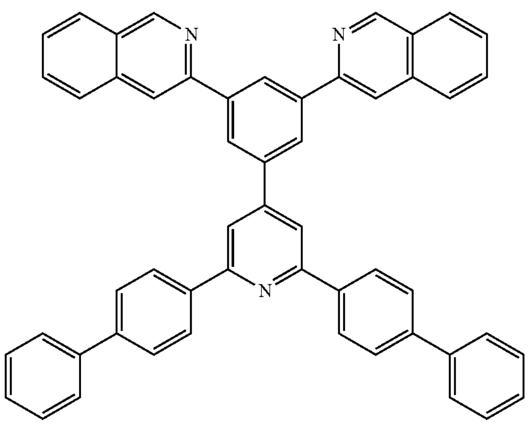
541
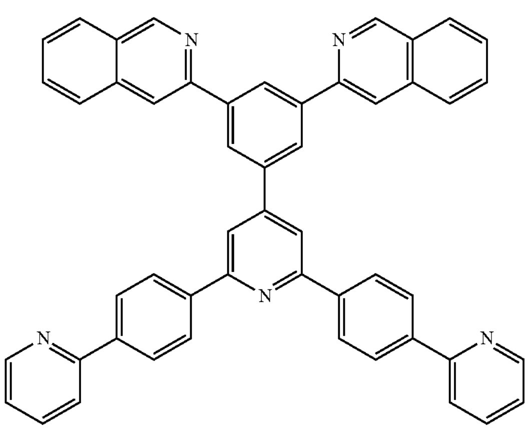
-continued
542
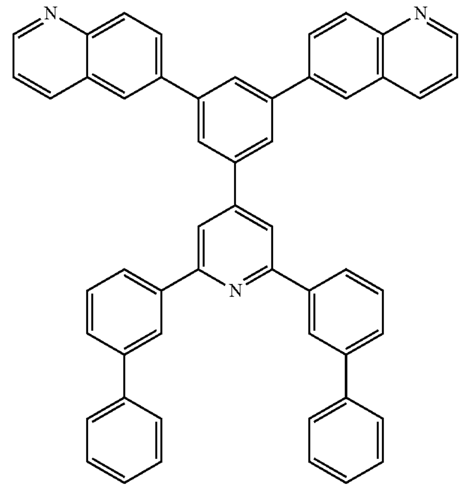
543
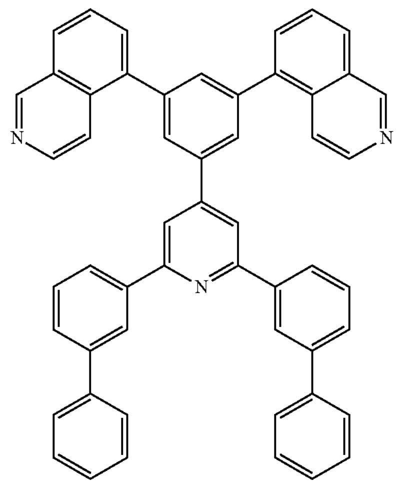
544
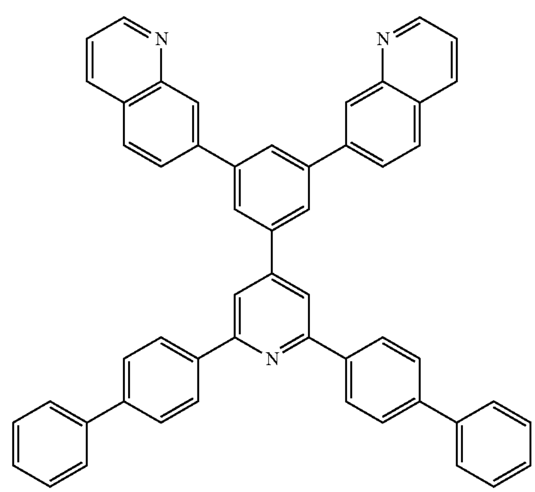
Generally, an anthracene-based compound having a symmetrical structure and high crystallinity is known to have low film formability. However, the first material represented by Formula 1 above has an asymmetrical structure and thus, film formability of the first material may be improved. The first material represented by Formula 1 may have a bulky substituent having greater steric hindrance than a phenyl group at the tenth carbon of anthracene, which leads to reduced association with a dopant, and thus, efficiency and lifespan of an organic light-emitting device may be improved.

The second material represented by Formula 2 may have great electron transporting ability.

Accordingly, an organic light-emitting device including the first material and the second material may have high efficiency and a long lifespan.

The organic layer 150 may further include a hole transport region 130 disposed between the first electrode 110 and the EML. The organic layer 150 may further include an electron transport region disposed between the EML and the second electrode.

The hole transport region may include at least one selected from a hole injection layer (HIL), a hole transport layer (HTL), a buffer layer, and an electron blocking layer (EBL); and the electron transport region may include at last one selected from a hole blocking layer (HBL), an electron transport layer (ETL), and an electron injection layer (EIL), but each of the hole transport region and the electron transport region is not limited thereto.

The hole transport region may include a single layer formed of a single material, a single layer formed of a plurality of different materials, or a multi-layered structure including a plurality of layers formed of a plurality of different materials.

For example, the hole transport region may have a single-layered structure formed of a plurality of different materials or a structure in which HIL/HTL, HIL/HTL/buffer layer, HIL/buffer layer, HTL/buffer layer, or HIL/HTL/EBL are sequentially layered on the first electrode 110, but it is not limited thereto.

When the hole transport region includes the HIL, the HIL may be formed on the first electrode 110 by using (utilizing) various suitable methods, such as vacuum deposition, spin coating, casting, Langmuir-Blodgett (LB) deposition, inkjet printing, laser printing, or laser-induced thermal imaging (LITI).

When the HIL is formed by using (utilizing) vacuum deposition, vacuum deposition conditions may vary according to the compound that is used (utilized) to form the HIL and the desired structure of the HIL to be formed. For example, vacuum deposition may be performed at a temperature of about 100° C. to about 500° C., a pressure of about $10^{-8}$ torr to about $10^{-3}$ torr, and a deposition rate of about 0.01 to about 100 Å/sec, depending on the s When the HIL is formed by using (utilizing) spin coating, the coating conditions may vary according to the compound that is used (utilized) to form the HIL and the desired structure of the HIL to be formed. For example, the coating rate may be in the range of about 2000 rpm to about 5000 rpm, and a temperature at which a heat treatment is performed may be in the range of about 80° C. to about 200° C.

When the hole transport region includes the HTL, the HTL may be formed on the first electrode 110 or on the HIL by using (utilizing) various suitable methods, such as vacuum deposition, spin coating, casting, LB deposition, inkjet printing, laser printing, or LITI. When the HTL is formed by vacuum deposition or spin coating, the vacuum deposition conditions and coating conditions may be the same as the vacuum deposition conditions and the coating conditions of the HIL.

The hole transport region may include at least one selected from m-MTDATA, TDATA, 2-TNATA, NPB, β-NPB, TPD, Spiro-TPD, Spiro-NPB, α-NPB, TAPC, HMTPD, 4,4',4"-tris(N-carbazolyl)triphenylamine(4,4',4"-tris(N-carbazolyl)triphenylamine) (TCTA), polyaniline/dodecylbenzenesulfonic acid (Pani/DBSA), Poly(3,4-ethylenedioxythiophene)/Poly(4-styrenesulfonate) (PEDOT/PSS), polyaniline/camphor sulfonic acid (pani/CSA), or (polyaniline)/poly(4-styrenesulfonate) (PANI/PSS), a compound represented by Formula 201 below, and a compound represented by Formula 202 below.

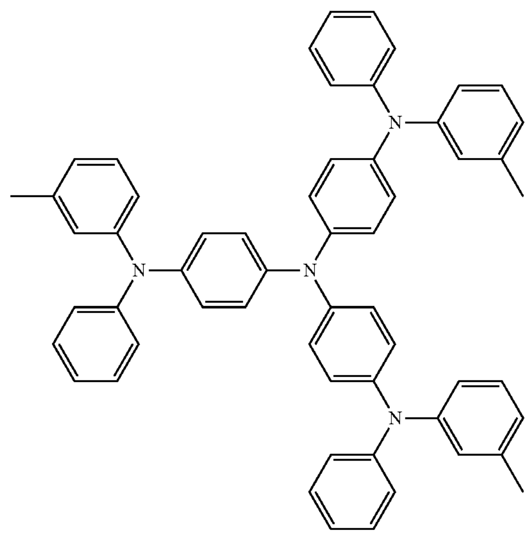

m-MTDATA

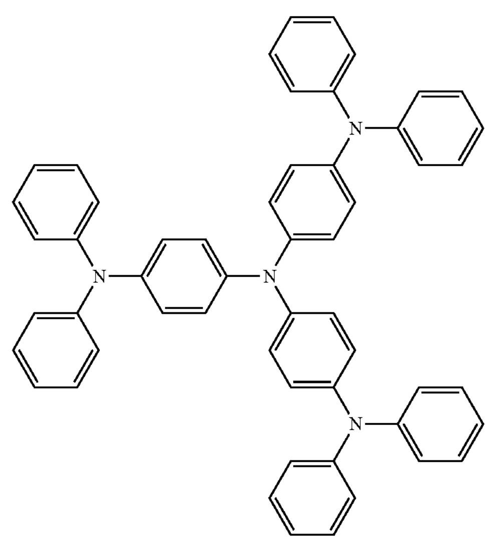

TDATA

-continued
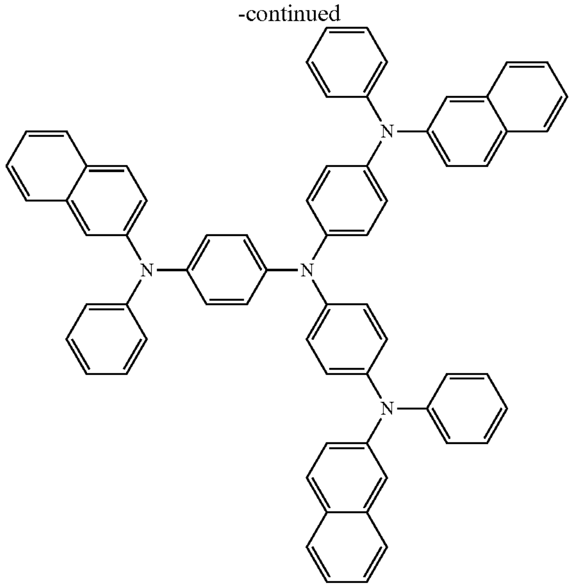
2-TNATA
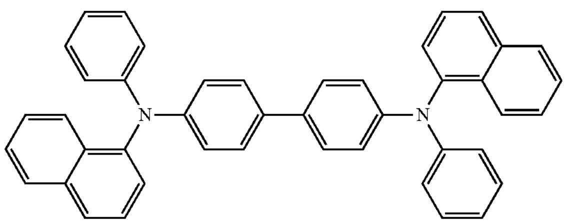
NPB
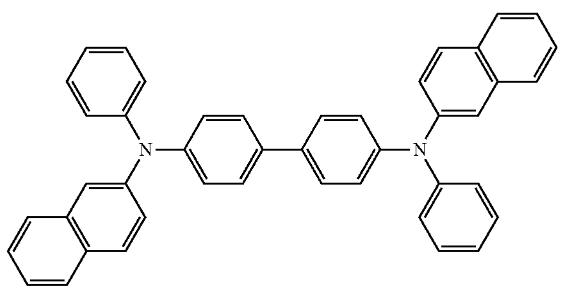
β-NPB
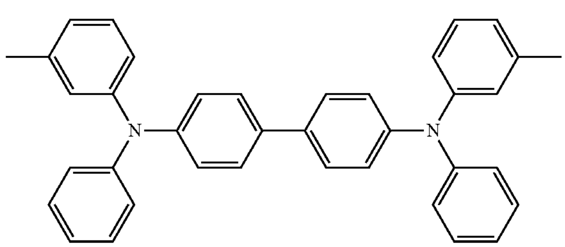
TPD
-continued
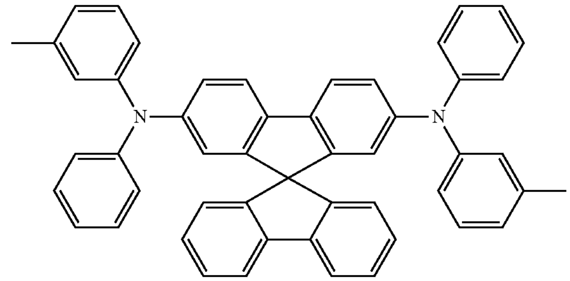
Spiro-TPD
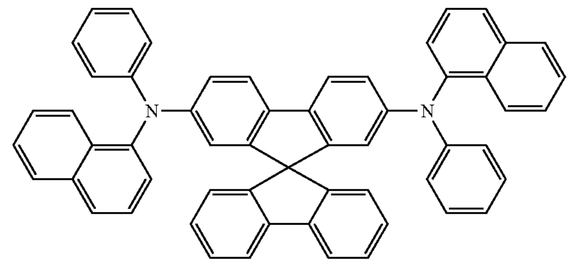
Spiro-NPB
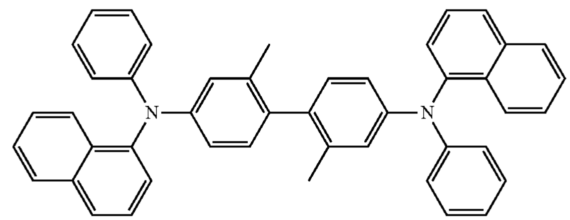
α-NPB
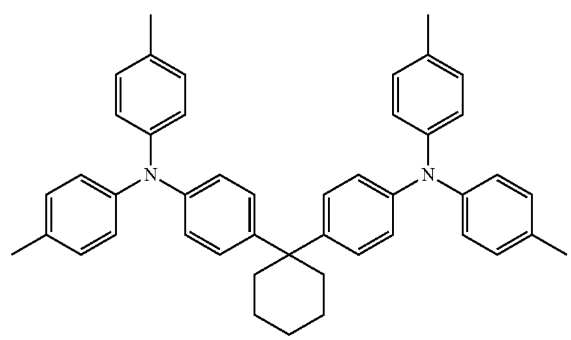
TAPC
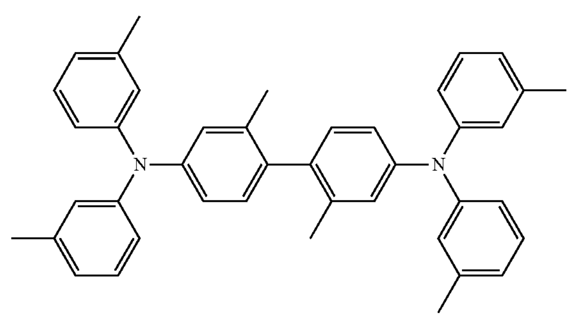
HMTPD
Formula 201
$$R_{201}-(L_{201})_{xa1}-N\begin{cases}(L_{202})_{xa2}-R_{202}\\(L_{203})_{xa3}-R_{203}\end{cases}$$

-continued

Formula 202

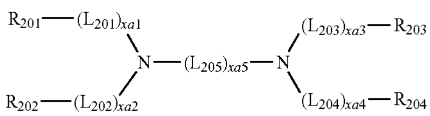

In Formulae 201 and 202, $L_{201}$ to $L_{205}$ may be each independently selected from a substituted or unsubstituted $C_3$-$C_{10}$ cycloalkylene, a substituted or unsubstituted $C_3$-$C_{10}$ heterocycloalkylene, a substituted or unsubstituted $C_3$-$C_{10}$ cycloalkenylene, a substituted or unsubstituted $C_3$-$C_{10}$ heterocycloalkenylene, a substituted or unsubstituted $C_6$-$C_{60}$ arylene, a substituted or unsubstituted $C_2$-$C_{60}$ heteroarylene, a substituted or unsubstituted divalent non-aromatic condensed polycyclic group, and a substituted or unsubstituted divalent non-aromatic hetero-condensed polycyclic group;

at least one substituent of the substituted $C_3$-$C_{10}$ cycloalkylene, substituted $C_3$-$C_{10}$ heterocycloalkylene, substituted $C_3$-$C_{10}$ cycloalkenylene, substituted $C_3$-$C_{10}$ heterocycloalkenylene, substituted $C_6$-$C_{60}$ arylene, substituted $C_2$-$C_{60}$ heteroarylene, substituted divalent non-aromatic condensed polycyclic group, and substituted divalent non-aromatic hetero-condensed polycyclic group may be selected from:

deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, a monovalent non-aromatic condensed hetero-polycyclic group, —$N(Q_{201})(Q_{202})$, —$Si(Q_{203})(Q_{204})(Q_{205})$, and —$B(Q_{206})(Q_{207})$;

a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, and a monovalent non-aromatic condensed hetero-polycyclic group;

a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{50}$ aryloxy group, a $C_6$-$C_{60}$ arylthio group, a $C_2$-$C_{60}$ heteroaryl group, a monovalent non-aromatic condensed polycyclic group, and a monovalent non-aromatic condensed hetero-polycyclic group, each substituted with at least one selected from a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, a monovalent non-aromatic condensed hetero-polycyclic group, —$N(Q_{211})(Q_{212})$, —$Si(Q_{213})(Q_{214})(Q_{215})$, and —$B(Q_{216})(Q_{217})$; and —$N(Q_{221})(Q_{222})$, —$Si(Q_{223})(Q_{224})(Q_{225})$, and —$B(Q_{226})(Q_{227})$;

xa1 to xa4 may be each independently selected from 0, 1, 2, and 3;

xa5 may be selected from 1, 2, 3, 4, and 5;

$R_{201}$ to $R_{204}$ may be each independently selected from a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a C1-$C_{60}$ alkoxy group, each substituted with at least one selected from a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a non-aromatic condensed polycyclic group, —$N(Q_{231})(Q_{232})$, —$Si(Q_{233})(Q_{234})(Q_{235})$, and —$B(Q_{236})(Q_{237})$;

a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{50}$ aryloxy group, a $C_6$-$C_{60}$ arylthio group, a $C_2$-$C_{60}$ heteroaryl group, a monovalent non-aromatic condensed polycyclic group, and a monovalent non-aromatic condensed hetero-polycyclic group; and a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, and a monovalent non-aromatic condensed hetero-polycyclic group, each substituted with at least one selected from a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, a monovalent non-aromatic condensed hetero-polycyclic group, —$N(Q_{241})(Q_{242})$, —$Si(Q_{243})(Q_{244})(Q_{245})$, and —$B(Q_{246})(Q_{247})$; wherein, $Q_{201}$ to $Q_{207}$, $Q_{211}$ to $Q_{217}$, $Q_{221}$ to $Q_{227}$, $Q_{231}$ to $Q_{237}$, and $Q_{241}$ to $Q_{247}$ may be each independently selected from:

hydrogen, deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, and a monovalent non-aromatic condensed hetero-polycyclic group;

$C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, and a monovalent non-aromatic condensed hetero-polycyclic group; and a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, and a monovalent non-aromatic condensed hetero-polycyclic group, each substituted with at least one selected from a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{50}$ aryloxy group, a $C_6$-$C_{60}$ arylthio group, a $C_2$-$C_{60}$ heteroaryl group, a monovalent non-aromatic condensed polycyclic group, and a monovalent non-aromatic condensed hetero-polycyclic group.

For example, in Formulae 201 and 202, $L_{201}$ to $L_{205}$ may be each independently selected from:

a phenylene group, a naphthylenylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group; and a phenylene group, a naphthylenylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group, each substituted with at least one selected from a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, an isoindolyl group, a quinolinyl group, an isoquinolinyl group, a quinoxalinyl group, a quinazolinyl group, a carbazolyl group, and a triazinyl group;

xa1 to xa4 may be each independently 0, 1, or 2;

xa5 may be 1, 2, or 3;

$R_{201}$ to $R_{205}$ may be each independently selected from a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an azulenyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group.

The compound represented by Formula 201 above may be represented by Formula 201A below:

Formula 201A

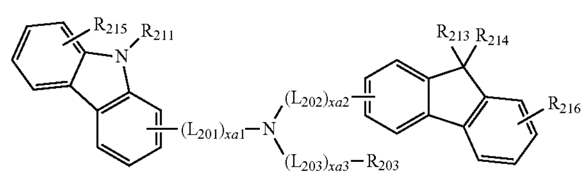

For example, the compound represented by Formula 201 may be represented by Formula 201A-1 below, but it is not limited thereto:

Formula 201A-1

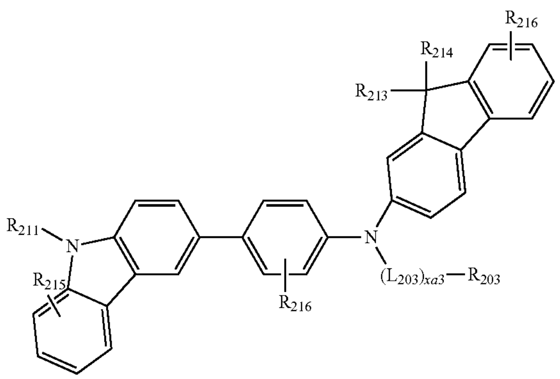

The compound represented by Formula 202 above may be represented by Formula 202A below, but it is not limited thereto:

Formula 202A

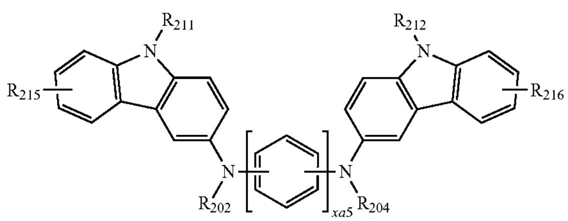

In Formulae 201A, 201A-1 and 202A, descriptions of $L_{201}$ to $L_{203}$; xa1 to xa3, xa5, and $R_{202}$ to $R_{204}$ may be the same as the descriptions herein; $R_{211}$ and $R_{212}$ may be understood by referring to $R_{203}$; and $R_{213}$ to $R_{216}$ may be each independently selected from hydrogen, deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, and a non-aromatic condensed polycyclic group.

For example, in Formulae 201A, 201A-1, and 202A above, $L_{201}$ to $L_{203}$ may be each independently selected from a phenylene group, a naphthylenylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group; and a phenylene group, a naphthylenylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group, each substituted with at least one selected from a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

xa1 to xa3 may be each independently 0 or 1;

$R_{203}$, $R_{211}$ and $R_{212}$ may be each independently selected from a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

$R_{213}$ and $R_{214}$ may be each independently selected from a $C_1$-$C_{20}$ alkyl group, and a $C_1$-$C_{20}$ alkoxy group;

a $C_1$-$C_{20}$ alkyl group, and a $C_1$-$C_{20}$ alkoxy group, each substituted with at least one selected from a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

$R_{215}$ and $R_{216}$ may be each independently selected from a hydrogen, a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid, group or a salt thereof, a $C_1$-$C_{20}$ alkyl group, and a $C_1$-$C_{20}$ alkoxy group;

a $C_1$-$C_{20}$ alkyl group, and a $C_1$-$C_{20}$ alkoxy group, each substituted with at least one selected from a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and xa5 is 1 or 2.

In Formulae 201A and 201A-1, $R_{213}$ and $R_{214}$ may bind to each other to form a saturated ring or an unsaturated ring.

The compound represented by Formula 201 above and the compound represented by Formula 202 above may include Compounds HT1 to HT20, but they are not limited thereto.

HT1

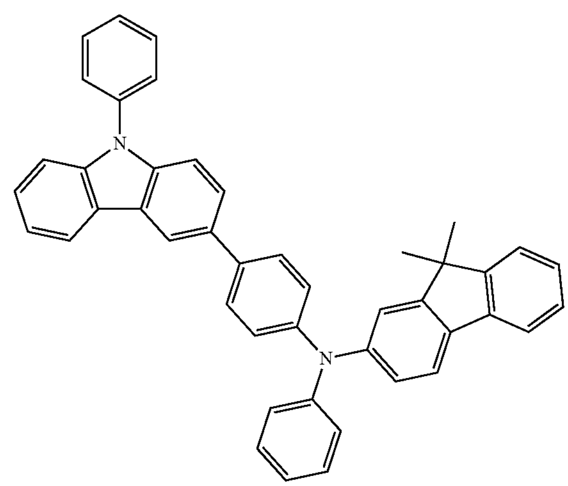

HT2

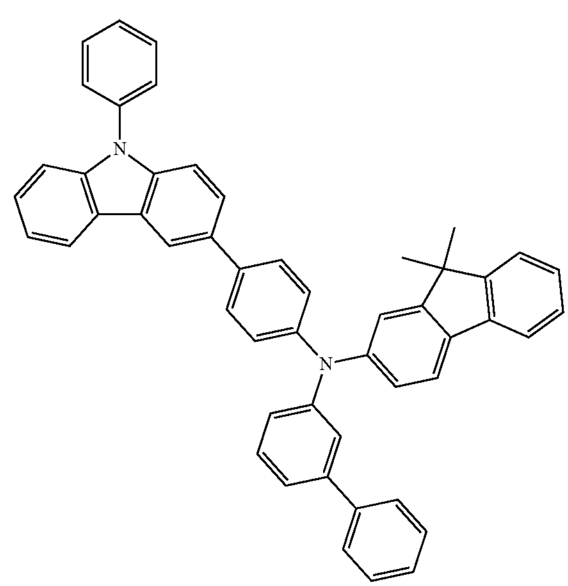

HT3
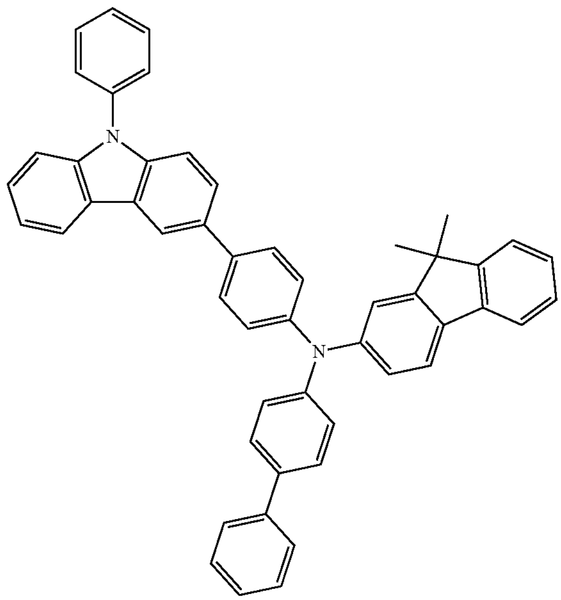
HT4
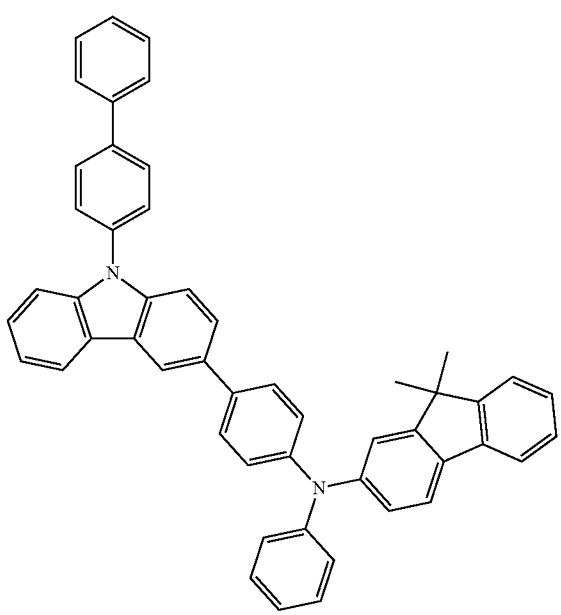
HT5
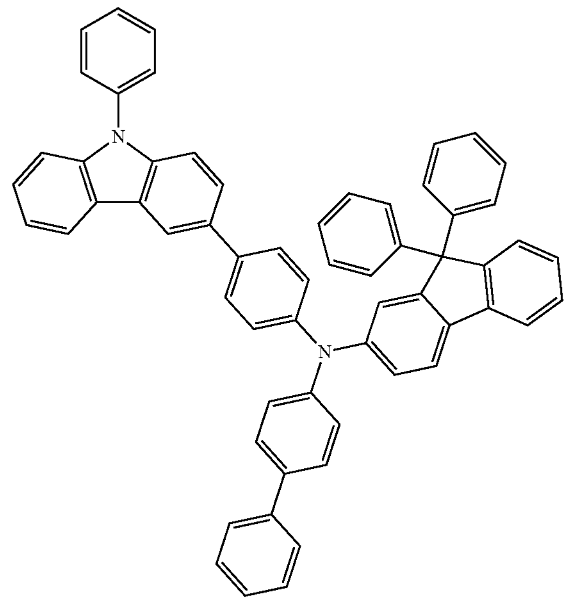
HT6
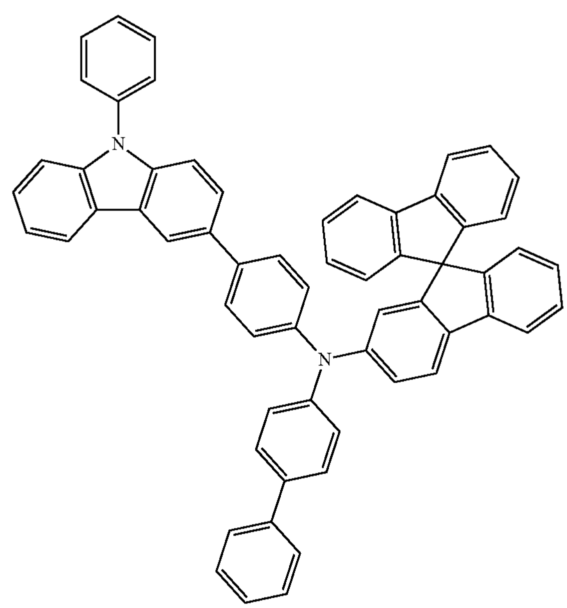

HT7
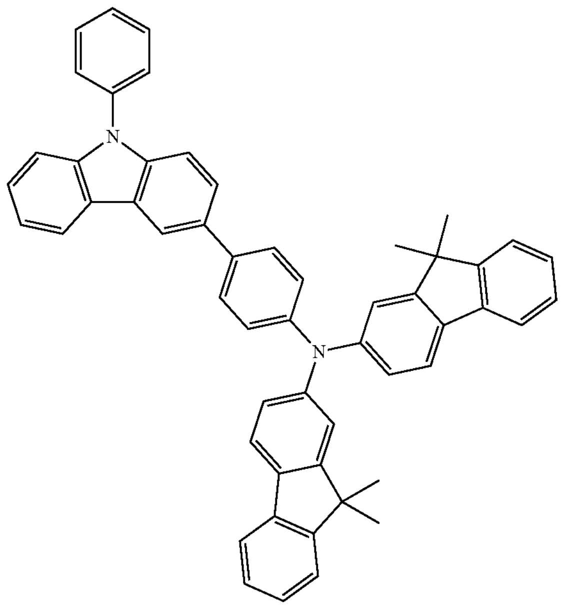
HT8
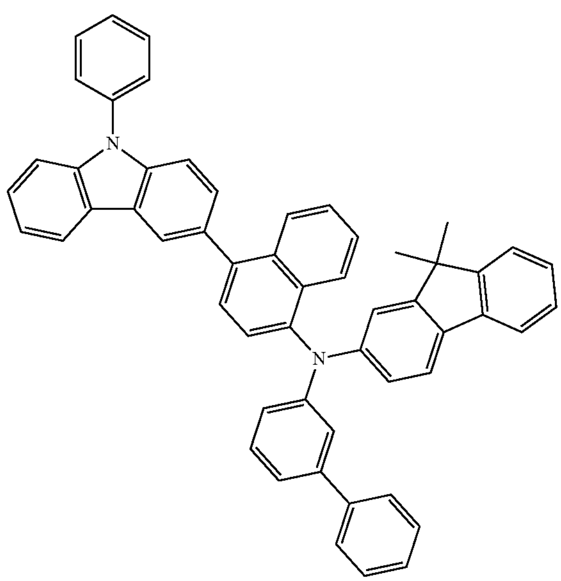
HT9
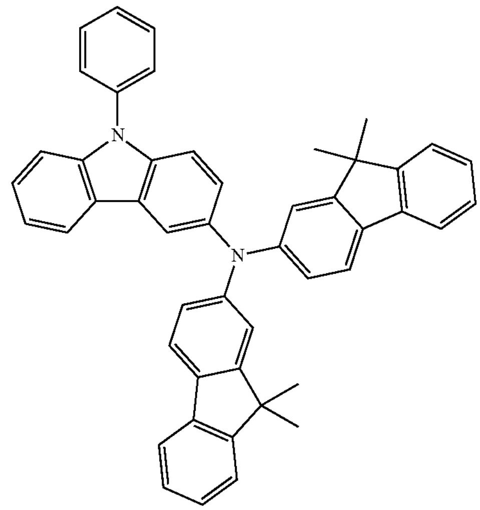
HT10
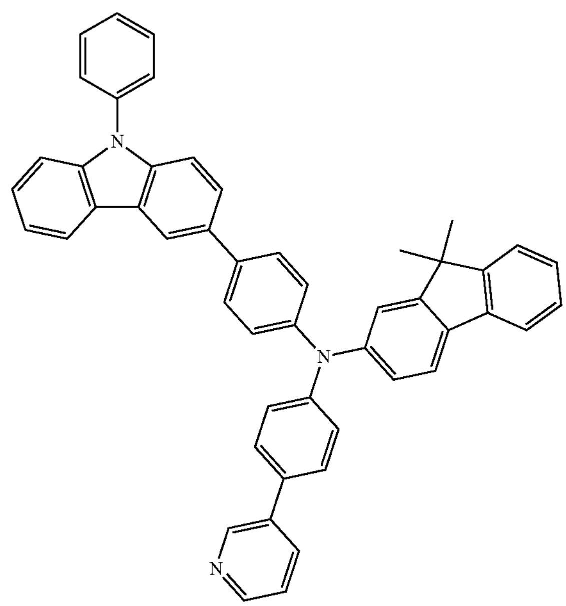

-continued
HT11
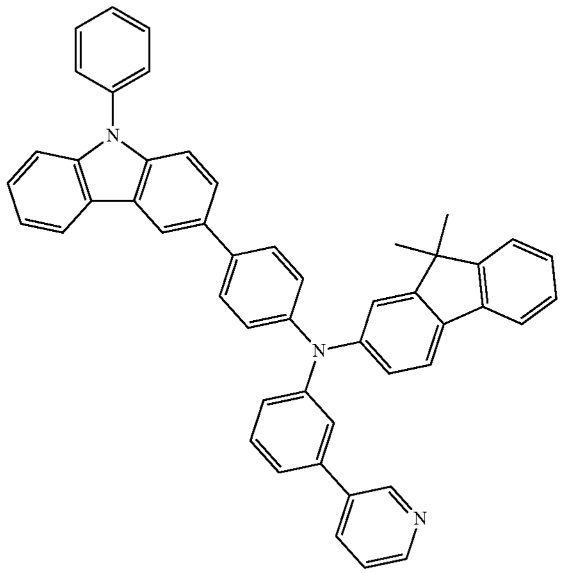
HT12
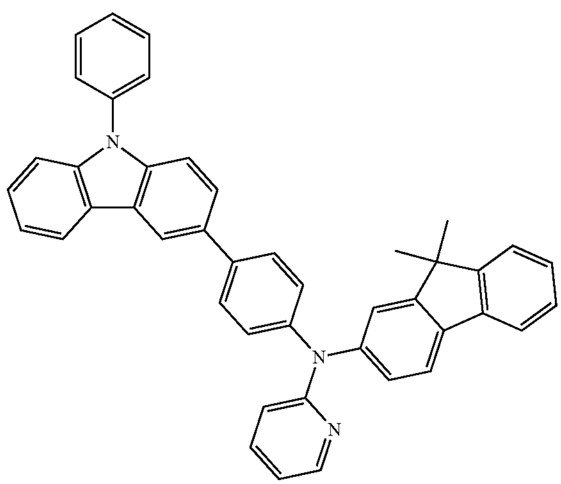
HT13
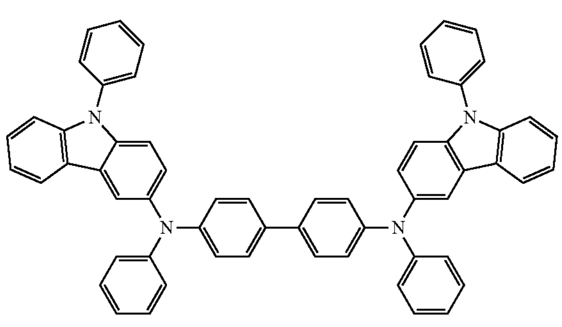
-continued
HT14
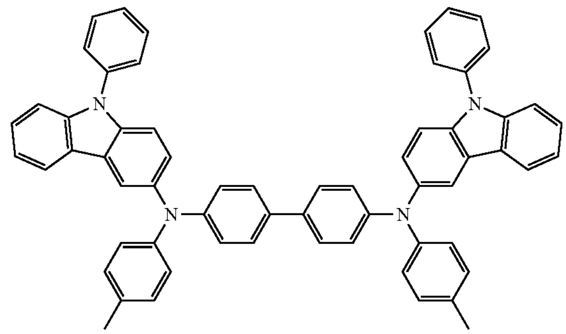
HT15
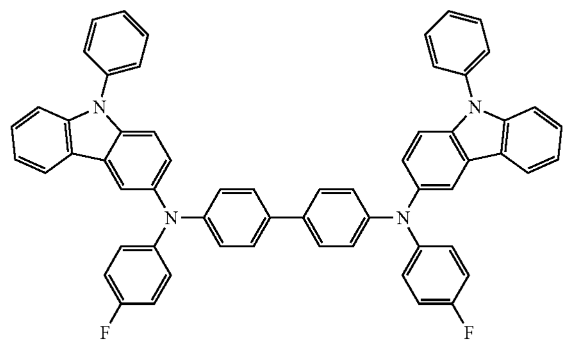
HT16
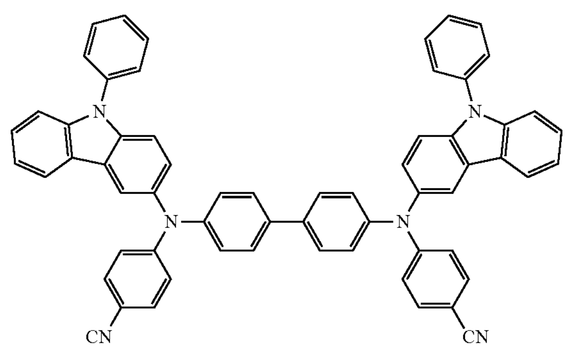
HT17
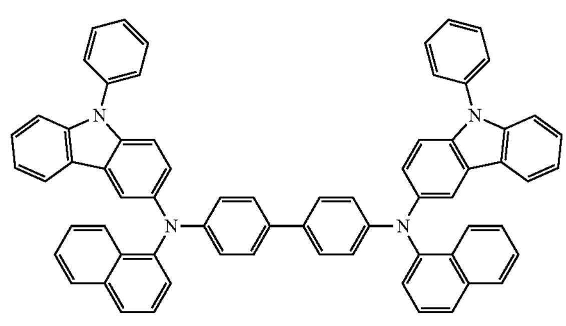

-continued

HT18

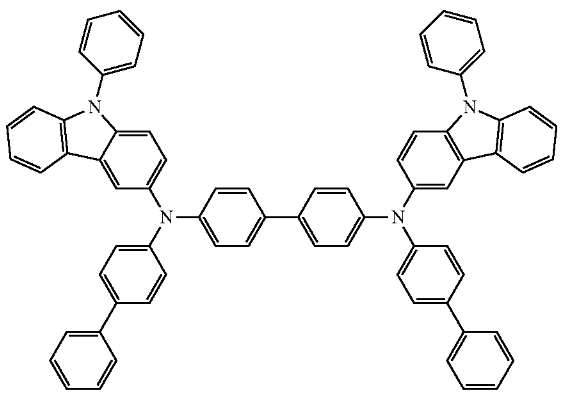

HT19

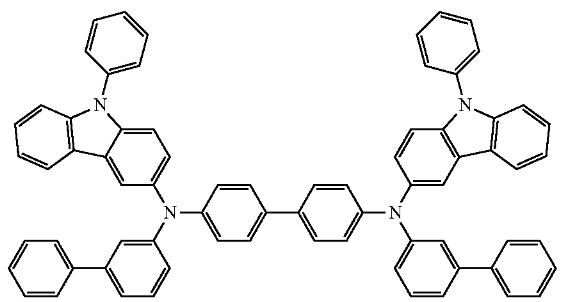

HT20

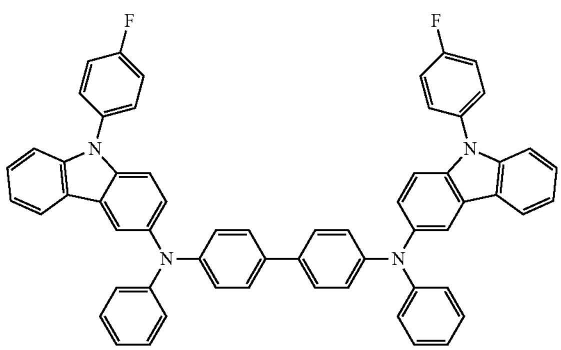

A thickness of the hole transport region may be about 100 Å to about 10000 Å, for example, about 100 Å to about 1000 Å. When the hole transport region includes both of the HIL and the HTL, a thickness of the HIL may be about 100 Å to about 10000 Å, for example, about 100 Å to about 1000 Å, and a thickness of the HTL may be about 50 Å to about 2000 Å, for example, about 100 Å to about 1500 Å. In one embodiment, when the thicknesses of the hole transport region, the HIL, and the HTL satisfy the ranges described above, satisfactory hole injection characteristics are obtained without a substantial increase in a driving voltage.

The hole transport region may further include a charge-generating material, in addition to the material described above. The charge-generating material may be uniformly or non-uniformly dispersed in the hole transport region.

The charge-generating material may be, for example, a p-dopant. The p-dopant may be selected from quinone derivatives, metal oxides, and CN-containing compounds, but it is not limited thereto. For example, non-limiting examples of the p-dopant are quinone derivatives (such as tetracyanoquinodimethane (TCNQ), or 2,3,5,6-tetrafluorotetracyano-1,4-benzoquinodimethane (F4-TCNQ)); metal oxides (such as tungsten oxides or molybdenym oxides); and Compound HT-D1 below.

Compound HT-D1

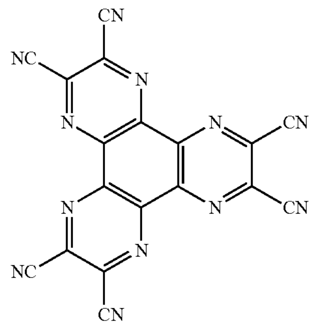

F4-TCNQ

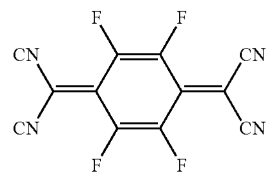

The hole transport region may include at least one selected from the buffer layer and the EBL, in addition to the HIL and the HTL. The buffer layer may compensate for an optical resonance distance of light according to a wavelength of the light emitted from the emission layer (EML), and thus may increase the efficiency of light emission. The buffer layer may include any suitable material that may be used (utilized) in the hole transport region. The EBL may reduce or prevent the injection of electrons from the electron transport region.

Then, the EML may be formed on the first electrode 110 or the hole transport region by vacuum deposition, spin coating, casting, LB deposition, inkjet printing, laser printing, LITI, or the like. When the EML is formed using (utilizing) vacuum deposition or spin coating, the deposition and coating conditions may be similar to those for the formation of the HIL.

When the organic light-emitting device 10 is a full color organic light-emitting device, the organic light-emitting device 10 may be patterned into red EML, green EML, and blue EML, according to different EMLs and individual sub-pixels. Alternatively, the EML may have a structure in which the red EML, the green EML, and the blue EML are layered, or a structure in which a red light emission material, a green light emission material, and a blue light emission material are mixed without separation of layers and emit white light. Alternatively, the EML is a white light EML, which includes a color filter or a color converting layer that converts white light into light of desired color.

The EML may include a host and a dopant.

The EML may include the at least one first material represented by Formula 1 above. For example, the host may include the at least one first material represented by Formula 1 above.

When the EML includes the at least one first material represented by Formula 1 above, the ETL may include the at least one second material represented by Formula 2 above, but each of the EML and ETL is not limited thereto. When the EML includes the at least one first material represented by Formula 1 and the ETL includes the at least one second material represented by Formula 2, the EML and the ETL may be adjacent to each other.

The dopant may be at least one of a fluorescent dopant and a phosphorescent dopant.

The fluorescent dopant may include a compound represented by Formula 501 below:

Formula 501

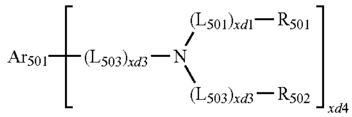

In Formula 501, $Ar_{501}$ may be selected from a naphthalene group, a heptalene group, a fluorene group, a spiro-fluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, and an indenoanthracene group;

a naphthalene group, a heptalene group, a fluorene group, a spiro-fluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, and an indenoanthracene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{50}$ heteroaryl group, a monovalent non-aromatic condensed polycyclic group, a monovalent non-aromatic condensed hetero-polycyclic group, and —Si($Q_{501}$)($Q_{502}$)($Q_{503}$) (wherein $Q_{501}$ to $Q_{503}$ may be each independently selected from a hydrogen, a $C_1$-$C_{60}$ alkyl group, a $C_2$-$C_{60}$ alkenyl group, a $C_6$-$C_{60}$ aryl group, and a $C_2$-$C_{60}$ heteroaryl group);

descriptions of $L_{501}$ to $L_{503}$ may be understood by referring to the description of $L_{201}$ above;

$R_{501}$ and $R_{502}$ may be each independently selected from a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, carbazole, a triazinyl group, a dibenzofuranyl group, and a dibenzothiophenyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, and a dibenzofuranyl group, and a dibenzothiophenyl group, each substituted with at least one selected from a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, and a dibenzothiophenyl group;

xd1 to xd3 may be each independently selected from 0, 1, 2, and 3;

xd4 may be selected from 1, 2, 3, and 4.

The fluorescent dopant may include at least one selected from Compounds FD1 to FD8:

FD1

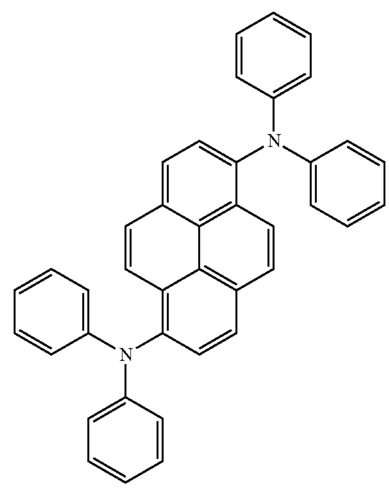

FD2

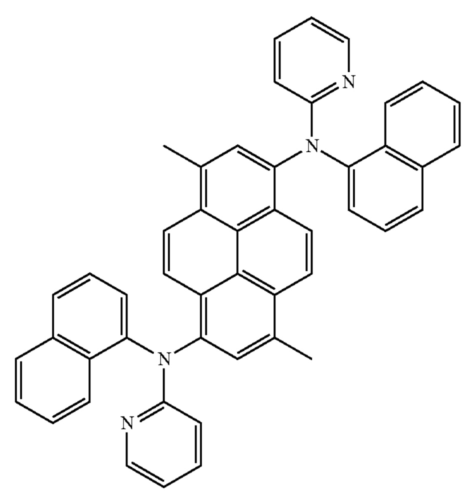

FD3
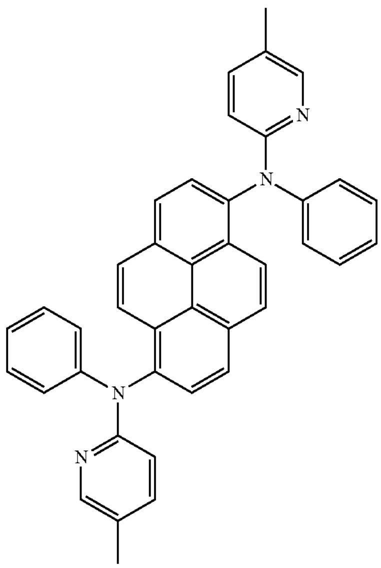
FD4
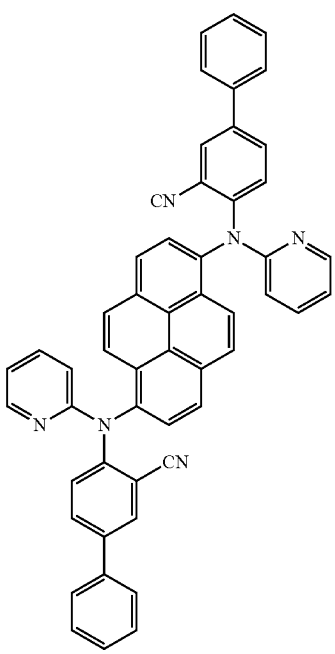
FD5
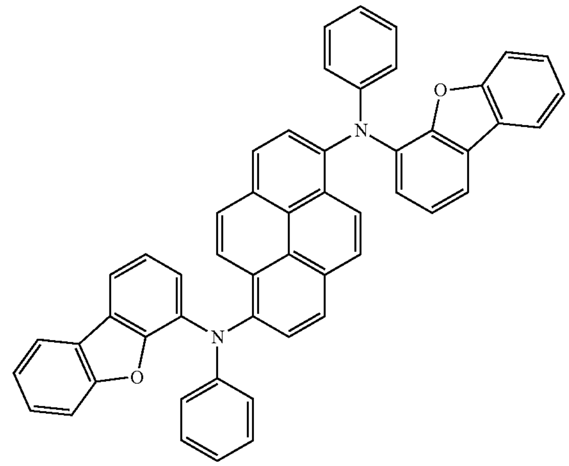
FD6
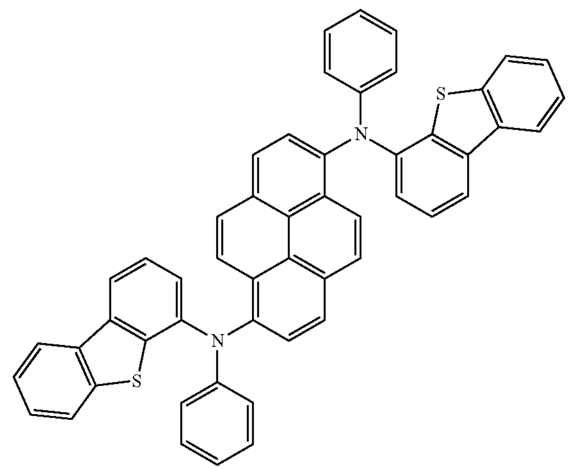
FD7
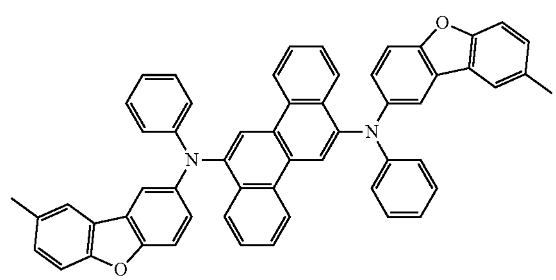
FD8
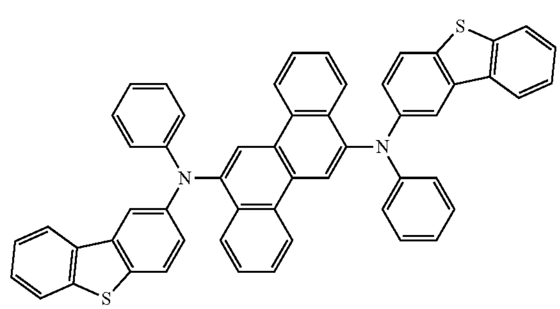

In the EML, an amount of the dopant may generally be about 0.01 parts by weight to about 15 parts by weight based on 100 parts by weight of the host, but it is not limited thereto.

A thickness of the EML may be about 100 Å to about 1000 Å, for example, about 200 Å to about 600 Å. In one embodiment, when the thickness of the EML is in the range described above, the EML has excellent light-emitting ability without a substantial increase in driving voltage.

The electron transport region may be disposed on the EML.

The electron transport region may include at least one of the HBL, the ETL, and the EIL, but it is not limited thereto.

For example, the electron transport region may have a structure in which the ETL, the ETL/EIL, or the HBL/ETL/EIL is sequentially layered on the EML, but it is not limited thereto.

The electron transport region may include an HBL. When the EML includes a phosphorescent dopant, the HBL may be formed to reduce or prevent diffusion of triplet excitons or holes into the ETL.

The HBL may include the at least one first material represented by Formula 1. When the hole blocking layer includes the at least one first material represented by Formula 1, the ETL may include the at least one second material represented by Formula 2, but it is not limited thereto. When the HBL includes the at least one first material represented by Formula 1 and the ETL includes the at least one second material represented by Formula 2, the HBL and the ETL may be adjacent to each other.

When the electron transport region includes the HBL, the HBL may be formed on the EML by using (utilizing) various suitable methods such as vacuum deposition, spin coating, casting, LB, inkjet printing, laser printing, or LITI. When the HBL is formed by vacuum deposition or spin coating, the deposition and coating conditions may be similar to those for forming the HIL, though the deposition and coating conditions may vary according to a compound that is used (utilized) to form the HBL.

The HBL may include, for example, the at least one second material represented by Formula 2 above.

A thickness of the HBL may be from about 20 Å to about 1,000 Å, and in some embodiments, may be from about 30 Å to about 300 Å. In one embodiment, when the thickness of the HBL is within these ranges, the HBL has a hole blocking transporting ability without a substantial increase in driving voltage. The electron transport region may include an ETL. The ETL may be formed on the EML or the HBL by using (utilizing) various suitable methods such as vacuum deposition, spin coating, casting, LB, inkjet printing, laser printing, or LITI. When the ETL is formed by vacuum deposition or spin coating, the deposition and coating conditions may be similar to those for forming the HIL, though the deposition and coating conditions may vary according to a compound that is used (utilized) to form the ETL.

The ETL may include at least one selected from the second material represented by Formula 2 above, BCP and Bphen above, and $Alq_3$, Balq, TAZ, and NTAZ below, and a compound represented by Formula 601 below.

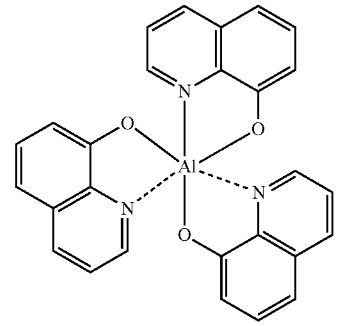

$Alq_3$

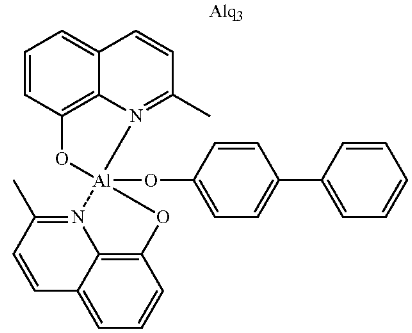

BAlq

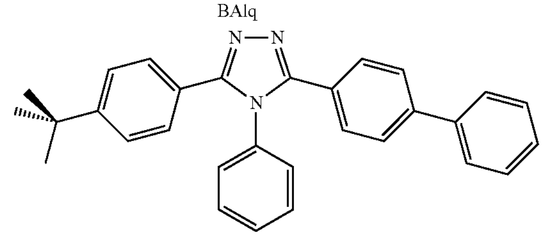

TAZ

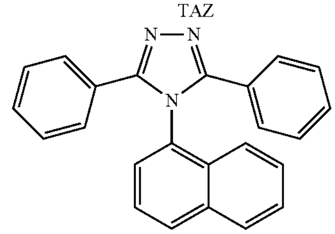

NTAZ

Formula 601

$$Ar_{601}—[(L_{601})_{xe1}—E_{601}]_{xe2}$$

In Formula 601, $Ar_{601}$ is at least one selected from a naphthalene group, a heptalene group, a fluorene group, a spiro-fluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, and an indenoanthracene group;

a naphthalene group, a heptalene group, a fluorene group, a spiro-fluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, and an indenoanthracene group, each substituted with at least one selected from deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a non-aromatic condensed polycyclic group, and —Si($Q_{301}$)($Q_{302}$)($Q_{303}$) (wherein, $Q_{301}$ to $Q_{303}$ may be each independently selected from hydrogen, a $C_1$-$C_{50}$ alkyl group, a $C_2$-$C_{60}$ alkenyl group, a $C_6$-$C_{60}$ aryl group, and a $C_2$-$C_{60}$ heteroaryl group);

description of $L_{601}$ may be the same as and understood by referring to the description of $L_{201}$ above;

$E_{601}$ may be selected from a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, and a dibenzocarbazolyl group; and a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, and a dibenzocarbazolyl group, each substituted with at least one selected from a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coroneryl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, and a dibenzocarbazolyl group;

xe1 may be selected from 0, 1, 2, and 3; and xe2 may be selected from 1, 2, 3, and 4.

Alternatively, the ETL may include at least one second material represented by Formula 2 above and/or at least one compound represented by Formula 602 below:

Formula 602

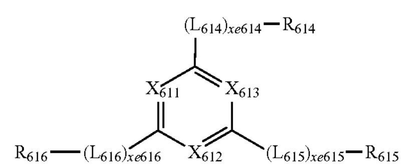

In Formula 602 above, $X_{611}$ may be N or C-$(L_{611})_{xe611}$-$R_{611}$; $X_{612}$ may be N or C-$(L_{612})_{xe612}$-$R_{612}$; $X_{613}$ may be N or C-$(L_{613})_{xe613}$-$R_{613}$, and at least one of $X_{611}$ to $X_{613}$ may be N;

description for each of $L_{611}$ to $L_{616}$ may be understood by referring to the description of $L_{201}$ herein;

$R_{611}$ to $R_{616}$ may be each independently selected from a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an azulenyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and xe611 to xe616 may be each independently selected from 0, 1, 2, and 3.

The compound represented by Formula 601 and the compound represented by Formula 602 above may include at least one selected from Compounds ET1 to ET15.

ET1

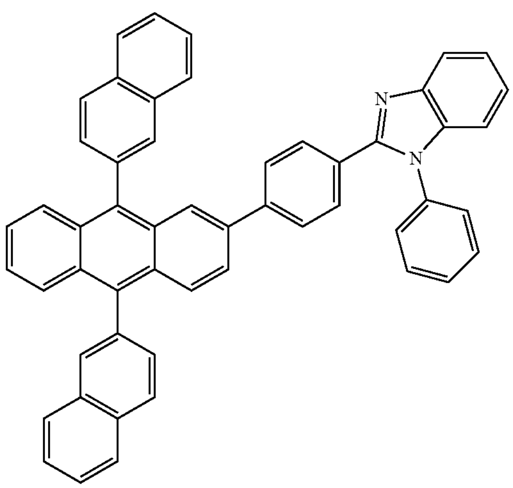

ET2

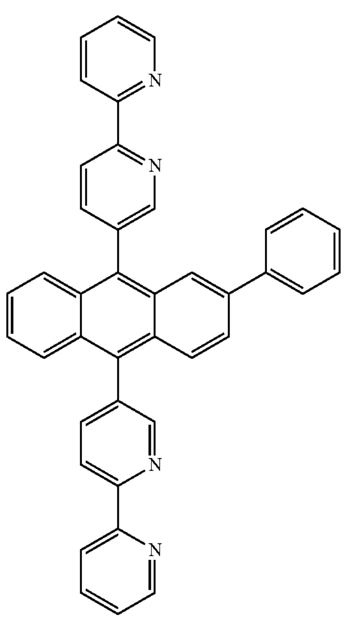

-continued

ET3

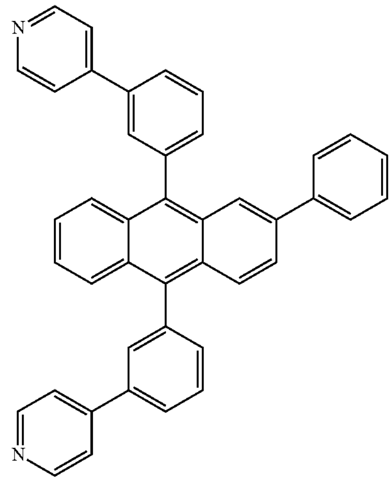

ET4

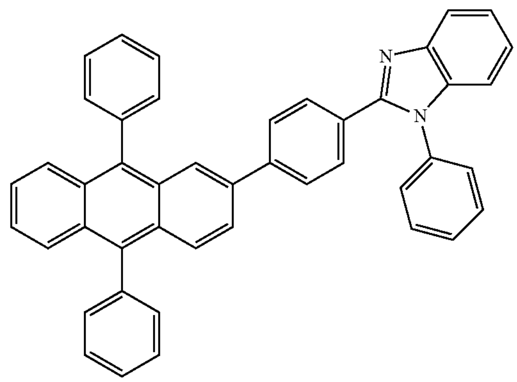

ET5

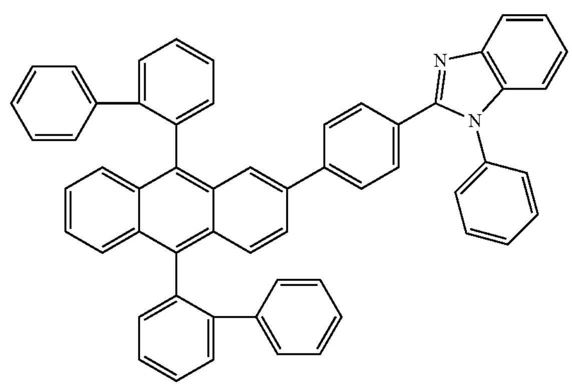

ET6

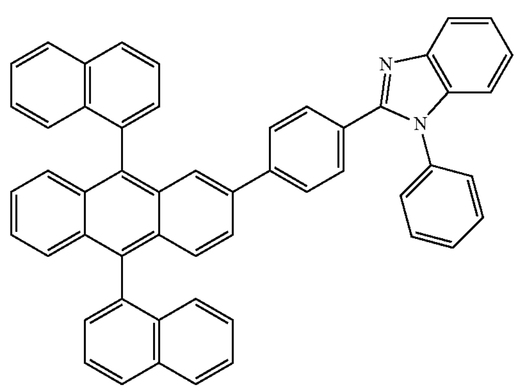

-continued
ET7
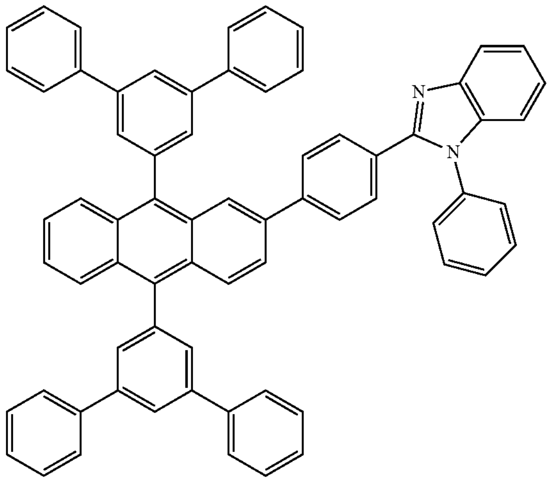
ET8
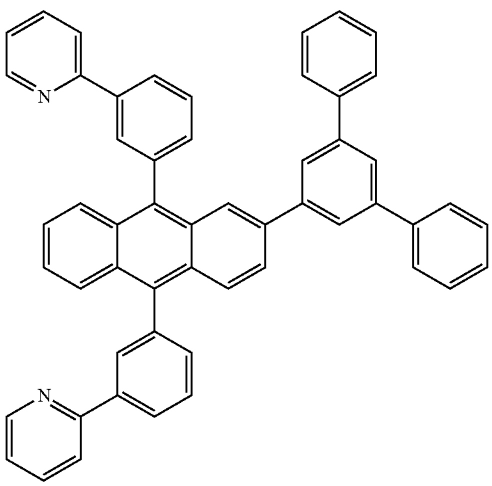
ET9
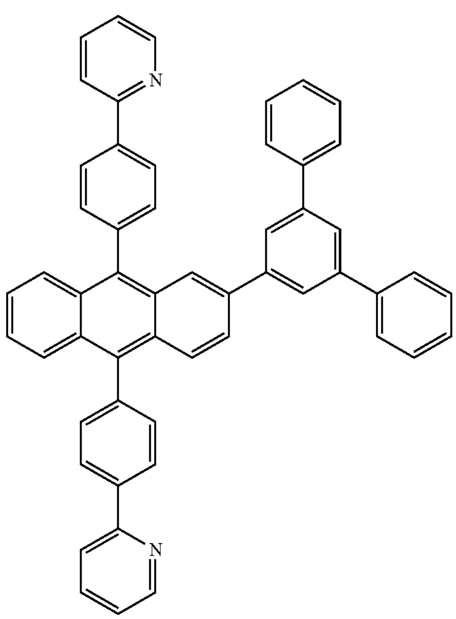
-continued
ET10
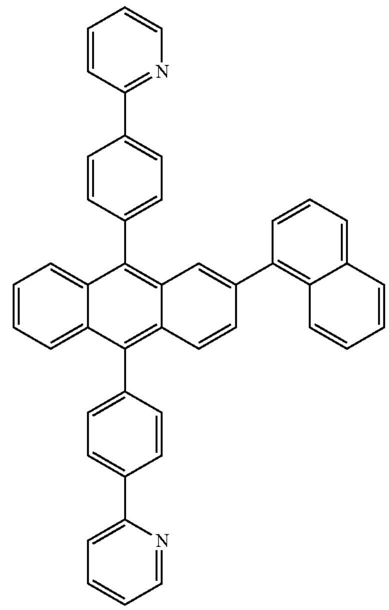
ET11
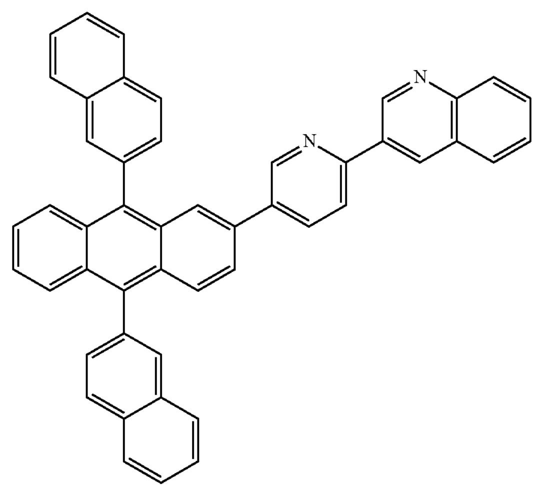
ET12
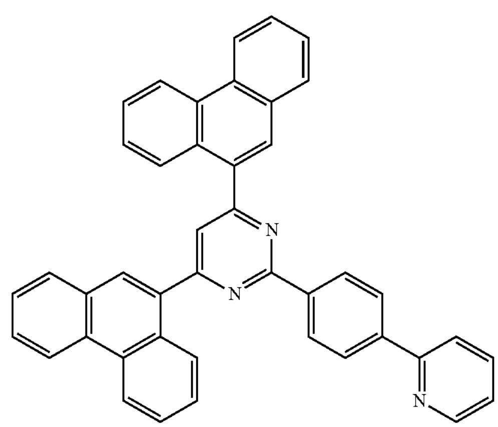

-continued

ET13

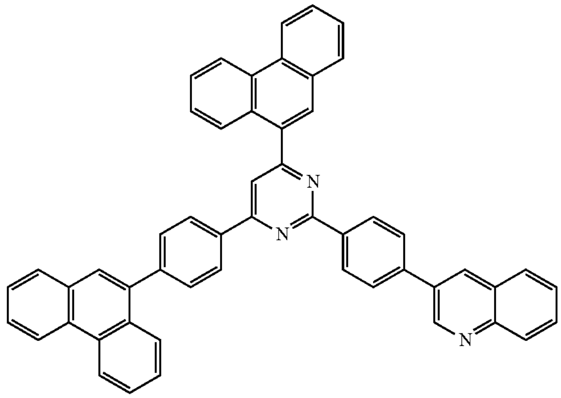

ET14

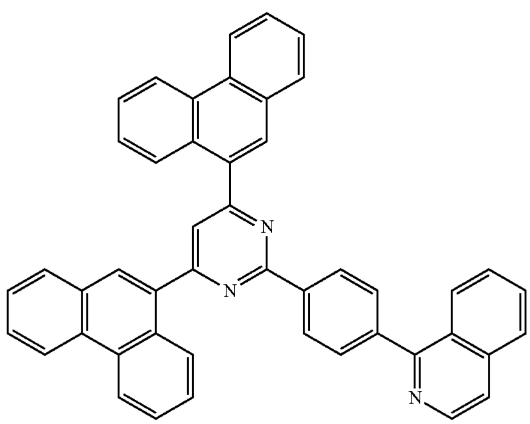

ET15

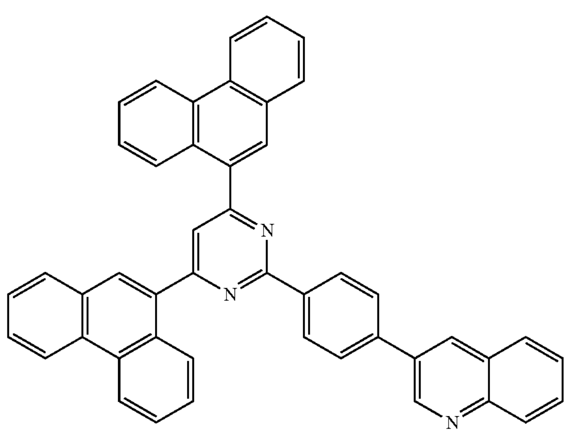

A thickness of the ETL may be about 100 Å to about 1000 Å, for example, about 150 Å to about 500 Å. In one embodiment, when the thickness of the ETL is within the range described above, the ETL has satisfactory electron transport characteristics without a substantial increase in driving voltage.

The ETL may further include a metal-containing material in addition to the material described above.

The metal-containing material may include a Li complex. The Li complex may, for example, include compounds ET-D1 (lithium quinolate: LiQ) or ET-D2 illustrated below.

ET-D1

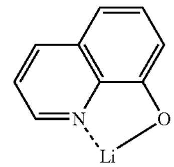

ET-D2

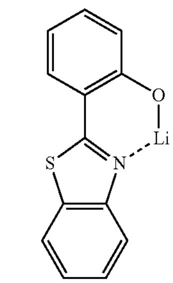

The electron transport region may include an EIL that facilitates electron injection from the second electrode 190.

The EIL may be formed on the ETL by using (utilizing) various suitable methods such as vacuum deposition, spin coating, casting, LB, inkjet printing, laser printing, or LITI. When the EIL is formed by vacuum deposition or spin coating, the deposition and coating conditions may be similar to those for forming the HIL. When the EIL is formed using (utilizing) vacuum deposition or spin coating, the deposition and coating conditions may be similar to those for the formation of the HIL.

The EIL may include at least one selected from LiF, NaCl, CsF, $Li_2O$, BaO, and LiQ.

A thickness of the EIL may be about 1 Å to about 100 Å, or about 3 Å to about 90 Å. In one embodiment, when the thickness of the EIL is within the range described above, satisfactory electron injection characteristics are obtained without a substantial increase in driving voltage.

The second electrode 190 is disposed on the organic layer 150 described above. The second electrode 190 may be a cathode, which is an electron injection electrode, in which a material of the second electrode 190 may be a metal, an alloy, an electroconductive compound, or a mixture thereof having a low work function. Detailed examples of the material of the second electrode 190 include lithium (Li), magnesium (Mg), aluminum (Al), aluminum-lithium (Al—Li), calcium (Ca), magnesium-indium (Mg—In), and magnesium-silver (Mg—Ag). Alternatively, ITO, IZO, or the like may be used (utilized) as the material of the second electrode 190. The second electrode 190 may be a reflective electrode, a semi-transmission electrode, or a transmission electrode.

Hereinabove, the organic light-emitting device is described with reference to the drawing, but it is not limited thereto.

As used herein, the $C_1$-$C_{60}$ alkyl group refers to a linear or branched aliphatic $C_1$-$C_{60}$ hydrocarbon monovalent group, and detailed examples thereof include a methyl group, an ethyl group, a propyl group, an isobutyl group, a sec-butyl group, a tert-butyl group, a pentyl group, an iso-amyl group, and a hexyl group. As used herein, the $C_1$-$C_{60}$ alkylene group refers to a divalent group having the same structure as the $C_1$-$C_{60}$ alkyl group.

As used herein, the $C_1$-$C_{60}$ alkoxy group is a monovalent group having a formula of —$OA_{101}$ (wherein, $A_{101}$ is the $C_1$-$C_{60}$ alkyl group) and detailed examples thereof include a methoxy group, an ethoxy group, and an isopropyloxy group.

As used herein, the $C_2$-$C_{60}$ alkenyl group refers to a $C_2$-$C_{60}$ alkyl group having one or more carbon-carbon double bonds at a center or end thereof. Examples of the unsubstituted $C_2$-$C_{60}$ alkenyl group are an ethenyl group, a propenyl group, and a butenyl group. As used herein, the $C_2$-$C_{60}$ alkenylene group refers to a divalent group having the same structure as the $C_2$-$C_{60}$ alkenyl group.

As used herein, the $C_2$-$C_{60}$ alkynyl group refers to an unsubstituted $C_2$-$C_{60}$ alkyl group having one or more carbon-carbon triple bonds at a center or end thereof. Examples of the $C_2$-$C_{60}$ alkynyl group are an ethynyl group, a propynyl group, and the like. As used herein, the $C_2$-$C_{60}$ alkynylene group refers to a divalent group having the same structure as the $C_2$-$C_{60}$ alkynyl group.

As used herein, the $C_3$-$C_{10}$ cycloalkyl group refers to a $C_3$-$C_{10}$ monovalent hydrocarbon monocyclic group, and detailed examples thereof include a cyclopropyl group, a cyclobutyl group, a cyclopentyl group, a cyclohexyl group, and a cycloheptyl group. As used herein, the $C_3$-$C_{10}$ cycloalkylene group refers to a divalent group having the same structure as the $C_3$-$C_{10}$ cycloalkyl group.

As used herein, the $C_2$-$C_{10}$ heterocycloalkyl group refers to a $C_2$-$C_{10}$ monovalent monocyclic group including at least one selected from N, O, P, and S as a ring-forming atom, and detailed examples thereof include a tetrahydrofuranyl group and a tetrahydrothiophenyl group. As used herein, the $C_2$-$C_{10}$ heterocycloalkylene group refers to a divalent group having the same structure as the $C_2$-$C_{10}$ heterocycloalkyl group.

As used herein, the $C_3$-$C_{10}$ cycloalkenyl group refers to a $C_3$-$C_{10}$ monovalent monocyclic group having at least one double bond in a ring but without aromaticity, and detailed examples thereof include a cyclopentenyl group, a cyclohexenyl group, and a cycloheptenyl group. As used herein, the $C_3$-$C_{10}$ cycloalkenylene group refers to a divalent group having the same structure as the $C_3$-$C_{10}$ cycloalkenyl group.

As used herein, the $C_2$-$C_{10}$ heterocycloalkenyl group refers to a $C_2$-$C_{10}$ monovalent monocyclic group including at least one selected from N, O, P, and S as a ring-forming atom, and includes at least one double bond in the ring. Detailed examples of the $C_2$-$C_{10}$ heterocycloalkenyl group include a 2,3-hydrofuranyl group and a 2,3-hydrothiophenyl group. As used herein, the $C_2$-$C_{10}$ heterocycloalkenylene group refers to a divalent group having the same structure as the $C_2$-$C_{10}$ heterocycloalkenyl group.

As used herein, the $C_6$-$C_{60}$ aryl group refers to a $C_6$-$C_{60}$ monovalent group having a carbocyclic aromatic system, and the $C_6$-$C_{60}$ arylene group refers to a divalent group having a $C_6$-$C_{60}$ carbocyclic aromatic system. Examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group include two or more rings, the two or more rings may be fused to each other.

As used herein, the $C_2$-$C_{60}$ heteroaryl group refers to a monovalent group having a $C_2$-$C_{60}$ carbocyclic aromatic system including at least one heteroatom selected from N, O, P, and S as a ring-forming atom, and the $C_2$-$C_{60}$ heteroarylene group refers to a divalent group having a $C_2$-$C_{60}$ carbocyclic aromatic system including at least one heteroatom selected from N, O, P, and S as a ring-forming atom. Examples of the $C_2$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_2$-$C_{60}$ heteroaryl group and the $C_2$-$C_{60}$ heteroarylene group include two or more rings, the two or more rings may be fused to each other.

As used herein, the $C_6$-$C_{60}$ aryloxy group refers to a group represented by —$OA_{102}$ (wherein, $A_{102}$ is the $C_6$-$C_{60}$ aryl group), and the $C_6$-$C_{60}$ arythio group refers to a group represented by —$SA_{103}$ (wherein, $A_{103}$ is the $C_6$-$C_{60}$ aryl group).

As used herein, the monovalent non-aromatic condensed polycyclic group refers to a monovalent group having two or more rings that are fused to each other, including only carbon as a ring forming atom (for example, carbon number may be 8 to 60), wherein the entire molecule does not have aromacity. Examples of the non-aromatic condensed polycyclic group include a fluorenyl group and the like. As used herein, the divalent non-aromatic condensed polycyclic group may refer to a divalent group having the same structure as the monovalent non-aromatic condensed polycyclic group.

As used herein, the monovalent non-aromatic hetero-condensed polycyclic group refers to a monovalent group having two or more rings that are fused to each other, including a heteroatom selected from N, O, P, and S as a ring-forming atom, in addition to carbon (for example, carbon number may be 2 to 60), wherein the entire molecule does not have aromaticity. Examples of the monovalent non-aromatic hetero-condensed polycyclic group includes a carbazolyl group and the like. As used herein, the divalent non-aromatic hetero-condensed polycyclic group refers to a divalent group having the same structure as the monovalent non-aromatic hetero-condensed polycyclic group.

As used herein, the term "Ph" refers to a phenyl group, the term "Me" refers to a methyl group, the term "Et" refers to an ethyl group, and the term "ter-Bu" or "Bu$^t$" refers to a tert-butyl group.

EXAMPLES

100A

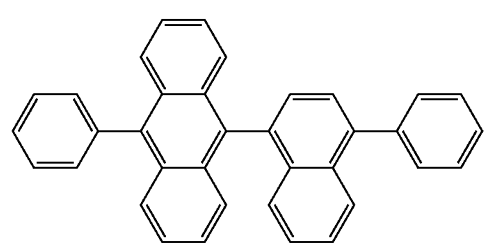

101A

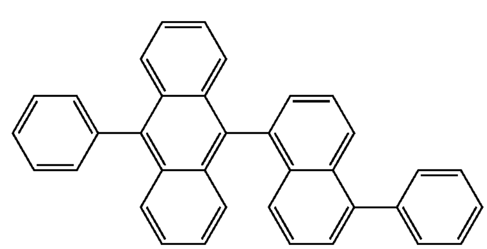

-continued
102A
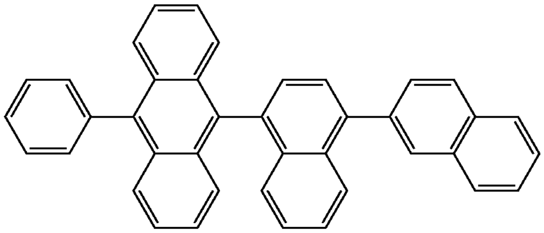
103A
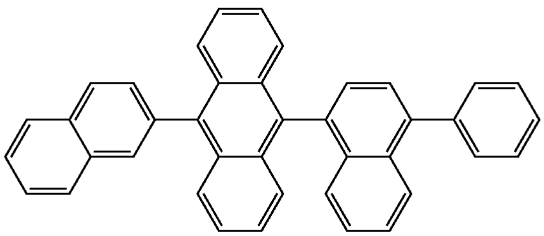
104A
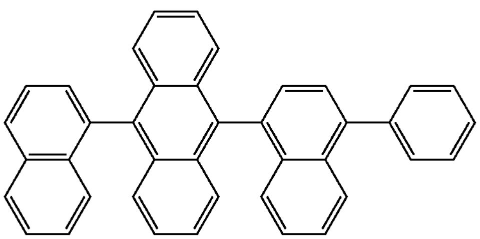
105A
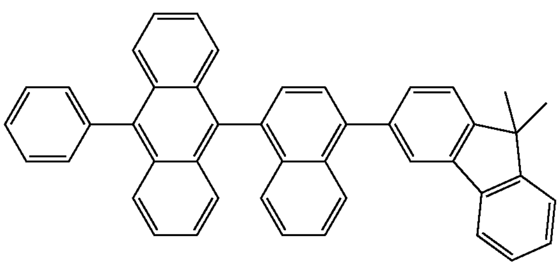
106A
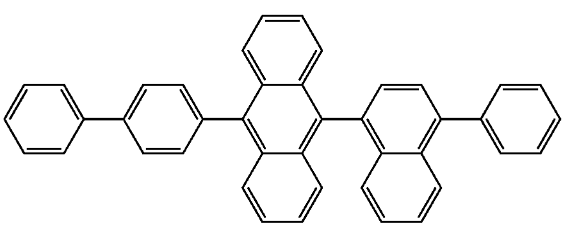
107A
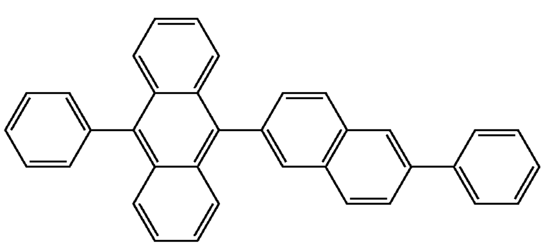
-continued
108A
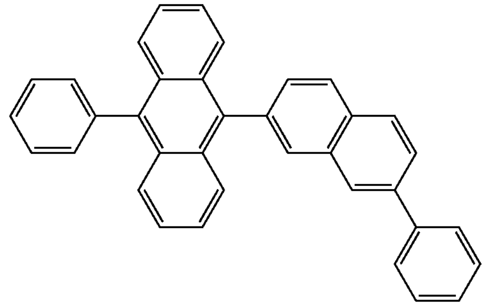
200B
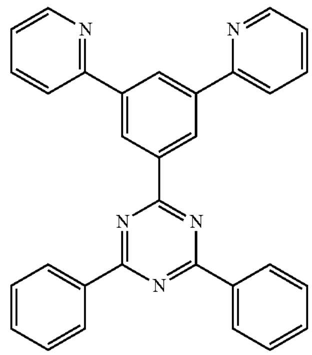
202B
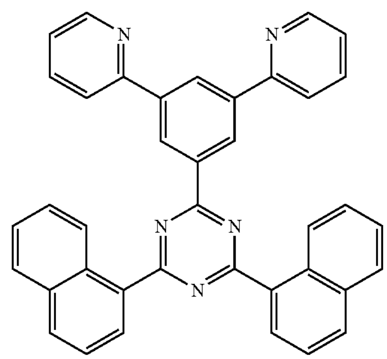
201B
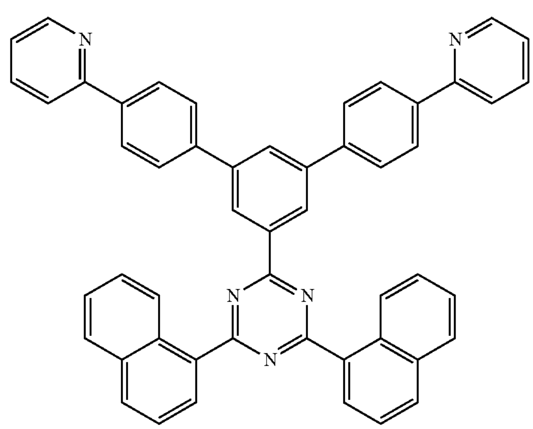

-continued

203B

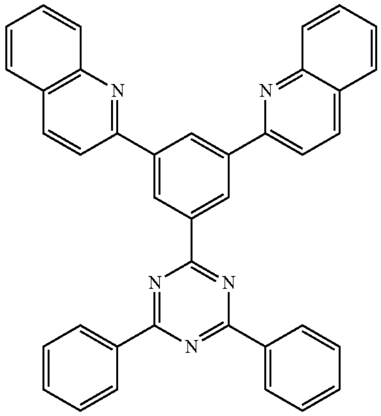

204B

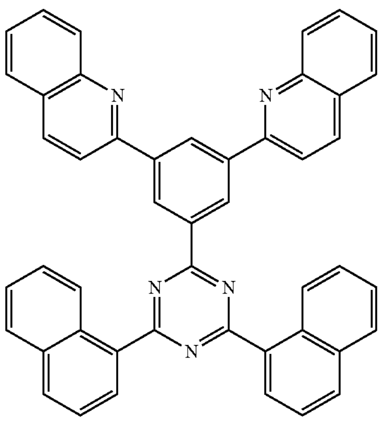

205B

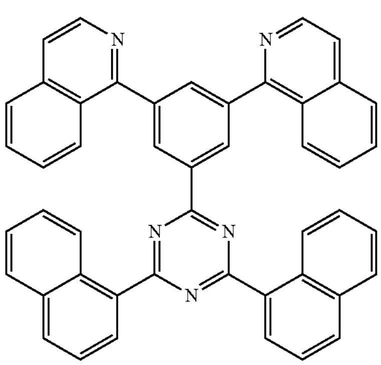

-continued

206B

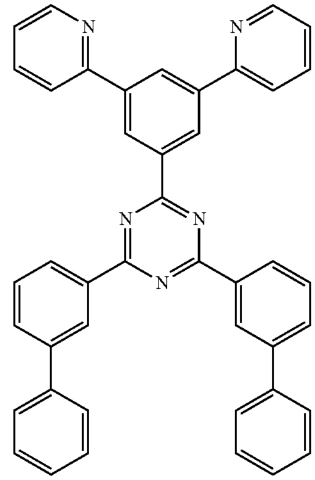

207B

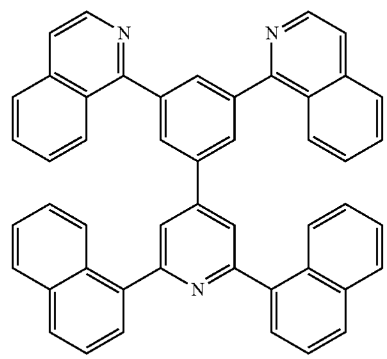

208B

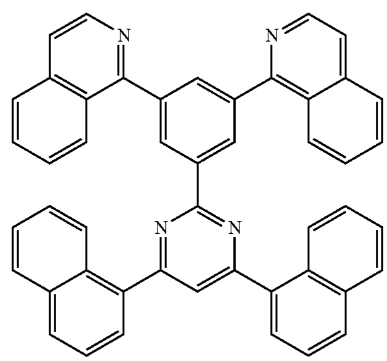

Example 1

As an anode, a 15 Ω/cm² ITO glass substrate (1200 Å, Corning) was cut into a size of about 50 mm×50 mm×0.7 mm, ultrasonically washed with isopropyl alcohol for 5 minutes and pure water for 5 minutes, irradiated with UV for 30 minutes, exposed to ozone, and then loaded onto a vacuum deposition device.

HT13 was deposited on the anode to form an HIL having a thickness of 500 Å, HT3 was deposited thereon as a hole-transporting compound to form an HTL having a thickness of 450 Å. Thereafter, Compound 100A and FD1 were co-deposited at a weight ratio of 95:5 to form an EML having a thickness of 300 Å.

Thereafter, Compound 200B was deposited on the EML as an ETL into a thickness of 250 Å, LiF, which is a halogenated alkaline metal, was deposited as an EIL on the ETL into a thickness of 10 Å, and then Al was vacuum deposited into a thickness of 1500 Å (a negative electrode) to manufacture an organic light-emitting device.

Example 2

An organic light-emitting device was manufactured in the same manner as in Example 1, except that when forming an ETL, Compound 201B was used (utilized) instead of Compound 200B.

Example 3

An organic light-emitting device was manufactured in the same manner as in Example 1, except that when forming an ETL, Compound 202B was used (utilized) instead of Compound 200B.

Example 4

An organic light-emitting device was manufactured in the same manner as in Example 1, except that when forming an ETL, Compound 203B was used (utilized) instead of Compound 200B.

Example 5

An organic light-emitting device was manufactured in the same manner as in Example 1, except that when forming an ETL, Compound 204B was used (utilized) instead of Compound 200B.

Example 6

An organic light-emitting device was manufactured in the same manner as in Example 1, except that when forming an ETL, Compound 205B was used (utilized) instead of Compound 200B.

Example 7

An organic light-emitting device was manufactured in the same manner as in Example 1, except that when forming an ETL, Compound 206B was used (utilized) instead of Compound 200B.

Example 8

An organic light-emitting device was manufactured in the same manner as in Example 1, except that when forming an ETL, Compound 207B was used (utilized) instead of Compound 200B.

Example 9

An organic light-emitting device was manufactured in the same manner as in Example 1, except that when forming an ETL, Compound 208B was used (utilized) instead of Compound 200B.

Example 10

An organic light-emitting device was manufactured in the same manner as in Example 1, except that Compound 101A was used (utilized) instead of Compound 100A when forming an EML, and Compound 205B was used (utilized) instead of Compound 200B when forming an ETL.

Example 11

An organic light-emitting device was manufactured in the same manner as in Example 1, except that Compound 102A was used (utilized) instead of Compound 100A when forming an EML, and Compound 205B was used (utilized) instead of Compound 200B when forming an ETL.

Example 12

An organic light-emitting device was manufactured in the same manner as in Example 1, except that Compound 103A was used (utilized) instead of Compound 100A when forming an EML, and Compound 205B was used (utilized) instead of Compound 200B when forming an ETL.

Example 13

An organic light-emitting device was manufactured in the same manner as in Example 1, except that Compound 104A was used (utilized) instead of Compound 100A when forming an EML, and Compound 205B was used (utilized) instead of Compound 200B when forming an ETL.

Example 14

An organic light-emitting device was manufactured in the same manner as in Example 1, except that Compound 105A was used (utilized) instead of Compound 100A when forming an EML, and Compound 205B was used (utilized) instead of Compound 200B when forming an ETL.

Example 15

An organic light-emitting device was manufactured in the same manner as in Example 1, except that Compound 106A was used (utilized) instead of Compound 100A when forming an EML, and Compound 205B was used (utilized) instead of Compound 200B when forming an ETL.

Example 16

An organic light-emitting device was manufactured in the same manner as in Example 1, except that Compound 107A was used (utilized) instead of Compound 100A when forming an EML, and Compound 205B was used (utilized) instead of Compound 200B when forming an ETL.

Example 17

An organic light-emitting device was manufactured in the same manner as in Example 1, except that Compound 108A was used (utilized) instead of Compound 100A when forming an EML, and Compound 205B was used (utilized) instead of Compound 200B when forming an ETL.

Comparative Example 1

An organic light-emitting device was manufactured in the same manner as in Example 1, except that Compound H1 below was used (utilized) instead of Compound 100A when forming an EML, and Compound 205B was used (utilized) instead of Compound 200B when forming an ETL.

Compound H1

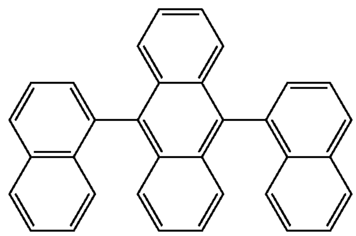

Comparative Example 2

An organic light-emitting device was manufactured in the same manner as in Example 1, except that Compound H2 below was used (utilized) instead of Compound 100A when forming an EML, and Compound 205B was used (utilized) instead of Compound 200B when forming an ETL.

Compound H2

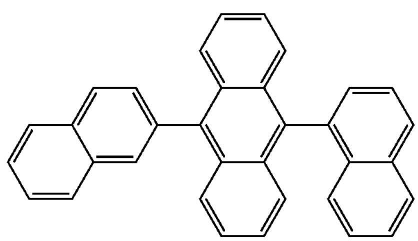

Example 18

As an anode, a 15 Ω/cm$^2$ ITO glass substrate (1200 Å, Corning) was cut into a size of about 50 mm×50 mm×0.7 mm, ultrasonically washed with isopropyl alcohol for 5 minutes and pure water for 5 minutes, irradiated with UV for 30 minutes, exposed to ozone, and then loaded onto a vacuum deposition device.

HT13 was deposited on the anode to form an HIL having a thickness of 500 Å, HT3 was deposited thereon as a hole-transporting compound to form an HTL having a thickness of 450 Å. Thereafter, Compound 100A and FD1 were co-deposited at a weight ratio of 95:5 to form an EML having a thickness of 300 Å.

Thereafter, Compound 200B and Liq were deposited at a weight ratio of 50:50 on the EML as an ETL into a thickness of 250 Å, LiF, which is a halogenated alkaline metal, was deposited as an EIL on the ETL into a thickness of 10 Å, and then Al was vacuum deposited into a thickness of 1500 Å (a negative electrode) to manufacture an organic light-emitting device.

Example 19

An organic light-emitting device was manufactured in the same manner as in Example 18, except that Compound 201B was used (utilized) instead of Compound 200B when forming an ETL.

Example 20

An organic light-emitting device was manufactured in the same manner as in Example 18, except that Compound 202B was used (utilized) instead of Compound 200B when forming an ETL.

Example 21

An organic light-emitting device was manufactured in the same manner as in Example 18, except that Compound 203B was used (utilized) instead of Compound 200B when forming an ETL.

Example 22

An organic light-emitting device was manufactured in the same manner as in Example 18, except that Compound 204B was used (utilized) instead of Compound 200B when forming an ETL.

Example 23

An organic light-emitting device was manufactured in the same manner as in Example 18, except that Compound 205B was used (utilized) instead of Compound 200B when forming an ETL.

Example 24

An organic light-emitting device was manufactured in the same manner as in Example 18, except that Compound 206B was used (utilized) instead of Compound 200B when forming an ETL.

Example 25

An organic light-emitting device was manufactured in the same manner as in Example 18, except that Compound 207B was used (utilized) instead of Compound 200B when forming an ETL.

Example 26

An organic light-emitting device was manufactured in the same manner as in Example 18, except that Compound 208B was used (utilized) instead of Compound 200B when forming an ETL.

Comparative Example 3

An organic light-emitting device was manufactured in the same manner as in Example 18, except that Compound H1 below was used (utilized) instead of Compound 100A when forming an EML, and Compound 201B was used (utilized) instead of Compound 200B when forming an ETL.

Compound H1

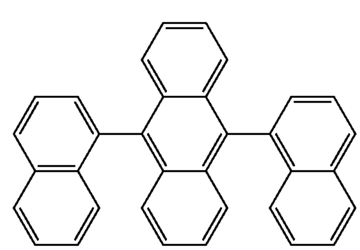

Comparative Example 4

An organic light-emitting device was manufactured in the same manner as in Example 18, except that Compound H2 below was used (utilized) instead of Compound 100A when forming an EML, and Compound 201B was used (utilized) instead of Compound 200B when forming an ETL.

Compound H2

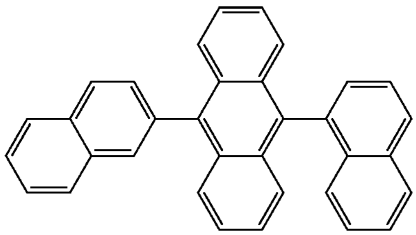

Example 27

As an anode, a 15 Ω/cm$^2$ ITO glass substrate (1200 Å, Corning) was cut into a size of about 50 mm×50 mm×0.7 mm, ultrasonically washed with isopropyl alcohol for 5 minutes and pure water for 5 minutes, irradiated with UV for 30 minutes, exposed to ozone, and then loaded onto a vacuum deposition device.

HT13 was deposited on the anode to form an HIL having a thickness of 500 Å, HT3 was deposited thereon as a hole-transporting compound to form an HTL having a thickness of 450 Å. Thereafter, Compound 100A and FD1 were co-deposited at a weight ratio of 95:5 to form an EML having a thickness of 300 Å.

Thereafter, Compound 200B was deposited as an HBL on the EML into a thickness of 100 Å, Bphen and Liq were deposited at a weight ratio of 50:50 on the EML as an ETL into a thickness of 150 Å, LiF, which is a halogenated alkaline metal, was deposited as an EIL on the ETL into a thickness of 10 Å, and then Al was vacuum deposited thereon into a thickness of 1500 Å (a negative electrode) to manufacture an organic light-emitting device.

Example 28

An organic light-emitting device was manufactured in the same manner as in Example 27, except that Compound 201B was used (utilized) instead of Compound 200B when forming an ETL.

Example 29

An organic light-emitting device was manufactured in the same manner as in Example 27, except that Compound 202B was used (utilized) instead of Compound 200B when forming an ETL.

Example 30

An organic light-emitting device was manufactured in the same manner as in Example 27, except that Compound 203B was used (utilized) instead of Compound 200B when forming an ETL.

Example 31

An organic light-emitting device was manufactured in the same manner as in Example 27, except that Compound 204B was used (utilized) instead of Compound 200B when forming an ETL.

Example 32

An organic light-emitting device was manufactured in the same manner as in Example 27, except that Compound 205B was used (utilized) instead of Compound 200B when forming an ETL.

Example 33

An organic light-emitting device was manufactured in the same manner as in Example 27, except that Compound 206B was used (utilized) instead of Compound 200B when forming an ETL.

Example 34

An organic light-emitting device was manufactured in the same manner as in Example 27, except that Compound 207B was used (utilized) instead of Compound 200B when forming an ETL.

Example 35

An organic light-emitting device was manufactured in the same manner as in Example 27, except that Compound 208B was used (utilized) instead of Compound 200B when forming an ETL.

Example 36

An organic light-emitting device was manufactured in the same manner as in Example 27, except that Compound 101A was used (utilized) instead of Compound 100A when forming an EML, and Compound 205B was used (utilized) instead of Compound 200B when forming an ETL.

Example 37

An organic light-emitting device was manufactured in the same manner as in Example 27, except that Compound 102A was used (utilized) instead of Compound 100A when forming an EML, and Compound 205B was used (utilized) instead of Compound 200B when forming an ETL.

Example 38

An organic light-emitting device was manufactured in the same manner as in Example 27, except that Compound 103A was used (utilized) instead of Compound 100A when forming an EML, and Compound 205B was used (utilized) instead of Compound 200B when forming an ETL.

Example 39

An organic light-emitting device was manufactured in the same manner as in Example 27, except that Compound 104A was used (utilized) instead of Compound 100A when forming an EML, and Compound 205B was used (utilized) instead of Compound 200B when forming an ETL.

Example 40

An organic light-emitting device was manufactured in the same manner as in Example 27, except that Compound 105A was used (utilized) instead of Compound 100A when forming an EML, and Compound 205B was used (utilized) instead of Compound 200B when forming an ETL.

Example 41

An organic light-emitting device was manufactured in the same manner as in Example 27, except that Compound 106A was used (utilized) instead of Compound 100A when forming an EML, and Compound 205B was used (utilized) instead of Compound 200B when forming an ETL.

Example 42

An organic light-emitting device was manufactured in the same manner as in Example 27, except that Compound 107A was used (utilized) instead of Compound 100A when forming an EML, and Compound 205B was used (utilized) instead of Compound 200B when forming an ETL.

Example 43

An organic light-emitting device was manufactured in the same manner as in Example 27, except that Compound 108A was used (utilized) instead of Compound 100A when forming an EML, and Compound 205B was used (utilized) instead of Compound 200B when forming an ETL.

Comparative Example 5

An organic light-emitting device was manufactured in the same manner as in Example 27, except that Compound H1 below was used (utilized) instead of Compound 100A when forming an EML, and Compound 205B was used (utilized) instead of Compound 200B when forming an ETL.

Compound H1

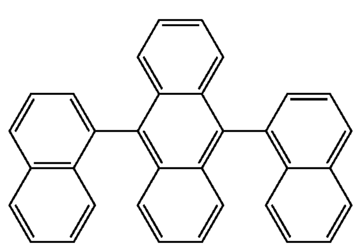

Comparative Example 6

An organic light-emitting device was manufactured in the same manner as in Example 27, except that Compound H2 below was used (utilized) instead of Compound 100A when forming an EML, and Compound 205B was used (utilized) instead of Compound 200B when forming an ETL.

Compound H2

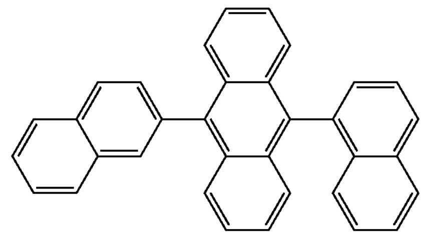

Evaluation Example

Efficiency and T80 lifespan of the organic light-emitting devices in Examples 1 to 43 and Comparative Examples 1 to 6 were evaluated by using (utilizing) a PR650 spectroscan source measurement unit (a product of PhotoResearch). T80 refers to an amount of time taken for the level of brightness to reach a level that is 80% of the initial level of brightness. Results are as shown in Table 1, Table 2 and Table 3 below.

TABLE 1

| | EML | ETL | Efficiency (cd/A) | T80 lifespan (time) |
|---|---|---|---|---|
| Example 1 | 100A | 200B | 5.2 | 120 |
| Example 2 | 100A | 201B | 5.3 | 130 |
| Example 3 | 100A | 202B | 5.5 | 110 |
| Example 4 | 100A | 203B | 5.4 | 100 |
| Example 5 | 100A | 204B | 5.5 | 110 |
| Example 6 | 100A | 205B | 5.7 | 120 |
| Example 7 | 100A | 206B | 5.6 | 100 |
| Example 8 | 100A | 207B | 5.5 | 130 |
| Example 9 | 100A | 208B | 5.7 | 120 |
| Example 10 | 101A | 205B | 5.6 | 120 |
| Example 11 | 102A | 205B | 5.8 | 130 |
| Example 12 | 103A | 205B | 5.4 | 120 |
| Example 13 | 104A | 205B | 5.3 | 120 |
| Example 14 | 105A | 205B | 5.8 | 110 |
| Example 15 | 106A | 205B | 5.2 | 100 |
| Example 16 | 107A | 205B | 5.5 | 130 |
| Example 17 | 108A | 205B | 5.4 | 120 |
| Comparative Example 1 | H1 | 205B | 4.9 | 70 |
| Comparative Example 2 | H2 | 205B | 4.7 | 80 |

TABLE 2

| | EML | ETL | Efficiency (cd/A) | T80 lifespan (time) |
|---|---|---|---|---|
| Example 18 | 100A | 200B:Liq | 5.1 | 130 |
| Example 19 | 100A | 201B:Liq | 5.3 | 140 |
| Example 20 | 100A | 202B:Liq | 5.4 | 120 |
| Example 21 | 100A | 203B:Liq | 5.4 | 120 |
| Example 22 | 100A | 204B:Liq | 5.4 | 110 |
| Example 23 | 100A | 205B:Liq | 5.6 | 120 |
| Example 24 | 100A | 206B:Liq | 5.5 | 110 |
| Example 25 | 100A | 207B:Liq | 5.4 | 140 |
| Example 26 | 100A | 208B:Liq | 5.7 | 120 |
| Comparative Example 3 | H1 | 201B:Liq | 4.8 | 70 |
| Comparative Example 4 | H2 | 201B:Liq | 4.6 | 80 |

TABLE 3

| | EML | HBL | ETL | Efficiency (cd/A) | Lifespan (time) |
|---|---|---|---|---|---|
| Example 27 | 100A | 200B | BPhen:Liq | 5.3 | 120 |
| Example 28 | 100A | 201B | BPhen:Liq | 5.3 | 130 |
| Example 29 | 100A | 202B | BPhen:Liq | 5.4 | 120 |
| Example 30 | 100A | 203B | BPhen:Liq | 5.3 | 110 |
| Example 31 | 100A | 204B | BPhen:Liq | 5.4 | 120 |
| Example 32 | 100A | 205B | BPhen:Liq | 5.6 | 130 |
| Example 33 | 100A | 206B | BPhen:Liq | 5.5 | 100 |
| Example 34 | 100A | 207B | BPhen:Liq | 5.3 | 120 |
| Example 35 | 100A | 208B | BPhen:Liq | 5.5 | 130 |
| Example 36 | 101A | 205B | BPhen:Liq | 5.6 | 140 |
| Example 37 | 102A | 205B | BPhen:Liq | 5.5 | 140 |
| Example 38 | 103A | 205B | BPhen:Liq | 5.5 | 130 |
| Example 39 | 104A | 205B | BPhen:Liq | 5.4 | 120 |
| Example 40 | 105A | 205B | BPhen:Liq | 5.7 | 120 |
| Example 41 | 106A | 205B | BPhen:Liq | 5.1 | 110 |
| Example 42 | 107A | 205B | BPhen:Liq | 5.6 | 130 |
| Example43 | 108A | 205B | BPhen:Liq | 5.6 | 120 |
| Comparative Example5 | H1 | 205B | BPhen:Liq | 4.9 | 70 |
| Comparative Example6 | H2 | 205B | BPhen:Liq | 4.7 | 80 |

According to Tables 1 to 3, the organic light-emitting devices in Examples 1 to 43 showed higher efficiency and longer lifespan than the organic light-emitting devices in Comparative Examples 1 to 6.

As described above, according to the one or more of the above embodiments of the present invention, an organic light-emitting device according to an embodiment of the present invention may show high efficiency, high heat resistance, and a long lifespan.

It should be understood that the example embodiments described therein should be considered in a descriptive sense only and not for purposes of limitation. Descriptions of features or aspects within each embodiment should typically be considered as available for other similar features or aspects in other embodiments.

While one or more embodiments of the present invention have been described with reference to the FIGURE, it will be understood by those of ordinary skill in the art that various changes in form and details may be made therein without departing from the spirit and scope of the present invention as defined by the following claims, and equivalents thereof.

What is claimed is:

1. An organic light-emitting device comprising:

a first electrode;

a second electrode facing the first electrode; and an organic layer between the first electrode and the second electrode, wherein the organic layer comprises at least one first material represented by Formula 1 below, and at least one second material represented by Formula 2 below:

Formula 1

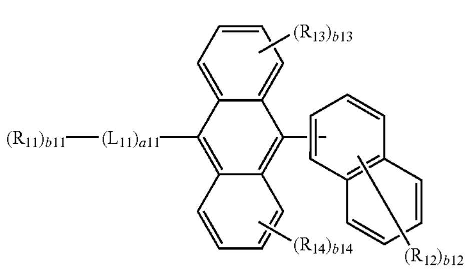

-continued

Formula 2

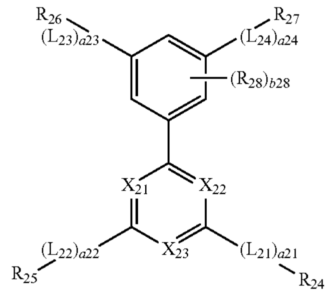

in Formulae 1 and 2, $X_{21}$ is $CR_{21}$ or a nitrogen atom (N); $X_{22}$ is $CR_{22}$ or N; $X_{23}$ is $CR_{23}$ or N;

$L_{11}$, and $L_{21}$ to $L_{24}$ are each independently selected from a substituted or unsubstituted $C_6$-$C_{60}$ arylene group and a substituted or unsubstituted $C_1$-$C_{60}$ heteroarylene group;

a11, and a21 to a24 are each independently 0 or 1;

$R_{11}$, $R_{12}$ and $R_{24}$ to $R_{27}$ are each independently selected from a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed hetero-polycyclic group;

b11 and b12 are each independently selected from 1, 2, and 3;

$R_{13}$, $R_{14}$, $R_{21}$ to $R_{23}$, and $R_{28}$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_1$-$C_{60}$ alkoxy group, a substituted or unsubstituted $C_3$-$C_{10}$ cycloalkyl group, a substituted or unsubstituted $C_6$-$C_{60}$ aryl group, a substituted or unsubstituted $C_6$-$C_{60}$ aryloxy group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed hetero-polycyclic group, and —Si($Q_1$)($Q_2$)($Q_3$);

b13 and b14 are each independently selected from 1, 2, 3, and 4;

b28 is selected from 1, 2, and 3;

at least one substituent of the substituted $C_6$-$C_{60}$ arylene group, substituted $C_1$-$C_{60}$ heteroarylene group, substituted $C_6$-$C_{60}$ aryl group, substituted $C_1$-$C_{60}$ heteroaryl group, substituted monovalent non-aromatic condensed polycyclic group, substituted monovalent non-aromatic condensed hetero-polycyclic group, substituted $C_1$-$C_{60}$ alkyl group, substituted $C_1$-$C_{60}$ alkoxy group, substituted $C_3$-$C_{10}$ cycloalkyl group, and substituted $C_6$-$C_{60}$ aryloxy group is selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arythio group, a $C_1$-$C_{60}$ heteroaryl group, a monovalent non-aromatic condensed polycyclic group, a monovalent non-aromatic condensed hetero-polycyclic group, and —Si($Q_{11}$)($Q_{12}$)($Q_{13}$);

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arythio group, a $C_1$-$C_{60}$ heteroaryl group, a monovalent non-aromatic condensed polycyclic group, and a monovalent non-aromatic condensed hetero-polycyclic group;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arythio group, a $C_1$-$C_{60}$ heteroaryl group, a monovalent non-aromatic condensed polycyclic group, and a monovalent non-aromatic condensed hetero-polycyclic group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arythio group, a $C_1$-$C_{60}$ heteroaryl group, a monovalent non-aromatic condensed polycyclic group, a monovalent non-aromatic condensed hetero-polycyclic group, and —Si($Q_{21}$)($Q_{22}$)($Q_{23}$); and —Si($Q_{31}$)($Q_{32}$)($Q_{33}$); wherein, $Q_1$ to $Q_3$, $Q_{11}$ to $Q_{13}$, $Q_{21}$ to $Q_{23}$, and $Q_{31}$ to $Q_{33}$ are each independently selected from a $C_1$-$C_{60}$ alkyl group, a $C_6$-$C_{60}$ aryl group, a $C_1$-$C_{60}$ heteroaryl group, a monovalent non-aromatic condensed polycyclic group, and a monovalent non-aromatic condensed hetero-polycyclic group.

2. The organic light-emitting device of claim 1, wherein $L_{11}$, and $L_{21}$ to $L_{24}$ are each independently selected from a phenylene group, a naphthylene group, a phenanthrenylene group, an anthracenylene group, a triphenylenylene group, a pyrenylene group, a chrysenylene group, a pyrrolylene group, a thiophenylene group, a furanylene group, an imidazolylene group, a pyridinylene group, a pyrazinylene group, a pyrimidinylene group, a pyridazinylene group, an indolylene group, a quinolinylene group, an isoquinolinylene group, a benzoquinolinylene group, a phenanthridinylene group, an acridinylene group, a phenanthrolinylene group, a benzofuranylene group, a benzothiophenylene group, a triazolylene group, a tetrazolylene group, a triazinylene group, a dibenzofuranylene group, and a dibenzothiophenylene group; and a phenylene group, a naphthylene group, a phenanthrenylene group, an anthracenylene group, a triphenylenylene group, a pyrenylene group, a chrysenylene group, a pyrrolylene group, a thiophenylene group, a furanylene group, an imidazolylene group, a pyridinylene group, a pyrazinylene group, a pyrimidinylene group, a pyridazinylene group, an indolylene group, a quinolinylene group, an isoquinolinylene group, a benzoquinolinylene group, a phenanthridinylene group, an acridinylene group, a phenanthrolinylene group, a benzofuranylene group, a benzothiophenylene group, a triazolylene group, a tetrazolylene group, a triazinylene group, a dibenzofuranylene group, and a dibenzothiophenylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, and an imidazopyridinyl group.

3. The organic light-emitting device of claim 1, wherein $L_{11}$, and $L_{21}$ to $L_{24}$ are each independently selected from a phenylene group, a naphthylene group, a pyridinylene group, a quinolinylene group, and an isoquinolinylene group; and a phenylene group, a naphthylene group, a pyridinylene group, a quinolinylene group, and an isoquinolinylene group, each substituted with at least one selected from deuterium, —F, —Cl, —Br, —I, a cyano group, a nitro group, a $C_1$-$C_{20}$ alkyl group, a phenyl group, and a naphthyl group.

4. The organic light-emitting device of claim 1, wherein $L_{11}$, and $L_{21}$ to $L_{24}$ are each independently a group selected from Formulae 3-1 to 3-6 below:

3-1

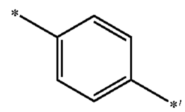

3-2

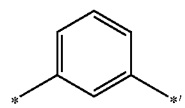

3-3

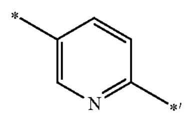

3-4

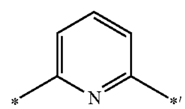

3-5

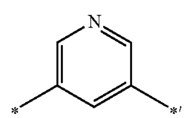

3-6

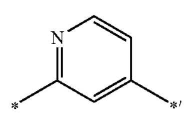

in Formulae 3-1 to 3-6,

* and *' are each a binding site to a neighboring atom.

5. The organic light-emitting device of claim 1, wherein a11, and a21 to a24 are each independently 0.

6. The organic light-emitting device of claim 1, wherein $R_{11}$, $R_{12}$ and $R_{24}$ to $R_{27}$ are each independently selected from a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a carbazolyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, and a dibenzocarbazolyl group; and a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a carbazolyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, and a dibenzocarbazolyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a carbazolyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, and a dibenzocarbazolyl group.

7. The organic light-emitting device of claim 1, wherein $R_{11}$, $R_{12}$ and $R_{24}$ to $R_{27}$ are each independently selected from a phenyl group, a naphthyl group, a fluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a quinolinyl group, an isoquinolinyl group, a carbazolyl group, a benzoquinolinyl group, a phthalazinyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, and a dibenzocarbazolyl group; and a phenyl group, a naphthyl group, a fluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a quinolinyl group, an isoquinolinyl group, a carbazolyl group, a benzoquinolinyl group, a phthalazinyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, and a dibenzocarbazolyl group, each substituted with at least one selected from deuterium, —F, —Cl, —Br, —I, a cyano group, a nitro group, a $C_1$-$C_{20}$ alkyl group, a phenyl group, a naphthyl group, a pyridinyl group, a quinolinyl group, and an isoquinolinyl group.

8. The organic light-emitting device of claim 1, wherein $R_{11}$, $R_{12}$ and $R_{24}$ to $R_{27}$ are each independently selected from a phenyl group, a naphthyl group, a fluorenyl group, a pyridinyl group, a quinolinyl group, and an isoquinolinyl group; and a phenyl group, a naphthyl group, a fluorenyl group, a pyridinyl group, a quinolinyl group, and an isoquinolinyl group, each substituted with at least one selected from deuterium, —F, —Cl, —Br, —I, a cyano group, a nitro group, a $C_1$-$C_{20}$ alkyl group, a phenyl group, a naphthyl group, a pyridinyl group, a quinolinyl group, and an isoquinolinyl group.

9. The organic light-emitting device of claim 1, wherein $R_{11}$ and $R_{12}$ are each independently selected from Formulae 4-1 to 4-5, 4-23, and 4-24 below:

4-1

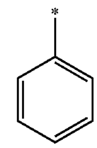

4-2

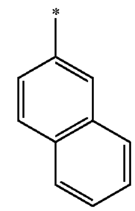

4-3

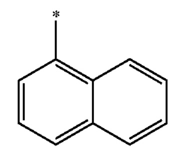

4-4

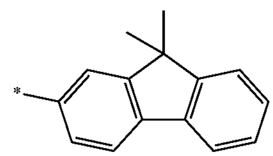

4-5

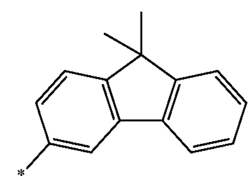

4-23

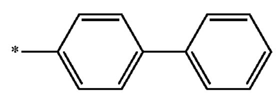

4-24

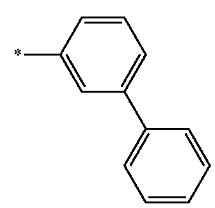

wherein in Formulae 4-1 to 4-5, 4-23, and 4-24 above

* is a binding site to a neighboring atom.

10. The organic light-emitting device of claim 1, wherein $R_{24}$ to $R_{27}$ are each independently selected from Formulae 4-1 to 4-3, and 4-6 to 4-30 below:

4-1

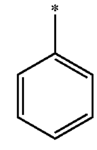

-continued
4-2
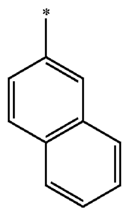
4-3
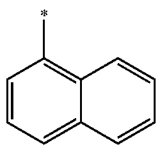
4-6
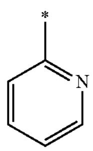
4-7
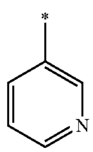
4-8
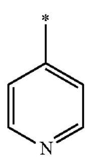
4-9
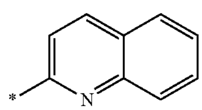
4-10
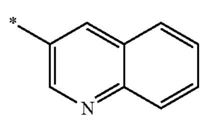
4-11
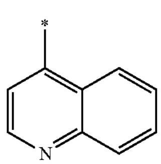
4-12
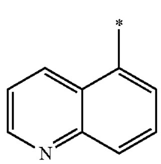
4-13
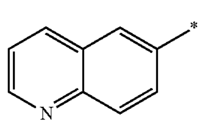
-continued
4-14
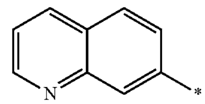
4-15
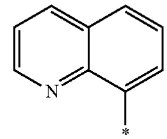
4-16
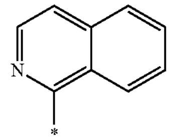
4-17
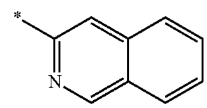
4-18
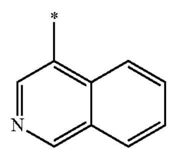
4-19
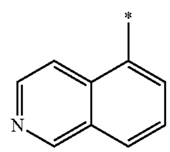
4-20
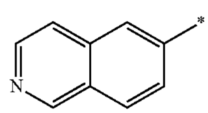
4-21
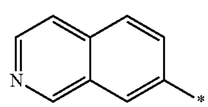
4-22
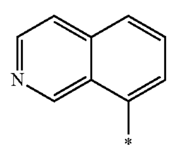
4-23
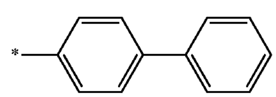
4-24
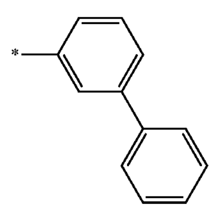
4-25
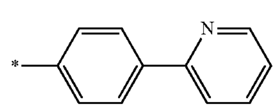

-continued 4-26

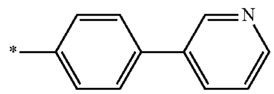

4-27

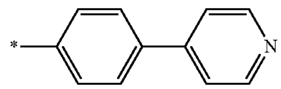

4-28

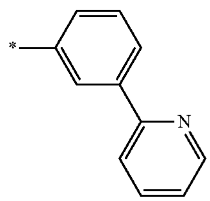

4-29

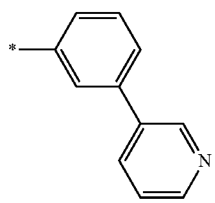

4-30

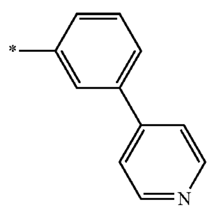

wherein in Formulae 4-1 to 4-3 and 4-6 to 4-30

* is a binding site to a neighboring atom.

11. The organic light-emitting device of claim 1, wherein $R_{13}$, $R_{14}$, $R_{21}$ to $R_{23}$, and $R_{28}$ are each independently selected from hydrogen, deuterium, —F, —Cl, —Br, —I, a cyano group, a nitro group, a methyl group, an ethyl group, an n-propyl group, an iso-propyl group, an n-butyl group, a sec-butyl group, an iso-butyl group, a tert-butyl group, an n-pentyl group, an n-hexyl group, an n-heptyl group, an n-octyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a carbazolyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, and a dibenzocarbazolyl group.

12. The organic light-emitting device of claim 1, wherein $R_{13}$, $R_{14}$, $R_{21}$ to $R_{23}$, and $R_{28}$ are each independently selected from hydrogen, deuterium, —F, —Cl, —Br, —I, a cyano group, a nitro group, a methyl group, an ethyl group, an n-propyl group, an iso-propyl group, an n-butyl group, a sec-butyl group, an iso-butyl group, a tert-butyl group, an n-pentyl group, an n-hexyl group, an n-heptyl group, an n-octyl group, and groups represented by Formula 4-1 to 4-30:

4-1

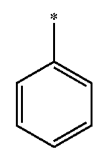

4-2

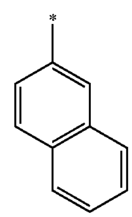

4-3

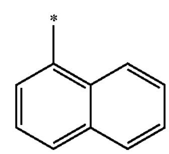

4-4

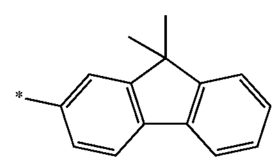

4-5

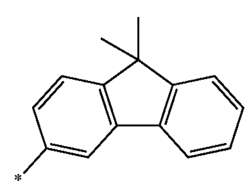

4-6

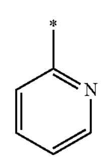

4-7

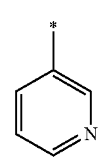

4-8
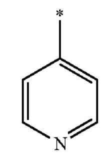
4-9
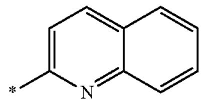
4-10
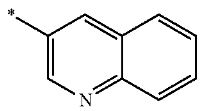
4-11
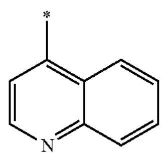
4-12
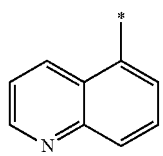
4-13
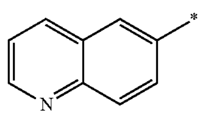
4-14
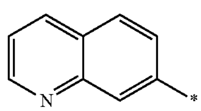
4-15
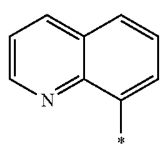
4-16
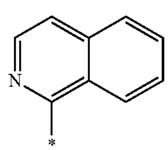
4-17
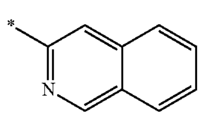
4-18
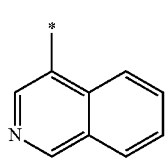
4-19
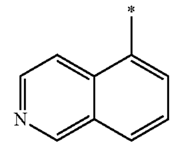
4-20
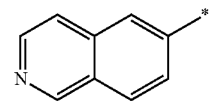
4-21
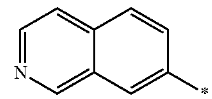
4-22
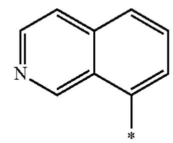
4-23
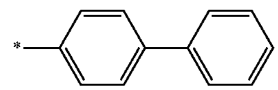
4-24
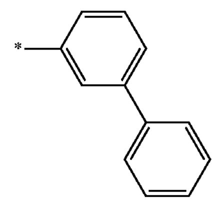
4-25
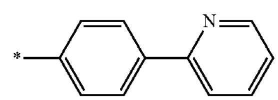
4-26
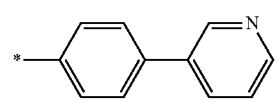
4-27
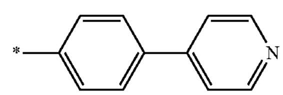
4-28
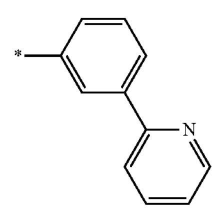
4-29
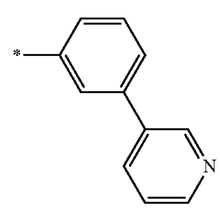

-continued 4-30

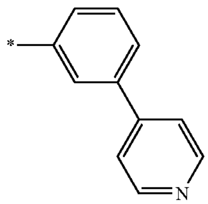

wherein in Formulae 4-1 to 4-30

* is a binding site to a neighboring atom.

13. The organic light-emitting device of claim 1, wherein the at least one first material is represented by any one of Formulae 1A and 1B, and the at least one second material is represented by any one of Formulae 2A to 2C below:

Formula 1A

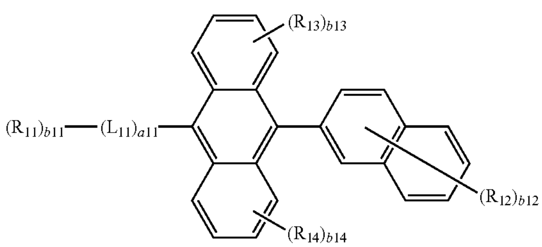

Formula 1B

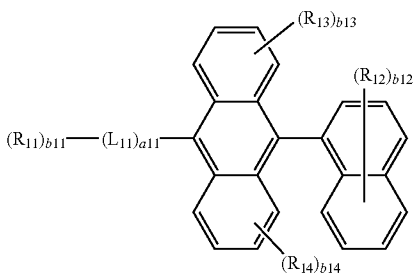

Formula 2A

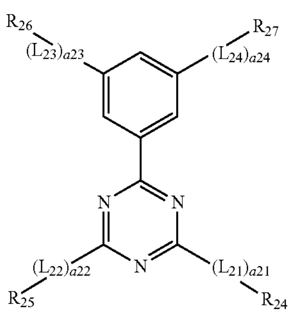

Formula 2B

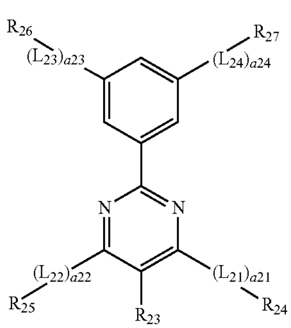

-continued

Formula 2C

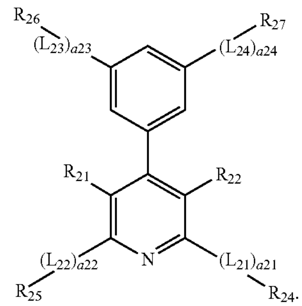

14. The organic light-emitting device of claim 1, wherein the at least one first material is represented by any one of Formulae 1A-1, 1A-2, 1B-1, and 1B-2, and the at least one second material is represented by any one of Formulae 2A-1 to 2C-1:

Formula 1A-1

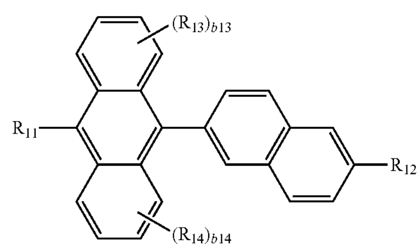

Formula 1A-2

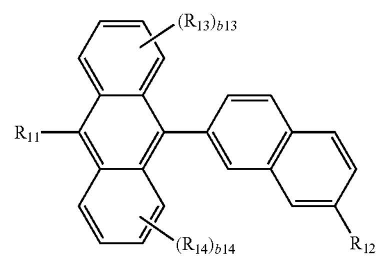

Formula 1B-1

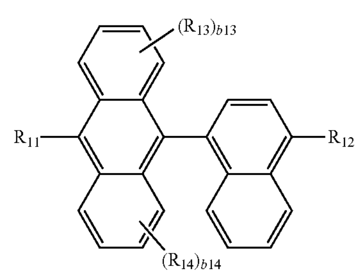

Formula 1B-2

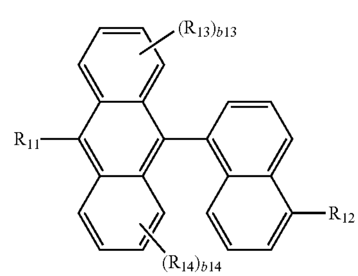

-continued
Formula 2A-1
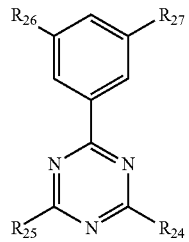
Formula 2B-1
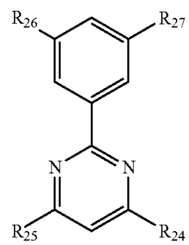
Formula 2C-1
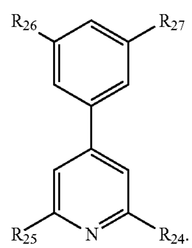
15. The organic light-emitting device of claim 1, wherein the at least one first material is selected from Compounds 100 to 201 below, and the at least one second material is selected from Compounds 300 to 544 below:
100
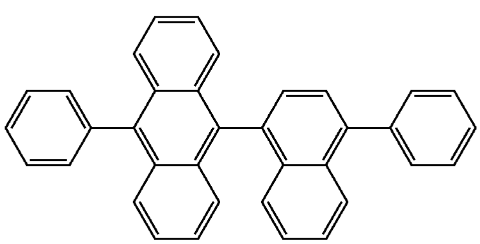
101
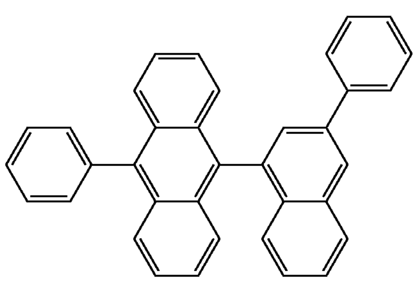
-continued
102
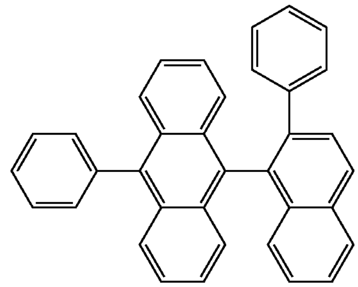
103
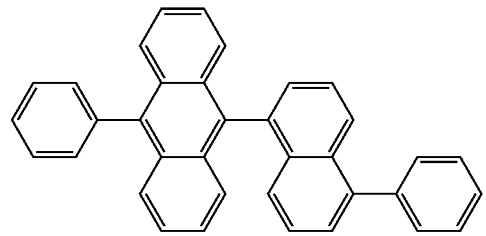
104
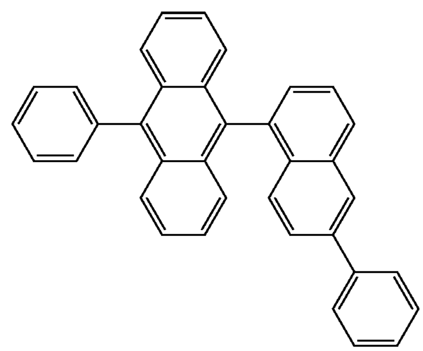
105
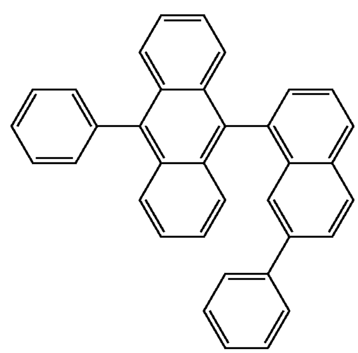
106
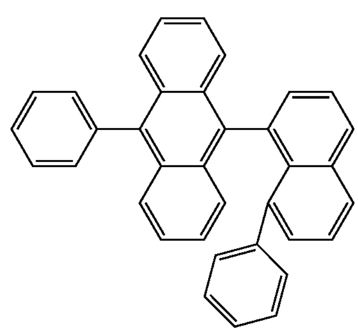

-continued
107
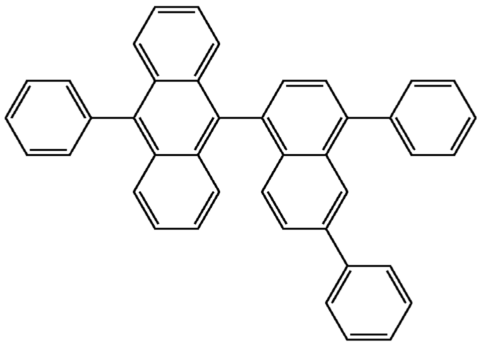
108
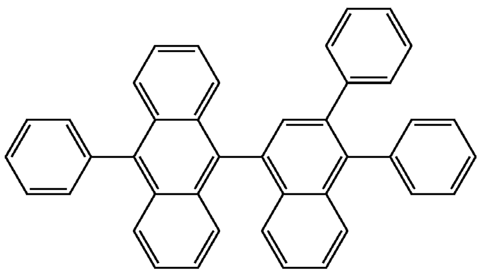
109
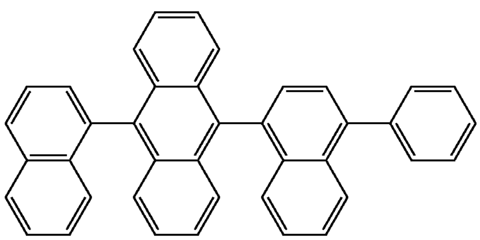
110
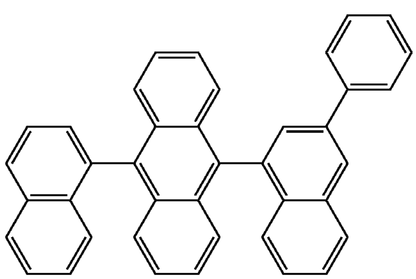
111
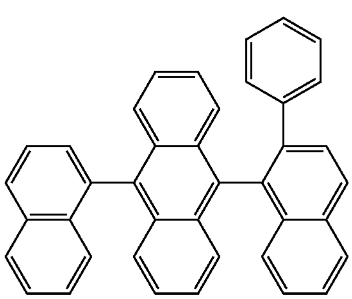
-continued
112
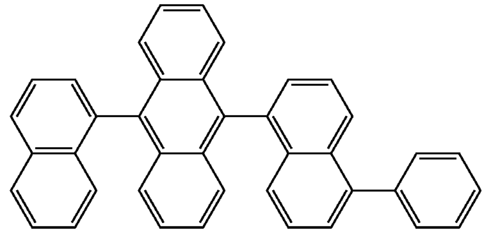
113
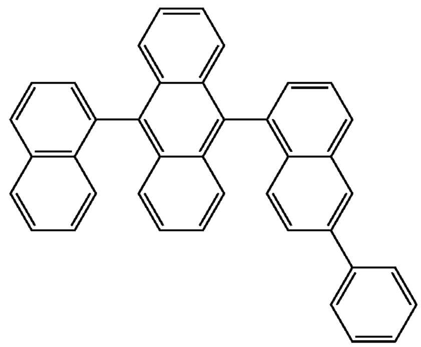
114
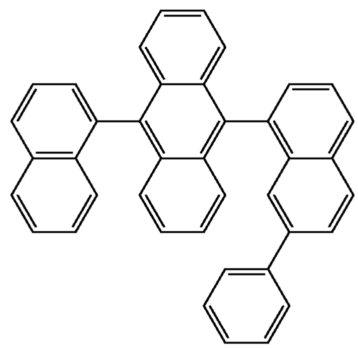
115
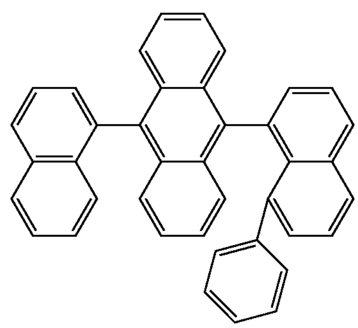
116
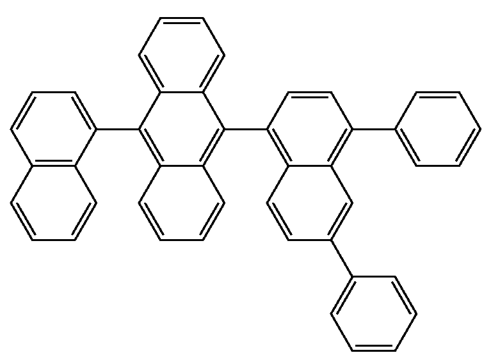

117
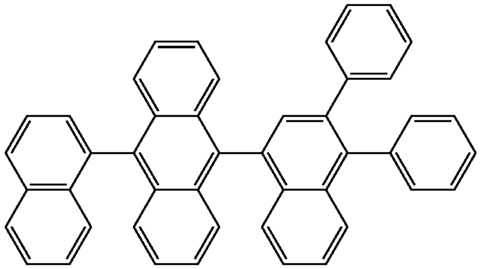
118
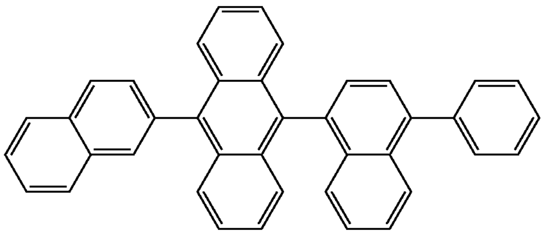
119
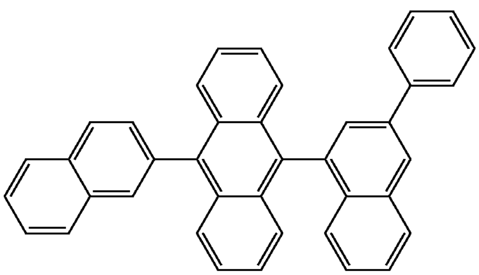
120
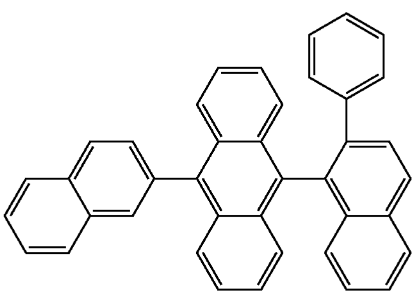
121
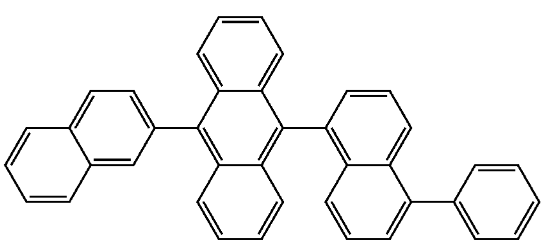
122
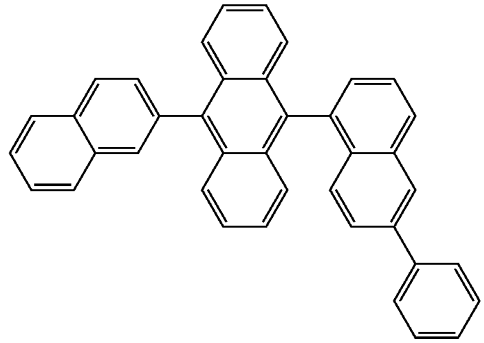
123
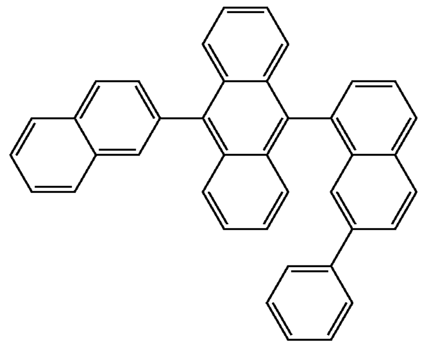
124
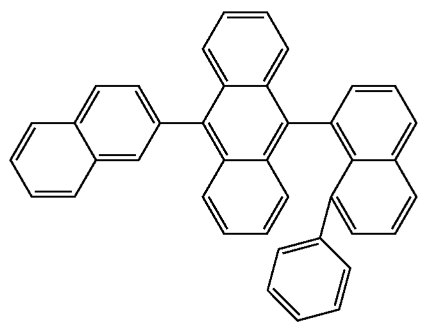
125
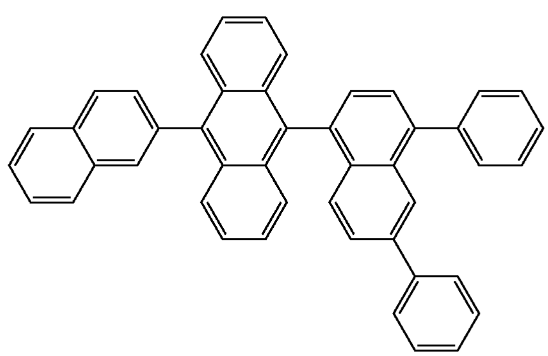

-continued
126
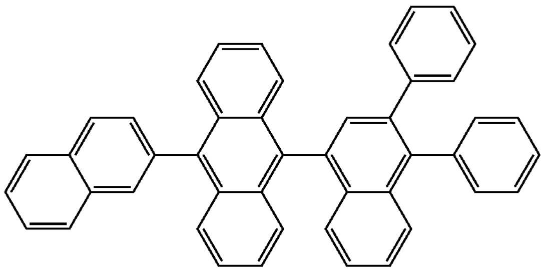
127
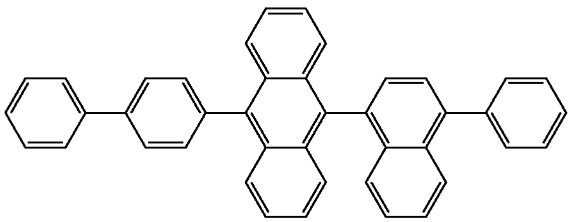
128
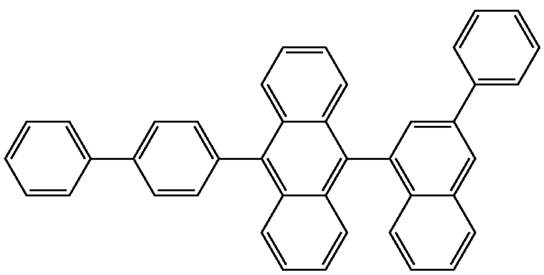
129
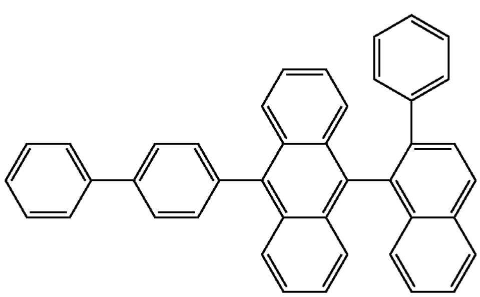
130
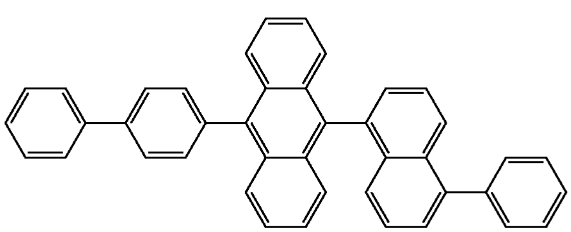
-continued
131
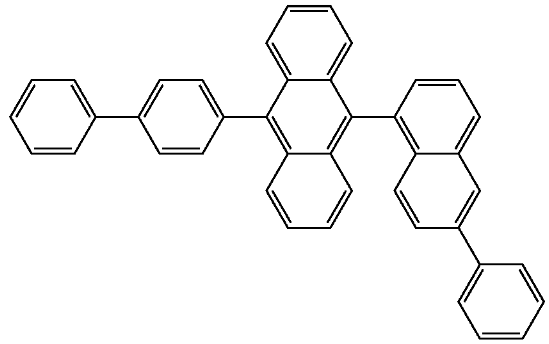
132
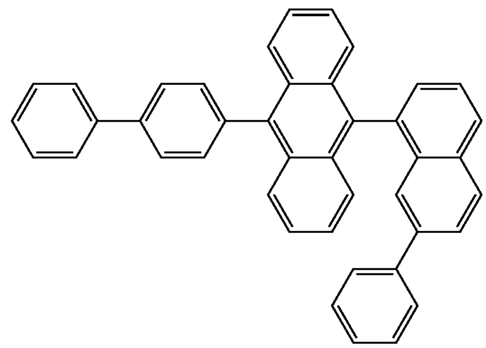
133
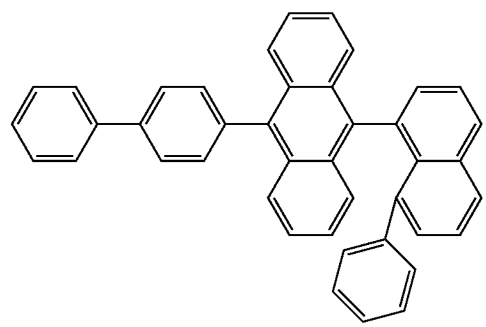
134
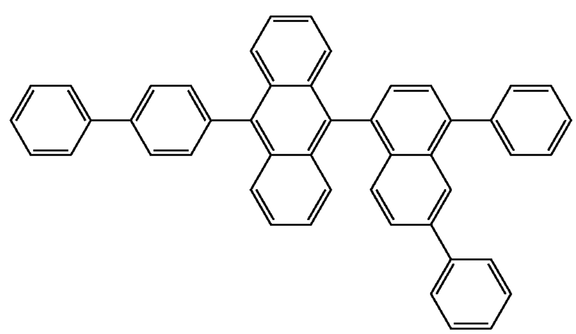

135
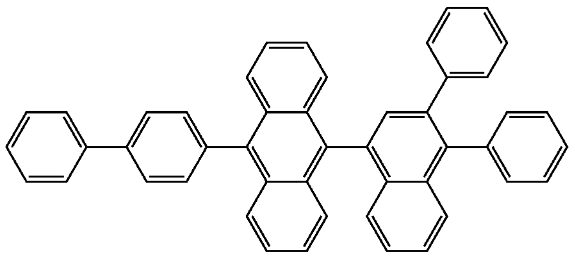
136
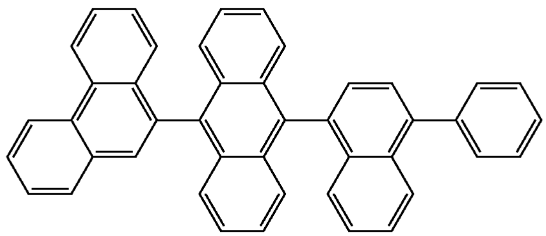
137
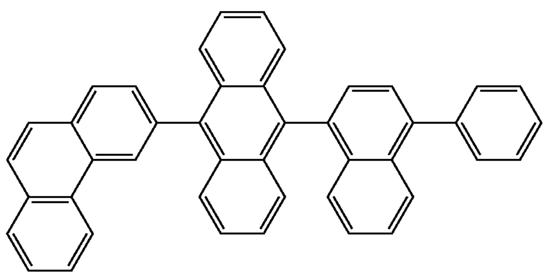
138
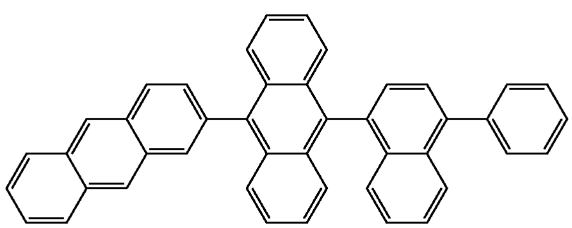
139
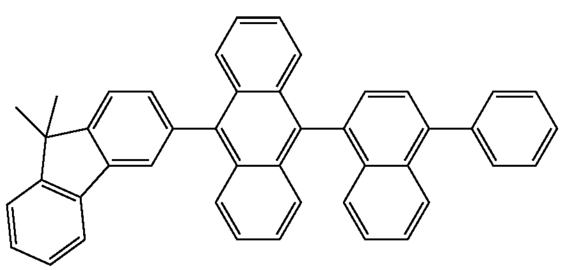
140
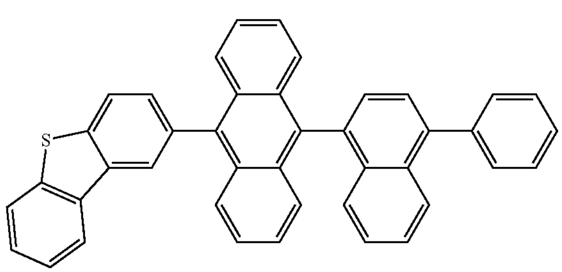
141
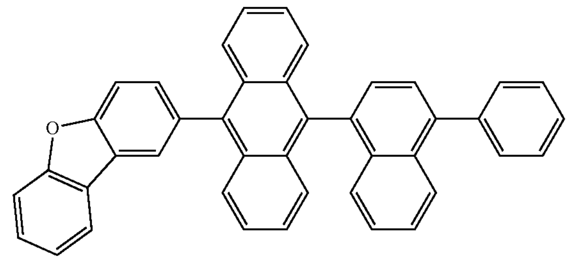
142
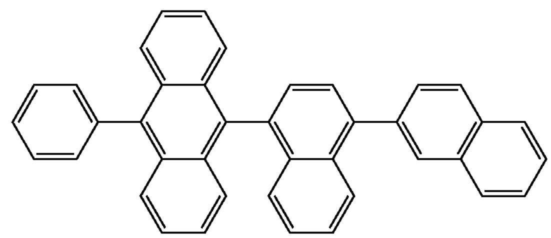
143
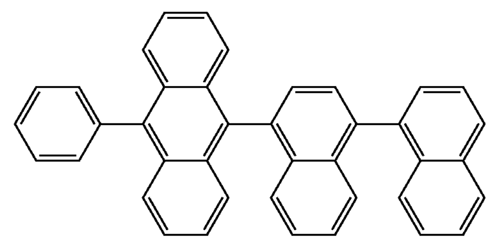
144
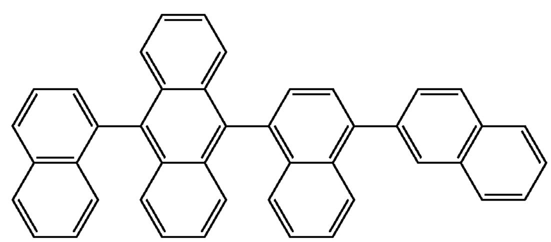
145
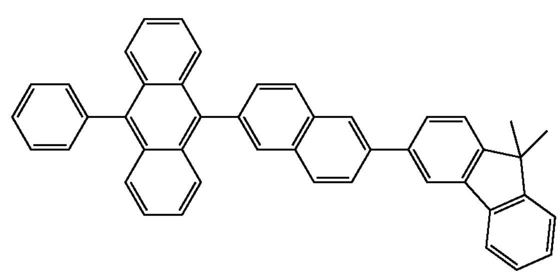
146
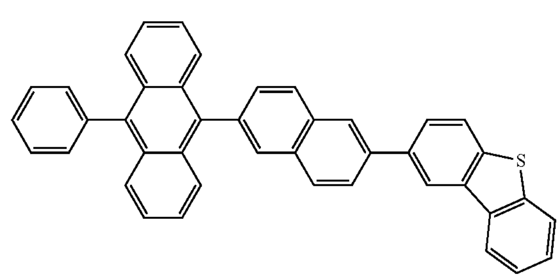

-continued
147
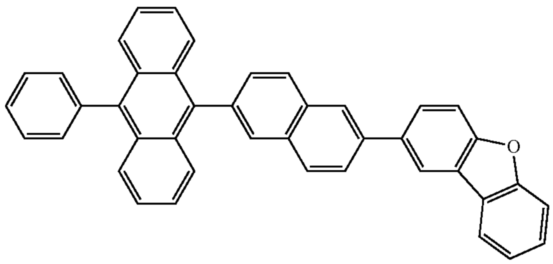
148
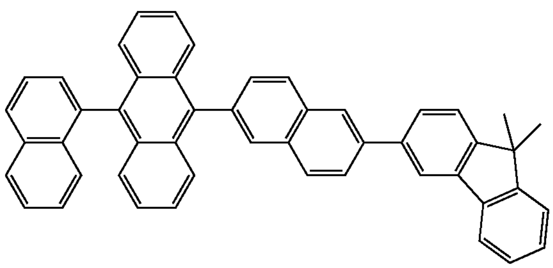
149
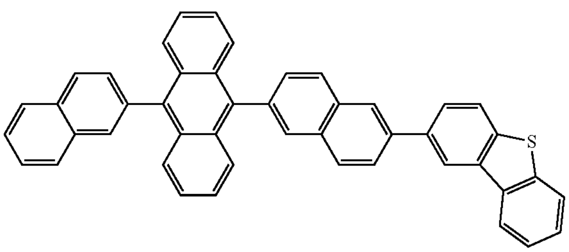
150
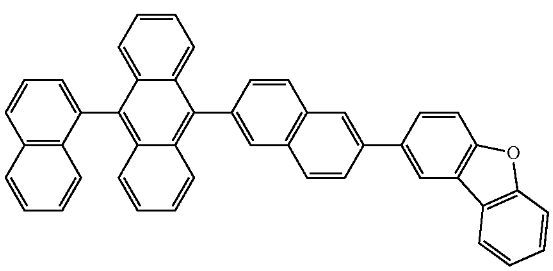
151
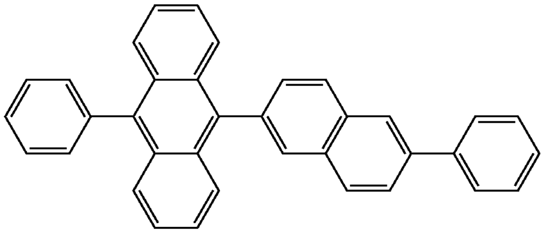
-continued
152
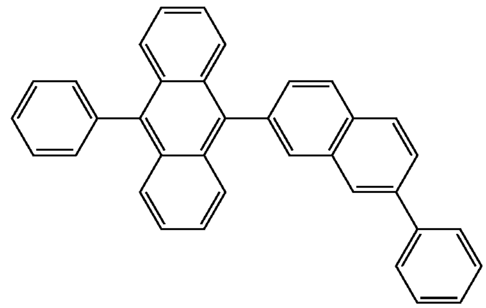
153
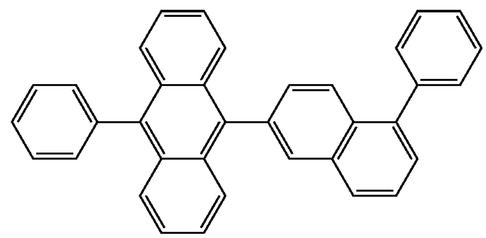
154
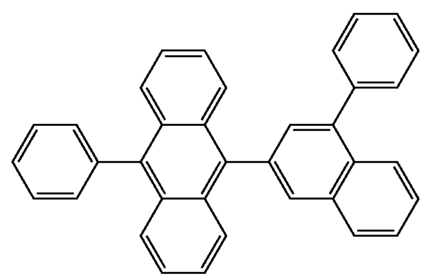
155
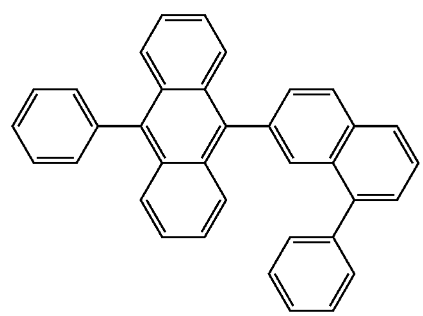
156
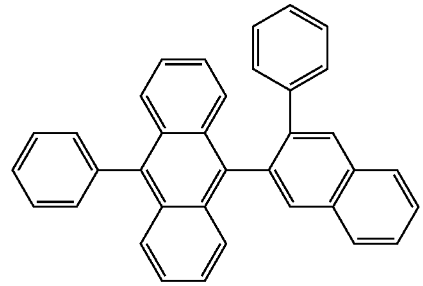

-continued
157
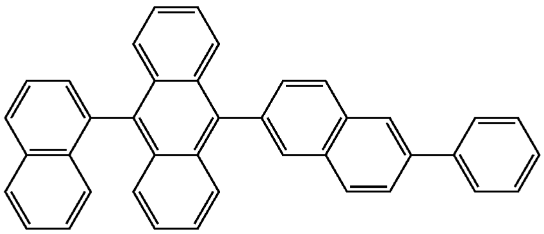
158
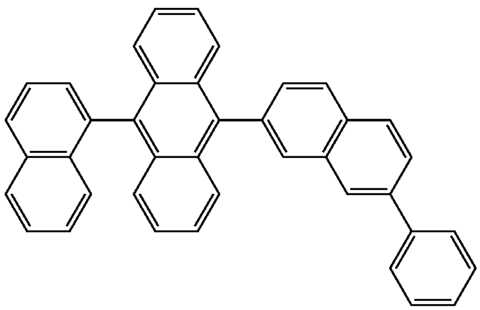
159
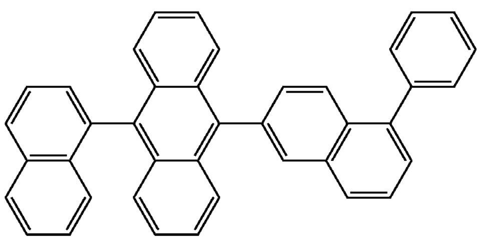
160
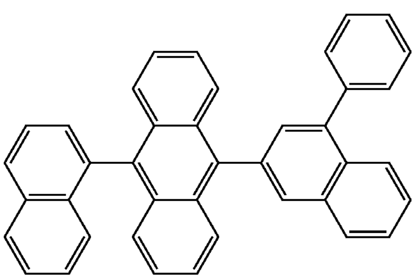
161
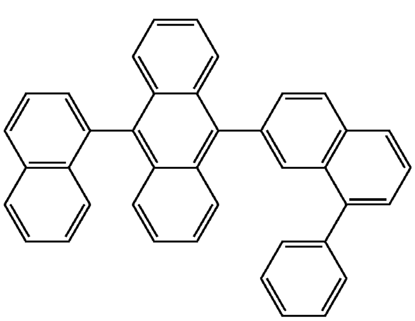
-continued
162
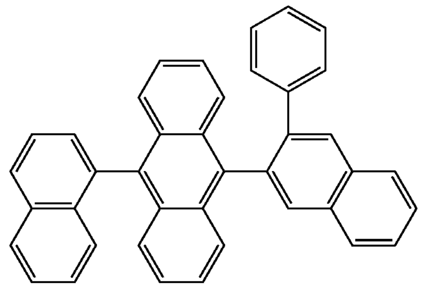
163
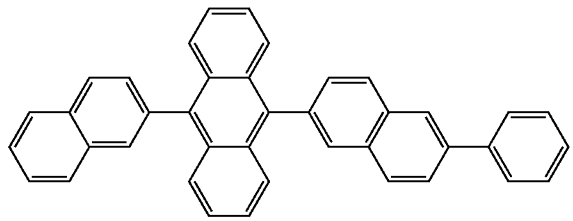
164
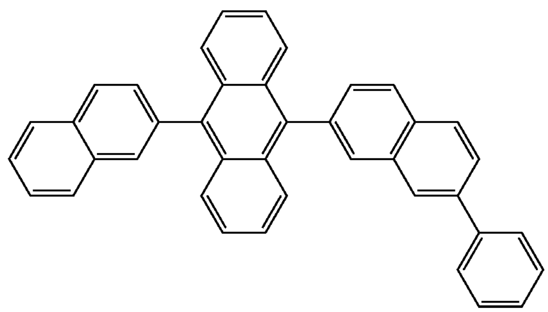
165
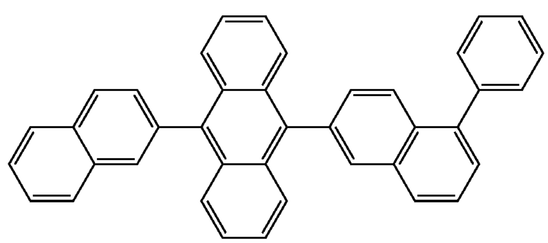
166
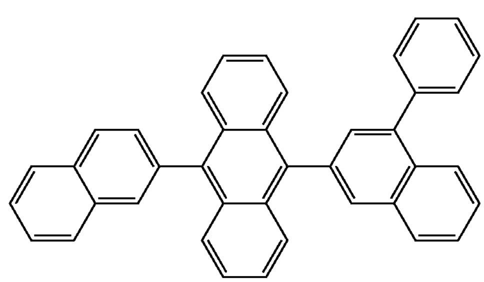

-continued
167
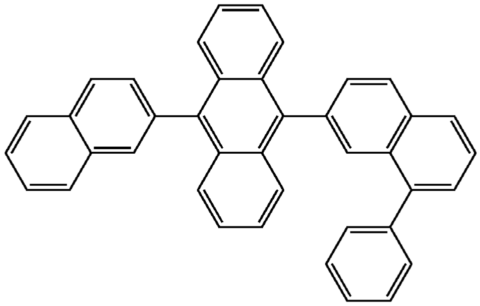
168
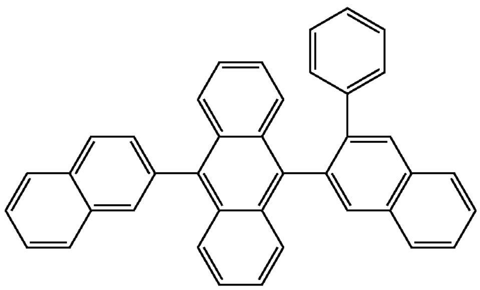
169
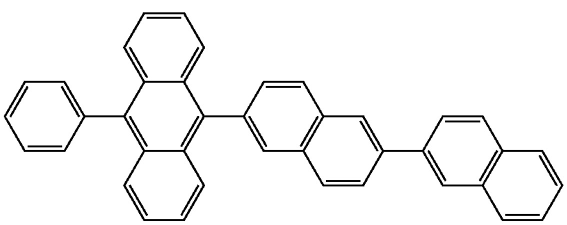
170
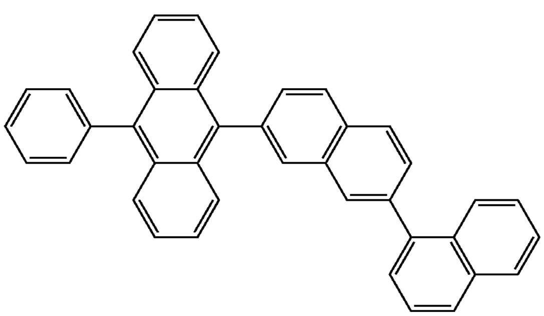
171
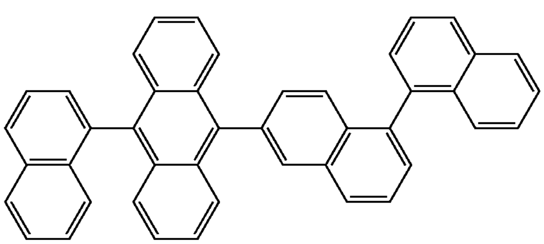
-continued
172
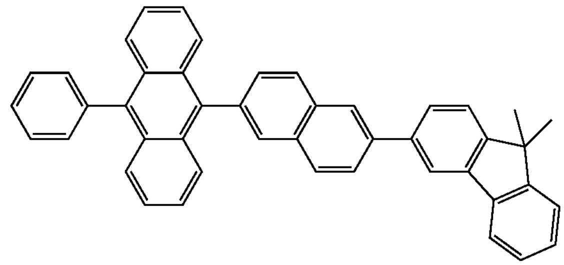
173
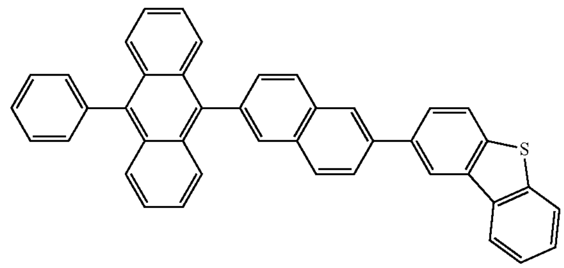
174
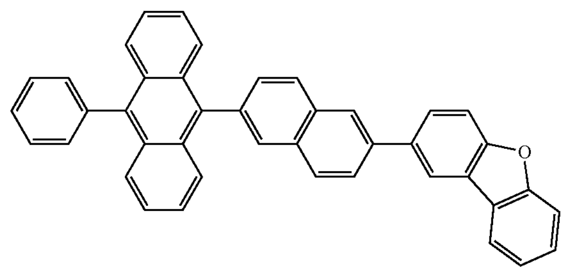
175
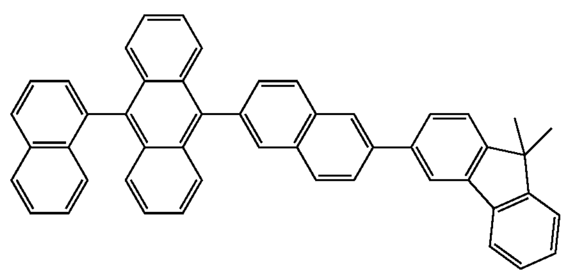
176
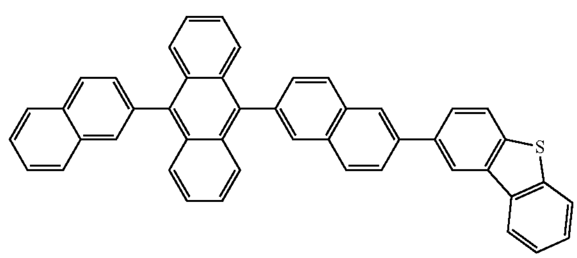

-continued
177
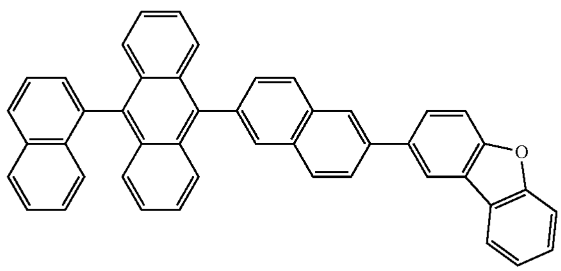
178
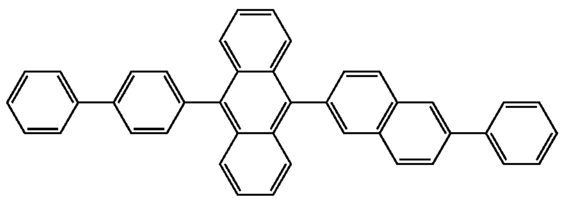
179
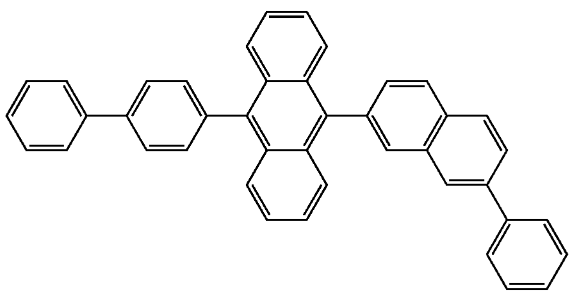
180
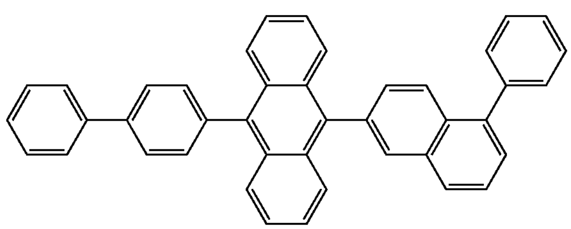
181
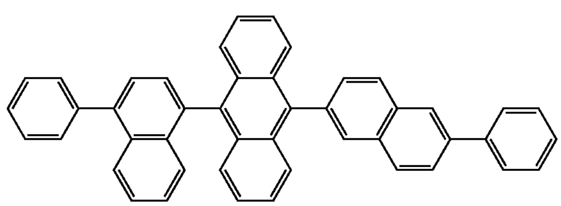
182
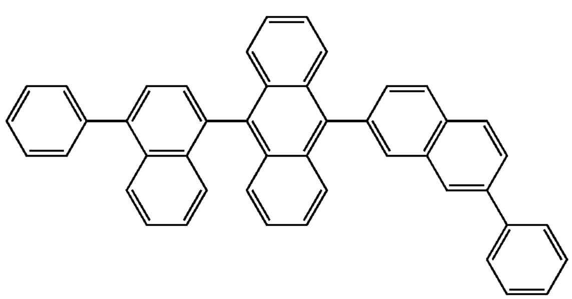
-continued
183
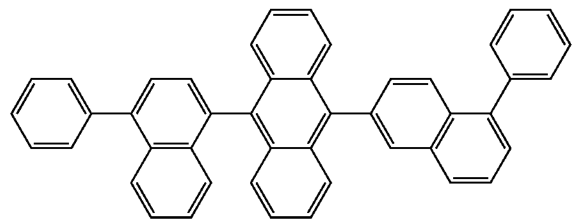
184
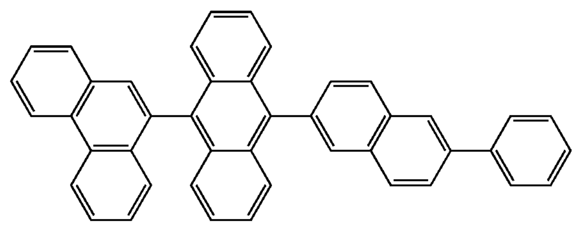
185
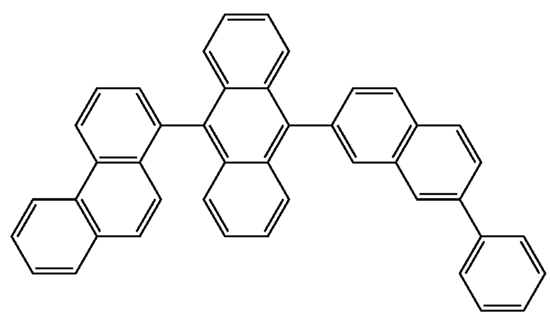
186
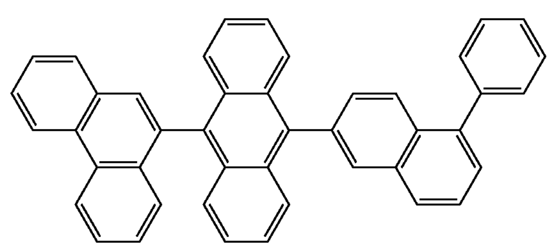
187
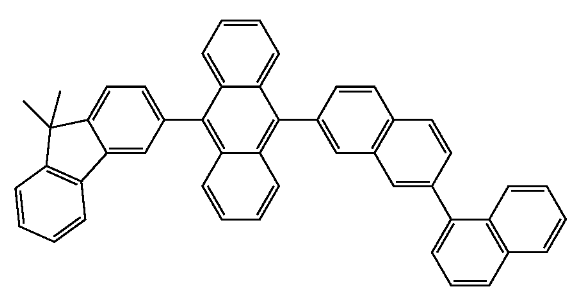

188
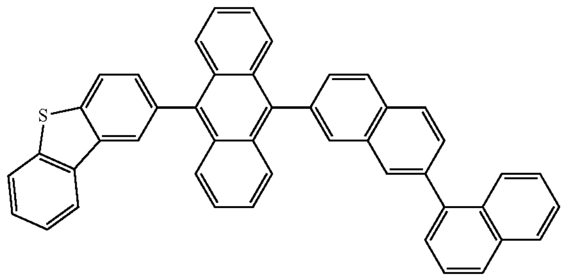
189
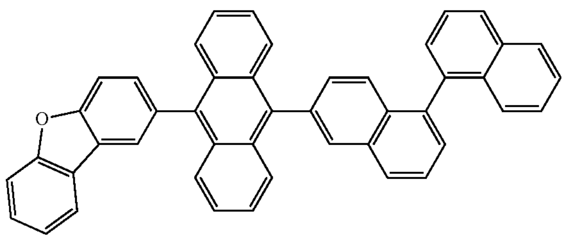
190
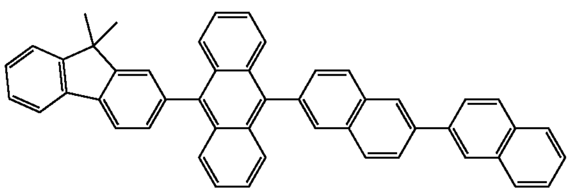
191
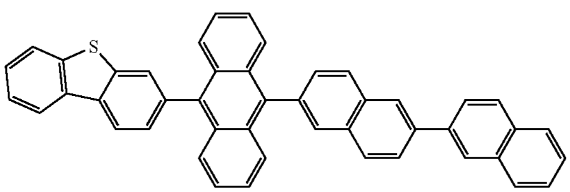
192
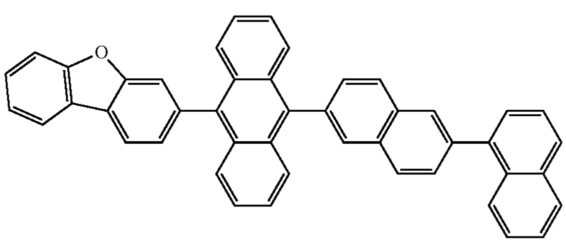
193
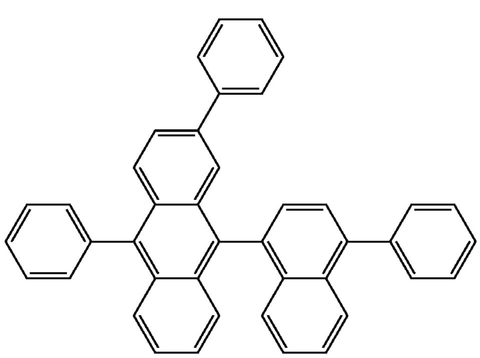
194
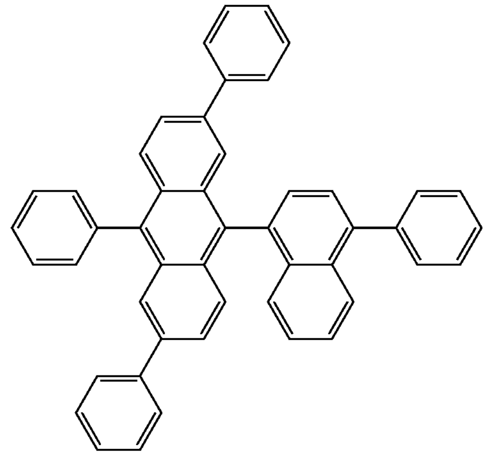
195
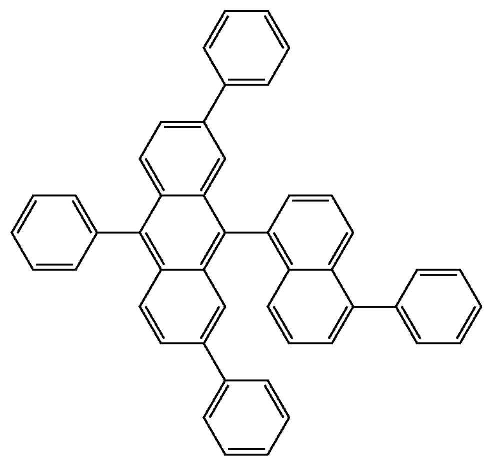
196
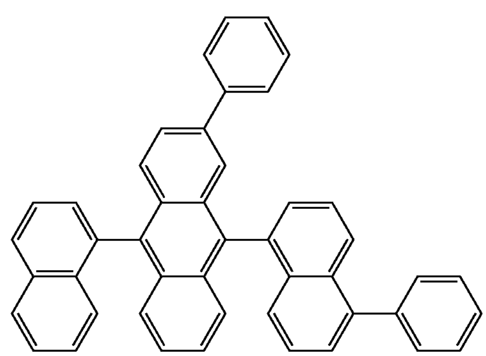

-continued
197
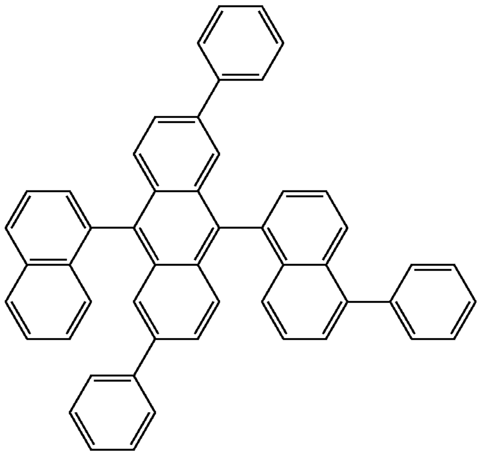
198
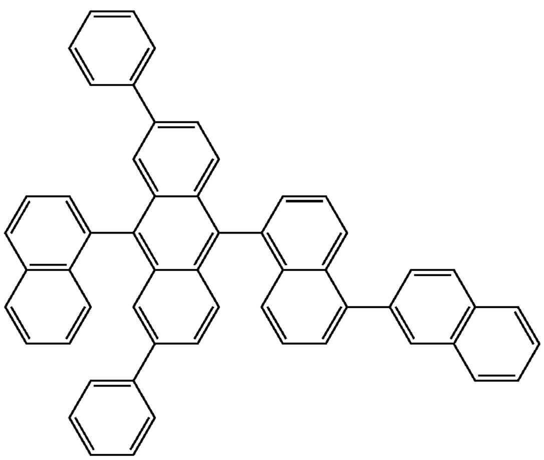
199
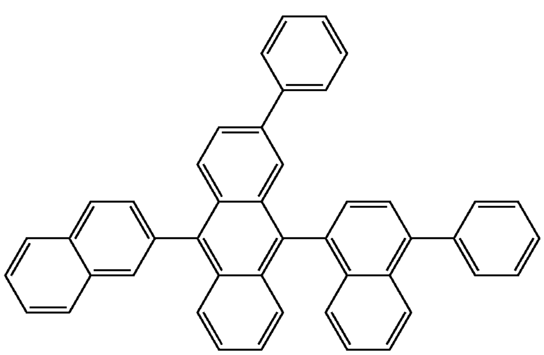
-continued
200
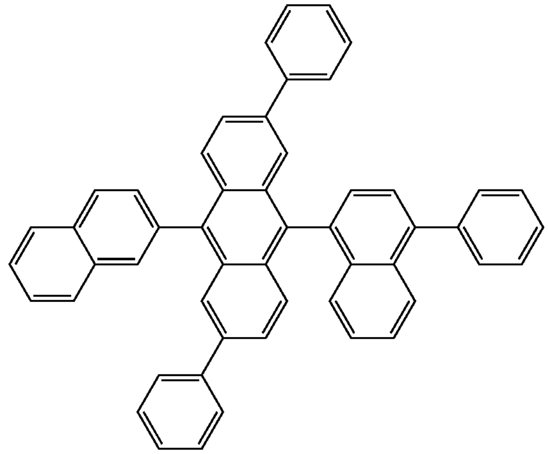
201
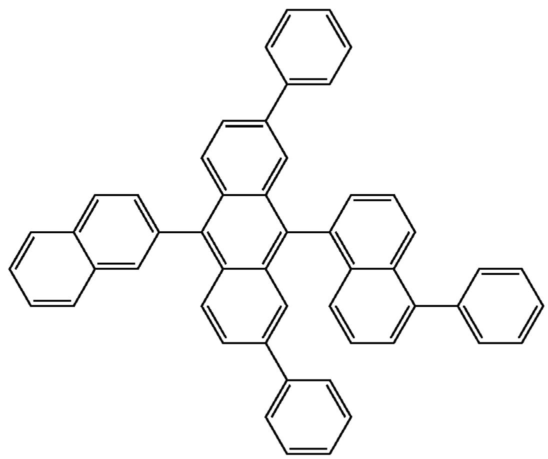
300
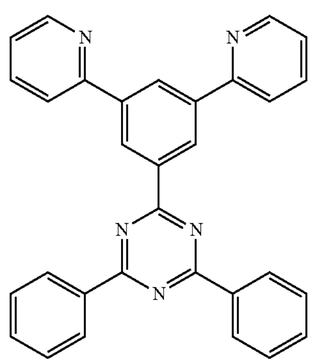

-continued
301
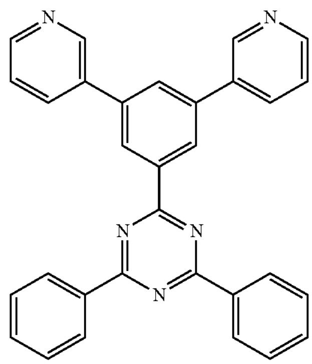
302
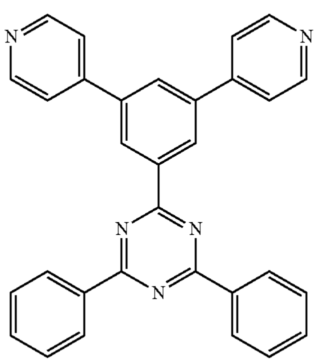
303
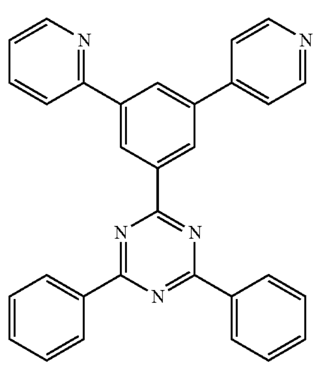
304
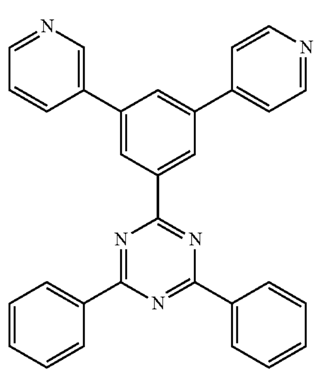
-continued
305
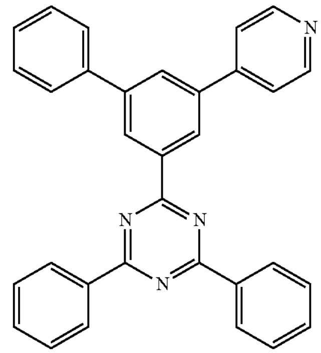
306
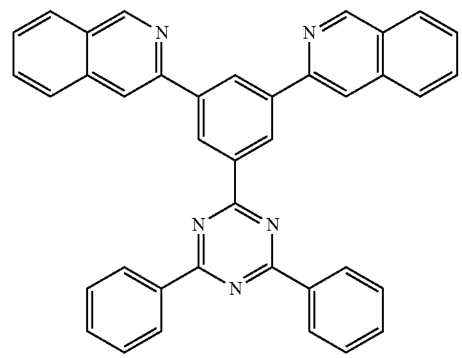
307
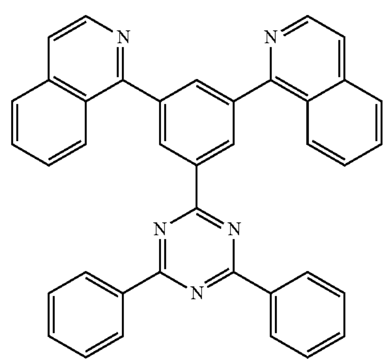
308
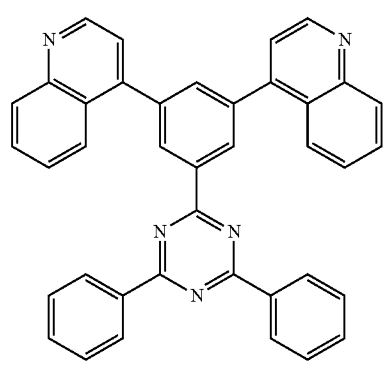

309
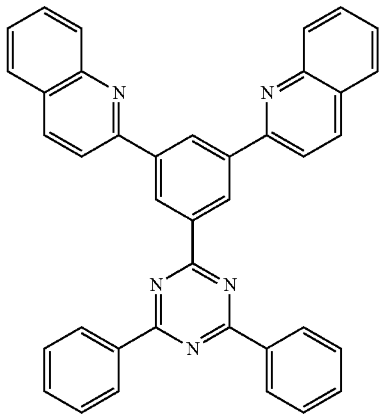
310
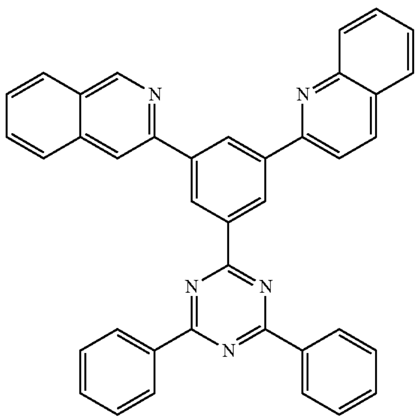
311
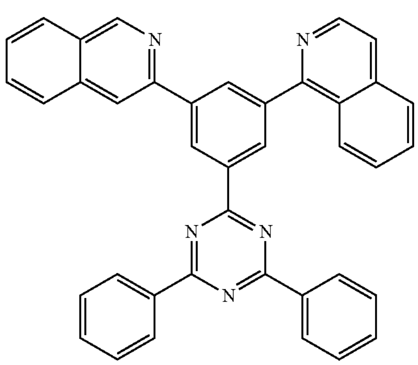
312
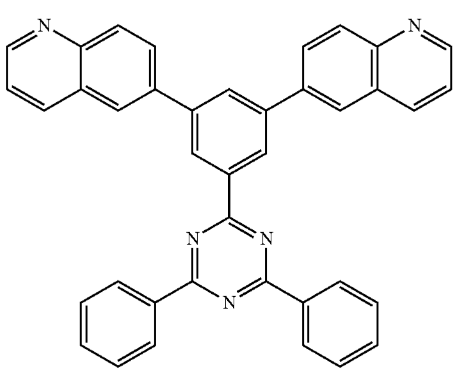
313
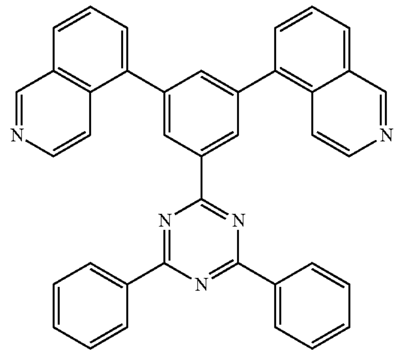
314
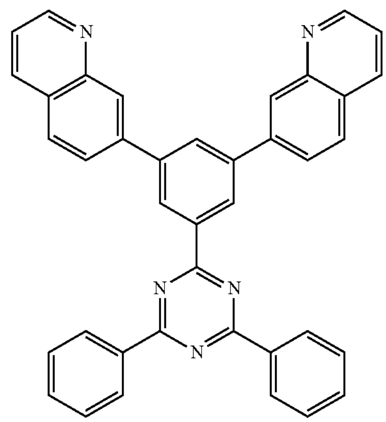
315
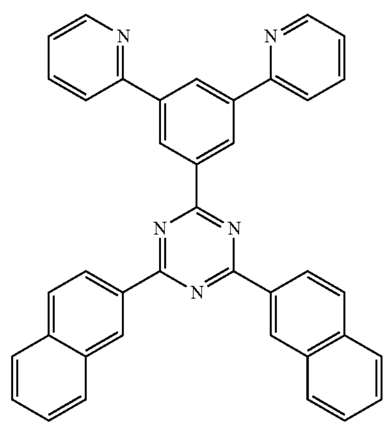
316
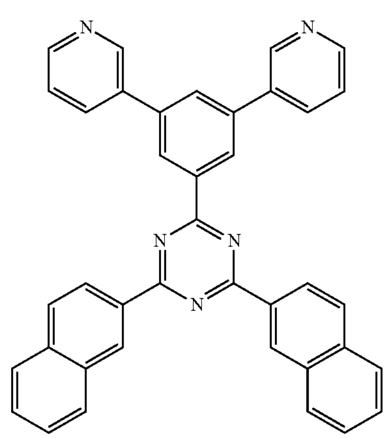

-continued
317
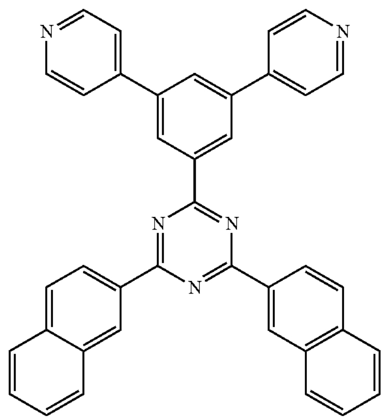
318
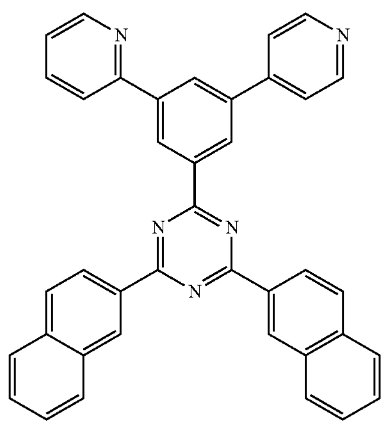
319
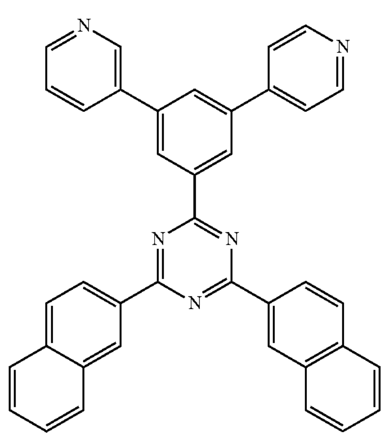
-continued
320
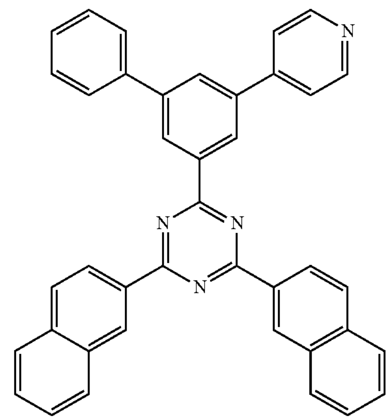
321
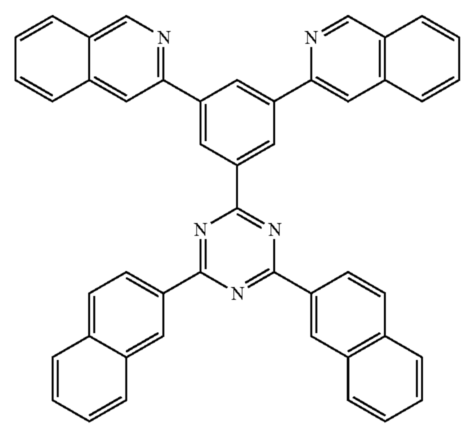
322
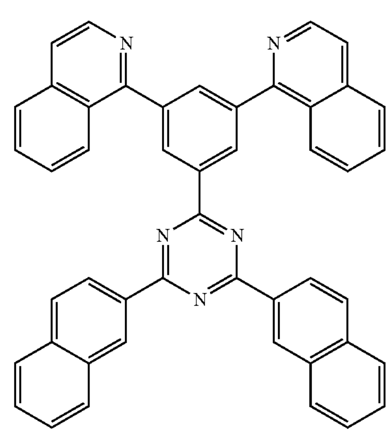

-continued
323
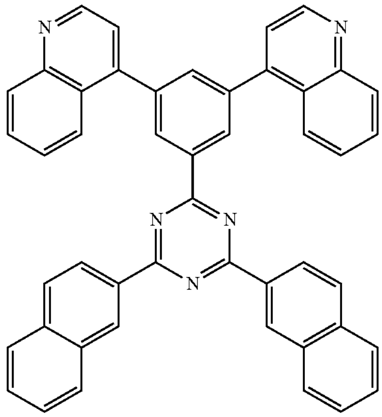
324
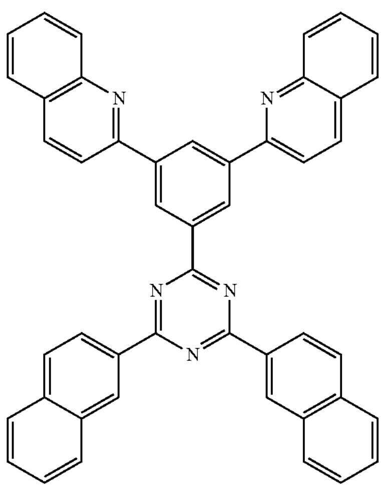
325
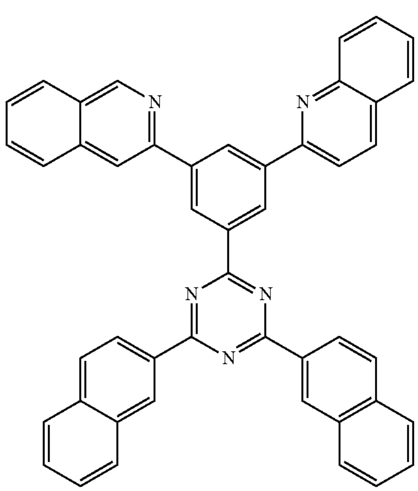
-continued
326
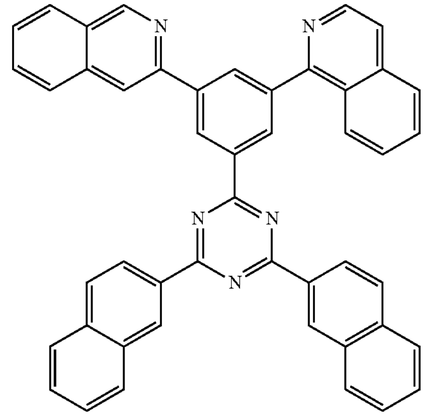
327
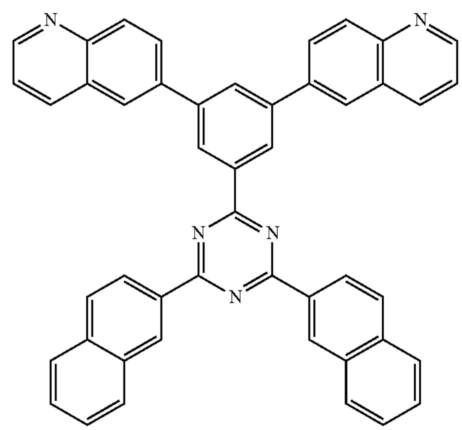
328
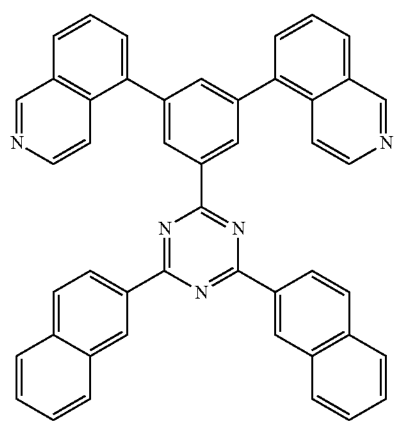

-continued
329
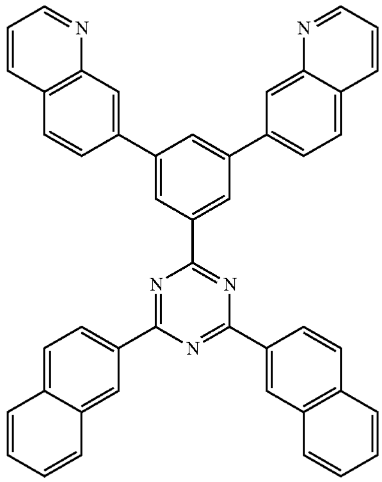
330
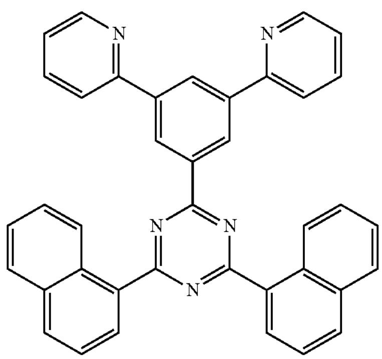
331
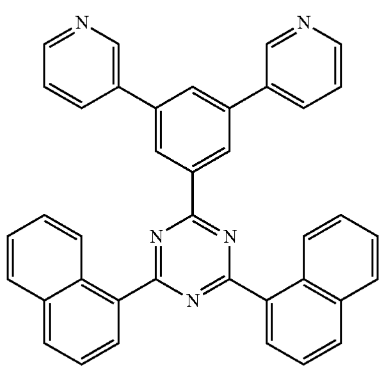
332
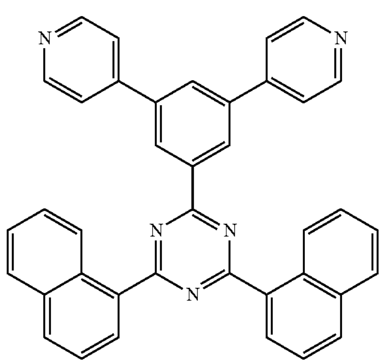
-continued
333
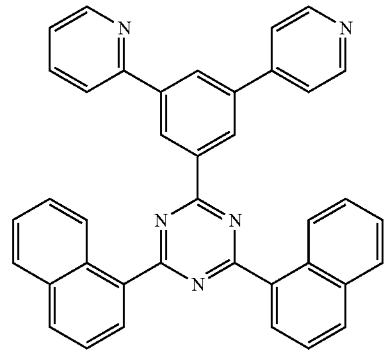
334
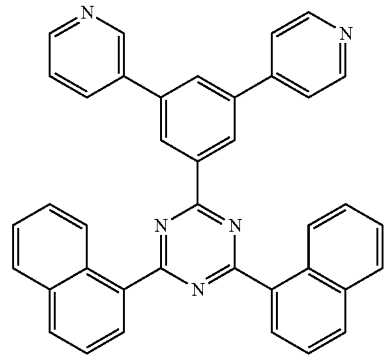
335
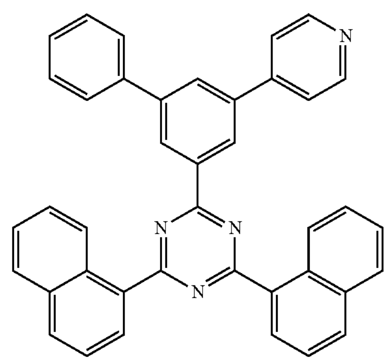
336
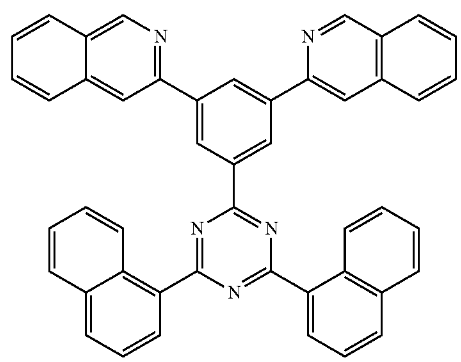

-continued
337
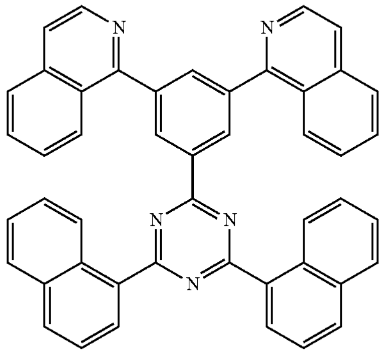
338
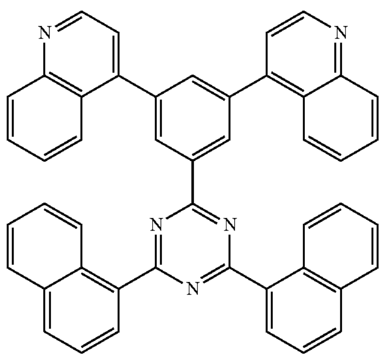
339
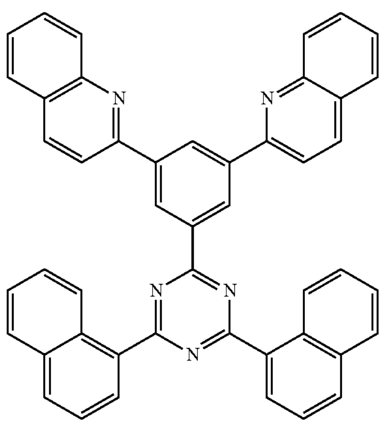
340
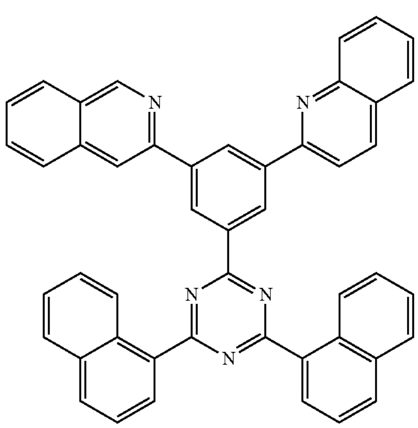
-continued
341
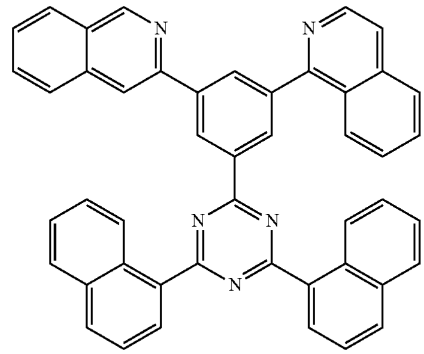
342
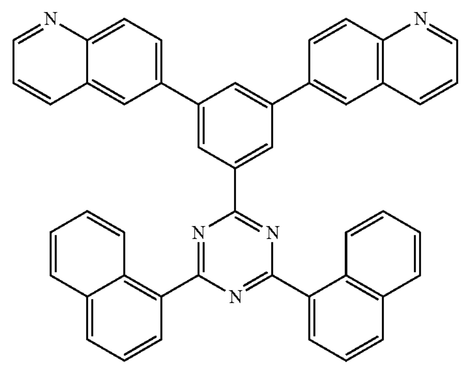
343
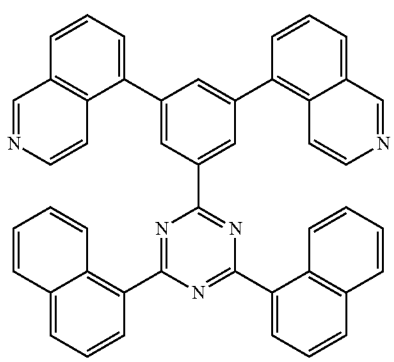
344
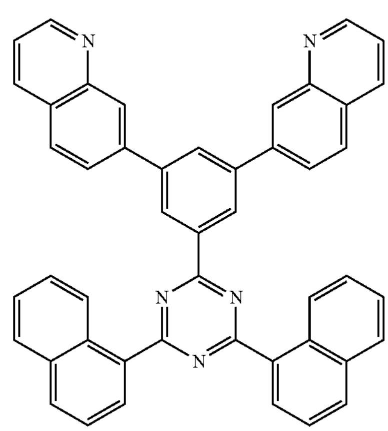

-continued
345
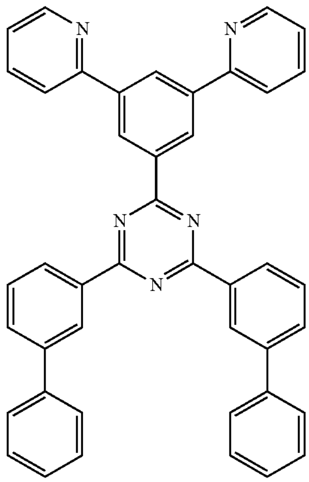
346
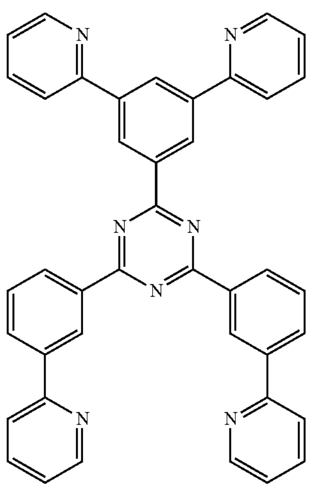
347
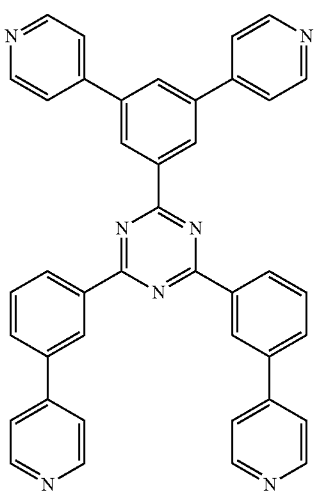
-continued
348
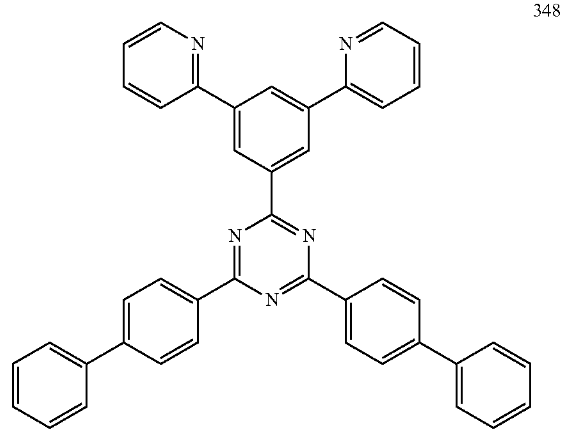
349
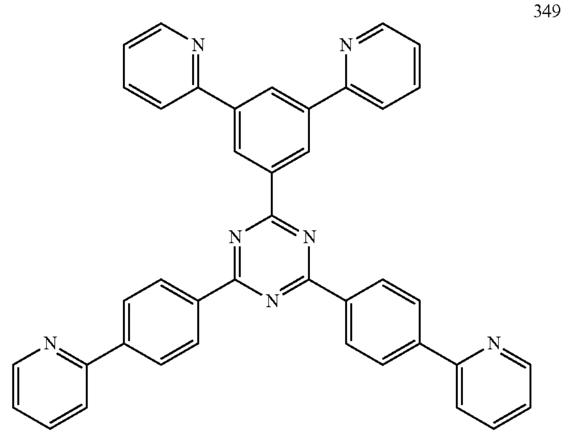
350
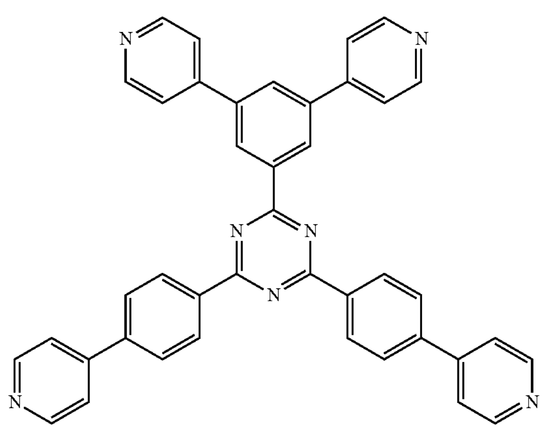

-continued
351
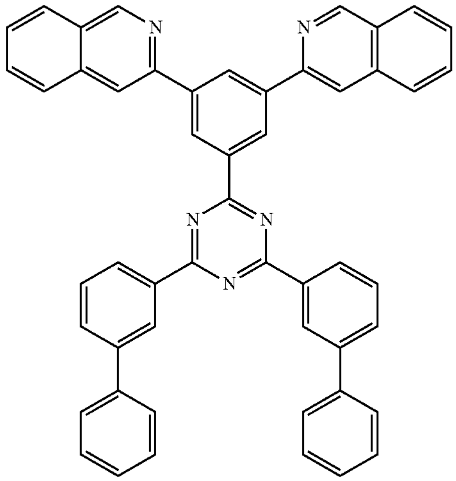
352
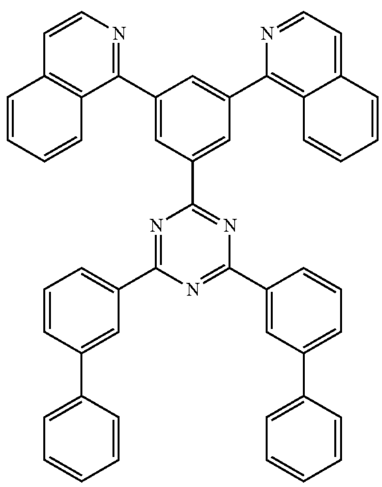
353
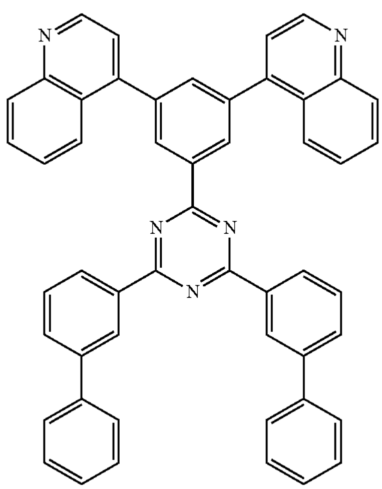
-continued
354
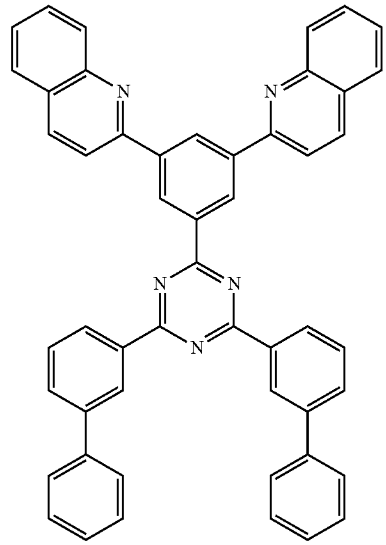
355
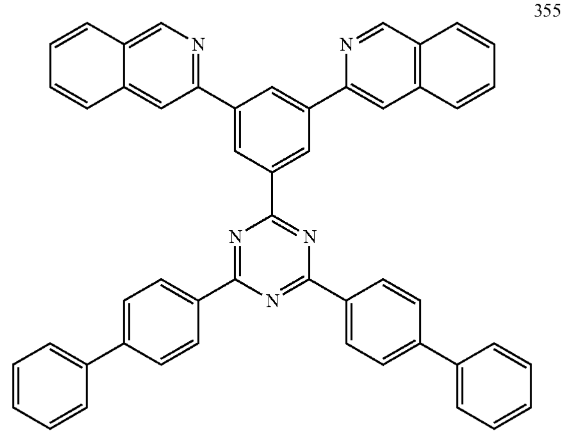
356
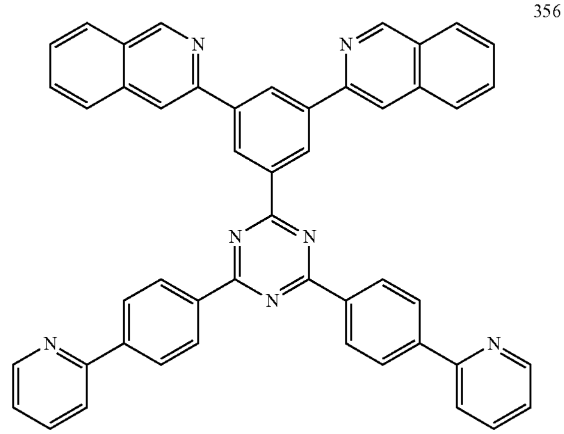

-continued
357
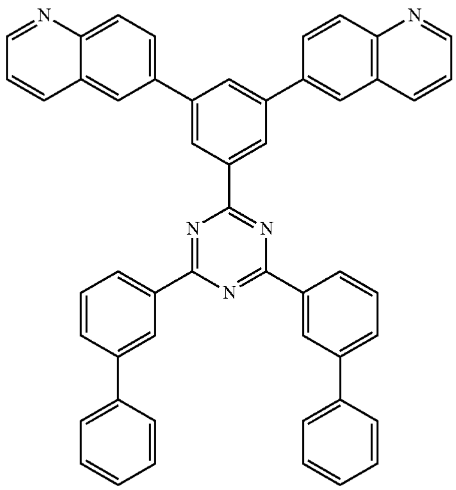
358
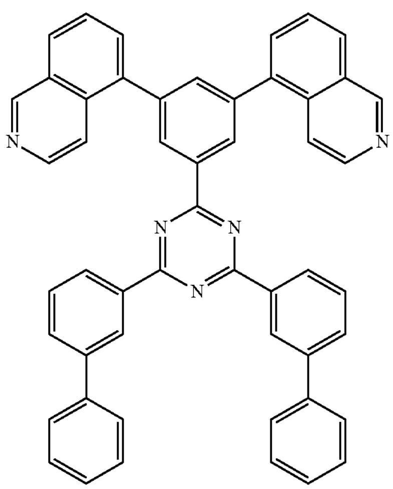
359
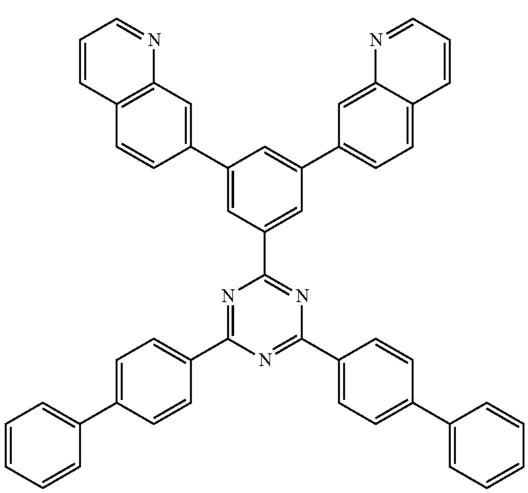
-continued
360
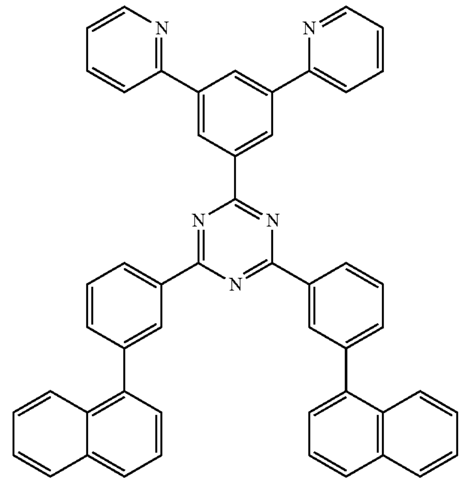
361
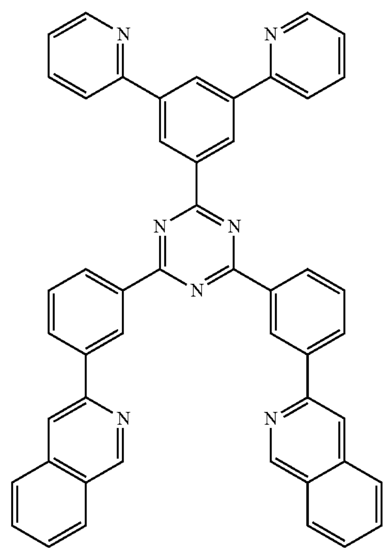
362
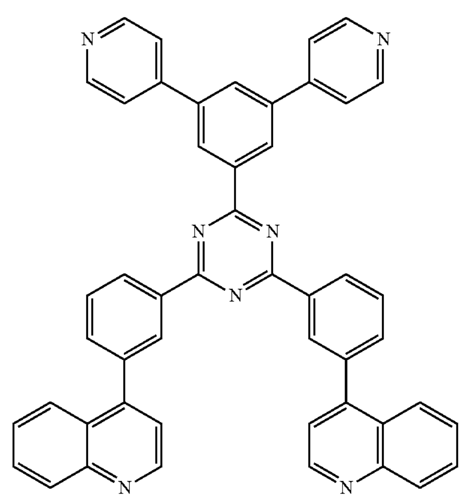

-continued
363
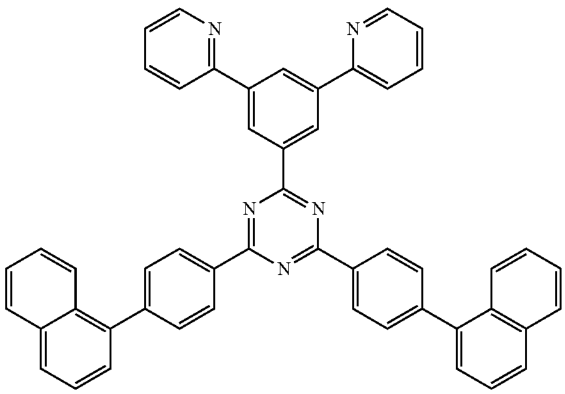
364
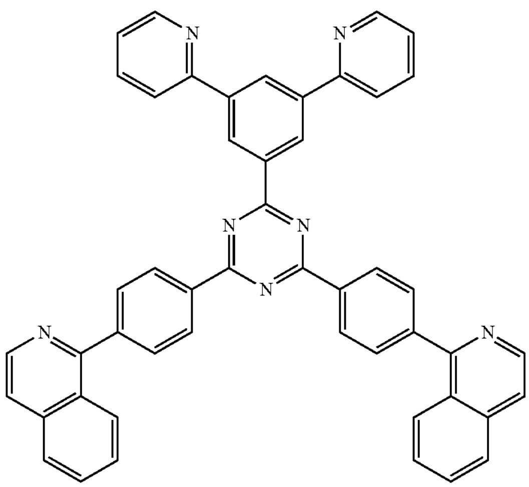
365
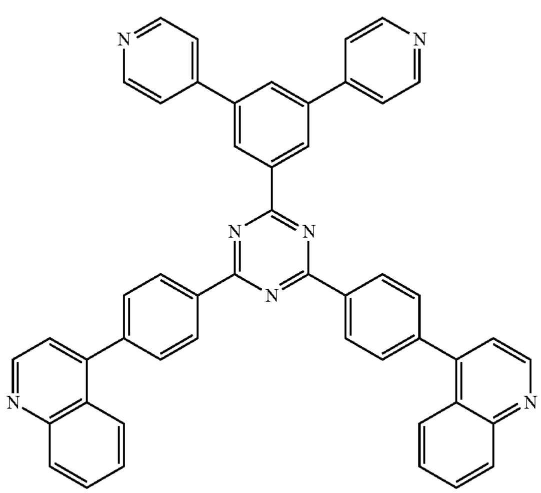
-continued
366
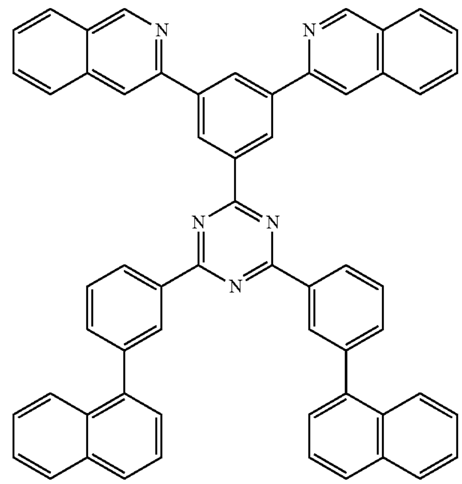
367
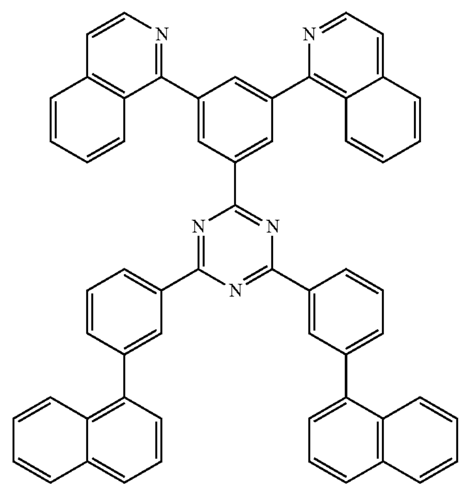
368
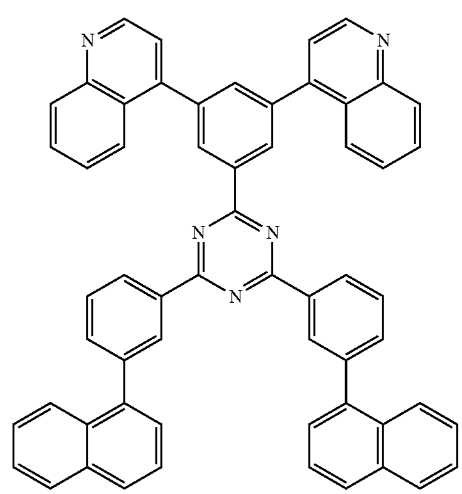

-continued
369
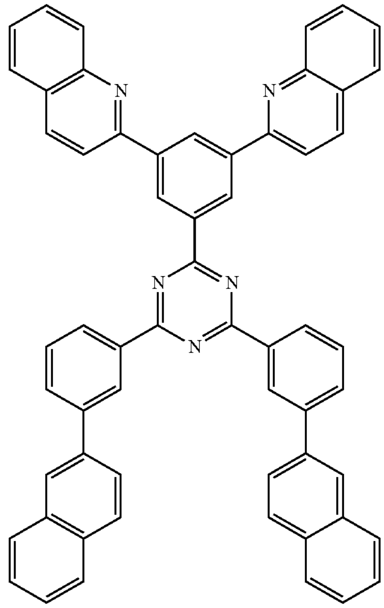
370
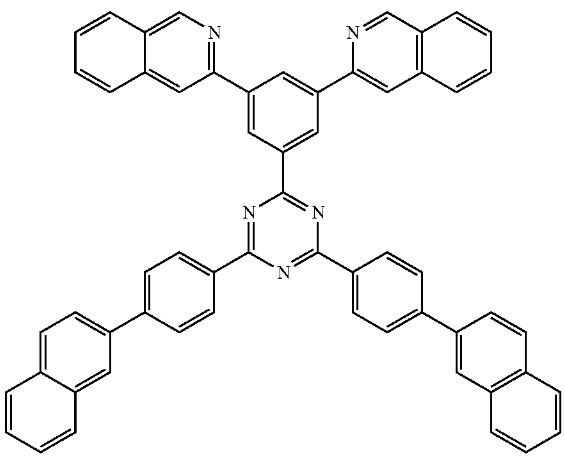
371
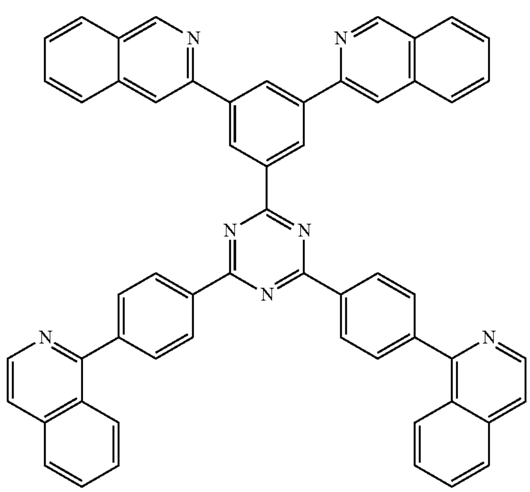
-continued
372
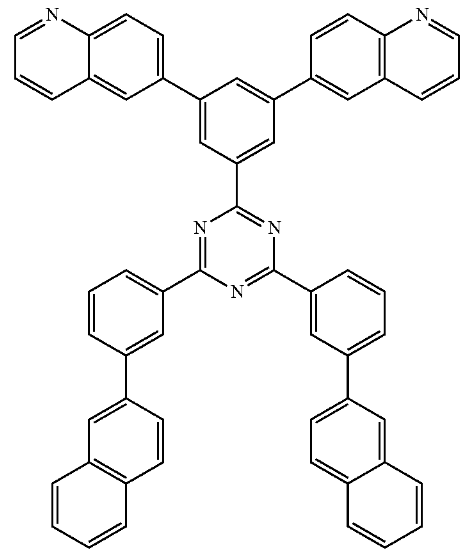
373
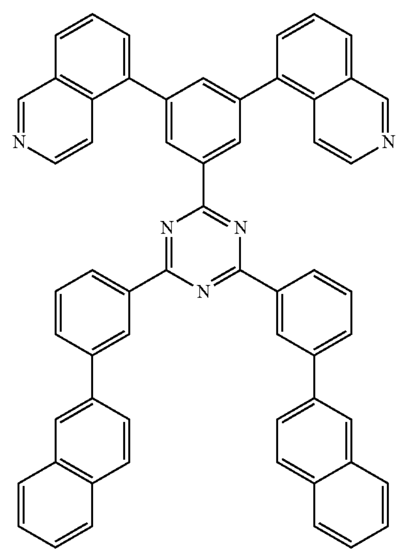
374
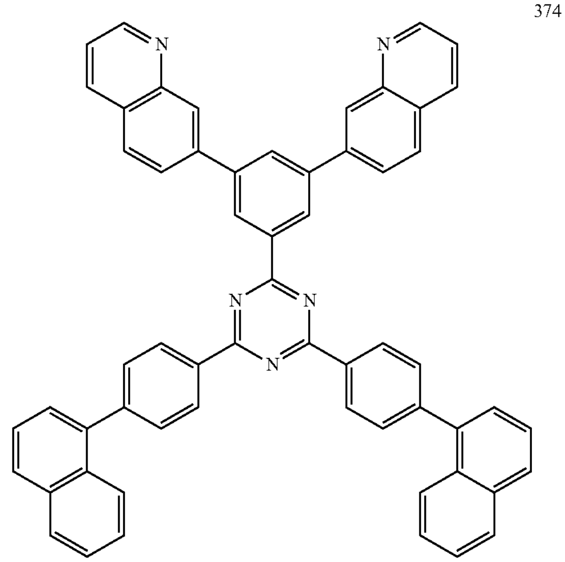

-continued
375
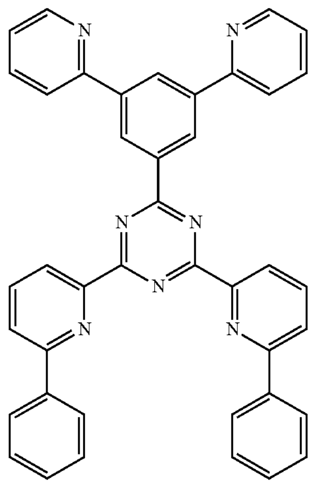
376
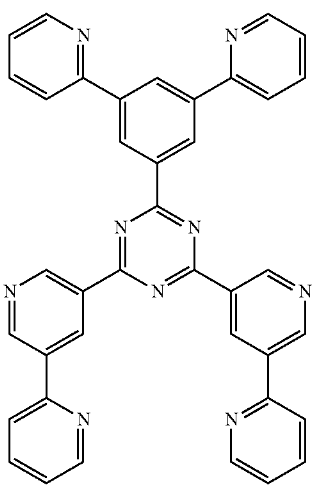
377
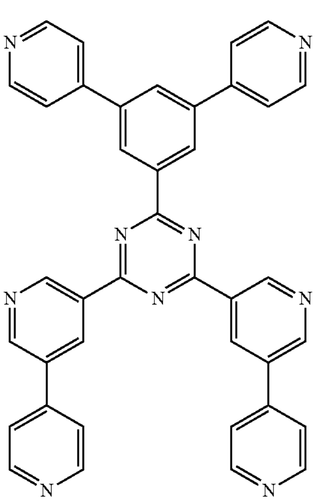
-continued
378
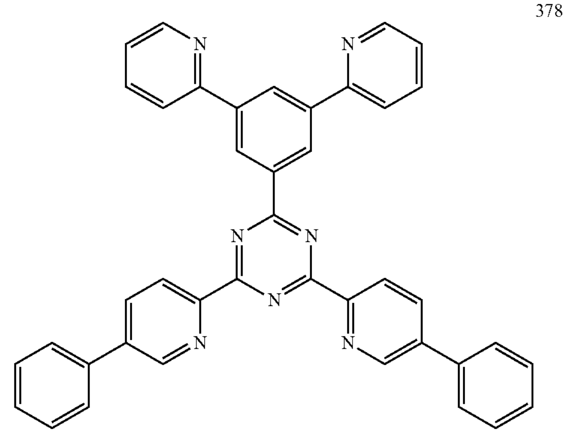
379
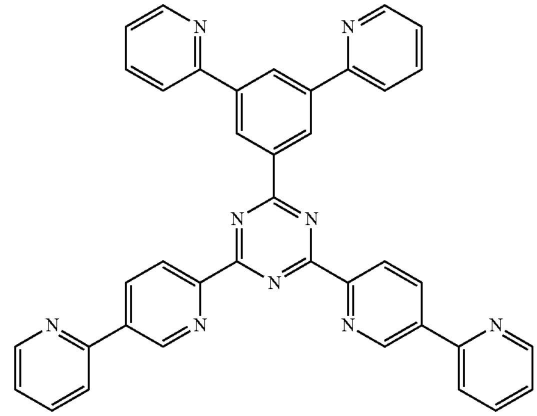
380
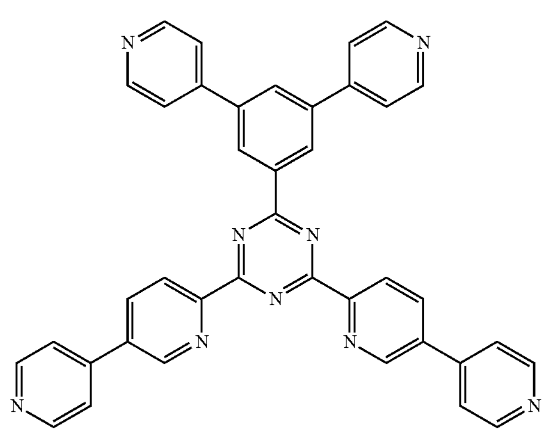

-continued
381
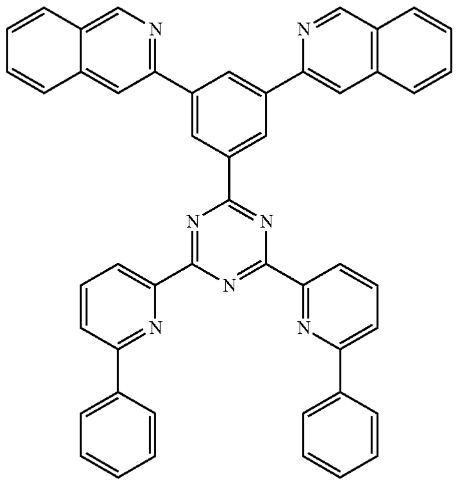
382
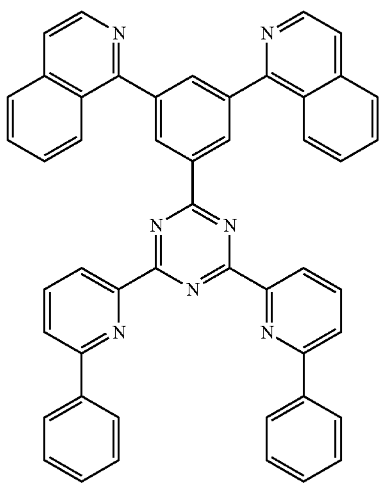
383
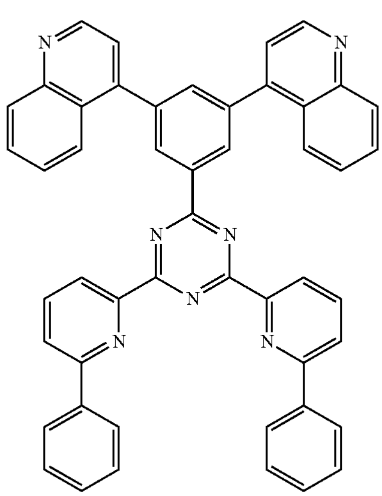
-continued
384
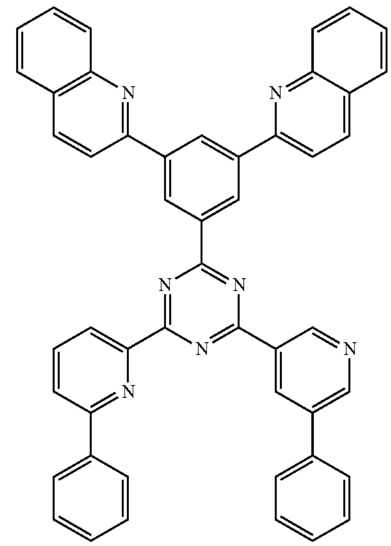
385
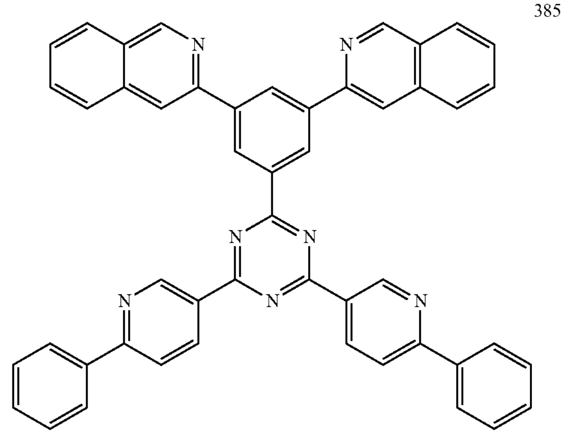
386
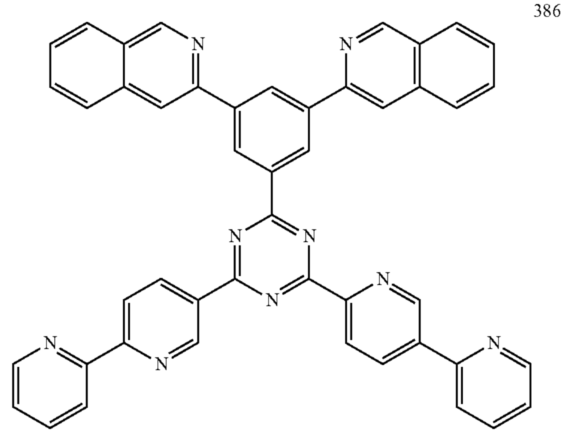

-continued
387
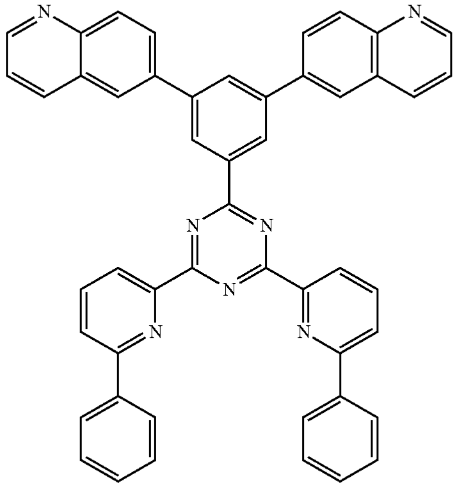
388
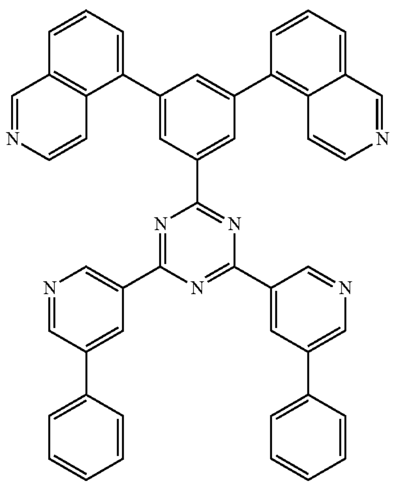
389
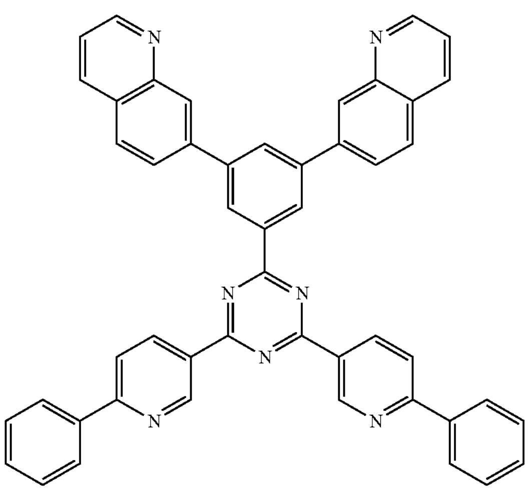
-continued
390
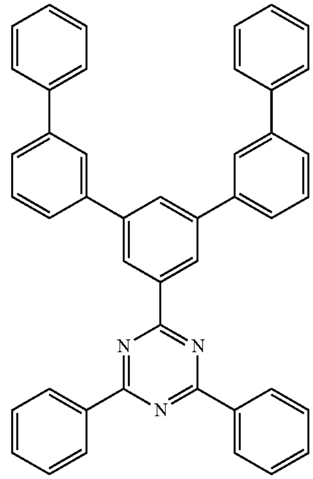
391
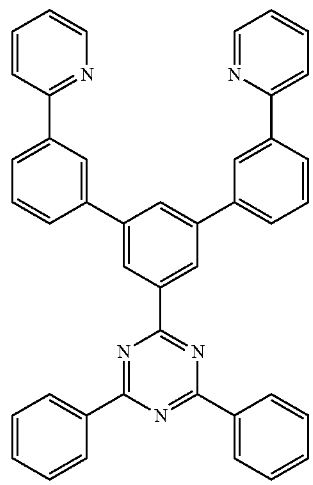
392
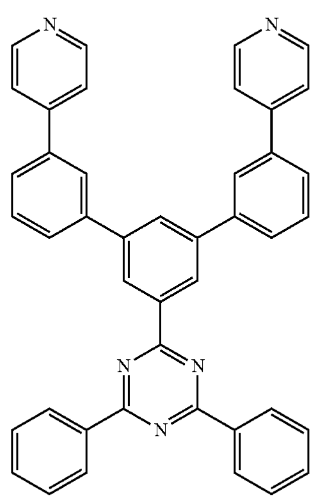

-continued
393
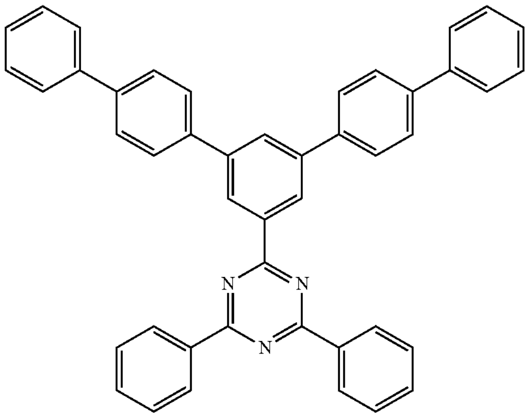
394
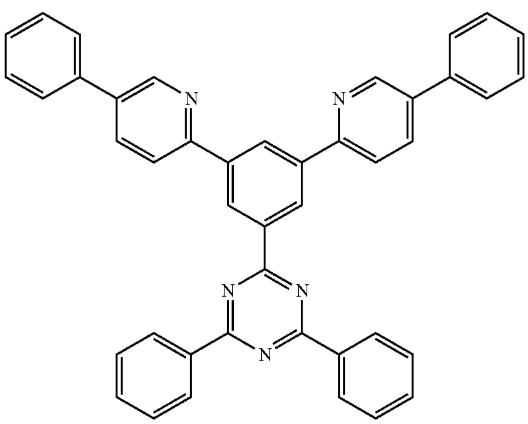
395
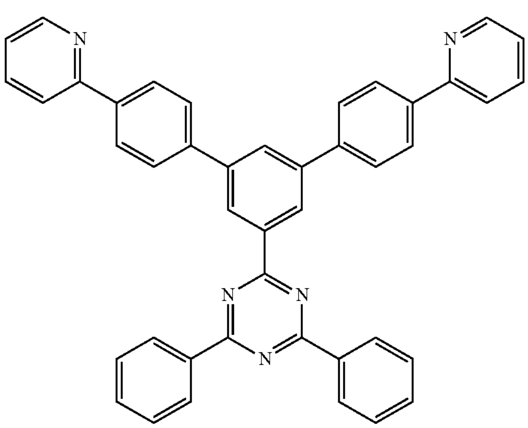
-continued
396
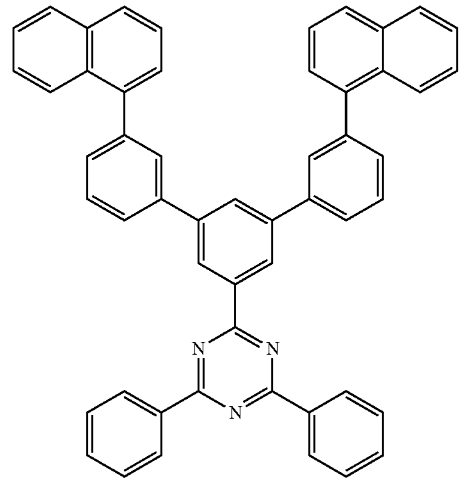
397
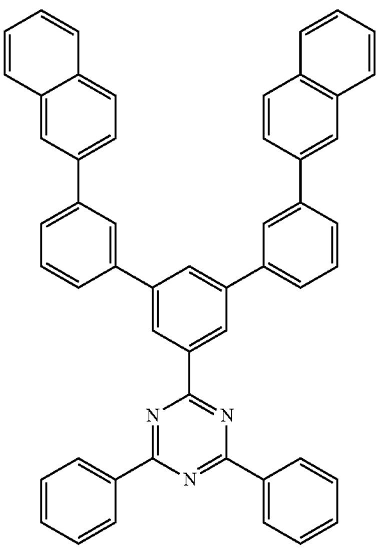
398
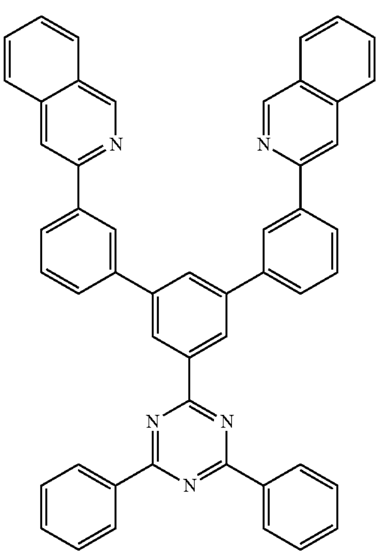

-continued
399
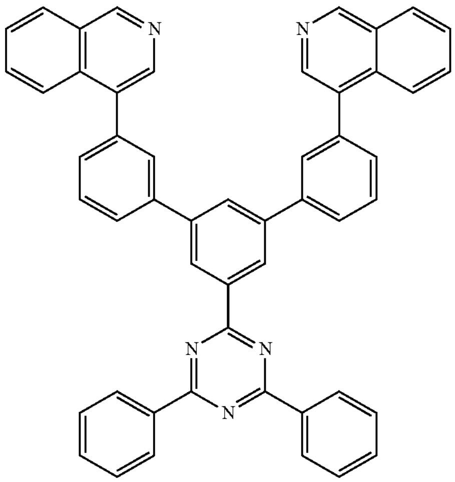
400
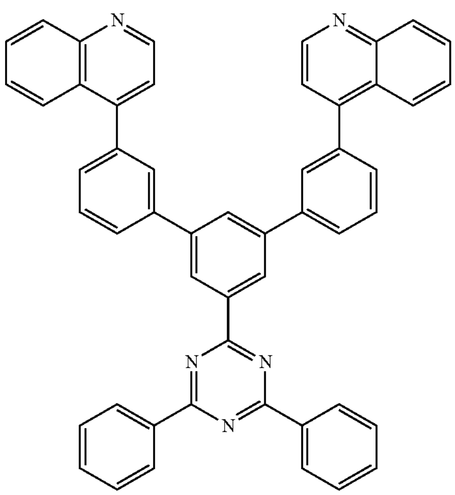
401
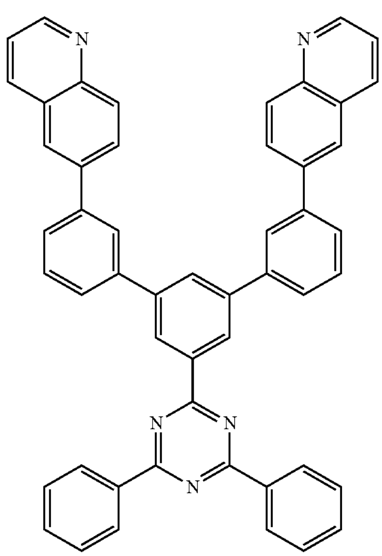
-continued
402
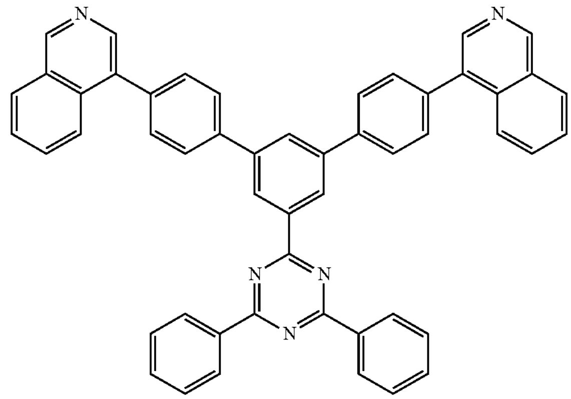
403
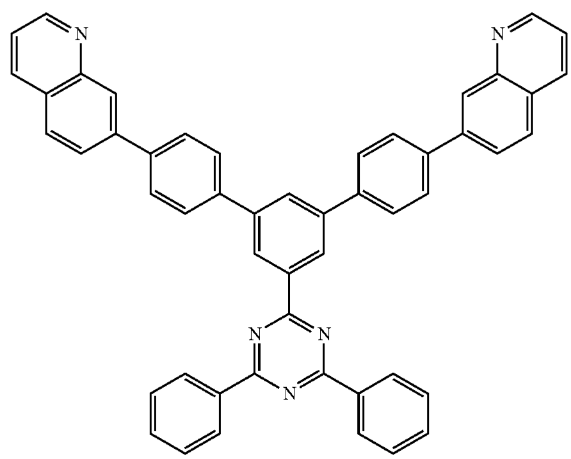
404
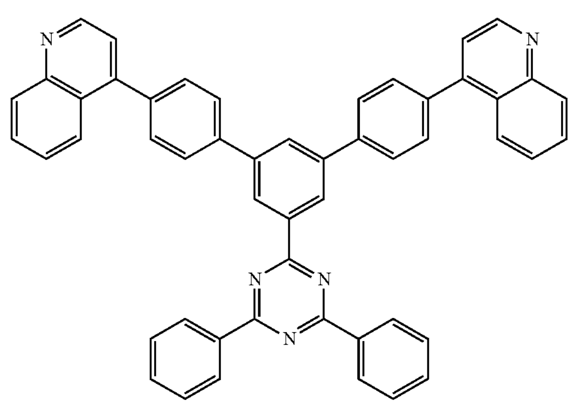

-continued
405
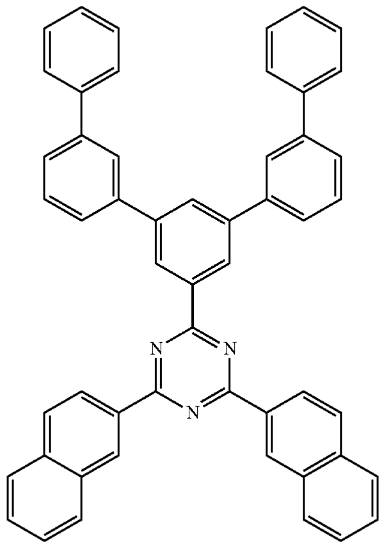
406
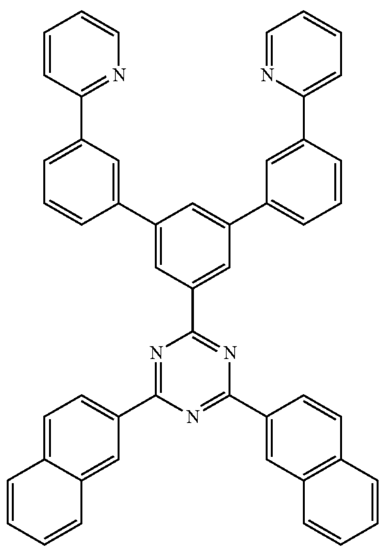
407
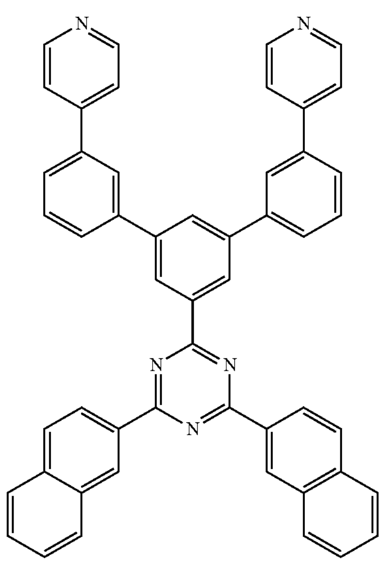
-continued
408
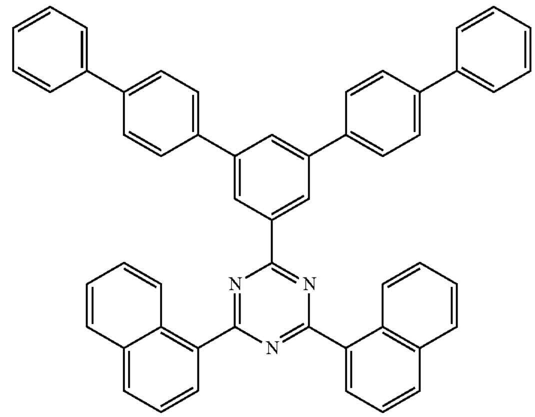
409
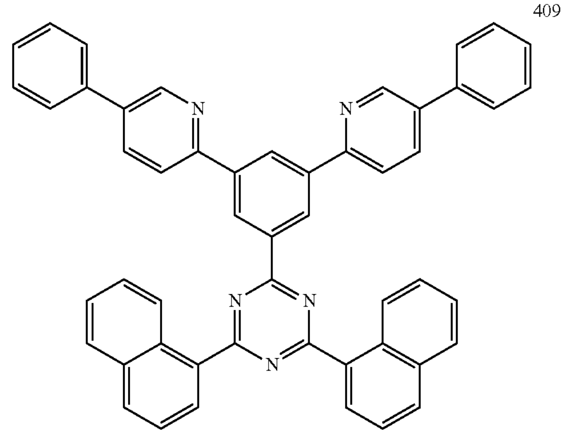
410
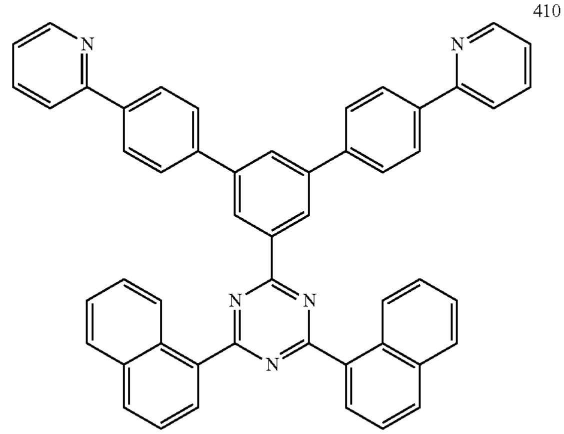

-continued
411
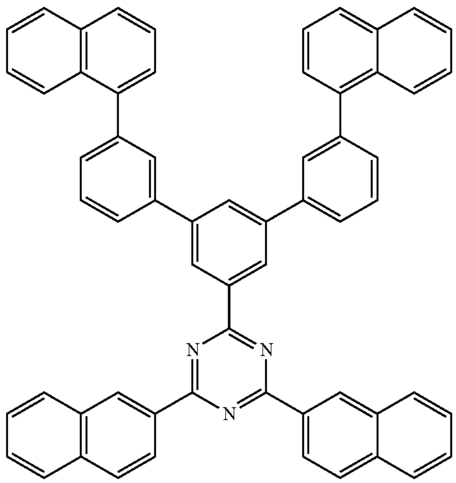
412
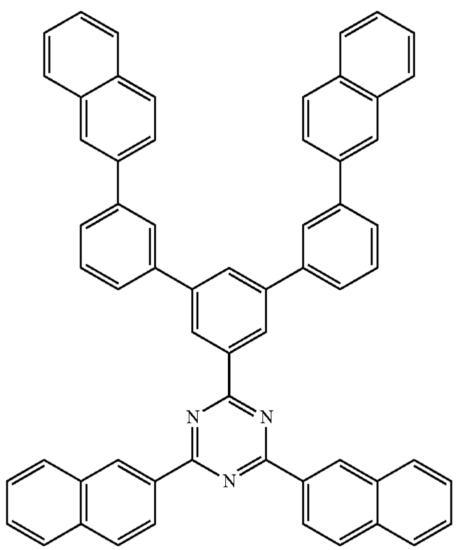
413
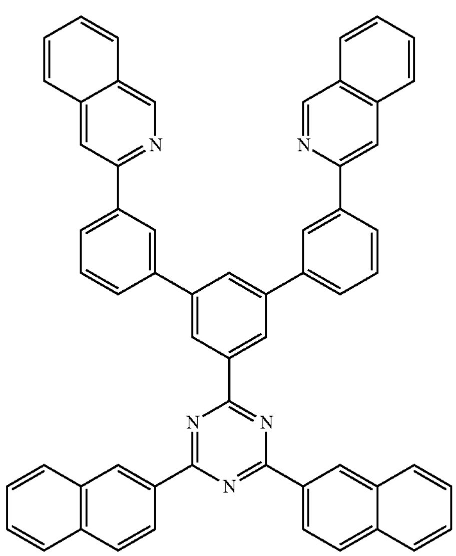
-continued
414
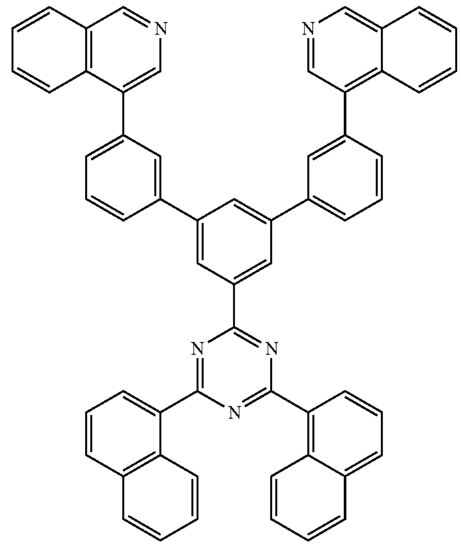
415
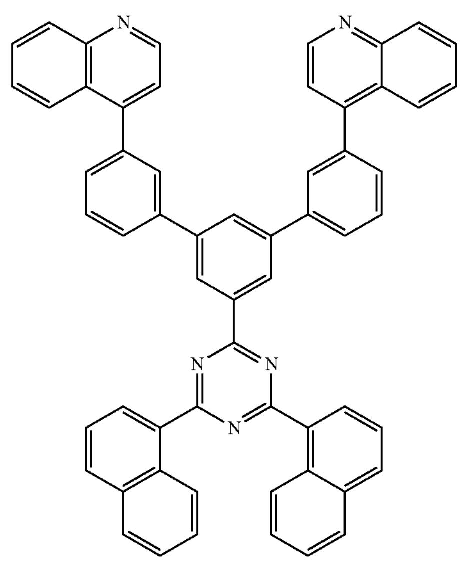

-continued
416
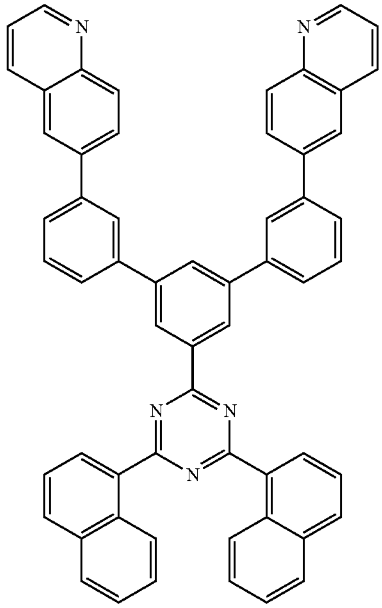
417
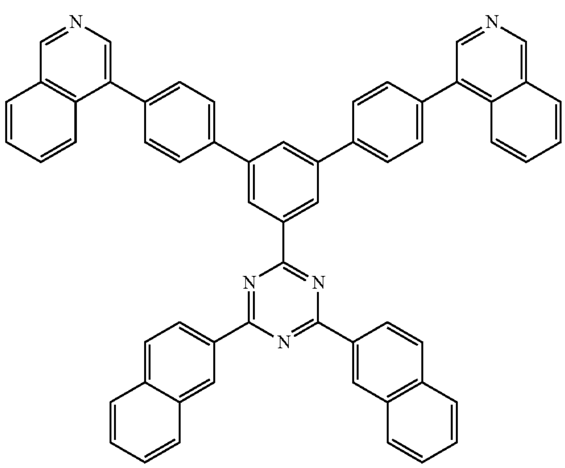
418
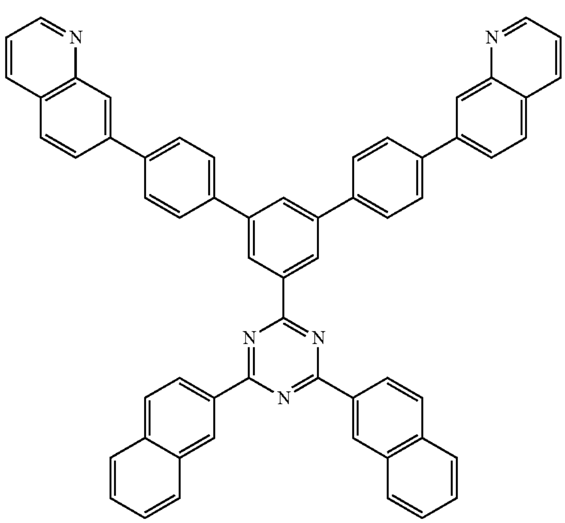
-continued
419
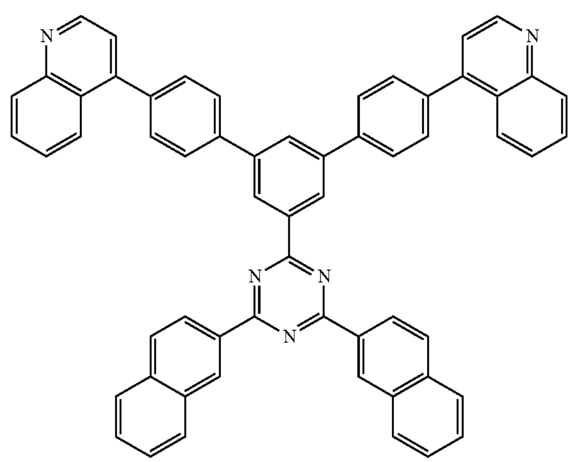
420
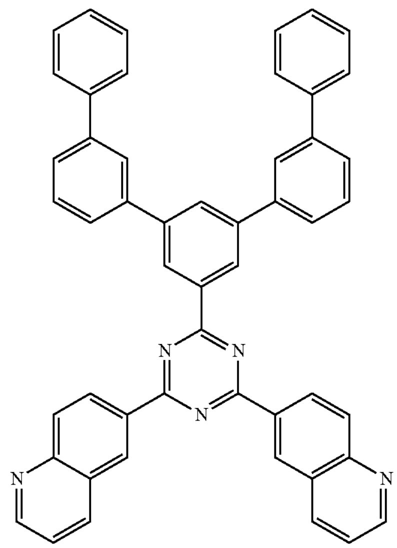
421
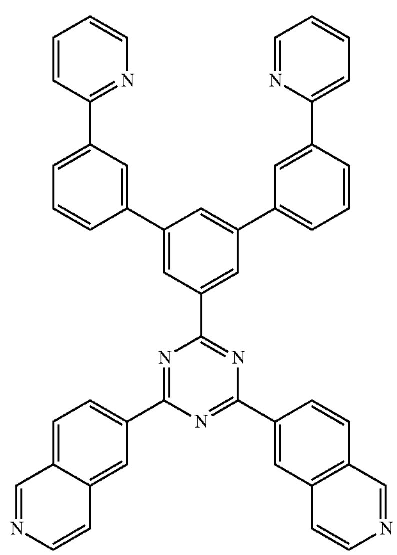

-continued
422
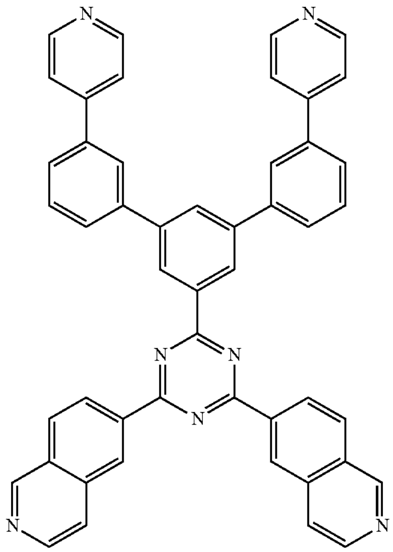
423
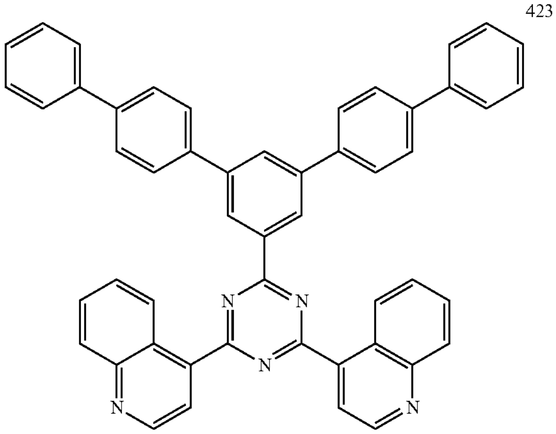
424
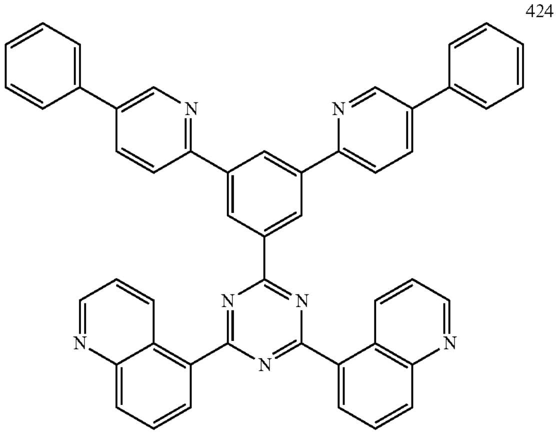
-continued
425
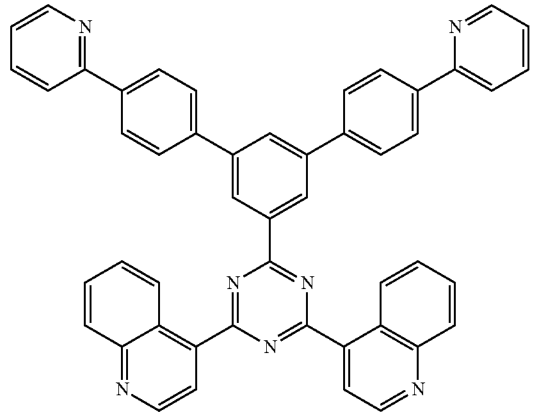
426
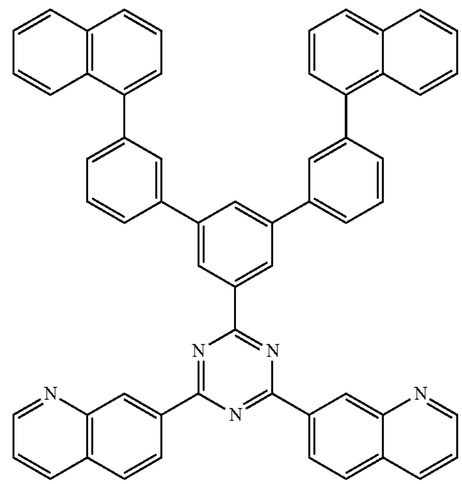
427
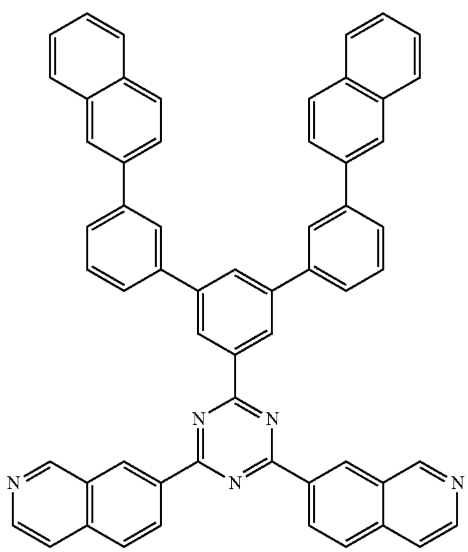

-continued
428
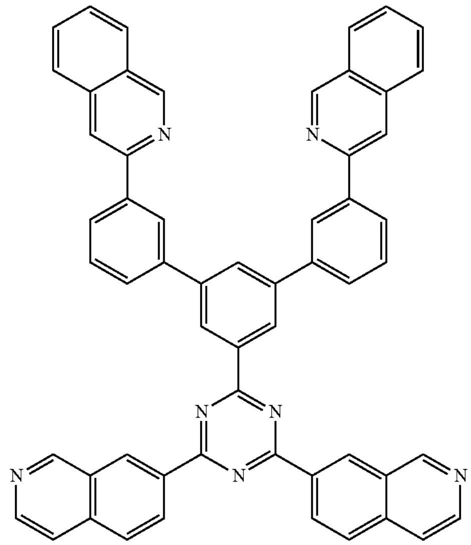
429
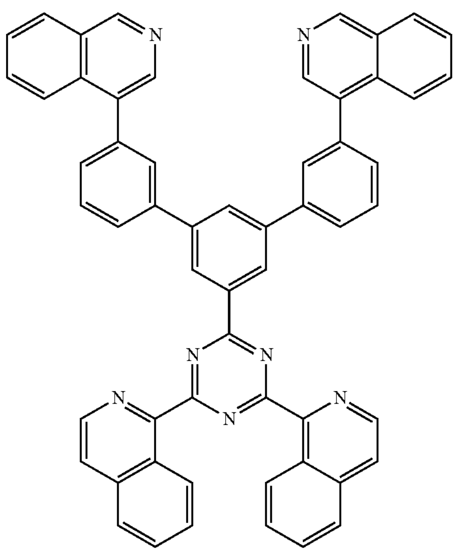
430
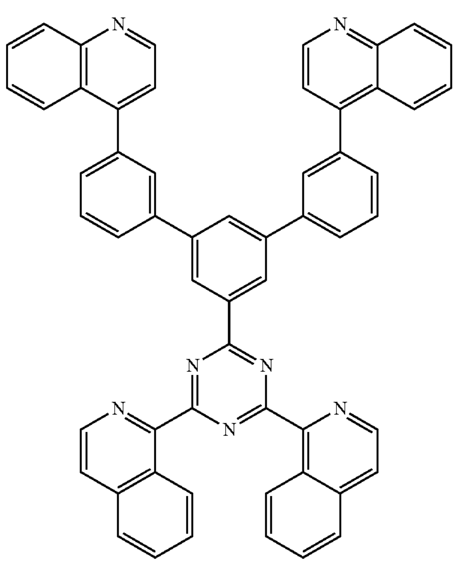
-continued
431
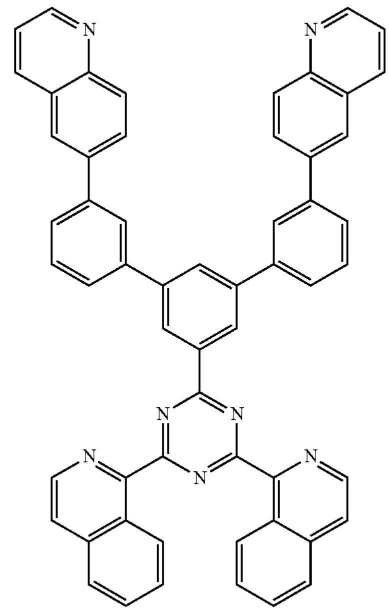
432
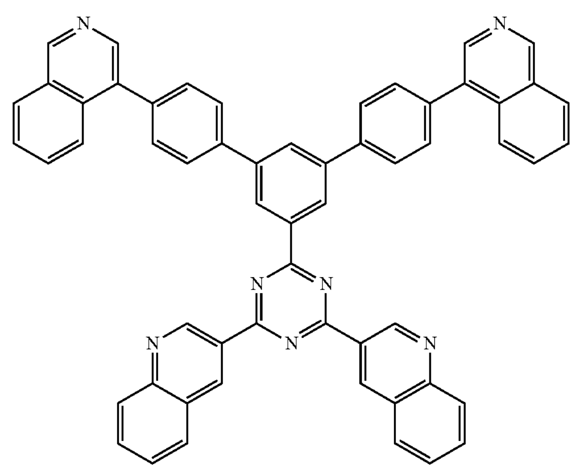
433
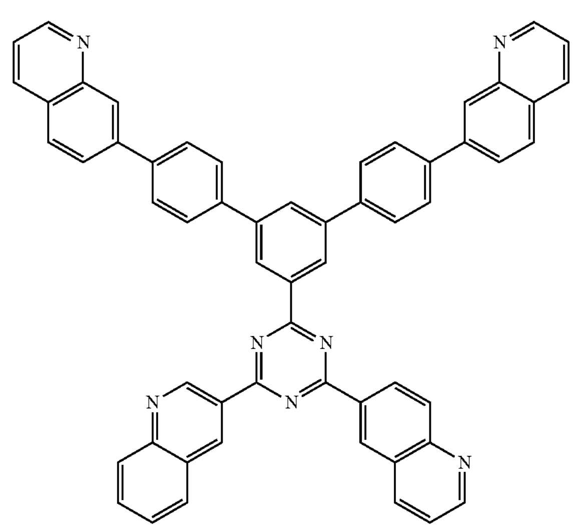

-continued
434
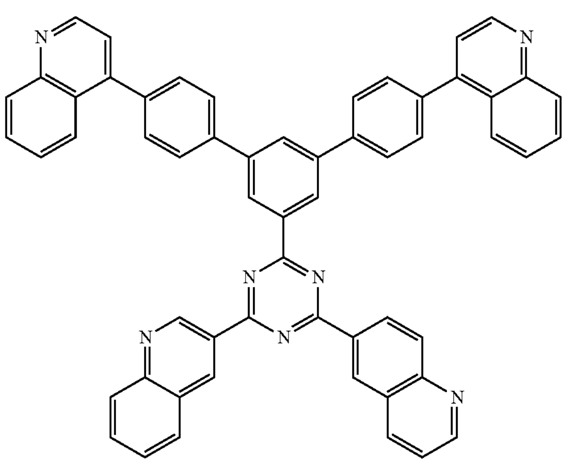
435
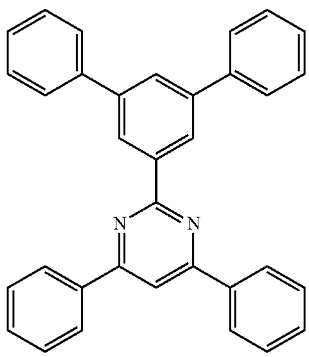
436
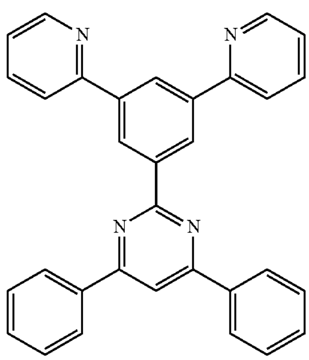
437
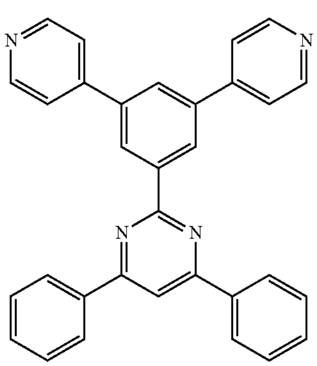
-continued
438
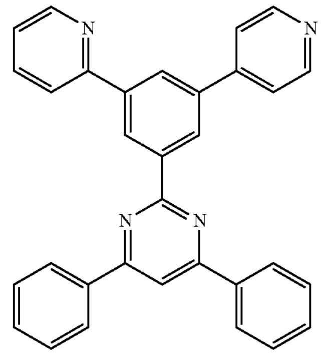
439
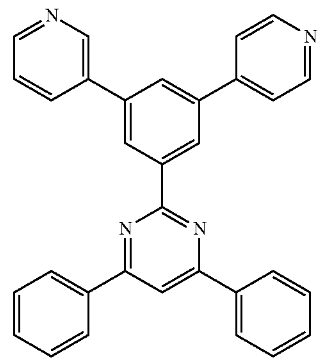
440
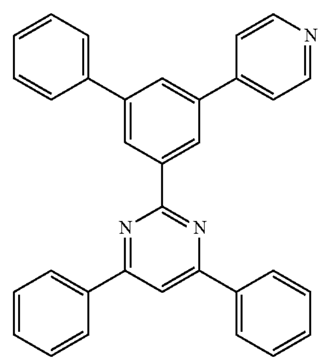
441
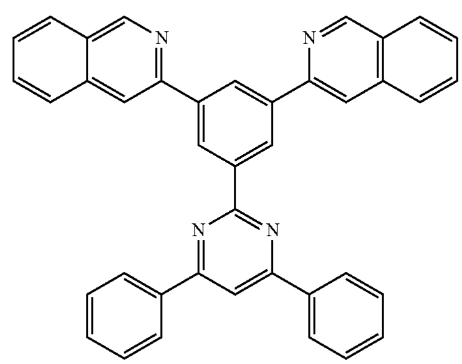

-continued
442
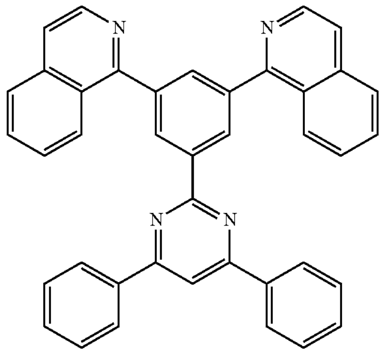
443
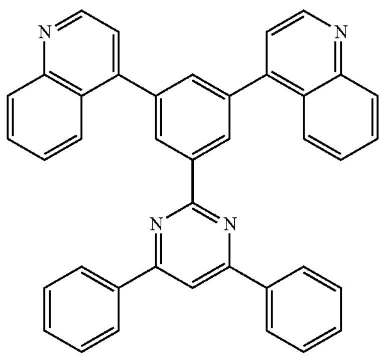
444
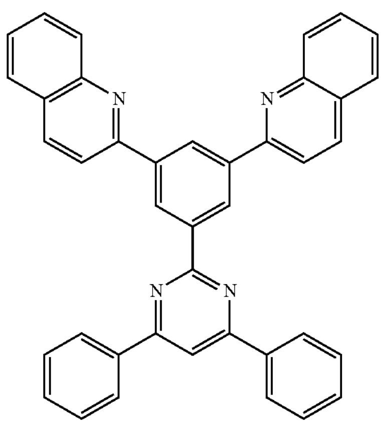
445
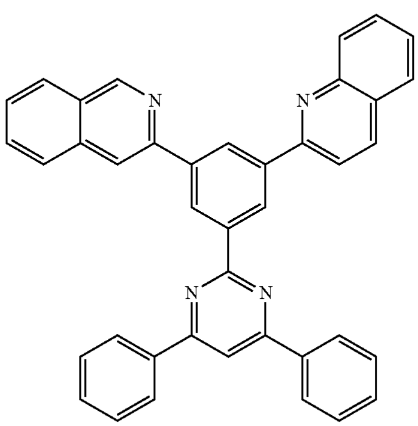
-continued
446
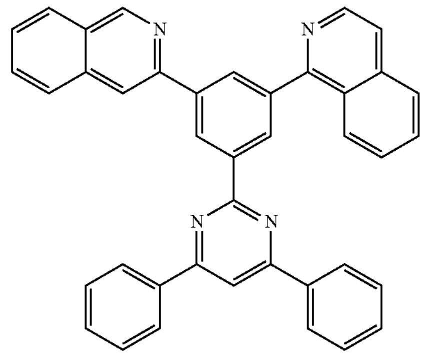
447
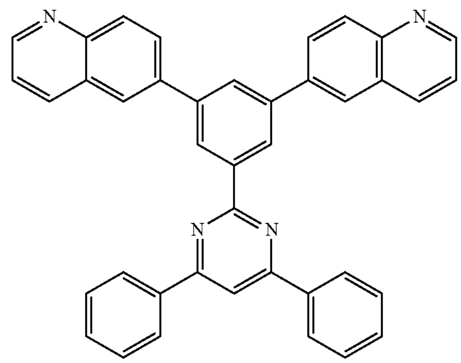
448
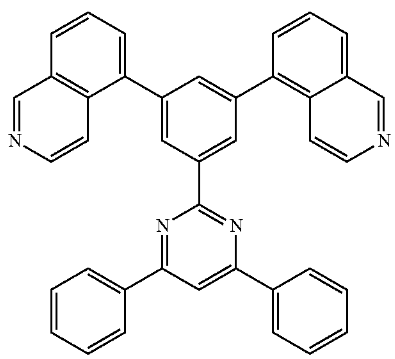
449
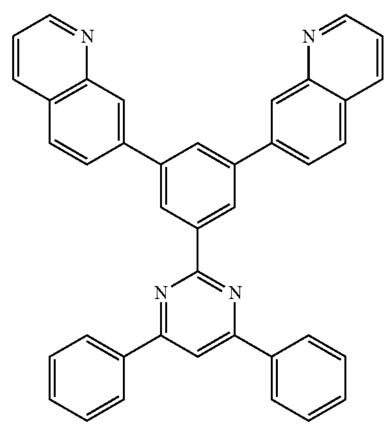

-continued
450
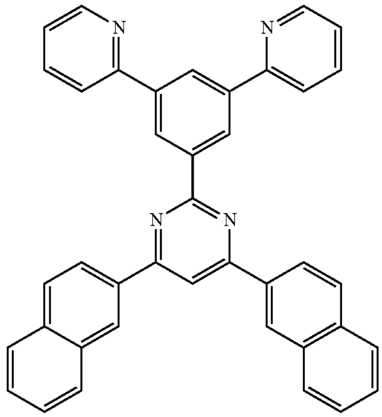
451
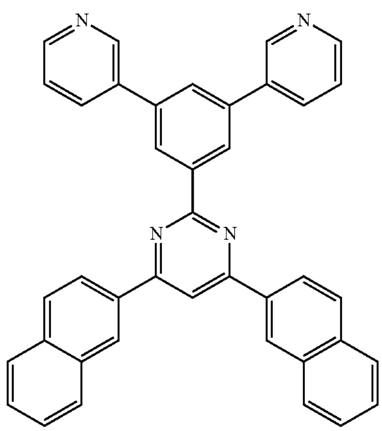
452
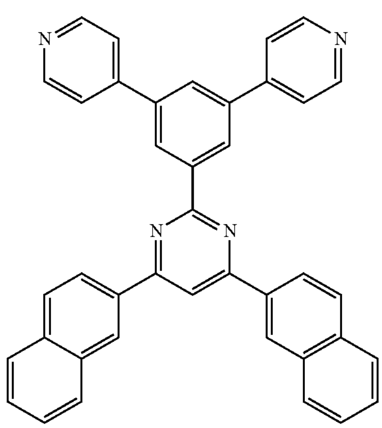
-continued
453
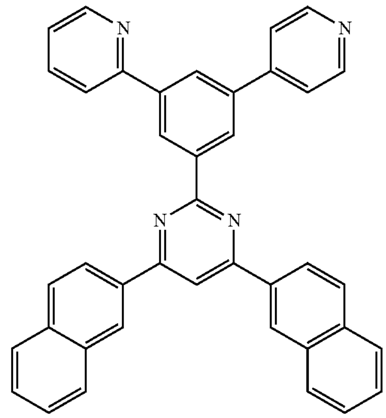
454
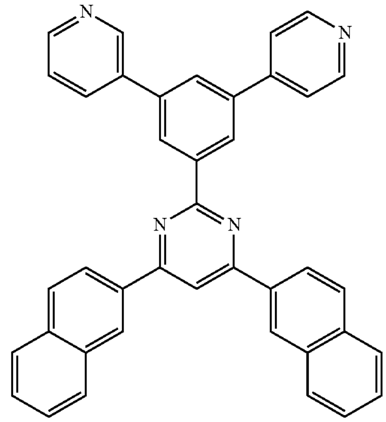
455
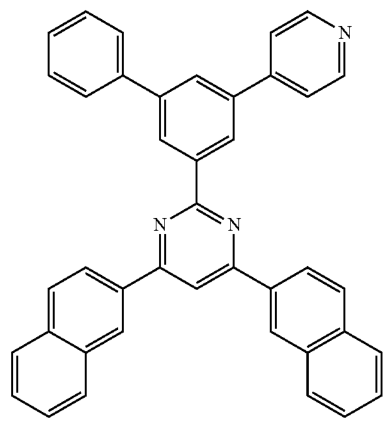
455
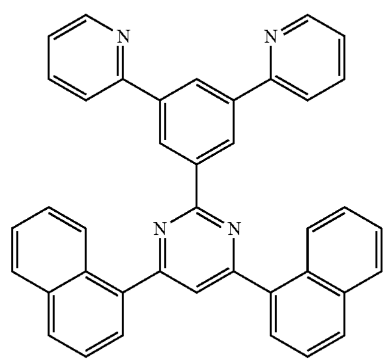

-continued
456
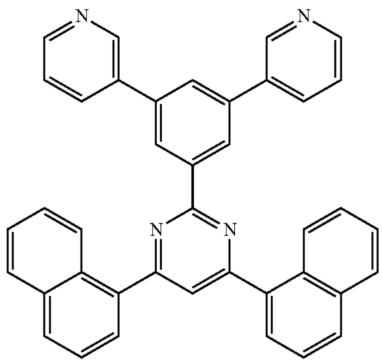
457
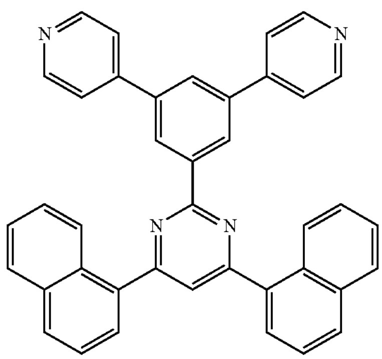
458
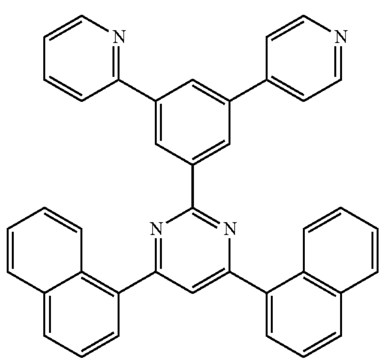
459
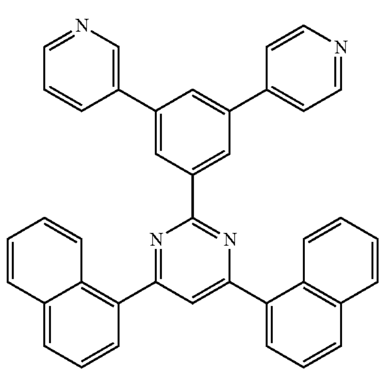
-continued
460
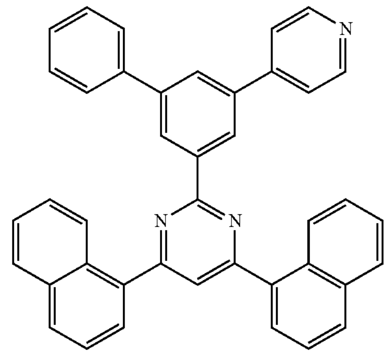
461
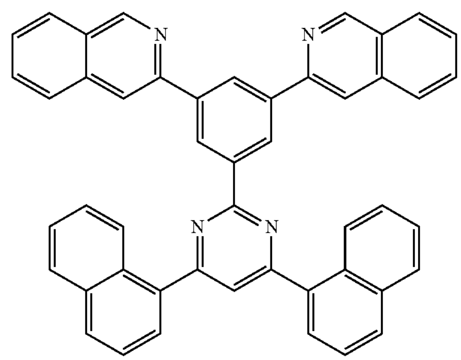
462
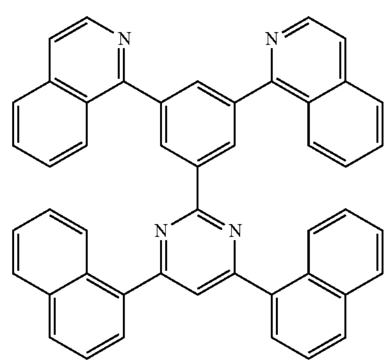
463
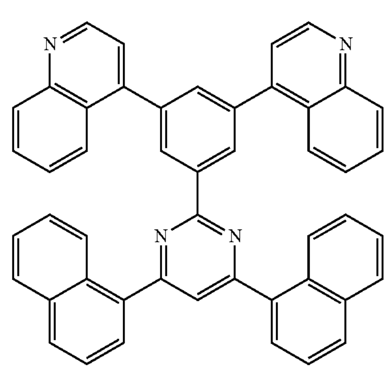

-continued
456
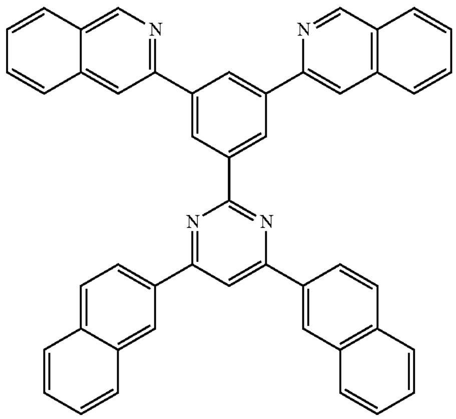
457
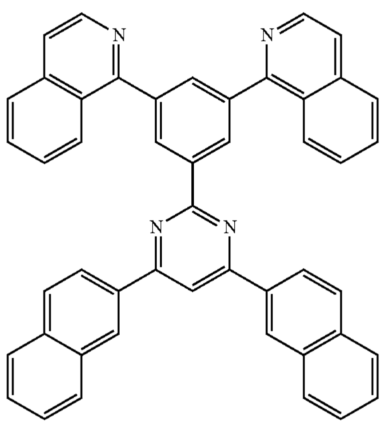
458
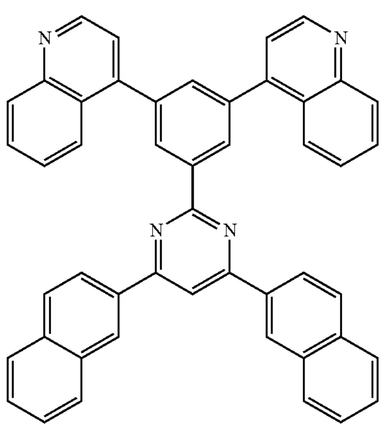
-continued
459
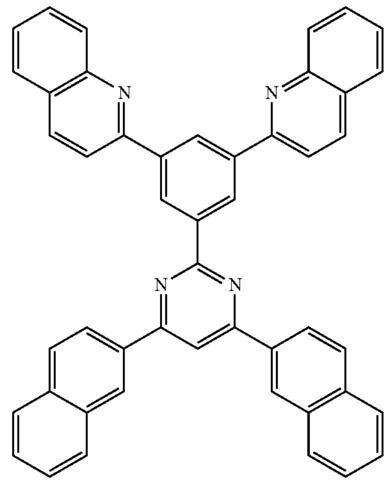
450
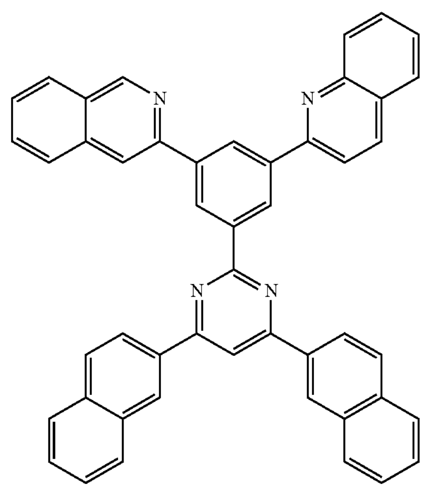
451
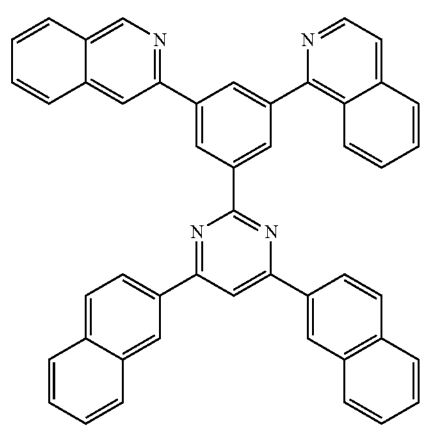

-continued
452
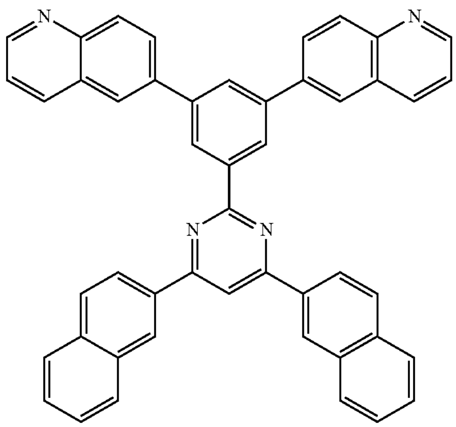
453
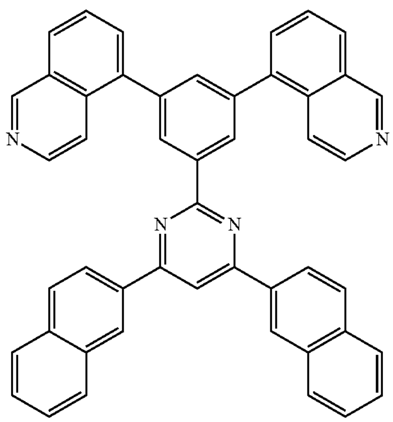
454
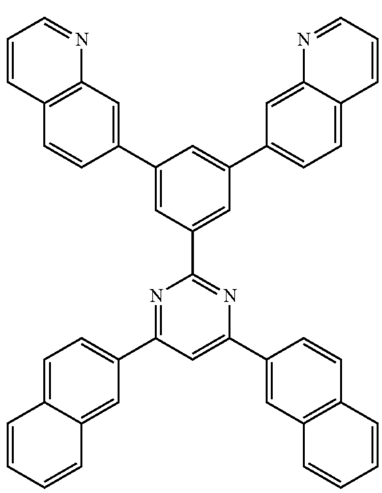
-continued
464
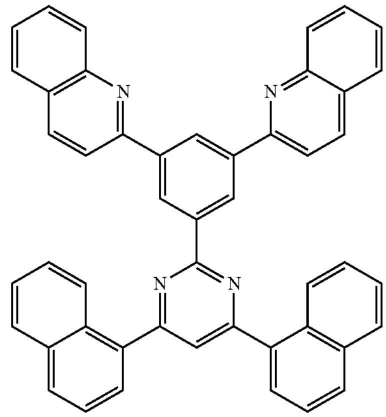
465
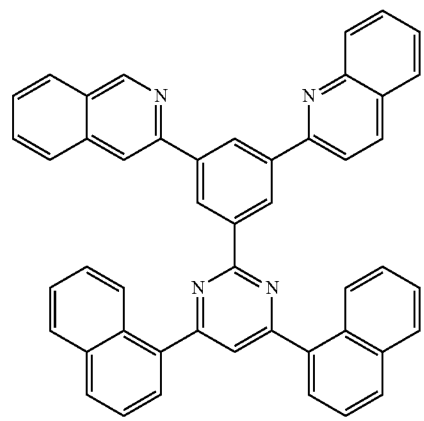
466
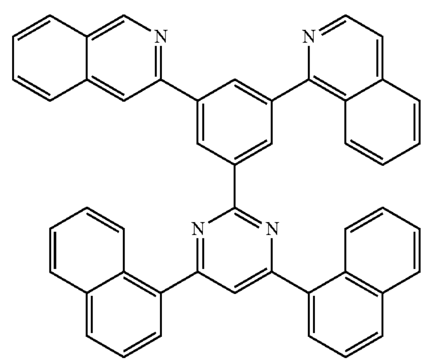
467
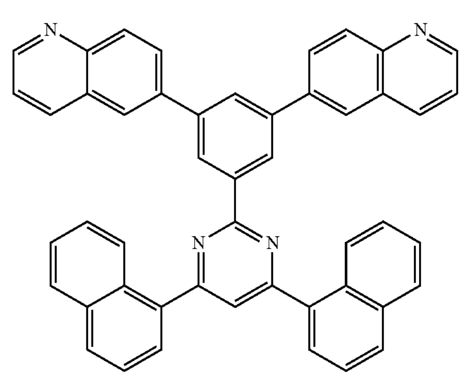

-continued
468
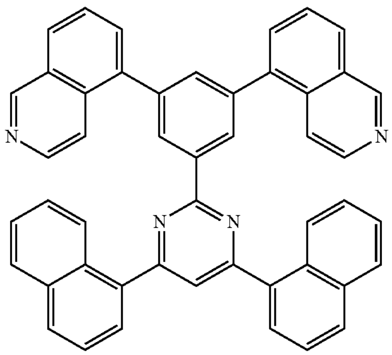
469
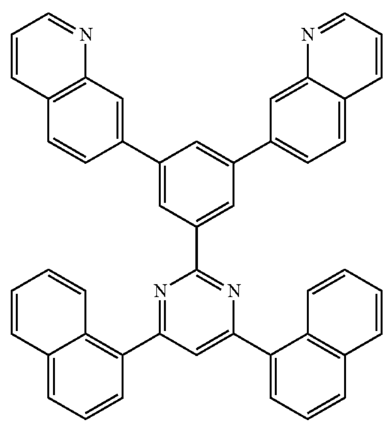
470
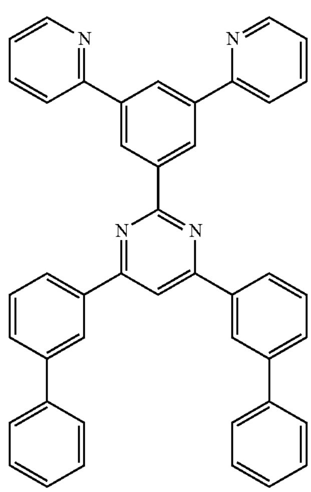
-continued
471
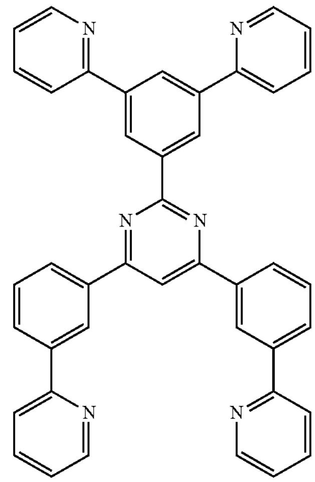
472
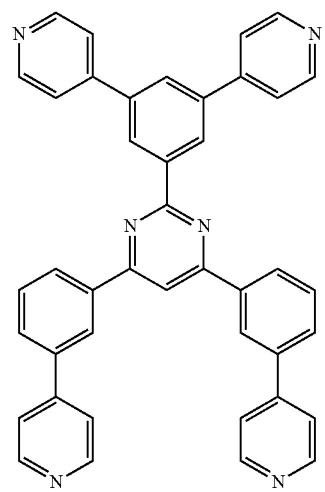
473
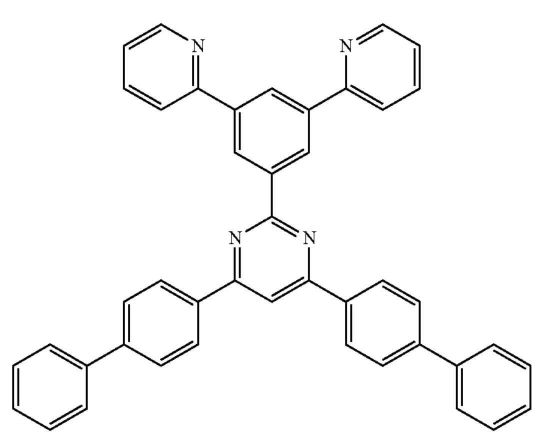

474
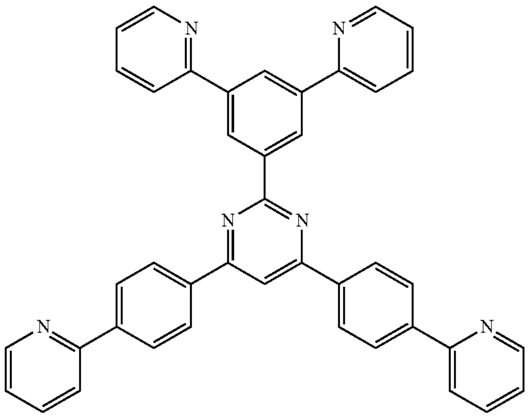
475
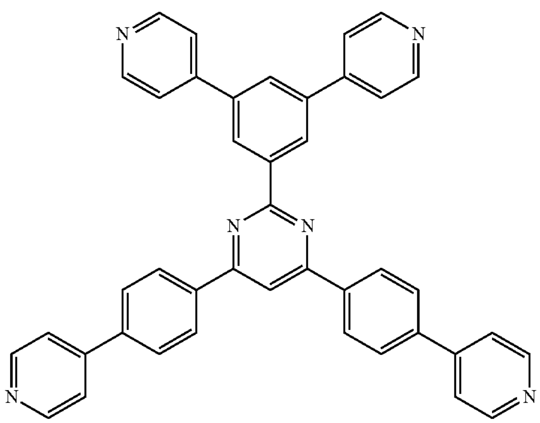
476
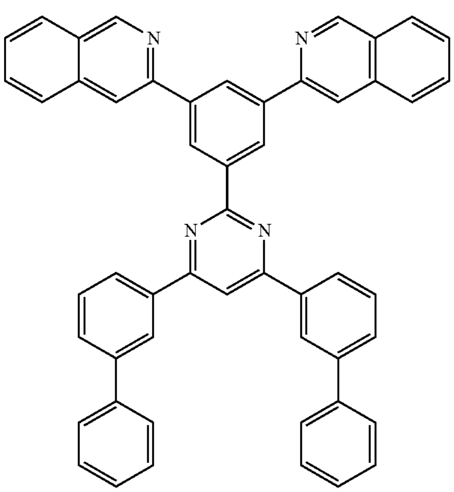
477
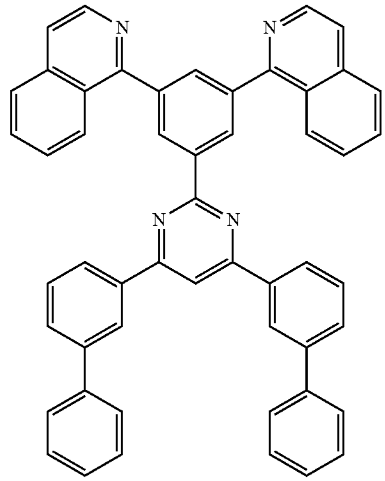
478
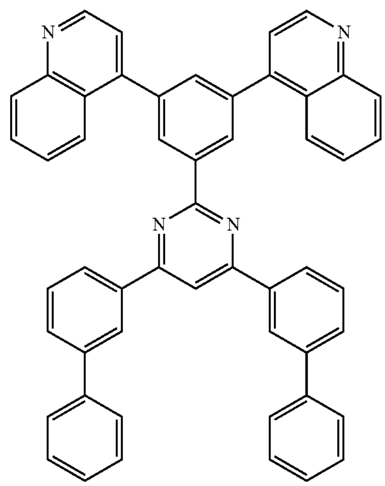
479
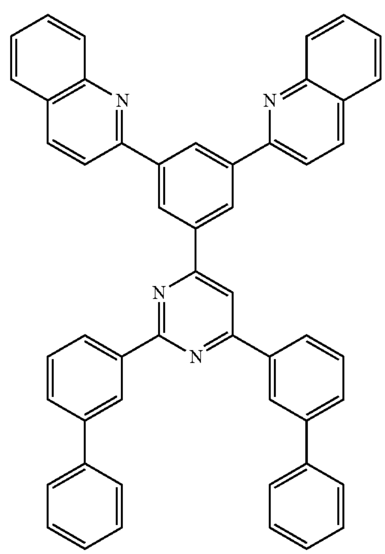

-continued
480
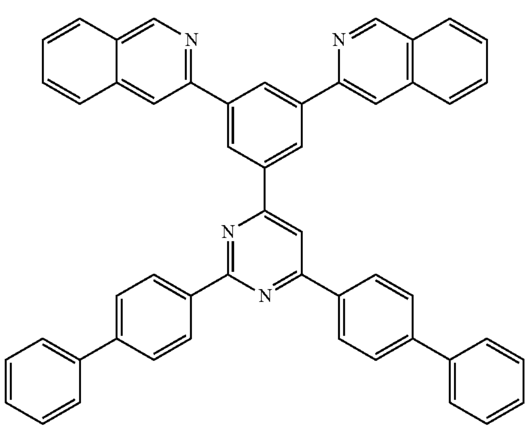
481
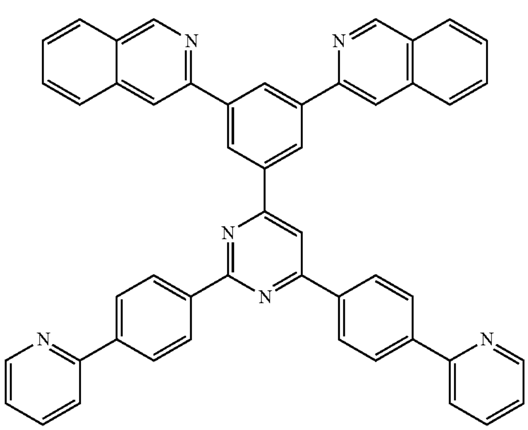
482
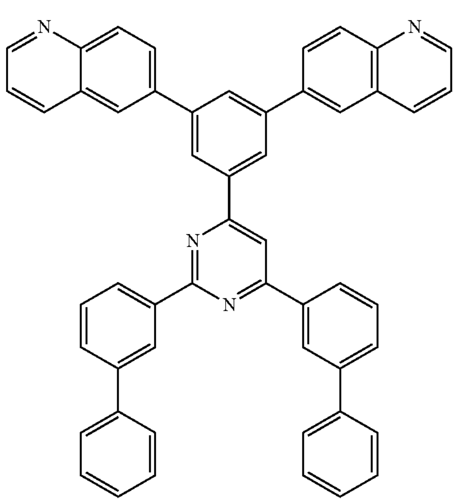
-continued
483
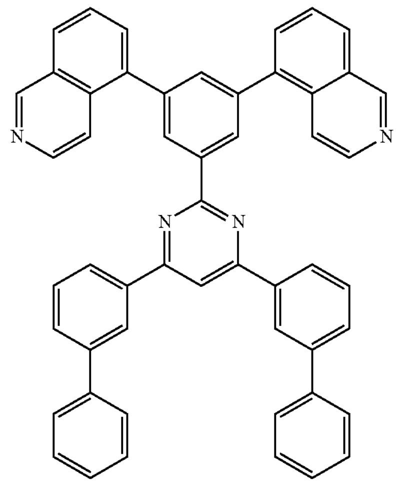
484
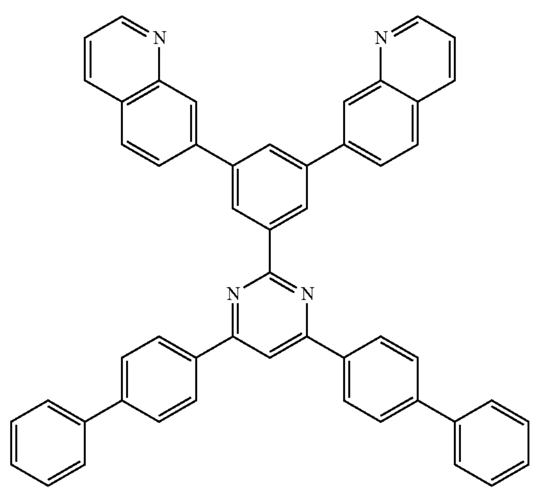
485
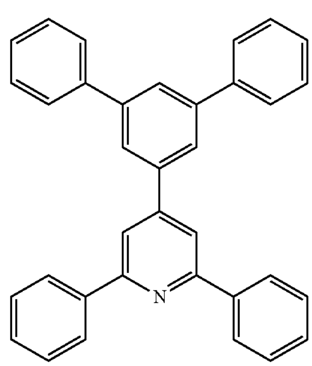

486
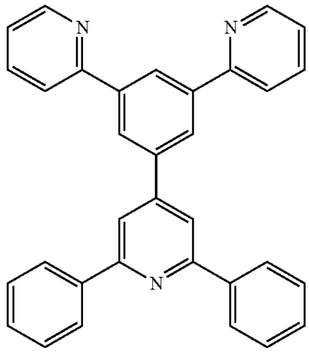
487
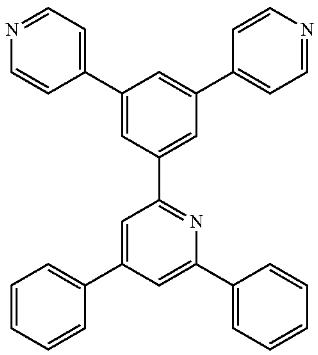
488
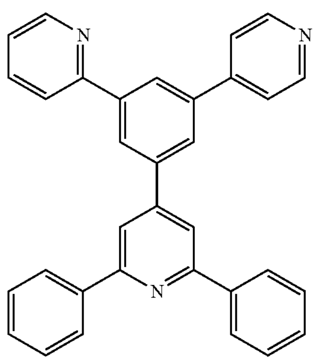
489
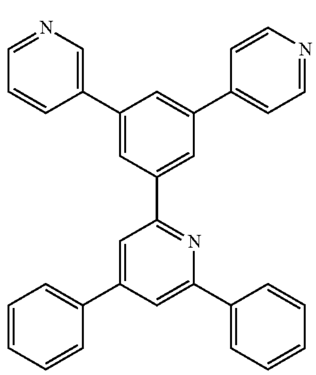
490
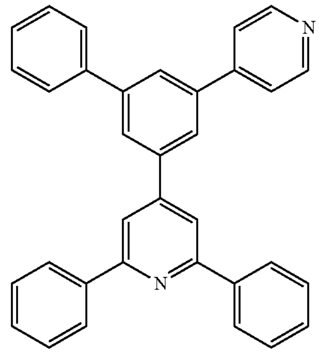
491
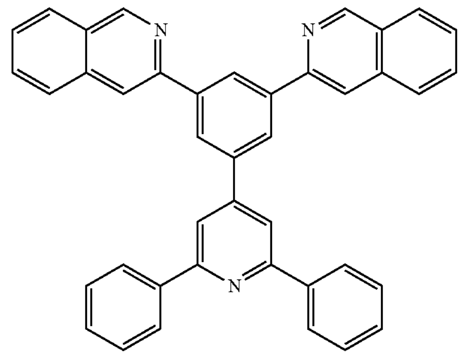
492
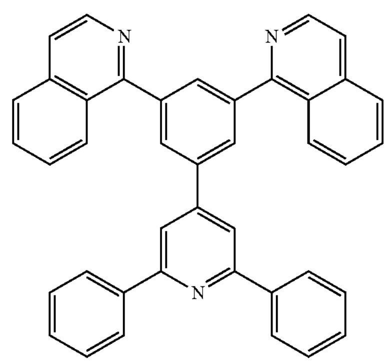
493
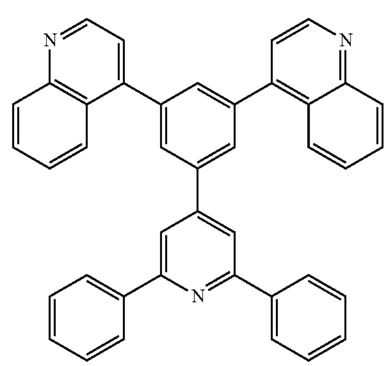

-continued
494
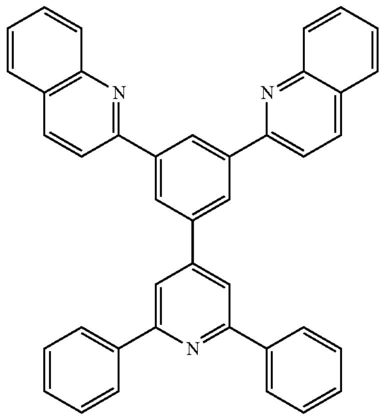
495
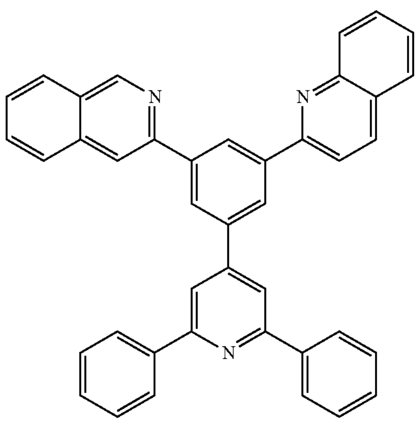
496
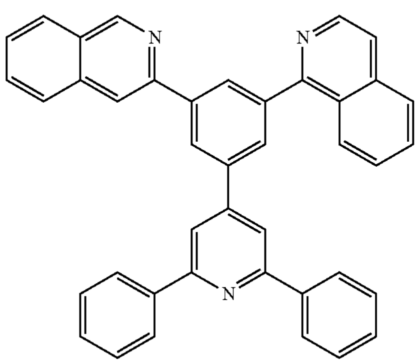
497
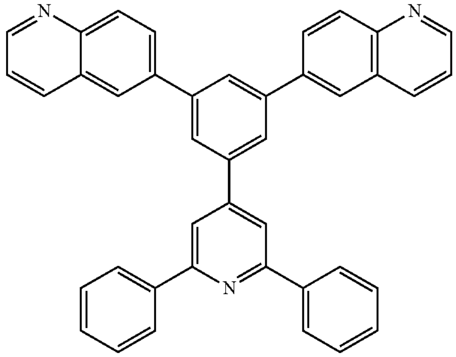
-continued
498
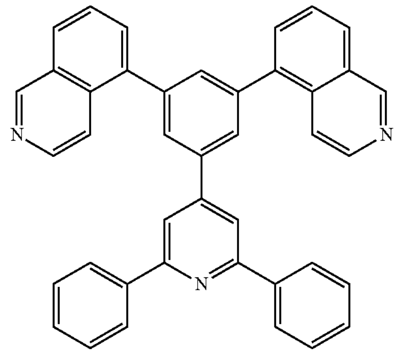
499
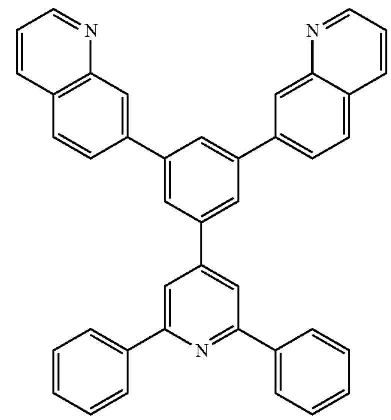
500
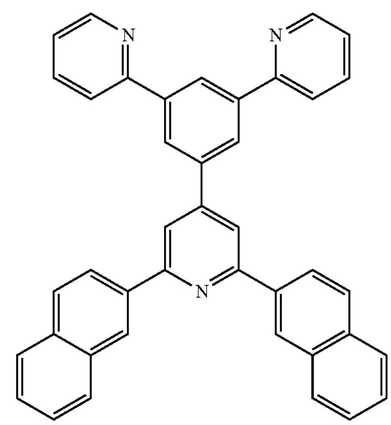
501
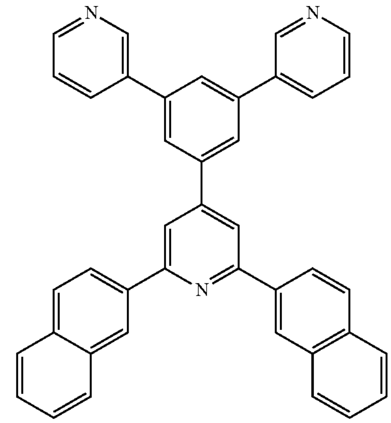

-continued
502
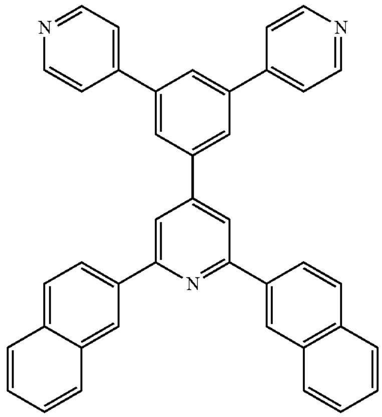
503
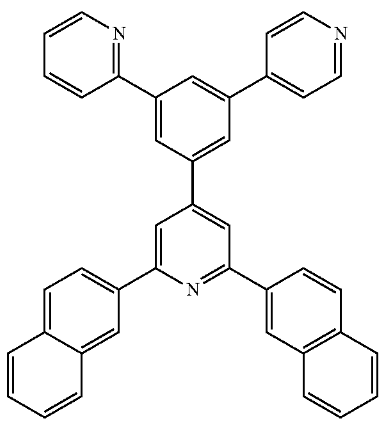
504
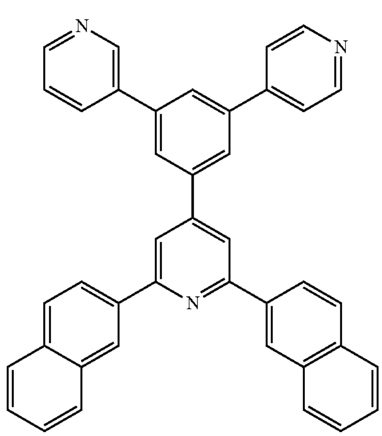
-continued
505
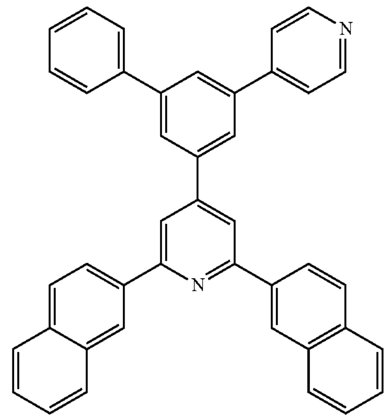
506
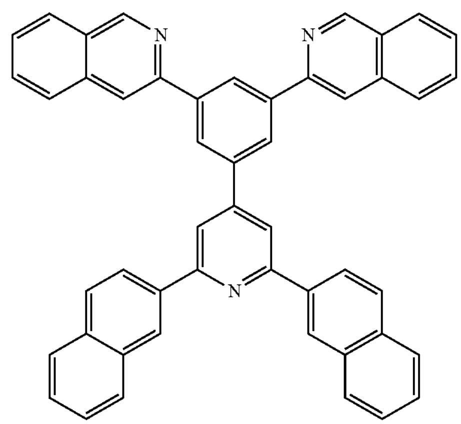
507
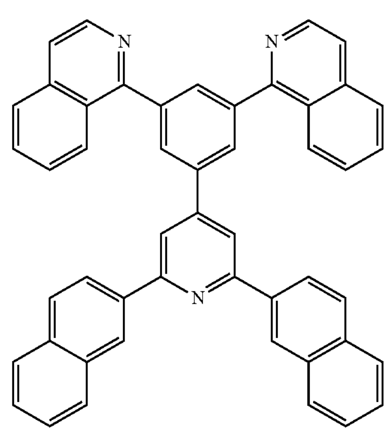

-continued
508
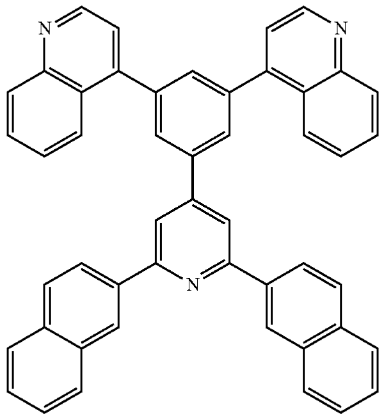
509
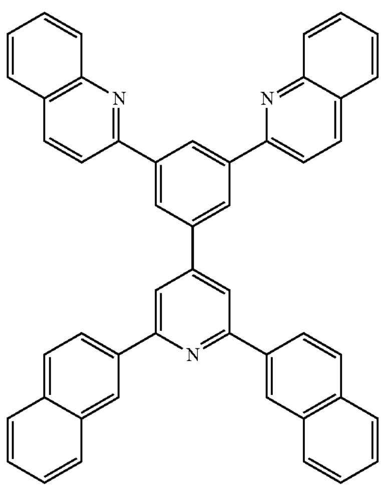
510
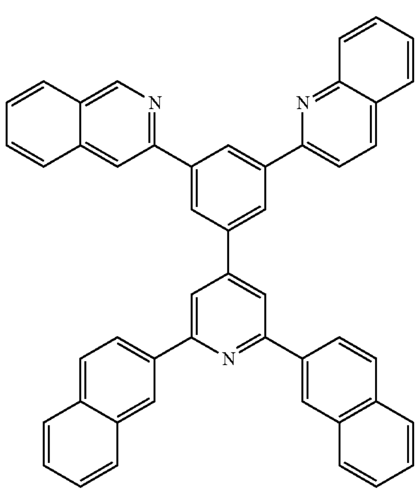
-continued
511
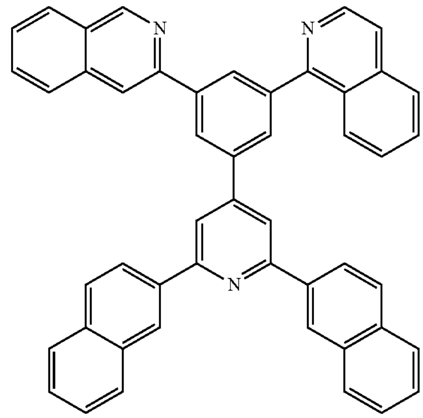
512
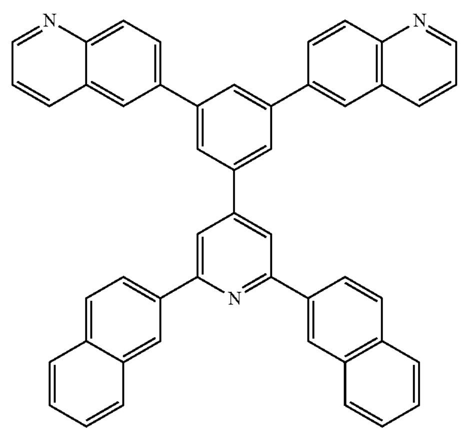
513
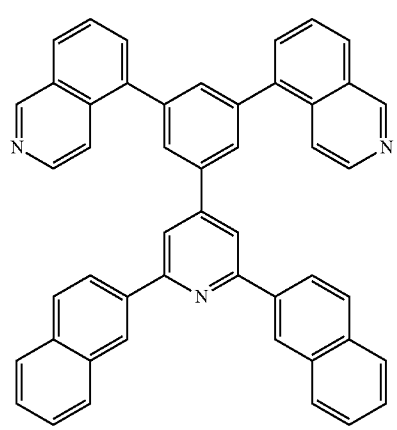

-continued
514
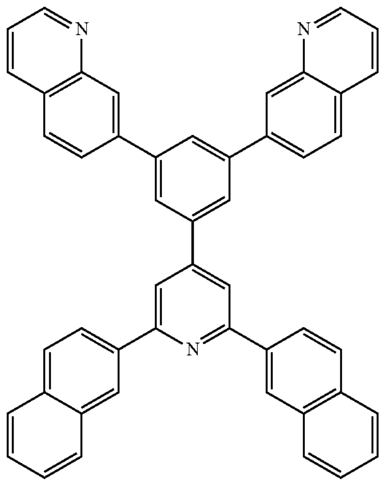
515
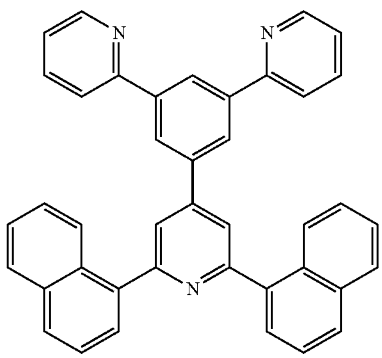
516
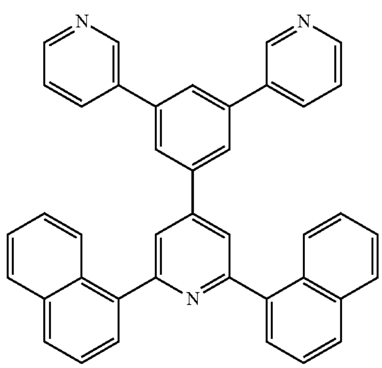
517
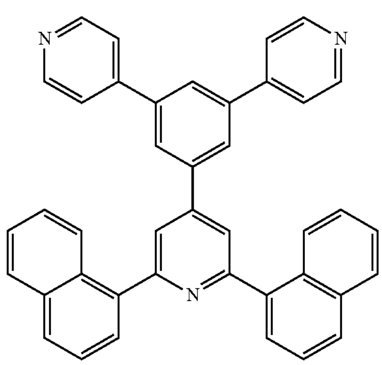
-continued
518
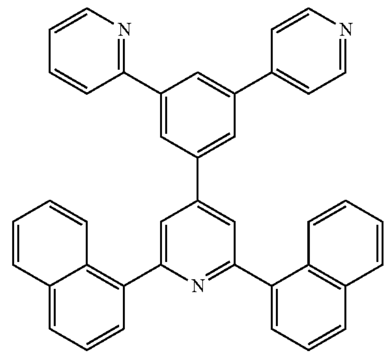
519
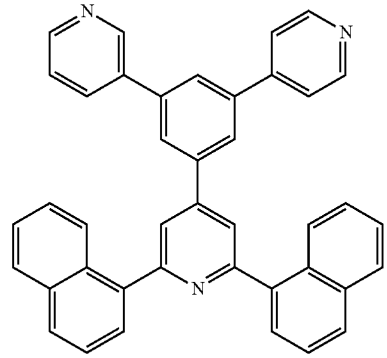
520
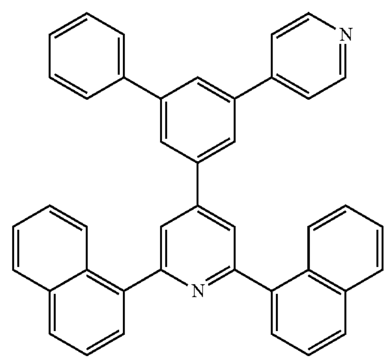
521
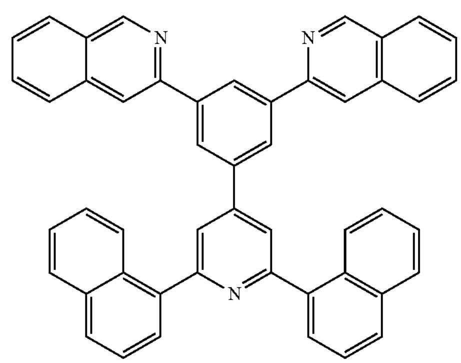

-continued
522
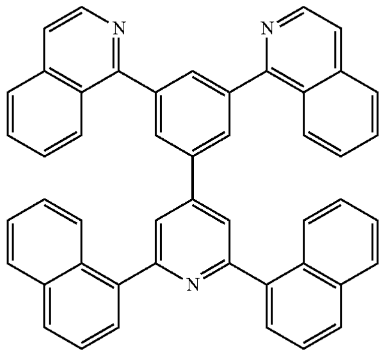
523
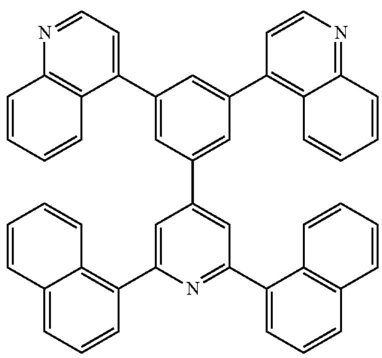
524
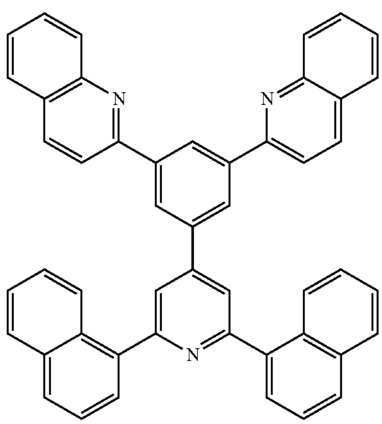
525
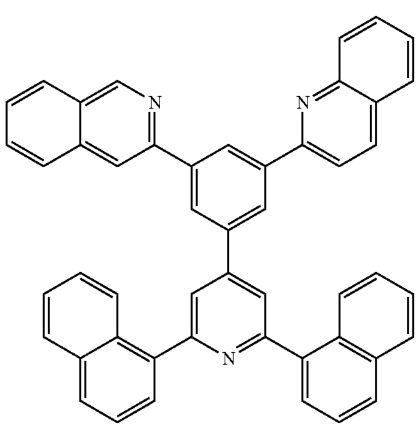
-continued
526
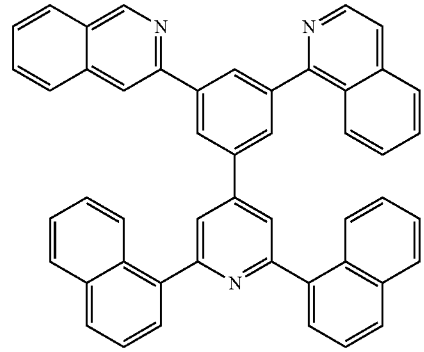
527
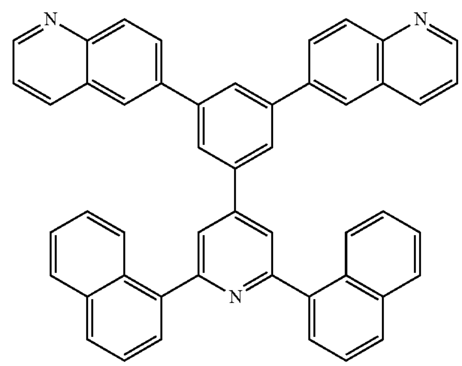
528
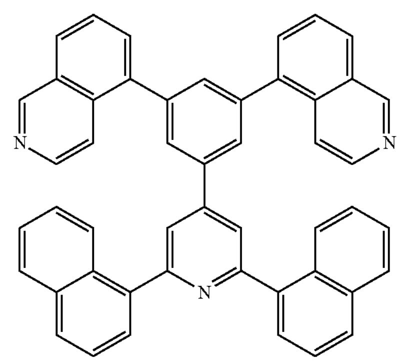
529
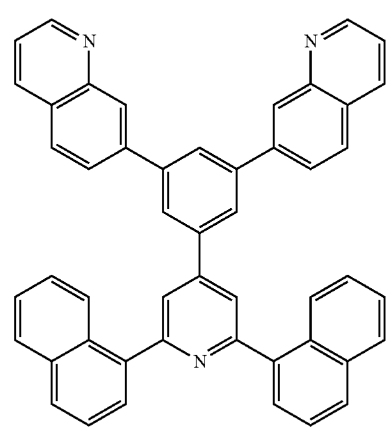

-continued
530
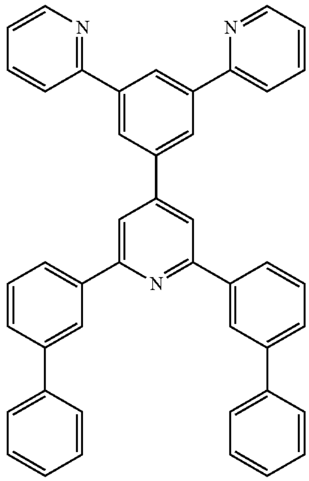
531
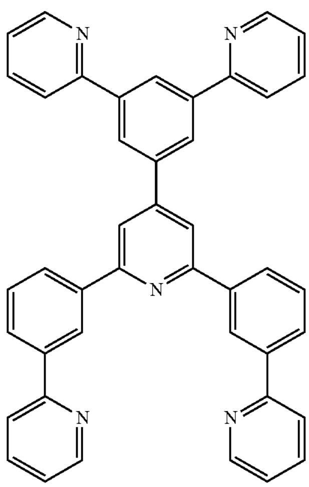
532
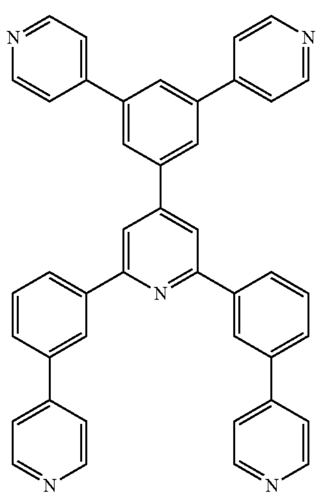
-continued
533
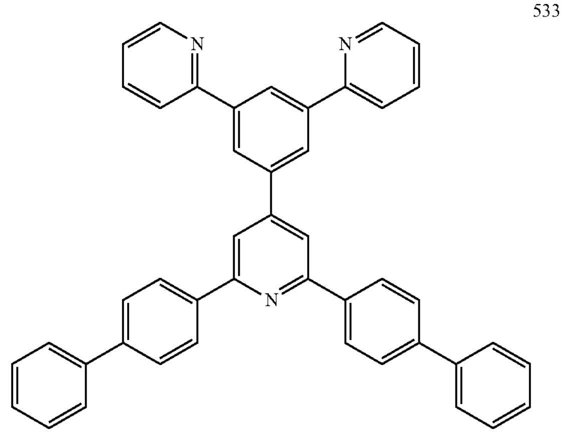
534
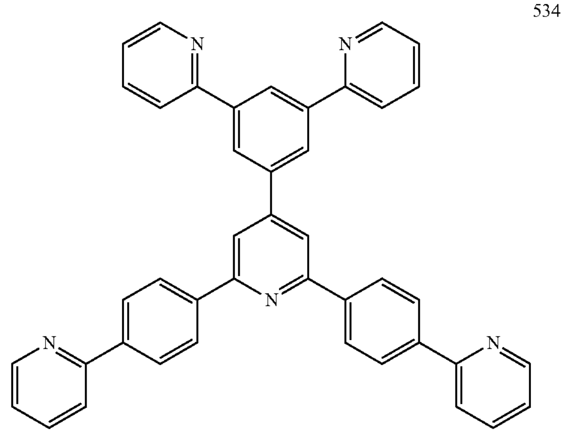
535
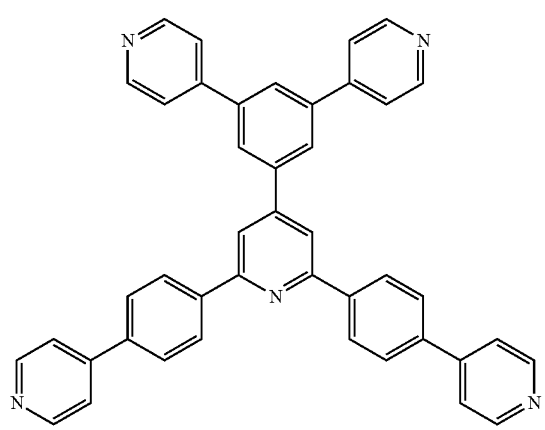

536
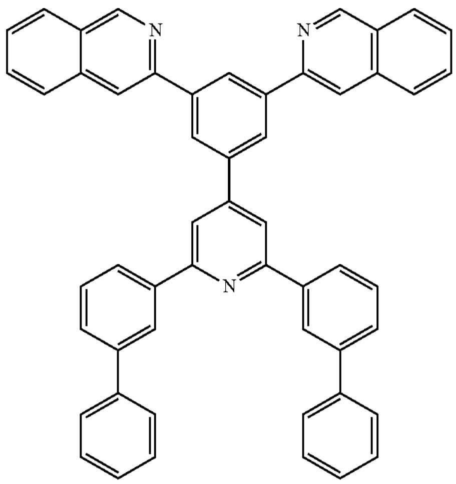
537
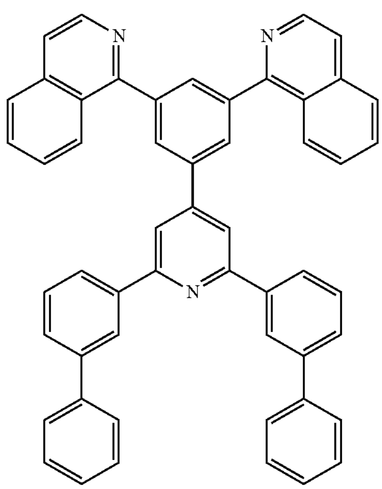
538
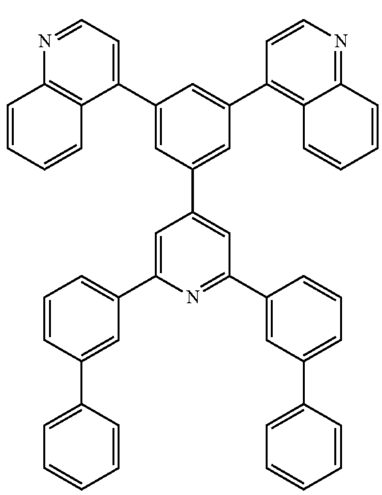
539
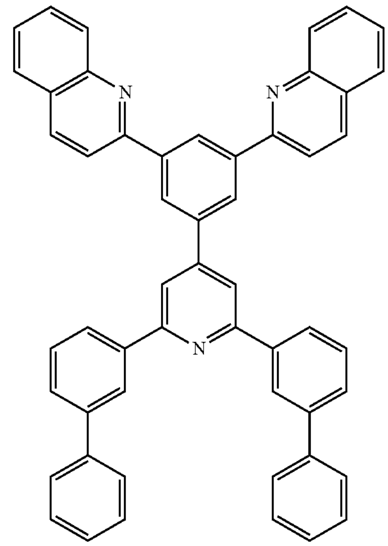
540
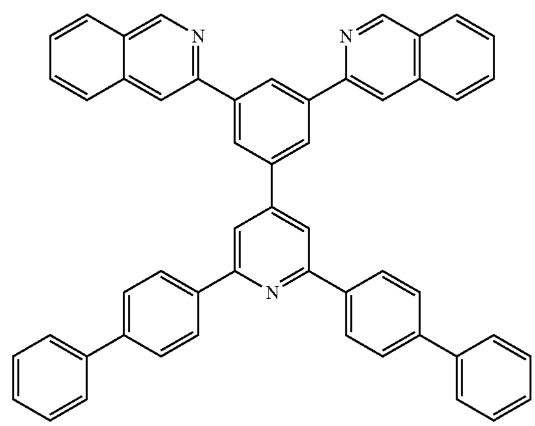
541
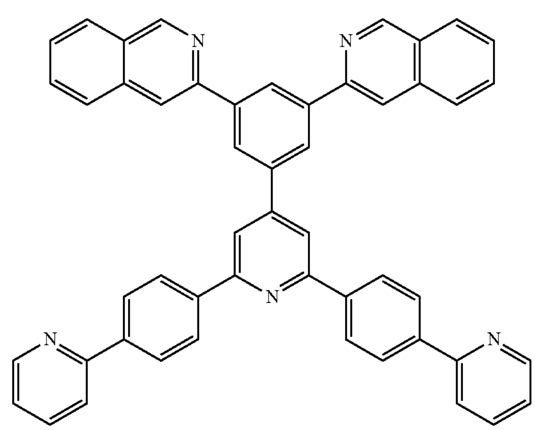

-continued

542

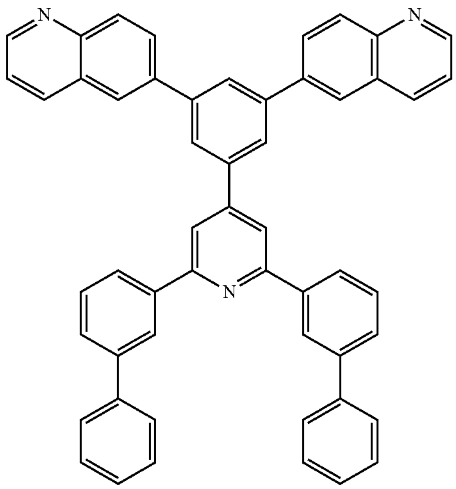

543

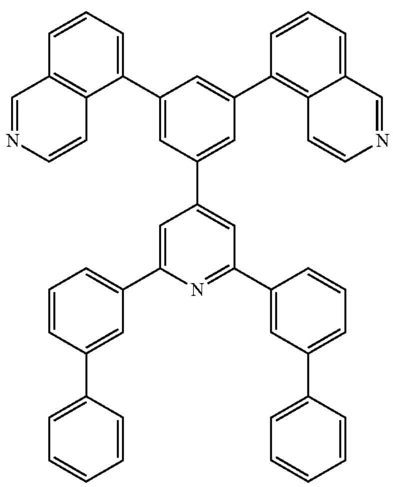

-continued

544

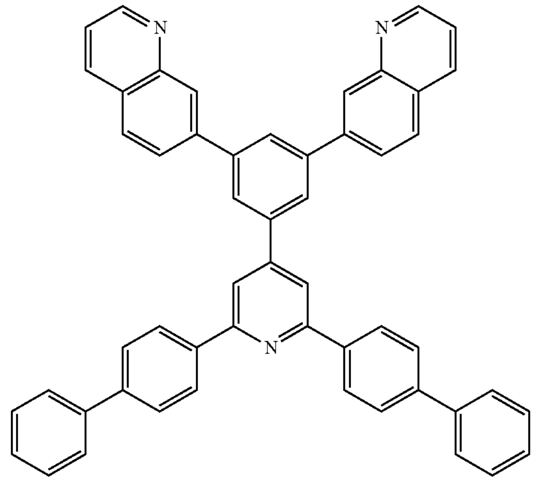

16. The organic light-emitting device of claim 1, wherein the organic layer comprises:

an emission layer; and an electron transport region between the second electrode and the emission layer, wherein the emission layer comprises the at least one first material represented by Formula 1; and the electron transport region comprises the at least one second material represented by Formula 2.

17. The organic light-emitting device of claim 16, wherein the electron transport region comprises an electron transport layer; and the electron transport layer comprises the at least one second material represented by Formula 2.

18. The organic light-emitting device of claim 16, wherein the electron transport region comprises a hole blocking layer; and the hole blocking layer comprises the at least one second material represented by Formula 2.

19. The organic light-emitting device of claim 17, wherein the emission layer and the electron transport layer are adjacent to each other.

20. The organic light-emitting device of claim 18, wherein the emission layer and the hole blocking layer are adjacent to each other.

* * * * *